(12) United States Patent
Maxim et al.

(10) Patent No.: US 11,177,064 B2
(45) Date of Patent: Nov. 16, 2021

(54) ADVANCED 3D INDUCTOR STRUCTURES WITH CONFINED MAGNETIC FIELD

(71) Applicant: Qorvo US, Inc., Greensboro, NC (US)

(72) Inventors: George Maxim, Saratoga, CA (US); Dirk Robert Walter Leipold, San Jose, CA (US); Baker Scott, San Jose, CA (US)

(73) Assignee: Qorvo US, Inc., Greensboro, NC (US)

(*) Notice: Subject to any disclaimer, the term of this patent is extended or adjusted under 35 U.S.C. 154(b) by 0 days.

(21) Appl. No.: 16/590,449

(22) Filed: Oct. 2, 2019

(65) Prior Publication Data
US 2020/0035395 A1 Jan. 30, 2020

Related U.S. Application Data

(60) Continuation of application No. 15/717,525, filed on Sep. 27, 2017, now Pat. No. 10,468,172, which is a
(Continued)

(51) Int. Cl.
*H01F 27/28* (2006.01)
*H01F 17/00* (2006.01)
(Continued)

(52) U.S. Cl.
CPC ......... *H01F 17/0013* (2013.01); *H03F 1/565* (2013.01); *H03F 3/193* (2013.01);
(Continued)

(58) Field of Classification Search
CPC ..... H01F 17/0013; H04B 1/525; H03F 1/565; H03F 3/193; H03F 3/245; H03F 3/68;
(Continued)

(56) References Cited

U.S. PATENT DOCUMENTS 2,014,524 A 9/1935 Franz
2,874,360 A 2/1959 Eisler
(Continued)

FOREIGN PATENT DOCUMENTS

EP 0957368 A2 11/1999
EP 1184977 A2 3/2002
(Continued)

OTHER PUBLICATIONS

Non-Final Office Action for U.S. Appl. No. 15/467,936, dated Jan. 2, 2019, 22 pages.
(Continued)

*Primary Examiner* — Mang Tin Bik Lian
(74) *Attorney, Agent, or Firm* — Withrow & Terranova, PLLC

(57) ABSTRACT

Embodiments of an apparatus that includes a substrate and an inductor residing in the substrate are disclosed. In one embodiment, the inductor is formed as a conductive path that extends from a first terminal to a second terminal. The conductive path has a shape corresponding to a two-dimensional (2D) lobe laid over a three-dimensional (3D) volume. Since the shape of the conductive path corresponds to the 2D lobe laid over a 3D volume, the magnetic field generated by the inductor has magnetic field lines that are predominately destructive outside the inductor and magnetic field lines that are predominately constructive inside the inductor. In this manner, the inductor can maintain a high quality (Q) factor while being placed close to other components.

17 Claims, 50 Drawing Sheets

Related U.S. Application Data division of application No. 14/450,156, filed on Aug. 1, 2014, now Pat. No. 9,899,133, which is a continuation-in-part of application No. 14/298,829, filed on Jun. 6, 2014, now Pat. No. 9,455,680, and a continuation-in-part of application No. 14/298,830, filed on Jun. 6, 2014, now Pat. No. 9,419,578, and a continuation-in-part of application No. 14/298,834, filed on Jun. 6, 2014, now Pat. No. 9,893,710, and a continuation-in-part of application No. 14/298,872, filed on Jun. 6, 2014, now Pat. No. 9,484,879, and a continuation-in-part of application No. 14/298,863, filed on Jun. 6, 2014, now Pat. No. 9,866,197, and a continuation-in-part of application No. 14/298,852, filed on Jun. 6, 2014, now Pat. No. 9,614,490, and a continuation-in-part of application No. 14/099,007, filed on Dec. 6, 2013, now Pat. No. 9,196,406.

(60) Provisional application No. 61/860,932, filed on Aug. 1, 2013, provisional application No. 61/909,028, filed on Nov. 26, 2013, provisional application No. 61/938,884, filed on Feb. 12, 2014, provisional application No. 61/949,581, filed on Mar. 7, 2014, provisional application No. 61/951,844, filed on Mar. 12, 2014, provisional application No. 61/982,946, filed on Apr. 23, 2014, provisional application No. 61/982,952, filed on Apr. 23, 2014, provisional application No. 61/982,971, filed on Apr. 23, 2014, provisional application No. 62/008,192, filed on Jun. 5, 2014, provisional application No. 62/011,629, filed on Jun. 13, 2014, provisional application No. 62/031,645, filed on Jul. 31, 2014, provisional application No. 61/789,693, filed on Mar. 15, 2013.

(51) Int. Cl.
| | |
|---|---|
| *H03F 1/56* | (2006.01) |
| *H03F 3/193* | (2006.01) |
| *H03F 3/24* | (2006.01) |
| *H03F 3/68* | (2006.01) |
| *H03F 3/72* | (2006.01) |
| *H04B 1/525* | (2015.01) |
| *H03H 7/09* | (2006.01) |
| *H03H 7/01* | (2006.01) |

(52) U.S. Cl.
CPC ............ *H03F 3/245* (2013.01); *H03F 3/68* (2013.01); *H03F 3/72* (2013.01); *H04B 1/525* (2013.01); *H03F 2200/111* (2013.01); *H03F 2200/267* (2013.01); *H03F 2200/391* (2013.01); *H03F 2200/451* (2013.01); *H03F 2203/7209* (2013.01); *H03H 7/09* (2013.01); *H03H 7/1775* (2013.01); *H03H 2210/012* (2013.01); *H03H 2210/025* (2013.01); *H03H 2210/04* (2013.01)

(58) Field of Classification Search
CPC ............ H03F 3/72; H03F 2200/391; H03F 2200/111; H03F 2200/267; H03F 2200/451; H03F 2203/7209; H03H 7/09; H03H 2210/012; H03H 2210/025; H03H 2210/04; H03H 7/1775
See application file for complete search history.

(56) References Cited

U.S. PATENT DOCUMENTS

| | | |
|---|---|---|
| 3,465,431 A | 9/1969 | Henning |
| 3,491,318 A * | 1/1970 | Chargin .................. H05H 1/10 335/213 |
| 3,597,709 A | 8/1971 | Rhodes |
| 3,718,874 A | 2/1973 | Cooper, Jr. |
| 3,794,941 A | 2/1974 | Templin |
| 4,169,252 A | 9/1979 | Muszkiewicz |
| 4,296,440 A | 10/1981 | Rosenheck |
| 4,361,894 A | 11/1982 | Kurihara et al. |
| 4,484,345 A | 11/1984 | Stearns |
| 4,816,784 A | 3/1989 | Rabjohn |
| 4,894,566 A | 1/1990 | Rush |
| 5,296,831 A | 3/1994 | Suzuki |
| 5,339,017 A | 8/1994 | Yang |
| 5,420,536 A | 5/1995 | Faulkner et al. |
| 5,507,014 A | 4/1996 | Wray et al. |
| 5,517,083 A | 5/1996 | Whitlock |
| 5,608,363 A | 3/1997 | Cameron et al. |
| 5,661,414 A | 8/1997 | Shigehara et al. |
| 5,675,288 A | 10/1997 | Peyrotte et al. |
| 5,689,144 A | 11/1997 | Williams |
| 5,757,247 A | 5/1998 | Koukkari et al. |
| 5,841,330 A | 11/1998 | Wenzel et al. |
| 5,880,620 A | 3/1999 | Gitlin et al. |
| 5,896,073 A | 4/1999 | Miyazaki et al. |
| 5,963,557 A | 10/1999 | Eng |
| 6,031,445 A | 2/2000 | Marty et al. |
| 6,137,354 A | 10/2000 | Dacus et al. |
| 6,150,901 A | 11/2000 | Auken |
| 6,215,374 B1 | 4/2001 | Petrovic |
| 6,233,438 B1 | 5/2001 | Wynn |
| 6,239,673 B1 | 5/2001 | Wenzel et al. |
| 6,330,289 B1 | 12/2001 | Keashly et al. |
| 6,362,986 B1 | 3/2002 | Schultz et al. |
| 6,522,217 B1 | 2/2003 | Shen |
| 6,529,750 B1 | 3/2003 | Zhang et al. |
| 6,617,925 B2 | 9/2003 | Hoang |
| 6,664,873 B2 | 12/2003 | Tiihonen |
| 6,707,338 B2 | 3/2004 | Kenington et al. |
| 6,801,102 B2 | 10/2004 | Shamsaifar et al. |
| 6,806,793 B2 | 10/2004 | Bhatia et al. |
| 6,809,421 B1 | 10/2004 | Hayasaka et al. |
| 6,819,938 B2 | 11/2004 | Sahota |
| 6,836,517 B2 | 12/2004 | Nagatani et al. |
| 6,980,774 B2 | 12/2005 | Shi |
| 7,015,870 B2 | 3/2006 | Guitton et al. |
| 7,102,430 B2 | 9/2006 | Johnson et al. |
| 7,116,186 B2 | 10/2006 | Chen |
| 7,164,313 B2 | 1/2007 | Capofreddi et al. |
| 7,164,339 B2 | 1/2007 | Huang |
| 7,212,798 B1 | 5/2007 | Adams et al. |
| 7,250,815 B2 | 7/2007 | Taylor et al. |
| 7,253,712 B1 | 8/2007 | Papananos |
| 7,262,680 B2 | 8/2007 | Wang |
| 7,317,353 B2 | 1/2008 | Hayase |
| 7,321,264 B2 | 1/2008 | Kokkeler |
| 7,333,557 B2 | 2/2008 | Rashev et al. |
| 7,336,939 B2 | 2/2008 | Gomez |
| 7,340,229 B2 | 3/2008 | Nakayama et al. |
| 7,378,733 B1 | 5/2008 | Hoang et al. |
| 7,471,739 B1 | 12/2008 | Wright |
| 7,570,129 B2 | 8/2009 | Kintis et al. |
| 7,573,350 B2 | 8/2009 | Frank |
| 7,652,532 B2 | 1/2010 | Li et al. |
| 7,733,207 B2 | 6/2010 | Yun et al. |
| 7,741,943 B2 | 6/2010 | Fouquet et al. |
| 7,795,995 B2 | 9/2010 | White et al. |
| 7,809,349 B1 | 10/2010 | Granger-Jones et al. |
| 7,825,751 B2 | 11/2010 | Kawaguchi et al. |
| 7,852,186 B2 | 12/2010 | Fouquet et al. |
| 7,917,106 B2 | 3/2011 | Drogi et al. |
| 7,970,360 B2 | 6/2011 | Pei |
| 7,973,633 B2 * | 7/2011 | Noma .................. H01F 27/40 336/200 |
| 8,013,674 B2 | 9/2011 | Drogi et al. |
| 8,103,233 B2 | 1/2012 | Im et al. |
| 8,126,409 B2 | 2/2012 | Osman et al. |
| 8,175,551 B2 | 5/2012 | Akaiwa |
| 8,193,781 B2 | 6/2012 | Lin et al. |
| 8,204,446 B2 | 6/2012 | Scheer et al. |
| 8,258,911 B2 | 9/2012 | Fouquet |
| 8,269,575 B2 | 9/2012 | Frye et al. |

(56) References Cited

U.S. PATENT DOCUMENTS

| | | |
|---|---|---|
| 8,314,653 B1 | 11/2012 | Granger-Jones et al. |
| 8,344,806 B1 | 1/2013 | Franck et al. |
| 8,346,179 B2 | 1/2013 | Brunn et al. |
| 8,362,751 B2 | 1/2013 | Lin et al. |
| 8,369,250 B1 | 2/2013 | Khlat |
| 8,400,232 B2 | 3/2013 | Leong et al. |
| 8,410,846 B2 | 4/2013 | Zare-Hoseini |
| 8,519,814 B2 | 8/2013 | Feng et al. |
| 8,620,233 B2 | 12/2013 | Brobston |
| 8,624,678 B2 | 1/2014 | Scott et al. |
| 8,626,083 B2 | 1/2014 | Greene et al. |
| 8,653,888 B2 | 2/2014 | Watanabe |
| 8,653,890 B1 | 2/2014 | Ahmed et al. |
| 8,736,511 B2 | 5/2014 | Morris, III |
| 8,742,871 B2 | 6/2014 | Jin et al. |
| 8,749,310 B2 | 6/2014 | Hayes |
| 8,751,993 B1 | 6/2014 | Fenzi et al. |
| 8,791,769 B2 | 7/2014 | Leong et al. |
| 8,803,632 B2 | 8/2014 | Takeuchi |
| 8,803,634 B2 | 8/2014 | Hanaoka |
| 8,803,648 B2 | 8/2014 | Lo et al. |
| 8,829,995 B2 | 9/2014 | Cohen |
| 8,841,983 B2 | 9/2014 | Newton et al. |
| 8,862,089 B2 | 10/2014 | Wang et al. |
| 8,884,714 B2 | 11/2014 | Carey et al. |
| 8,977,216 B2 | 3/2015 | Weissman et al. |
| 9,002,309 B2 | 4/2015 | Sahota et al. |
| 9,048,112 B2 | 6/2015 | Pan et al. |
| 9,054,648 B1 | 6/2015 | Xu |
| 9,094,104 B2 | 7/2015 | Din et al. |
| 9,124,355 B2 | 9/2015 | Black et al. |
| 9,196,406 B2 | 11/2015 | Leipold et al. |
| 9,203,455 B2 | 12/2015 | Yang et al. |
| 9,312,060 B2 | 4/2016 | Godoy et al. |
| 9,369,162 B2 | 6/2016 | Lo et al. |
| 9,385,055 B2 | 7/2016 | Refai-Ahmed et al. |
| 9,391,650 B2 | 7/2016 | Aparin |
| 9,444,417 B2 | 9/2016 | Maxim et al. |
| 9,472,332 B2 | 10/2016 | Nakamura et al. |
| 9,608,595 B1 | 3/2017 | Raihn et al. |
| 9,628,045 B2 | 4/2017 | Leipold et al. |
| 9,698,751 B2 | 7/2017 | Leipold et al. |
| 9,705,478 B2 | 7/2017 | Maxim et al. |
| 9,721,903 B2 | 8/2017 | Lee et al. |
| 9,899,133 B2 | 2/2018 | Maxim et al. |
| 9,954,498 B2 | 4/2018 | Maxim et al. |
| 2001/0020877 A1 | 9/2001 | Hasegawa et al. |
| 2002/0057139 A1 | 5/2002 | Matsumura et al. |
| 2002/0095778 A1 | 7/2002 | Ahn et al. |
| 2002/0186378 A1 | 12/2002 | Tazartes et al. |
| 2002/0190795 A1 | 12/2002 | Hoang |
| 2003/0008577 A1 | 1/2003 | Quigley et al. |
| 2003/0008628 A1 | 1/2003 | Lindell et al. |
| 2003/0128084 A1 | 7/2003 | Chang et al. |
| 2003/0151409 A1 | 8/2003 | Marek |
| 2003/0155988 A1 | 8/2003 | Douziech et al. |
| 2003/0222732 A1 | 12/2003 | Matthaei |
| 2004/0121741 A1 | 6/2004 | Rashev et al. |
| 2004/0127178 A1 | 7/2004 | Kuffner |
| 2004/0130414 A1 | 7/2004 | Marquardt et al. |
| 2004/0162042 A1 | 8/2004 | Chen et al. |
| 2004/0182602 A1 | 9/2004 | Satoh et al. |
| 2004/0196085 A1 | 10/2004 | Shen |
| 2004/0212038 A1 | 10/2004 | Ott et al. |
| 2004/0222868 A1 | 11/2004 | Rathgeber et al. |
| 2004/0227578 A1 | 11/2004 | Hamalainen |
| 2004/0266378 A1 | 12/2004 | Fukamachi et al. |
| 2005/0123064 A1 | 6/2005 | Ben-Ayun et al. |
| 2005/0150106 A1 | 7/2005 | Long et al. |
| 2005/0190035 A1 | 9/2005 | Wang |
| 2005/0195063 A1 | 9/2005 | Mattsson |
| 2005/0237144 A1 | 10/2005 | Einzinger et al. |
| 2006/0033602 A1 | 2/2006 | Mattsson |
| 2006/0035600 A1 | 2/2006 | Lee et al. |
| 2006/0038635 A1 | 2/2006 | Richiuso et al. |
| 2006/0055050 A1 | 3/2006 | Numata et al. |
| 2006/0058629 A1 | 3/2006 | Warntjes et al. |
| 2006/0109064 A1 | 5/2006 | Toncich et al. |
| 2006/0125465 A1 | 6/2006 | Xiang et al. |
| 2006/0145804 A1* | 7/2006 | Matsutani ............ H01F 27/027 336/200 |
| 2006/0176135 A1* | 8/2006 | Winter ................ H01F 17/0033 336/200 |
| 2006/0220727 A1 | 10/2006 | Yen |
| 2006/0226943 A1 | 10/2006 | Marques |
| 2006/0261890 A1 | 11/2006 | Floyd et al. |
| 2006/0281431 A1 | 12/2006 | Isaac et al. |
| 2007/0085648 A1 | 4/2007 | Lee et al. |
| 2007/0091006 A1 | 4/2007 | Thober et al. |
| 2007/0161361 A1 | 7/2007 | Vaisanen et al. |
| 2007/0182520 A1 | 8/2007 | Kawakubo et al. |
| 2007/0194859 A1 | 8/2007 | Brobston et al. |
| 2007/0241839 A1 | 10/2007 | Taniguchi |
| 2007/0290767 A1 | 12/2007 | Ali-Ahmad et al. |
| 2008/0002380 A1 | 1/2008 | Hazucha et al. |
| 2008/0096516 A1 | 4/2008 | Mun et al. |
| 2008/0099884 A1 | 5/2008 | Inohara |
| 2008/0122560 A1 | 5/2008 | Liu |
| 2008/0164967 A1 | 7/2008 | Mashino |
| 2008/0197963 A1 | 8/2008 | Muto |
| 2008/0220735 A1 | 9/2008 | Kim et al. |
| 2008/0297299 A1 | 12/2008 | Yun et al. |
| 2008/0303623 A1 | 12/2008 | Hsu et al. |
| 2009/0058589 A1 | 3/2009 | Chen et al. |
| 2009/0088110 A1 | 4/2009 | Schuur et al. |
| 2009/0134947 A1 | 5/2009 | Tarng |
| 2009/0134953 A1 | 5/2009 | Hunt et al. |
| 2009/0167460 A1 | 7/2009 | Akasegawa et al. |
| 2009/0261936 A1 | 10/2009 | Widjaja et al. |
| 2009/0289721 A1 | 11/2009 | Rajendran et al. |
| 2009/0309661 A1 | 12/2009 | Chang et al. |
| 2010/0013562 A1 | 1/2010 | Stockinger et al. |
| 2010/0060354 A1 | 3/2010 | Maeda |
| 2010/0144305 A1 | 6/2010 | Cook et al. |
| 2010/0148344 A1 | 6/2010 | Chandra et al. |
| 2010/0188171 A1 | 7/2010 | Mohajer-Iravani et al. |
| 2010/0283557 A1 | 11/2010 | Taniguchi |
| 2011/0010749 A1 | 1/2011 | Alkan |
| 2011/0050384 A1 | 3/2011 | Chen et al. |
| 2011/0103494 A1 | 5/2011 | Ahmadi |
| 2011/0156835 A1 | 6/2011 | Nagai |
| 2011/0159834 A1 | 6/2011 | Salvi |
| 2011/0163824 A1 | 7/2011 | Kawano |
| 2011/0169589 A1 | 7/2011 | Franzon et al. |
| 2011/0210787 A1 | 9/2011 | Lee et al. |
| 2011/0241163 A1 | 10/2011 | Liu et al. |
| 2012/0051409 A1 | 3/2012 | Brobston et al. |
| 2012/0081192 A1 | 4/2012 | Hanaoka |
| 2012/0139090 A1 | 6/2012 | Kim et al. |
| 2012/0230227 A1 | 9/2012 | Weiss |
| 2012/0249266 A1 | 10/2012 | Lim et al. |
| 2012/0262252 A1 | 10/2012 | Tseng et al. |
| 2012/0268229 A1 | 10/2012 | Yen et al. |
| 2012/0280366 A1 | 11/2012 | Kamgaing et al. |
| 2012/0286900 A1 | 11/2012 | Kadota et al. |
| 2013/0049902 A1 | 2/2013 | Hendry et al. |
| 2013/0143381 A1* | 6/2013 | Kikukawa ............... H01F 17/02 438/381 |
| 2013/0168810 A1 | 7/2013 | Cho |
| 2013/0176013 A1 | 7/2013 | Takemae et al. |
| 2013/0187743 A1 | 7/2013 | Chang et al. |
| 2013/0221526 A1 | 8/2013 | Lange et al. |
| 2013/0244591 A1 | 9/2013 | Weissman et al. |
| 2013/0257564 A1 | 10/2013 | Huang et al. |
| 2013/0281031 A1 | 10/2013 | Gingrich et al. |
| 2013/0295863 A1 | 11/2013 | Shanan |
| 2014/0015603 A1 | 1/2014 | Scott et al. |
| 2014/0035358 A1 | 2/2014 | Ichikawa |
| 2014/0106698 A1 | 4/2014 | Mi et al. |
| 2014/0113573 A1 | 4/2014 | Khatri et al. |
| 2014/0133189 A1 | 5/2014 | Worek |
| 2014/0141738 A1 | 5/2014 | Janesch |
| 2014/0146737 A1 | 5/2014 | Ohshima et al. |
| 2014/0162712 A1 | 6/2014 | Feld et al. |

(56) References Cited

U.S. PATENT DOCUMENTS

| | | | |
|---|---|---|---|
| 2014/0167877 | A1 | 6/2014 | Shimizu et al. |
| 2014/0167896 | A1* | 6/2014 | Tung .................. H01F 17/0013 336/5 |
| 2014/0192845 | A1 | 7/2014 | Szini et al. |
| 2014/0225680 | A1 | 8/2014 | Fujiwara et al. |
| 2014/0232467 | A1 | 8/2014 | Mukai et al. |
| 2014/0266432 | A1 | 9/2014 | Scott et al. |
| 2014/0266451 | A1 | 9/2014 | Scott et al. |
| 2014/0266452 | A1 | 9/2014 | Scott et al. |
| 2014/0266457 | A1 | 9/2014 | Scott et al. |
| 2014/0266458 | A1 | 9/2014 | Scott et al. |
| 2014/0266459 | A1 | 9/2014 | Scott et al. |
| 2014/0266531 | A1 | 9/2014 | Leipold et al. |
| 2014/0266544 | A1 | 9/2014 | Leipold et al. |
| 2014/0285286 | A1 | 9/2014 | Bojer |
| 2014/0323046 | A1 | 10/2014 | Asai et al. |
| 2014/0323071 | A1 | 10/2014 | Liao |
| 2014/0328220 | A1 | 11/2014 | Khlat et al. |
| 2014/0361848 | A1 | 12/2014 | Leipold et al. |
| 2014/0361849 | A1 | 12/2014 | Maxim et al. |
| 2014/0361852 | A1 | 12/2014 | Leipold et al. |
| 2014/0364077 | A1 | 12/2014 | Maxim et al. |
| 2015/0001708 | A1 | 1/2015 | Lin |
| 2015/0002240 | A1 | 1/2015 | Reiha |
| 2015/0035612 | A1 | 2/2015 | Maxim et al. |
| 2015/0035617 | A1 | 2/2015 | Leipold et al. |
| 2015/0035622 | A1 | 2/2015 | Maxim et al. |
| 2015/0035625 | A1 | 2/2015 | Ohtomo et al. |
| 2015/0035637 | A1 | 2/2015 | Maxim et al. |
| 2015/0038094 | A1 | 2/2015 | Maxim et al. |
| 2015/0038101 | A1 | 2/2015 | Maxim et al. |
| 2015/0042399 | A1 | 2/2015 | Imbornone et al. |
| 2015/0054582 | A1 | 2/2015 | Goss |
| 2015/0056939 | A1 | 2/2015 | Ong et al. |
| 2015/0061680 | A1 | 3/2015 | Leskowitz |
| 2015/0065070 | A1 | 3/2015 | Maxim et al. |
| 2015/0084699 | A1 | 3/2015 | Maxim et al. |
| 2015/0084713 | A1 | 3/2015 | Maxim et al. |
| 2015/0084718 | A1 | 3/2015 | Maxim et al. |
| 2015/0092625 | A1 | 4/2015 | Leipold et al. |
| 2015/0094008 | A1 | 4/2015 | Maxim et al. |
| 2015/0102887 | A1 | 4/2015 | Park |
| 2015/0116950 | A1* | 4/2015 | Yoo ........................ H05K 1/185 361/728 |
| 2015/0117280 | A1 | 4/2015 | Khlat et al. |
| 2015/0117281 | A1 | 4/2015 | Khlat et al. |
| 2015/0226950 | A1 | 8/2015 | Booth et al. |
| 2015/0279921 | A1 | 10/2015 | Lam et al. |
| 2016/0126613 | A1 | 5/2016 | Leipold et al. |
| 2016/0126623 | A1 | 5/2016 | Maxim et al. |
| 2016/0359510 | A1 | 12/2016 | Scott et al. |
| 2016/0359511 | A1 | 12/2016 | Maxim et al. |
| 2017/0062119 | A1 | 3/2017 | Zybura et al. |
| 2017/0084991 | A1 | 3/2017 | Mayo |
| 2017/0134058 | A1 | 5/2017 | Leipold et al. |
| 2017/0278623 | A1 | 9/2017 | Leipold et al. |
| 2018/0158775 | A1 | 6/2018 | Leipold et al. |

FOREIGN PATENT DOCUMENTS

| | | |
|---|---|---|
| JP | H05243057 A | 9/1993 |
| JP | 06082539 A | 3/1994 |
| JP | 07015253 A | 1/1995 |
| JP | 2010141827 A | 6/2010 |
| KR | 100812098 B1 | 3/2008 |
| KR | 20110114238 A | 10/2011 |
| WO | 0146971 A1 | 6/2001 |
| WO | 2005117255 A1 | 12/2005 |

OTHER PUBLICATIONS

Final Office Action for U.S. Appl. No. 15/467,936, dated Dec. 2, 2019, 59 pages.
Advisory Action for U.S. Appl. No. 15/467,936, dated Jan. 9, 2020, 3 pages.
Notice of Allowance for U.S. Appl. No. 15/467,936, dated Feb. 11, 2020, 9 pages.
Idris, D., et al., "Design and Implementation of Self-Calibration for Digital Predistortion of Power Amplifiers," WSEAS Transactions on Circuits and Systems, vol. 7, No. 2, Feb. 2008, pp. 75-84.
Keerti, Arvind, et al., "RF Characterization of SiGe HBT Power Amplifiers under Load Mismatch," IEEE Transactions on Microwave Theory and Techniques, vol. 55, No. 2, Feb. 2007, pp. 207-214.
Kim, Jangheon et al., "Analysis of Adaptive Digital Feedback Linearization Techniques," IEEE Transactions on Circuits and Systems—1: Regular Papers, vol. 57, No. 2, Feb. 2010, pp. 345-354.
Ko, Sangwon, et al., "A Linearized Cascode CMOS Power Amplifier," IEEE Annual Wireless and Microwave Technology Conference, WAMICON '06, Dec. 4-6, 2006, Clearwater Beach, Florida, 4 pages.
Liu, Jenny Yi-Chun, et al., "Millimeter-Wave Self-Healing Power Amplifier with Adaptive Amplitude and Phase Linearization in 65-nm CMOS," IEEE Transactions on Microwave Theory and Techniques, vol. 60, No. 5, May 2012, pp. 1342-1352.
Mu, Xiaofang, et al., "Analysis of Output Power Variation under Mismatched Load in Power Amplifier FEM with Directional Coupler," IEEE MTT-S International Microwave Symposium Digest, Jun. 7-12, 2009, Boston, Mass., pp. 549-552.
Nakayama, Masatoshi, et al., "A Novel Amplitude and Phase Linearizing Technique for Microwave Power Amplifiers," IEEE MTT-S International Microwave Symposium Digest, vol. 3, May 16-20, 1995, Orlando, Fla., pp. 1451-1454.
Peng, Zhan, et al., "RF Power Amplifier Linearization Method Based on Quadrature Nonlinear Model," 1st International Conference on Information Science and Engineering, Dec. 26-28, 2009, Nanjing, China, pp. 2711-2713.
Rachakonda, Anil, et al., "Log Amps and Directional Couplers Enable VSWR Detection," RF Design Magazine, Jan. 2007, pp. 28-34.
Scuderi, Antonino, et al., "A VSWR-Rugged Silicon Bipolar RF Power Amplifier," Proceedings of the Bipolar/BiCMOS Circuits and Technology Meeting, Oct. 9-11, 2005, pp. 116-119.
So, Jinhyun, et al., "Digital Predistortion Based on Envelope Feedback," IEEE International Conference on Acoustics, Speech and Signal Processing (ICASSP), Mar. 25-30, 2012, Kyoto, Japan, pp. 3169-3172.
Woo, Wangmyong, et al., "A New Envelope Predistortion Linearization Architecture for Handset Power Amplifiers," IEEE Radio and Wireless Conference, Sep. 19-22, 2004, pp. 175-178.
Zhang, X., et al., "Gain/Phase Imbalance-Minimization Techniques for LINC Transmitters," IEEE Transactions on Microwave Theory and Techniques, vol. 49, No. 12, Dec. 2001, pp. 2507-2516.
Non-Final Office Action for U.S. Appl. No. 14/215,815, dated May 4, 2015, 13 pages.
Notice of Allowance for U.S. Appl. No. 14/215,815, dated Oct. 1, 2015, 7 pages.
Non-Final Office Action for U.S. Appl. No. 14/216,376, dated May 7, 2015, 8 pages.
Notice of Allowance for U.S. Appl. No. 14/216,376, dated Feb. 22, 2016, 10 pages.
Non-Final Office Action for U.S. Appl. No. 14/216,794, dated Jun. 30, 2015, 5 pages.
Notice of Allowance for U.S. Appl. No. 14/216,794, dated Nov. 24, 2015, 7 pages.
Non-Final Office Action for U.S. Appl. No. 14/217,199, dated Jul. 2, 2015, 6 pages.
Final Office Action for U.S. Appl. No. 14/217,199, dated Oct. 19, 2015, 5 pages.
Non-Final Office Action for U.S. Appl. No. 14/217,199, dated Feb. 4, 2016, 5 pages.
Final Office Action for U.S. Appl. No. 14/217,199, dated Jul. 7, 2016, 5 pages.
Advisory Action for U.S. Appl. No. 14/217,199, dated Oct. 17, 2016, 2 pages.

(56) References Cited

OTHER PUBLICATIONS

Non-Final Office Action for U.S. Appl. No. 14/217,199, dated Nov. 23, 2016, 6 pages.
Notice of Allowance for U.S. Appl. No. 14/217,199, dated Apr. 4, 2017, 6 pages.
Non-Final Office Action for U.S. Appl. No. 14/216,560, dated Jul. 16, 2015, 9 pages.
Non-Final Office Action for U.S. Appl. No. 14/216,560, dated Feb. 2, 2016, 9 pages.
Non-Final Office Action for U.S. Appl. No. 14/216,560, dated Aug. 16, 2016, 8 pages.
Notice of Allowance for U.S. Appl. No. 14/216,560, dated Apr. 20, 2017, 9 pages.
Non-Final Office Action for U.S. Appl. No. 14/218,953, dated Jul. 24, 2015, 10 pages.
Final Office Action for U.S. Appl. No. 14/218,953, dated Jan. 4, 2016, 11 pages.
Notice of Allowance for U.S. Appl. No. 14/218,953, dated May 2, 2016, 5 pages.
International Search Report and Written Opinion for PCT/US2014/030431, dated Jun. 20, 2014, 14 pages.
International Preliminary Reporton Patentability for PCT/US/2014/030431, dated Sep. 24, 2015, 10 pages.
Non-Final Office Action for U.S. Appl. No. 15/961,299, dated Sep. 5, 2018, 10 pages.
Final Office Action for U.S. Appl. No. 15/961,299, dated Mar. 5, 2019, 11 pages.
Non-Final Office Action for U.S. Appl. No. 15/717,525, dated Mar. 4, 2019, 10 pages.
Notice of Allowance for U.S. Appl. No. 15/972,917, dated Jan. 28, 2019, 7 pages.
Non-Final Office Action for U.S. Appl. No. 15/208,780, dated Oct. 22, 2018, 7 pages.
Final Office Action for U.S. Appl. No. 15/208,780, dated Mar. 7, 2019, 9 pages.
Non-Final Office Action for U.S. Appl. No. 15/961,299, dated Jun. 25, 2019, 11 pages.
Notice of Allowance and Examiner-Initiated Interview Summary for U.S. Appl. No. 15/717,525, dated Jun. 26, 2019, 10 pages.
Non-Final Office Action for U.S. Appl. No. 15/208,780, dated Aug. 7, 2019, 11 pages.
Hoppenjans, Eric E. et al., "A Vertically Integrated Tunable UHF Filter," International Microwave Symposium Digest (MTT), May 23-28, 2010, Anaheim, California, IEEE, pp. 1380-1383.
Joshi, H. et al., "Tunable high Q narrow-band triplexer," IEEE MTT-S International Microwave Symposium Digest, Jun. 7-12, 2009, Boston, MA, IEEE, pp. 1477-1480.
Kamali-Sarvestani, Reza et al., "Fabrication of High Quality Factor RF-Resonator Using Embedded Inductor and Via Capacitor," IECON 2010—36th Annual Conference on IEEE Industrial Electronics Society, Nov. 7-10, 2010, Glendale, Arizona, IEEE, pp. 2283-2287.
Non-Final Office Action for U.S. Appl. No. 14/215,800, dated Nov. 20, 2015, 5 pages.
Final Office Action for U.S. Appl. No. 14/215,800, dated Mar. 11, 2016, 6 pages.
Non-Final Office Action for U.S. Appl. No. 14/215,800, dated Aug. 11, 2016, 6 pages.
Invitation to Pay Additional Fees and, Where Applicable, Protest Fee for PCT/US2014/048608, dated Oct. 21, 2014, 7 pages.
International Search Report and Written Opinion for PCT/US2014/048608, dated Dec. 16, 2014, 18 pages.
International Preliminary Reporton Patentability for PCT/US2014/048608, dated Feb. 11, 2016, 14 pages.
Non-Final Office Action for U.S. Appl. No. 14/298,829, dated Jun. 22, 2015, 8 pages.
Final Office Action for U.S. Appl. No. 14/298,829, dated Feb. 3, 2016, 10 pages.
Notice of Allowance for U.S. Appl. No. 14/298,829, dated May 20, 2016, 9 pages.
Non-Final Office Action for U.S. Appl. No. 14/298,830, dated Dec. 3, 2015, 10 pages.
Notice of Allowance for U.S. Appl. No. 14/298,830, dated Apr. 7, 2016, 9 pages.
Non-Final Office Action for U.S. Appl. No. 14/298,863, dated Jan. 7, 2016, 16 pages.
Final Office Action for U.S. Appl. No. 14/298,863, dated Jun. 3, 2016, 17 pages.
Non-Final Office Action for U.S. Appl. No. 14/449,913, dated Mar. 28, 2016, 15 pages.
Final Office Action for U.S. Appl. No. 14/449,913, dated Sep. 7, 2016, 14 pages.
Non-Final Office Action for U.S. Appl. No. 14/298,852, dated Dec. 22, 2015, 7 pages.
Notice of Allowance for U.S. Appl. No. 14/298,852, dated May 13, 2016, 9 pages.
Notice of Allowance for U.S. Appl. No. 14/298,852, dated Jul. 13, 2016, 9 pages.
Non-Final Office Action for U.S. Appl. No. 14/450,156, dated Mar. 14, 2016, 11 pages.
Non-Final Office Action for U.S. Appl. No. 14/450,156, dated Sep. 15, 2016, 11 pages.
Non-Final Office Action for U.S. Appl. No. 14/450,028, dated Dec. 10, 2015, 11 pages.
Final Office Action for U.S. Appl. No. 14/450,028, dated Mar. 31, 2016, 12 pages.
Advisory Action for U.S. Appl. No. 14/450,028, dated Aug. 2, 2016, 3 pages.
Non-Final Office Action for U.S. Appl. No. 14/449,764, dated May 4, 2016, 12 pages.
Non-Final Office Action for U.S. Appl. No. 14/450,199, dated Apr. 20, 2016, 7 pages.
Notice of Allowance for U.S. Appl. No. 14/450,199, dated Aug. 1, 2016, 7 pages.
Non-Final Office Action for U.S. Appl. No. 14/450,204, dated Apr. 22, 2016, 8 pages.
Non-Final Office Action for U.S. Appl. No. 14/555,053, dated Dec. 31, 2015, 5 pages.
Notice of Allowance for U.S. Appl. No. 14/555,053, dated Apr. 19, 2016, 7 pages.
Non-Final Office Action for U.S. Appl. No. 14/450,200, dated Feb. 29, 2016, 13 pages.
Final Office Action for U.S. Appl. No. 14/450,200, dated Jun. 14, 2016, 13 pages.
Non-Final Office Action for U.S. Appl. No. 14/450,200, dated Sep. 8, 2016, 14 pages.
Non-Final Office Action for U.S. Appl. No. 14/554,943, dated Jun. 30, 2016, 14 pages.
Non-Final Office Action for U.S. Appl. No. 14/555,557, dated Jun. 13, 2016, 28 pages.
Non-Final Office Action for U.S. Appl. No. 14/298,863, dated Sep. 26, 2016, 9 pages.
Non-Final Office Action for U.S. Appl. No. 14/450,028, dated Sep. 26, 2016, 14 pages.
Non-Final Office Action for U.S. Appl. No. 14/449,764, dated Oct. 17, 2016, 10 pages.
Final Office Action for U.S. Appl. No. 14/555,557, dated Sep. 20, 2016, 23 pages.
Non-Final Office Action for U.S. Appl. No. 14/553,371, dated Oct. 25, 2016, 19 pages.
Notice of Allowance for U.S. Appl. No. 14/449,913, dated Dec. 7, 2016, 7 pages.
Notice of Allowance and Examiner-Initiated Interview Summary for U.S. Appl. No. 14/554,943, dated Nov. 16, 2016, 8 pages.
Notice of Allowance for U.S. Appl. No. 15/223,416, dated Dec. 2, 2016, 8 pages.
Final Office Action for U.S. Appl. No. 14/215,800, dated Feb. 8, 2017, 7 pages.
Final Office Action for U.S. Appl. No. 14/298,863, dated Feb. 14, 2017, 10 pages.
Final Office Action for U.S. Appl. No. 14/450,028, dated Jan. 19, 2017, 12 pages.

(56) References Cited

OTHER PUBLICATIONS

Non-Final Office Action for U.S. Appl. No. 16/402,336, dated Oct. 6, 2020, 7 pages.
Notice of Allowance for U.S. Appl. No. 15/961,299, dated Nov. 17, 2020, 7 pages.
Final Office Action for U.S. Appl. No. 15/835,041, dated Nov. 27, 2020, 12 pages.
Non-Final Office Action for U.S. Appl. No. 15/961,299, dated May 1, 2020, 12 pages.
Notice of Allowance for U.S. Appl. No. 15/208,780, dated May 27, 2020, 9 pages.
Non-Final Office Action for U.S. Appl. No. 14/450,204, dated Feb. 1, 2017, 9 pages.
Notice of Allowance and Examiner-Initiated Interview Summary for U.S. Appl. No. 14/450,200, dated Feb. 10, 2017, 8 pages.
Non-Final Office Action for U.S. Appl. No. 14/555,557, dated Feb. 13, 2017, 21 pages.
Non-Final Office Action for U.S. Appl. No. 14/554,975, dated Feb. 16, 2017, 9 pages.
Notice of Allowance for U.S. Appl. No. 15/223,416, dated Feb. 28, 2017, 8 pages.
Non-Final Office Action for U.S. Appl. No. 15/240,420, dated Jan. 26, 2017, 7 pages.
Non-Final Office Action for U.S. Appl. No. 15/241,823, dated Jan. 17, 2017, 6 pages.
Final Office Action for U.S. Appl. No. 14/449,764, dated Mar. 2, 2017, 10 pages.
Corrected Notice of Allowability for U.S. Appl. No. 14/450,200, dated Mar. 1, 2017, 3 pages.
Advisory Action for U.S. Appl. No. 14/215,800, dated Apr. 20, 2017, 2 pages.
Notice of Allowance for U.S. Appl. No. 14/298,863, dated May 31, 2017, 6 pages.
Final Office Action for U.S. Appl. No. 14/450,156, dated Apr. 27, 2017, 12 pages.
Notice of Allowance for U.S. Appl. No. 14/450,028, dated May 3, 2017, 5 pages.
Notice of Allowance and Examiner-Initiated Interview Summary for U.S. Appl. No. 14/449,764, dated May 19, 2017, 8 pages.
Notice of Allowance for U.S. Appl. No. 14/450,204, dated Jun. 28, 2017, 8 pages.
Notice of Allowance for U.S. Appl. No. 14/555,371, dated Mar. 31, 2017, 8 pages.
Notice of Allowance and Examiner-Initiated Inteview Summary for U.S. Appl. No. 14/554,975, dated Jul. 17, 2017, 9 pages.
Notice of Allowance for U.S. Appl. No. 15/240,420, dated May 10, 2017, 8 pages.
Notice of Allowance for U.S. Appl. No. 15/241,823, dated May 9, 2017, 7 pages.
Non-Final Office Action for U.S. Appl. No. 15/587,581, dated Jun. 30, 2017, 6 pages.
Non-Final Office Action for U.S. Appl. No. 15/415,538, dated Jul. 17, 2017, 18 pages.
Non-Final Office Action for U.S. Appl. No. 14/215,800, dated Aug. 15, 2017, 6 pages.
Notice of Allowance for U.S. Appl. No. 14/450,156, dated Oct. 11, 2017, 10 pages.
Supplemental Notice of Allowability for U.S. Appl. No. 14/450,204, dated Aug. 28, 2017, 5 pages.
Notice of Allowance for U.S. Appl. No. 14/554,943, dated Aug. 31, 2017, 7 pages.
Advisory Action for U.S. Appl. No. 14/555,557, dated Nov. 3, 2017, 3 pages.
Final Office Action for U.S. Appl. No. 14/555,557, dated Aug. 7, 2017, 21 pages.
Duplessis, M., et al., "Physical implementation of 3D integrated solenoids within silicon substrate for hybrid IC applications," presented at the European Microwave Conference, Sep. 29-Oct. 1, 2009, Rome, IEEE, pp. 1006-1009.

Invitation to Pay Additional Fees for PCT/US2014/030188, dated Jul. 4, 2014, 8 pages.
International Search Report and Written Opinion for PCT/US2014/030188, dated Sep. 5, 2014, 19 pages.
International Preliminary Report on Patentability for PCT/US2014/030188, dated Sep. 24, 2015, 13 pages.
Non-Final Office Action for U.S. Appl. No. 14/099,007, dated Oct. 30, 2014, 10 pages.
Final Office Action for U.S. Appl. No. 14/099,007, dated Mar. 4, 2015, 14 pages.
Notice of Allowance for U.S. Appl. No. 14/099,007, dated Jul. 22, 2015, 9 pages.
Non-Final Office Action for U.S. Appl. No. 14/450,156, dated Sep. 9, 2015, 13 pages.
Notice of Allowance for U.S. Appl. No. 14/215,800, dated Jan. 9, 2018, 8 pages.
Notice of Allowance for U.S. Appl. No. 15/587,581, dated Dec. 8, 2017, 7 pages.
Bogya, Robert I., et al., "Linear Radio Frequency Power Amplifier Design Using Nonlinear Feedback Linearization Techniques," presented at the 60th Vehicular Technology Conference, vol. 3, Sep. 26-29, 2004, IEEE, pp. 2259-2263.
Brounley, Richard W., "Matching Networks for Power Amplifiers Operating into High VSWR Loads," High Frequency Electronics, May 2004, pp. 58-62.
Charles, C.T., "A Calibrated Phase and Amplitude Control System for a 1.9 GHz Phased-Array Transmitter Element," IEEE Transactions on Circuits and Systems 1: Regular Papers, vol. 56, No. 12, Dec. 2009, pp. 2728-2737.
Chen, Wei, et al., "A Novel VSWR-Protected and Controllable CMOS Class E Power Amplifier for Bluetooth Applications," International Journal of Design, Analysis and Tools for Circuits and Systems, vol. 1, No. 1, Jun. 2011, pp. 22-26.
D'Andrea, Aldo N., et al., "RF Power Amplifier Linearization through Amplitude and Phase Predistortion," IEEE Transactions on Communications, vol. 44, No. 11, Nov. 1996, pp. 1477-1484.
Dawson, J., et al., "Automatic Phase Alignment for a Fully Integrated Cartesian Feedback Power Amplifier System," IEEE Journal of Solid-State Circuits, vol. 38, No. 12, Dec. 2003, pp. 2269-2279.
Dawson, Joel L., "Feedback Linearization of RF Power Amplifiers," Dissertation for Stanford University, Stanford, Calif., Aug. 2003, 191 pages.
Delaunay, Nicolas, et al., "Linearization of a 65nm CMOS Power Amplifier with a Cartesian Feedback for W-CDMA Standard," Joint IEEE North-East Workshop on Circuits and Systems and TAISA Conference, Jun. 28-Jul. 1, 2009, Toulouse, France, 4 pages.
Do, Ji-Hoon, et al., "W-CDMA High Power Amplifier Using Anti-Phase Intermodulation Distortion Linearization Technology," Asia-Pacific Microwave Conference, Dec. 11-14, 2007, Bangkok, Thailand, 4 pages.
Hoppenjans, Eric E., et al., "A Vertically Integrated Tunable UHF Filter," 2010 IEEE MTT-S International Microwave Symposium Digest (MTT), May 23-28, 2010, Anaheim, Calif., pp. 1380-1383.
Hu, Q.Z., et al., "A SiGe Power Amplifier with Power Detector and VSWR Protection For TD-SCDMA Application," Proceedings of the International Conference on Mixed Design of Integrated Circuits and Systems, Jun. 22-24, 2006, Gdynia, Poland, pp. 214-217.
Hur, J., et al., "An Amplitude and Phase Mismatches Calibration Technique for the LINC Transmitter with Unbalanced Phase Control," IEEE Transactions on Vehicular Technology, vol. 60, No. 9, Nov. 2011, pp. 4184-4193.
Final Office Action for U.S. Appl. No. 15/961,299, dated Dec. 31, 2019, 13 pages.
Final Office Action for U.S. Appl. No. 15/208,780, dated Jan. 8, 2020, 12 pages.
Advisory Action for U.S. Appl. No. 15/208,780, dated Mar. 13, 2020, 3 pages.
Non-Final Office Action for U.S. Appl. No. 15/835,041, dated Feb. 28, 2020, 14 pages.
Final Office Action for U.S. Appl. No. 16/402,336, dated Apr. 1, 2021, 7 pages.
Interview Summary for U.S. Appl. No. 15/835,041, dated Feb. 10, 2021, 5 pages.

(56) References Cited

OTHER PUBLICATIONS

Notice of Allowance for U.S. Appl. No. 15/835,041, dated Jun. 2, 2021, 8 pages.

\* cited by examiner

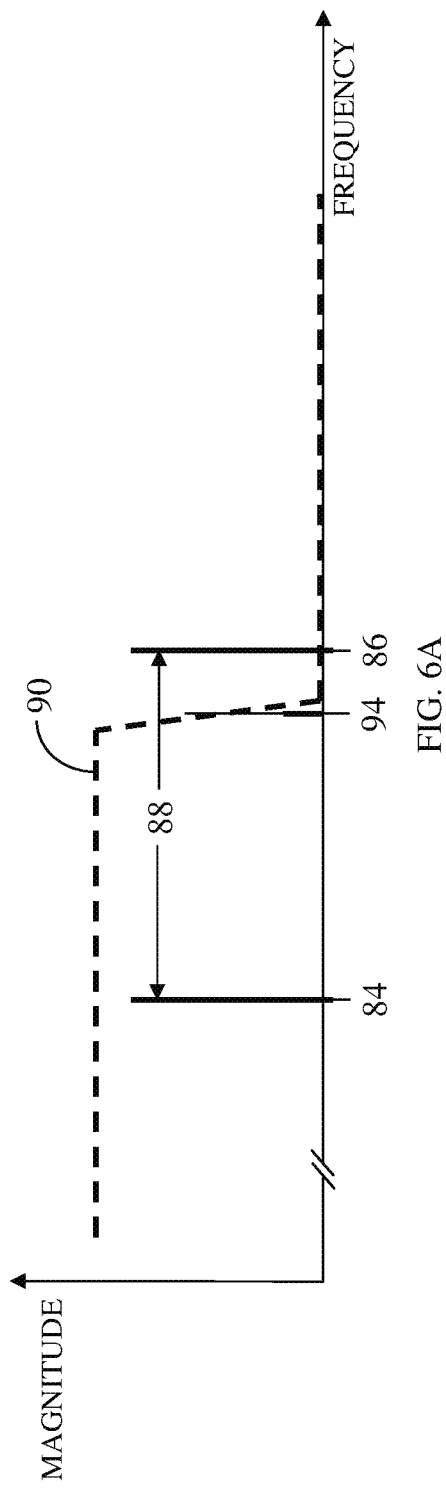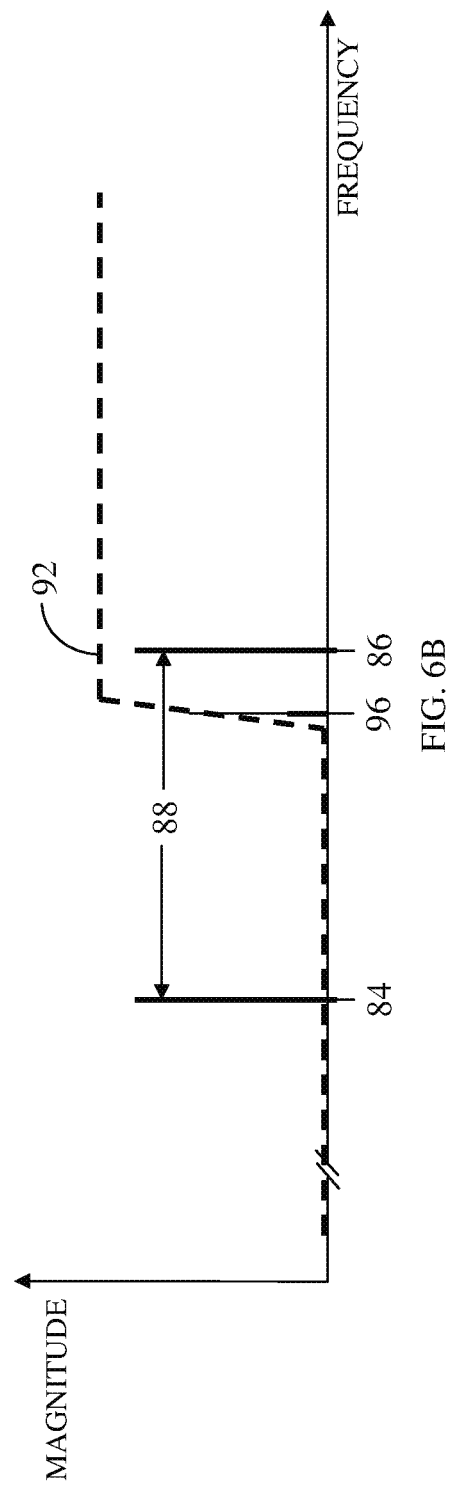

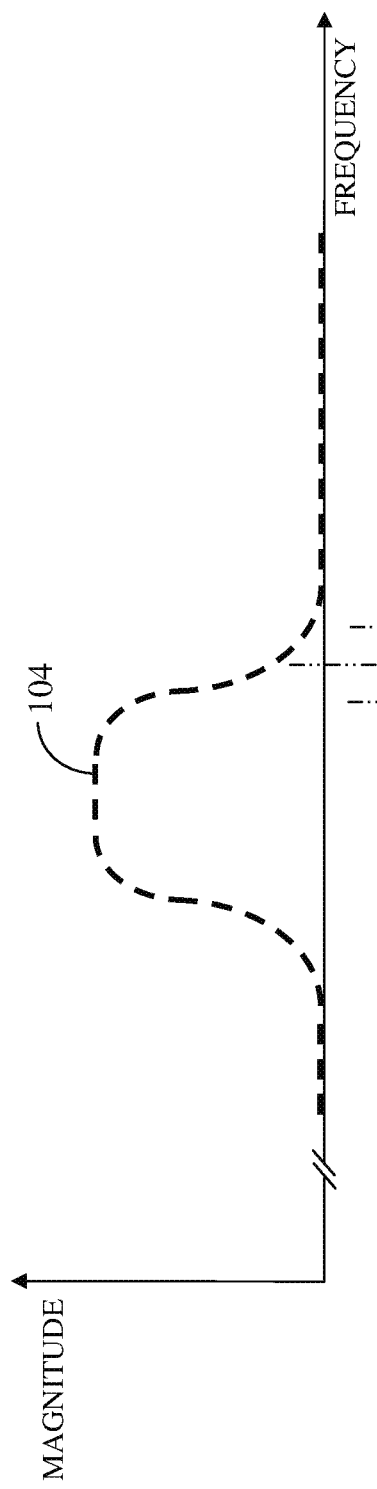
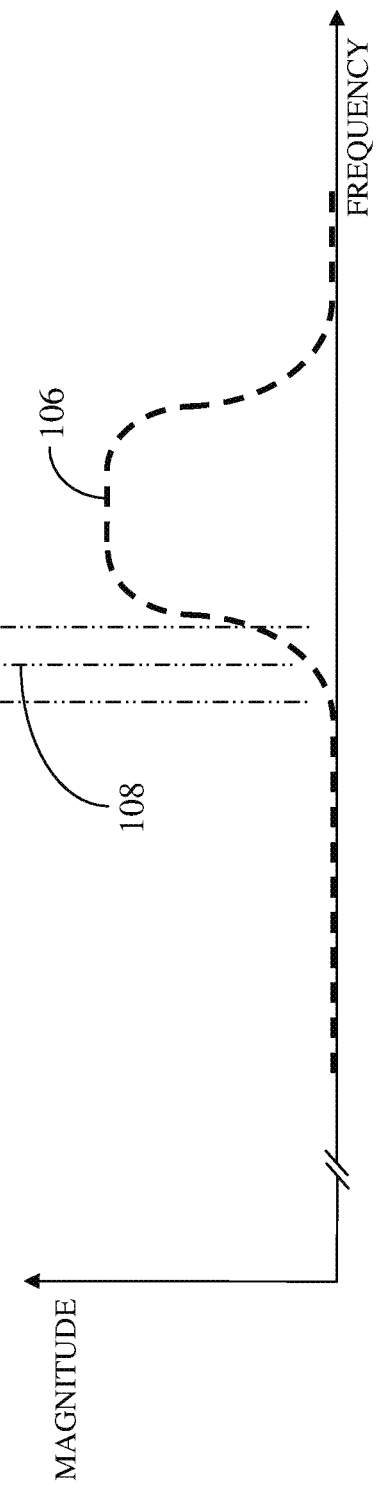
FIG. 10A – Prior Art
FIG. 10B – Prior Art

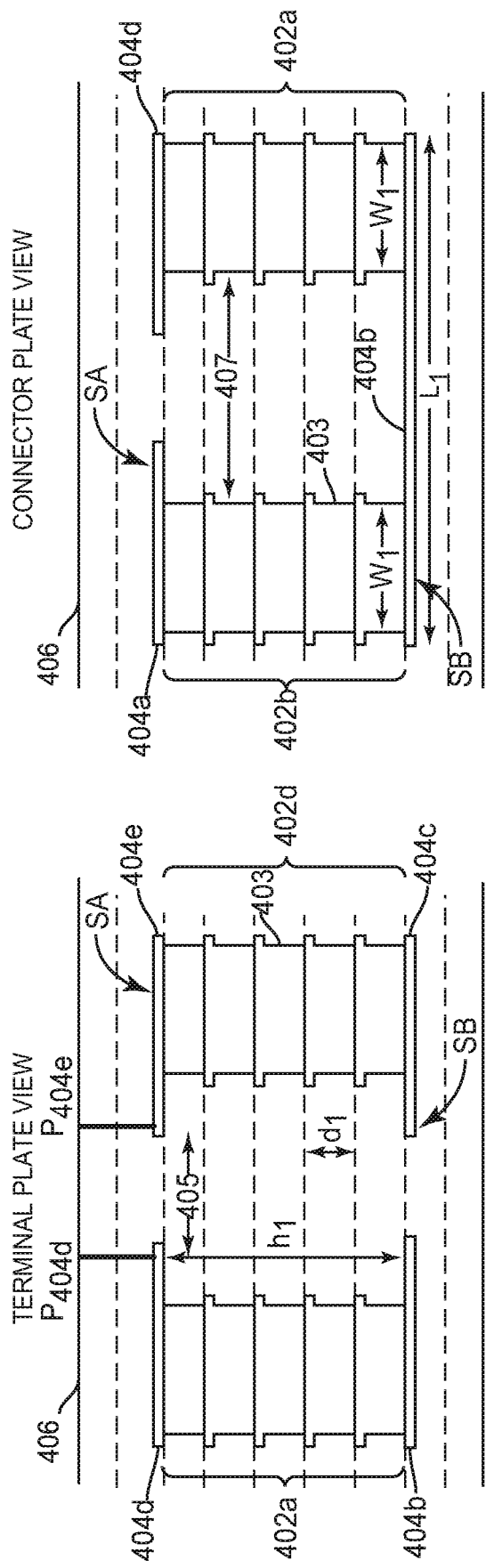
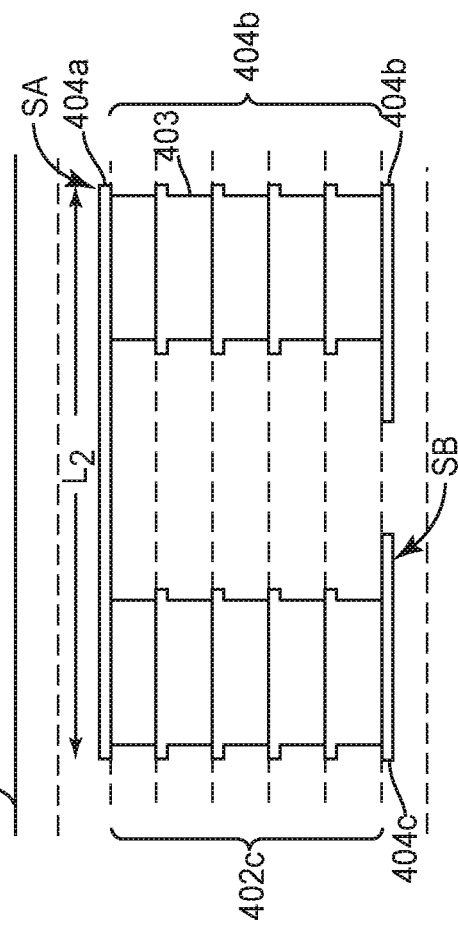
FIG. 44B
FIG. 44C
FIG. 44D

ADVANCED 3D INDUCTOR STRUCTURES WITH CONFINED MAGNETIC FIELD

RELATED APPLICATIONS

The present application is a continuation of U.S. patent application Ser. No. 15/717,525, filed Sep. 27, 2017, now U.S. Pat. No. 10,468,172, which is a divisional of U.S. patent application Ser. No. 14/450,156, filed Aug. 1, 2014, now U.S. Pat. No. 9,899,133.

Application Ser. No. 14/450,156 (now U.S. Pat. No. 9,899,133) claims priority to U.S. Provisional Patent Application No. 61/860,932, filed Aug. 1, 2013; U.S. Provisional Patent Application No. 61/909,028, filed Nov. 26, 2013; U.S. Provisional Patent Application No. 61/938,884, filed Feb. 12, 2014; U.S. Provisional Patent Application No. 61/949,581, filed Mar. 7, 2014; U.S. Provisional Patent Application No. 61/951,844, filed Mar. 12, 2014; U.S. Provisional Patent Application No. 61/982,946, filed Apr. 23, 2014; U.S. Provisional Patent Application No. 61/982,952, filed Apr. 23, 2014; U.S. Provisional Patent Application No. 61/982,971, filed Apr. 23, 2014; U.S. Provisional Patent Application No. 62/008,192, filed Jun. 5, 2014; U.S. Provisional Patent Application No. 62/011,629, filed Jun. 13, 2014; and U.S. Provisional Patent Application No. 62/031,645, filed Jul. 31, 2014, the disclosures of which are hereby incorporated herein by reference in their entirety.

Application Ser. No. 14/450,156 (now U.S. Pat. No. 9,899,133) claims the benefit of and is a Continuation-in-Part of U.S. patent application Ser. No. 14/298,829, filed Jun. 6, 2014, now U.S. Pat. No. 9,455,680, entitled "TUNABLE RF FILTER STRUCTURE FORMED BY A MATRIX OF WEAKLY COUPLED RESONATORS;" U.S. patent application Ser. No. 14/298,830, filed Jun. 6, 2014, now U.S. Pat. No. 9,419,578, entitled "TUNABLE RF FILTER PATHS FOR TUNABLE RF FILTER STRUCTURES;" U.S. patent application Ser. No. 14/298,834, filed Jun. 6, 2014, now U.S. Pat. No. 9,893,710, entitled "HIGH QUALITY FACTOR INTERCONNECT FOR RF CIRCUITS;" U.S. patent application Ser. No. 14/298,872, filed Jun. 6, 2014, now U.S. Pat. No. 9,484,879, entitled "NONLINEAR CAPACITANCE LINEARIZATION;" U.S. patent application Ser. No. 14/298,863, filed Jun. 6, 2014, now U.S. Pat. No. 9,866,197, entitled "TUNABLE RF FILTER BASED RF COMMUNICATIONS SYSTEM;" and U.S. patent application Ser. No. 14/298,852, filed Jun. 6, 2014, now U.S. Pat. No. 9,614,490, entitled "MULTI-BAND INTERFERENCE OPTIMIZATION."

Application Ser. No. 14/450,156 (now U.S. Pat. No. 9,899,133) claims the benefit of and is a Continuation-in-Part of U.S. patent application Ser. No. 14/099,007, filed Dec. 6, 2013, now U.S. Pat. No. 9,196,406; which claims priority to U.S. Provisional Patent Application No. 61/789,693, filed Mar. 15, 2013.

Application Ser. No. 14/450,156 (now U.S. Pat. No. 9,899,133) is related to U.S. patent application Ser. No. 14/449,913, now U.S. Pat. No. 9,628,045, entitled "COOPERATIVE TUNABLE RF FILTERS;" U.S. patent application Ser. No. 14/450,028, now U.S. Pat. No. 9,755,671, entitled "VSWR DETECTOR FOR A TUNABLE RF FILTER STRUCTURE;" U.S. patent application Ser. No. 14/449,764, now U.S. Pat. No. 9,780,756, entitled "CALIBRATION FOR A TUNABLE RF FILTER STRUCTURE;" U.S. patent application Ser. No. 14/450,199, now U.S. Pat. No. 9,705,478, entitled "WEAKLY COUPLED TUNABLE RF RECEIVER ARCHITECTURE;" U.S. patent application Ser. No. 14/450,204, now U.S. Pat. No. 9,825,656, entitled "WEAKLY COUPLED TUNABLE RF TRANSMITTER ARCHITECTURE;" U.S. patent application Ser. No. 14/450,200, now U.S. Pat. No. 9,685,928, entitled "INTERFERENCE REJECTION RF FILTERS;" and U.S. patent application Ser. No. 14/449,594, now U.S. Pat. No. 9,048,836, entitled "BODY BIAS SWITCHING FOR AN RF SWITCH."

All of the applications listed above are hereby incorporated herein by reference in their entireties.

FIELD

Field of the Disclosure

Embodiments of the present disclosure relate to radio frequency (RF) communications systems, which may include RF front-end circuitry, RF transceiver circuitry, RF amplifiers, direct current (DC)-DC converters, RF filters, RF antennas, RF switches, RF combiners, RF splitters, the like, or any combination thereof.

Background

As wireless communications technologies evolve, wireless communications systems become increasingly sophisticated. As such, wireless communications protocols continue to expand and change to take advantage of the technological evolution. As a result, to maximize flexibility, many wireless communications devices must be capable of supporting any number of wireless communications protocols, each of which may have certain performance requirements, such as specific out-of-band emissions requirements, linearity requirements, or the like. Further, portable wireless communications devices are typically battery powered and need to be relatively small, and have low cost. As such, to minimize size, cost, and power consumption, RF circuitry in such a device needs to be as simple, small, flexible, and efficient as is practical. Thus, there is a need for RF circuitry in a communications device that is low cost, small, simple, flexible, and efficient.

SUMMARY

Embodiments of an apparatus that includes a substrate and an inductor residing in the substrate are disclosed. In one embodiment, the inductor is formed as a conductive path that extends from a first terminal to a second terminal. The conductive path has a shape corresponding to a two-dimensional (2D) lobe laid over a three-dimensional (3D) volume. Since the shape of the conductive path corresponds to the 2D lobe laid over a 3D volume, the magnetic field generated by the inductor has magnetic field lines that are predominately destructive outside the inductor and magnetic field lines that are predominately constructive inside the inductor. In this manner, the inductor can maintain a high quality (Q) factor while being placed close to other components.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS

The accompanying drawings incorporated in and forming a part of this specification illustrate several aspects of the disclosure, and together with the description serve to explain the principles of the disclosure.

FIGS. 6A and 6B are graphs illustrating filtering characteristics of the first tunable RF filter path and the second tunable RF filter path, respectively, illustrated in FIG. 4 according to an alternate embodiment of the first tunable RF filter path and the second tunable RF filter path, respectively.

FIGS. 10A and 10B are graphs illustrating filtering characteristics of a first traditional RF duplexer and a second traditional RF duplexer, respectively, illustrated in FIG. 3 according to the prior art.

FIGS. 44A-44F illustrate embodiments of an inductor similar to the inductor shown in FIG. 40 that is implemented using vias and metallic plates.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

RF communications circuitry, which includes a first RF filter structure, is disclosed according to a first embodiment of the present disclosure. The first RF filter structure includes a first tunable RF filter path and a second tunable RF filter path. The first tunable RF filter path includes a pair of weakly coupled resonators. Additionally, a first filter parameter of the first tunable RF filter path is tuned based on a first filter control signal. A first filter parameter of the second tunable RF filter path is tuned based on a second filter control signal.

In one embodiment of the first RF filter structure, the first tunable RF filter path is directly coupled between a first common connection node and a first connection node. The second tunable RF filter path is directly coupled between a second connection node and the first common connection node.

In one embodiment of the RF communications system, the first tunable RF filter path and the second tunable RF filter path do not significantly load one another at frequencies of interest. As such, by directly coupling the first tunable RF filter path and the second tunable RF filter path to the first common connection node; front-end RF switching elements may be avoided, thereby reducing cost, size, and non-linearity; and increasing efficiency and flexibility of the RF communications system. In one embodiment of the RF communications system, the first common connection node is coupled to an antenna.

Embodiments of the RF communications system include frequency division duplex (FDD) applications, time division duplex (TDD) applications, carrier-aggregation (CA) applications, multiple antenna applications, MIMO applications, hybrid applications, applications supporting multiple communications bands, the like, or any combination thereof.

Figure 1:
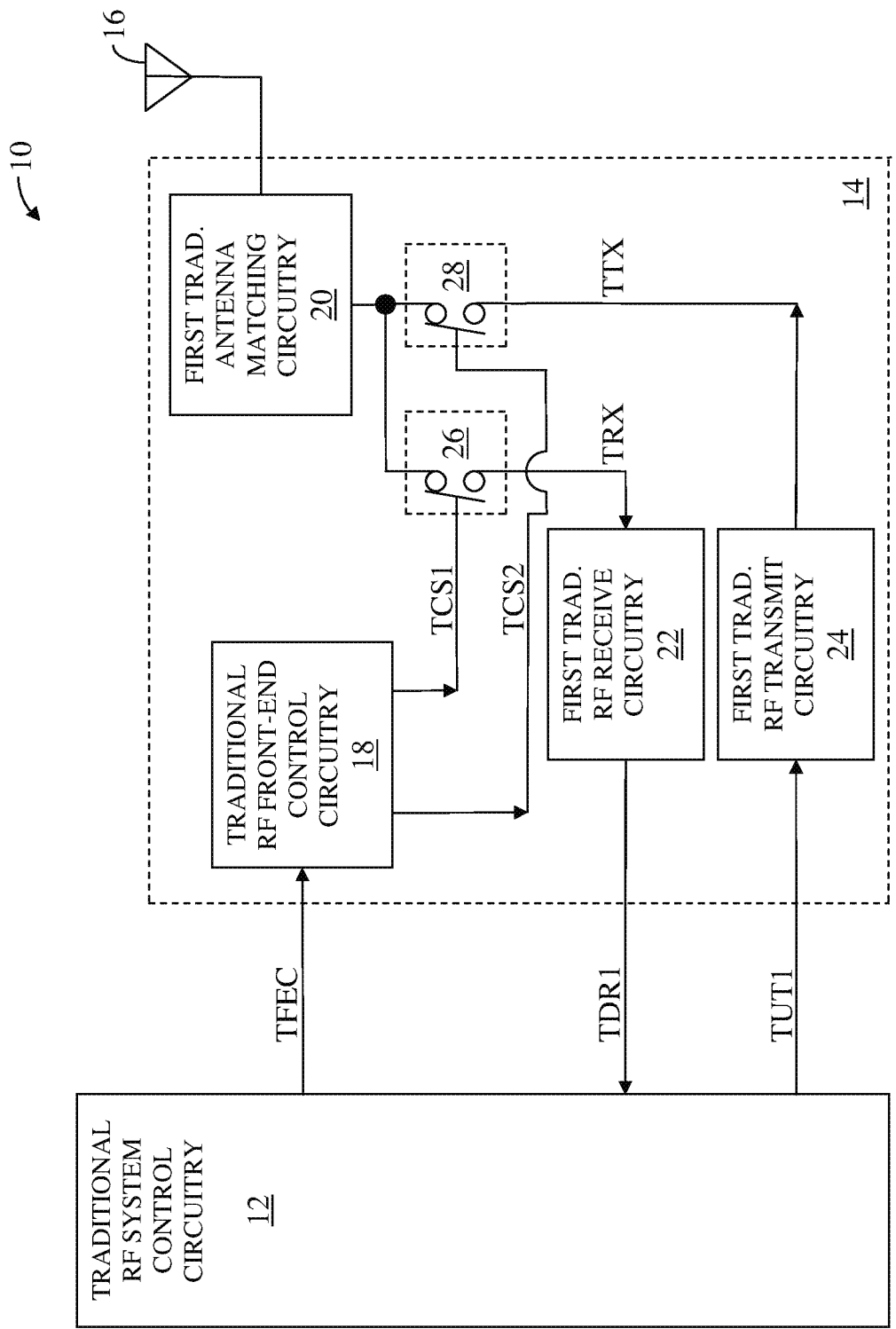
FIG. 1 shows traditional communications circuitry according to the prior art.

FIG. 1 shows traditional communications circuitry 10 according to the prior art. The traditional communications circuitry 10 illustrated in FIG. 1 is a time-division duplex (TDD) system, which is capable of transmitting and receiving RF signals, but not simultaneously. Such a system may also be called a half-duplex system. Additionally, the traditional communications circuitry 10 may be used as a simplex system, which is a system that only transmits RF signals or only receives RF signals. Traditional communications systems often use fixed frequency filters. As a result, to cover multiple communications bands, switching elements are needed to select between different signal paths.

The traditional communications circuitry 10 includes traditional RF system control circuitry 12, traditional RF front-end circuitry 14, and a first RF antenna 16. The traditional RF front-end circuitry 14 includes traditional RF front-end control circuitry 18, first traditional antenna matching circuitry 20, first traditional RF receive circuitry 22, first traditional RF transmit circuitry 24, a first traditional RF switch 26, and a second traditional RF switch 28. The first traditional RF switch 26 is coupled between the first traditional antenna matching circuitry 20 and the first traditional RF receive circuitry 22. The second traditional RF switch 28 is coupled between the first traditional antenna matching circuitry 20 and the first traditional RF transmit circuitry 24. The first RF antenna 16 is coupled to the first traditional antenna matching circuitry 20. The first traditional antenna matching circuitry 20 provides at least partial impedance matching between the first RF antenna 16 and either the first traditional RF receive circuitry 22 or the first traditional RF transmit circuitry 24.

The traditional RF system control circuitry 12 provides the necessary control functions needed to facilitate RF communications between the traditional communications circuitry 10 and other RF devices. The traditional RF system control circuitry 12 processes baseband signals needed for the RF communications. As such, the traditional RF system control circuitry 12 provides a first traditional upstream transmit signal TUT1 to the first traditional RF transmit circuitry 24. The first traditional upstream transmit signal TUT1 may be a baseband transmit signal, an intermediate frequency (IF) transmit signal, or an RF transmit signal. Conversely, the traditional RF system control circuitry 12 receives a first traditional downstream receive signal TDR1 from the first traditional RF receive circuitry 22. The first traditional downstream receive signal TDR1 may be a baseband receive signal, an IF receive signal, or an RF receive signal.

The first traditional RF transmit circuitry 24 may include up-conversion circuitry, amplification circuitry, power supply circuitry, filtering circuitry, switching circuitry, combining circuitry, splitting circuitry, dividing circuitry, clocking circuitry, the like, or any combination thereof. Similarly, the first traditional RF receive circuitry 22 may include down-conversion circuitry, amplification circuitry, power supply circuitry, filtering circuitry, switching circuitry, combining circuitry, splitting circuitry, dividing circuitry, clocking circuitry, the like, or any combination thereof.

The traditional RF system control circuitry 12 provides a traditional front-end control signal TFEC to the traditional RF front-end control circuitry 18. The traditional RF front-end control circuitry 18 provides a first traditional switch control signal TCS1 and a second traditional switch control signal TCS2 to the first traditional RF switch 26 and the second traditional RF switch 28, respectively, based on the traditional front-end control signal TFEC. As such, the traditional RF system control circuitry 12 controls the first traditional RF switch 26 and the second traditional RF switch 28 via the traditional front-end control signal TFEC. The first traditional RF switch 26 is in one of an ON state and an OFF state based on the first traditional switch control signal TCS1. The second traditional RF switch 28 is in one of an ON state and an OFF state based on the second traditional switch control signal TCS2.

Half-duplex operation of the traditional communications circuitry 10 is accomplished using the first traditional RF switch 26 and the second traditional RF switch 28. When the traditional communications circuitry 10 is transmitting RF signals via the first RF antenna 16, the first traditional RF switch 26 is in the OFF state and the second traditional RF switch 28 is in the ON state. As such, the first traditional antenna matching circuitry 20 is electrically isolated from the first traditional RF receive circuitry 22 and the first traditional antenna matching circuitry 20 is electrically coupled to the first traditional RF transmit circuitry 24. In this regard, the traditional RF system control circuitry 12 provides the first traditional upstream transmit signal TUT1 to the first traditional RF transmit circuitry 24, which provides a traditional transmit signal TTX to the first RF antenna 16 via the second traditional RF switch 28 and the first traditional antenna matching circuitry 20 based on the first traditional upstream transmit signal TUT1.

When the traditional communications circuitry 10 is receiving RF signals via the first RF antenna 16, the first traditional RF switch 26 is in the ON state and the second traditional RF switch 28 is in the OFF state. As such, the first traditional antenna matching circuitry 20 is isolated from the first traditional RF transmit circuitry 24 and the first traditional antenna matching circuitry 20 is electrically coupled to the first traditional RF receive circuitry 22. In this regard, the first traditional antenna matching circuitry 20 receives the RF signals from the first RF antenna 16 and forwards the RF signals via the first traditional RF switch 26 to the first traditional RF receive circuitry 22. The first traditional RF switch 26 provides a traditional receive signal TRX to the first traditional RF receive circuitry 22, which provides a first traditional downstream receive signal TDR1 to the traditional RF system control circuitry 12 based on the traditional receive signal TRX.

Since the traditional communications circuitry 10 illustrated in FIG. 1 is a half-duplex system, during operation, the first traditional RF switch 26 and the second traditional RF switch 28 are not simultaneously in the ON state. Therefore, the first traditional RF receive circuitry 22 and the first traditional RF transmit circuitry 24 are isolated from one another. As such, the first traditional RF receive circuitry 22 and the first traditional RF transmit circuitry 24 are prevented from interfering with one another.

Figure 2:
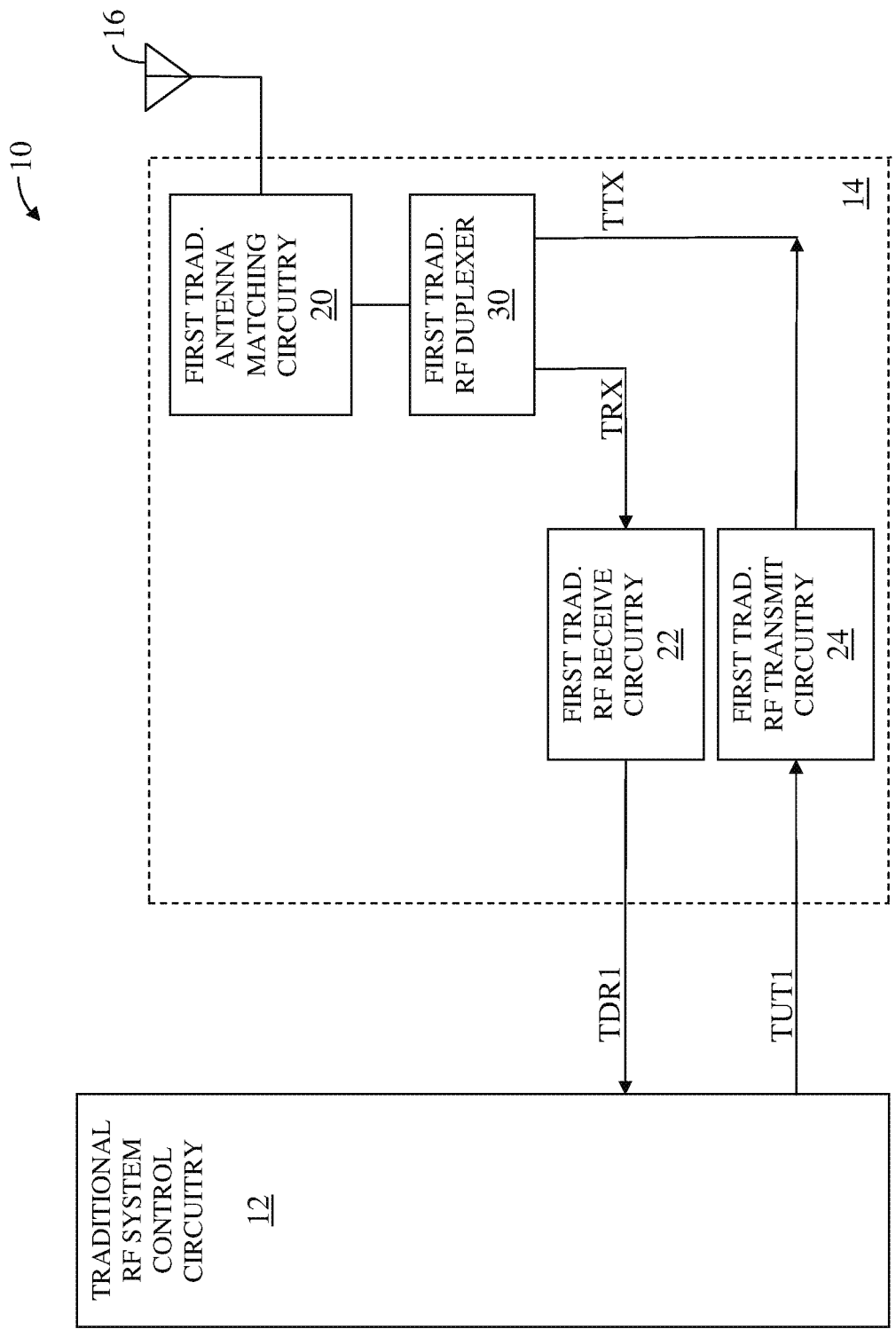
FIG. 2 shows the traditional communications circuitry according to the prior art.

FIG. 2 shows the traditional communications circuitry 10 according to the prior art. The traditional communications circuitry 10 illustrated in FIG. 2 is similar to the traditional communications circuitry 10 illustrated in FIG. 1, except in the traditional communications circuitry 10 illustrated in FIG. 2, the traditional RF front-end control circuitry 18, the first traditional RF switch 26, and the second traditional RF switch 28 are omitted, and the traditional RF front-end circuitry 14 further includes a first traditional RF duplexer 30. The first traditional RF duplexer 30 is coupled between the first traditional antenna matching circuitry 20 and the first traditional RF receive circuitry 22, and is further coupled between the first traditional antenna matching circuitry 20 and the first traditional RF transmit circuitry 24.

The traditional communications circuitry 10 illustrated in FIG. 2 may be used as a TDD system or a simplex system. However, the traditional communications circuitry 10 illustrated in FIG. 2 may also be used as a frequency-division duplex (FDD) system, which is capable of transmitting and receiving RF signals simultaneously. Such a system may also be called a full-duplex system.

When the traditional communications circuitry 10 is transmitting RF signals via the first RF antenna 16, the traditional RF system control circuitry 12 provides the first traditional upstream transmit signal TUT1 to the first traditional RF transmit circuitry 24, which provides the traditional transmit signal TTX to the first RF antenna 16 via first traditional RF duplexer 30 based on the first traditional upstream transmit signal TUT1.

When the traditional communications circuitry 10 is receiving RF signals via the first RF antenna 16, the first traditional antenna matching circuitry 20 receives the RF signals from the first RF antenna 16 and forwards the RF signals via the first traditional RF duplexer 30 to the first traditional RF receive circuitry 22. As such, the first traditional RF duplexer 30 provides the traditional receive signal TRX to the first traditional RF receive circuitry 22, which provides the first traditional downstream receive signal TDR1 to the traditional RF system control circuitry 12 based on the traditional receive signal TRX.

The first traditional RF duplexer 30 provides filtering, such that the first traditional RF receive circuitry 22 and the first traditional RF transmit circuitry 24 are substantially isolated from one another. As such, the first traditional RF receive circuitry 22 and the first traditional RF transmit circuitry 24 are prevented from interfering with one another. Traditional FDD systems using duplexers with high rejection ratios have a fixed frequency transfer. Covering multiple communications bands requires multiple duplexers and switches to route RF signals through appropriate signal paths.

Figure 3:
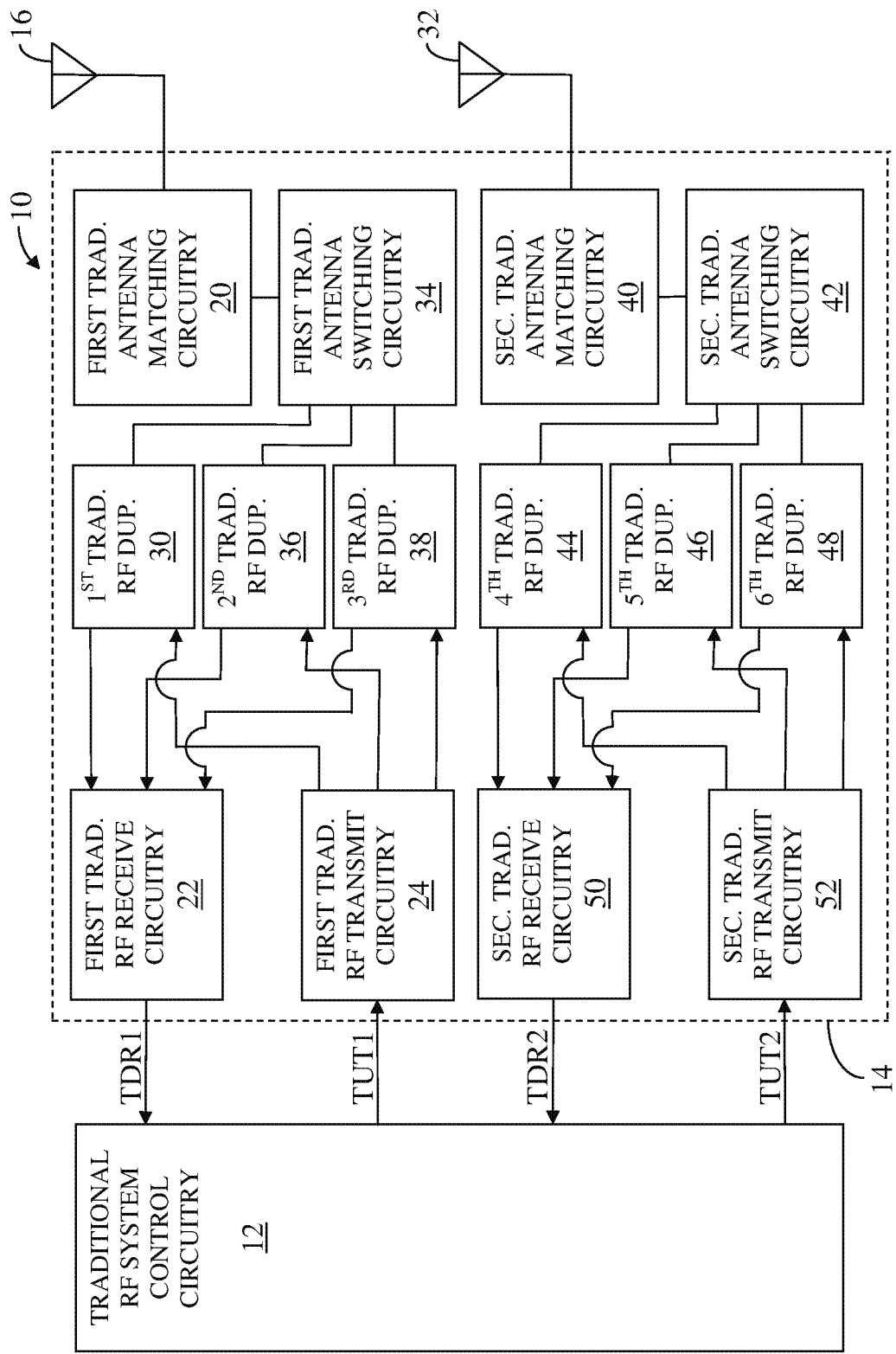
FIG. 3 shows the traditional communications circuitry according to the prior art.

FIG. 3 shows the traditional communications circuitry 10 according to the prior art. The traditional communications circuitry 10 illustrated in FIG. 3 is a carrier aggregation (CA) based system, which is capable of transmitting or receiving multiple simultaneous transmit signals or multiple simultaneous receive signals, respectively, or both. Each of the simultaneous transmit signals is in a frequency band that is different from each frequency band of a balance of the simultaneous transmit signals. Similarly, each of the simultaneous receive signals is in a frequency band that is different from each frequency band of a balance of the simultaneous receive signals. The traditional communications circuitry 10 may operate as a simplex system, a half-duplex system, or a full-duplex system.

The traditional communications circuitry 10 includes the traditional RF system control circuitry 12, the traditional RF front-end circuitry 14, the first RF antenna 16, and a second RF antenna 32. The traditional RF front-end circuitry 14 includes the first traditional antenna matching circuitry 20, the first traditional RF receive circuitry 22, the first traditional RF transmit circuitry 24, the first traditional RF duplexer 30, first traditional antenna switching circuitry 34, a second traditional RF duplexer 36, a third traditional RF duplexer 38, second traditional antenna matching circuitry 40, second traditional antenna switching circuitry 42, a fourth traditional RF duplexer 44, a fifth traditional RF duplexer 46, a sixth traditional RF duplexer 48, second traditional RF receive circuitry 50, and second traditional RF transmit circuitry 52. Traditional CA systems use fixed frequency filters and diplexers, triplexers, or both to combine signal paths, which increases complexity. Alternatively, additional switch paths may be used, but may degrade performance.

The first traditional antenna matching circuitry 20 is coupled between the first RF antenna 16 and the first traditional antenna switching circuitry 34. The second traditional antenna matching circuitry 40 is coupled between the second RF antenna 32 and the second traditional antenna switching circuitry 42. The first traditional RF duplexer 30 is coupled between the first traditional antenna switching circuitry 34 and the first traditional RF receive circuitry 22, and is further coupled between the first traditional antenna switching circuitry 34 and the first traditional RF transmit circuitry 24. The second traditional RF duplexer 36 is coupled between the first traditional antenna switching circuitry 34 and the first traditional RF receive circuitry 22, and is further coupled between the first traditional antenna switching circuitry 34 and the first traditional RF transmit circuitry 24. The third traditional RF duplexer 38 is coupled between the first traditional antenna switching circuitry 34 and the first traditional RF receive circuitry 22, and is further coupled between the first traditional antenna switching circuitry 34 and the first traditional RF transmit circuitry 24.

The fourth traditional RF duplexer 44 is coupled between the second traditional antenna switching circuitry 42 and the second traditional RF receive circuitry 50, and is further coupled between the second traditional antenna switching circuitry 42 and the second traditional RF transmit circuitry 52. The fifth traditional RF duplexer 46 is coupled between the second traditional antenna switching circuitry 42 and the second traditional RF receive circuitry 50, and is further coupled between the second traditional antenna switching circuitry 42 and the second traditional RF transmit circuitry 52. The sixth traditional RF duplexer 48 is coupled between the second traditional antenna switching circuitry 42 and the second traditional RF receive circuitry 50, and is further coupled between the second traditional antenna switching circuitry 42 and the second traditional RF transmit circuitry 52.

The first traditional RF duplexer 30 is associated with a first aggregated receive band, a first aggregated transmit band, or both. The second traditional RF duplexer 36 is associated with a second aggregated receive band, a second aggregated transmit band, or both. The third traditional RF duplexer 38 is associated with a third aggregated receive band, a third aggregated transmit band, or both. The fourth traditional RF duplexer 44 is associated with a fourth aggregated receive band, a fourth aggregated transmit band, or both. The fifth traditional RF duplexer 46 is associated with a fifth aggregated receive band, a fifth aggregated transmit band, or both. The sixth traditional RF duplexer 48 is associated with a sixth aggregated receive band, a sixth aggregated transmit band, or both.

The first traditional antenna switching circuitry 34 couples a selected one of the first traditional RF duplexer 30, the second traditional RF duplexer 36, and the third traditional RF duplexer 38 to the first traditional antenna matching circuitry 20. Therefore, the first RF antenna 16 is associated with a selected one of the first aggregated receive band, the second aggregated receive band, and the third aggregated receive band; with a selected one of the first aggregated transmit band, the second aggregated transmit band, and the third aggregated transmit band; or both.

Similarly, the second traditional antenna switching circuitry 42 couples a selected one of the fourth traditional RF duplexer 44, the fifth traditional RF duplexer 46, and the sixth traditional RF duplexer 48 to the second traditional antenna matching circuitry 40. Therefore, the second RF antenna 32 is associated with a selected one of the fourth aggregated receive band, the fifth aggregated receive band, and the sixth aggregated receive band; with a selected one of the fourth aggregated transmit band, the fifth aggregated transmit band, and the sixth aggregated transmit band; or both.

During transmit CA, the traditional RF system control circuitry 12 provides the first traditional upstream transmit signal TUT1 to the first traditional RF transmit circuitry 24, which forwards the first traditional upstream transmit signal TUT1 to the first RF antenna 16 for transmission via the selected one of the first traditional RF duplexer 30, the second traditional RF duplexer 36, and the third traditional RF duplexer 38; via the first traditional antenna switching circuitry 34; and via the first traditional antenna matching circuitry 20.

Additionally, during transmit CA, the traditional RF system control circuitry 12 provides a second traditional upstream transmit signal TUT2 to the second traditional RF transmit circuitry 52, which forwards the second traditional upstream transmit signal TUT2 to the second RF antenna 32 for transmission via the selected one of the fourth traditional RF duplexer 44, the fifth traditional RF duplexer 46, and the sixth traditional RF duplexer 48; via the second traditional antenna switching circuitry 42; and via the second traditional antenna matching circuitry 40.

During receive CA, the first RF antenna 16 forwards a received RF signal to the first traditional RF receive circuitry 22 via the first traditional antenna matching circuitry 20, the first traditional antenna switching circuitry 34, and the selected one of the first traditional RF duplexer 30, the second traditional RF duplexer 36, and the third traditional RF duplexer 38. The first traditional RF receive circuitry 22 provides the first traditional downstream receive signal TDR1 to the traditional RF system control circuitry 12 based on the received RF signal.

Additionally, during receive CA, the second RF antenna 32 forwards a received RF signal to the second traditional RF receive circuitry 50 via the second traditional antenna matching circuitry 40, the second traditional antenna switching circuitry 42, and the selected one of the fourth traditional RF duplexer 44, the fifth traditional RF duplexer 46, and the sixth traditional RF duplexer 48. The second traditional RF receive circuitry 50 provides a second traditional downstream receive signal TDR2 to the traditional RF system control circuitry 12 based on the received RF signal.

Since only the selected one of the first traditional RF duplexer 30, the second traditional RF duplexer 36, and the third traditional RF duplexer 38 is coupled to the first traditional antenna matching circuitry 20; the first traditional antenna switching circuitry 34 isolates each of the first traditional RF duplexer 30, the second traditional RF duplexer 36, and the third traditional RF duplexer 38 from one another; and prevents each of the first traditional RF duplexer 30, the second traditional RF duplexer 36, and the third traditional RF duplexer 38 from interfering with one another.

Similarly, since only the selected one of the fourth traditional RF duplexer 44, the fifth traditional RF duplexer 46, and the sixth traditional RF duplexer 48 is coupled to the second traditional antenna matching circuitry 40; the second traditional antenna matching circuitry 40 isolates each of the fourth traditional RF duplexer 44, the fifth traditional RF duplexer 46, and the sixth traditional RF duplexer 48 from one another; and prevents each of the fourth traditional RF duplexer 44, the fifth traditional RF duplexer 46, and the sixth traditional RF duplexer 48 from interfering with one another.

Figure 4:
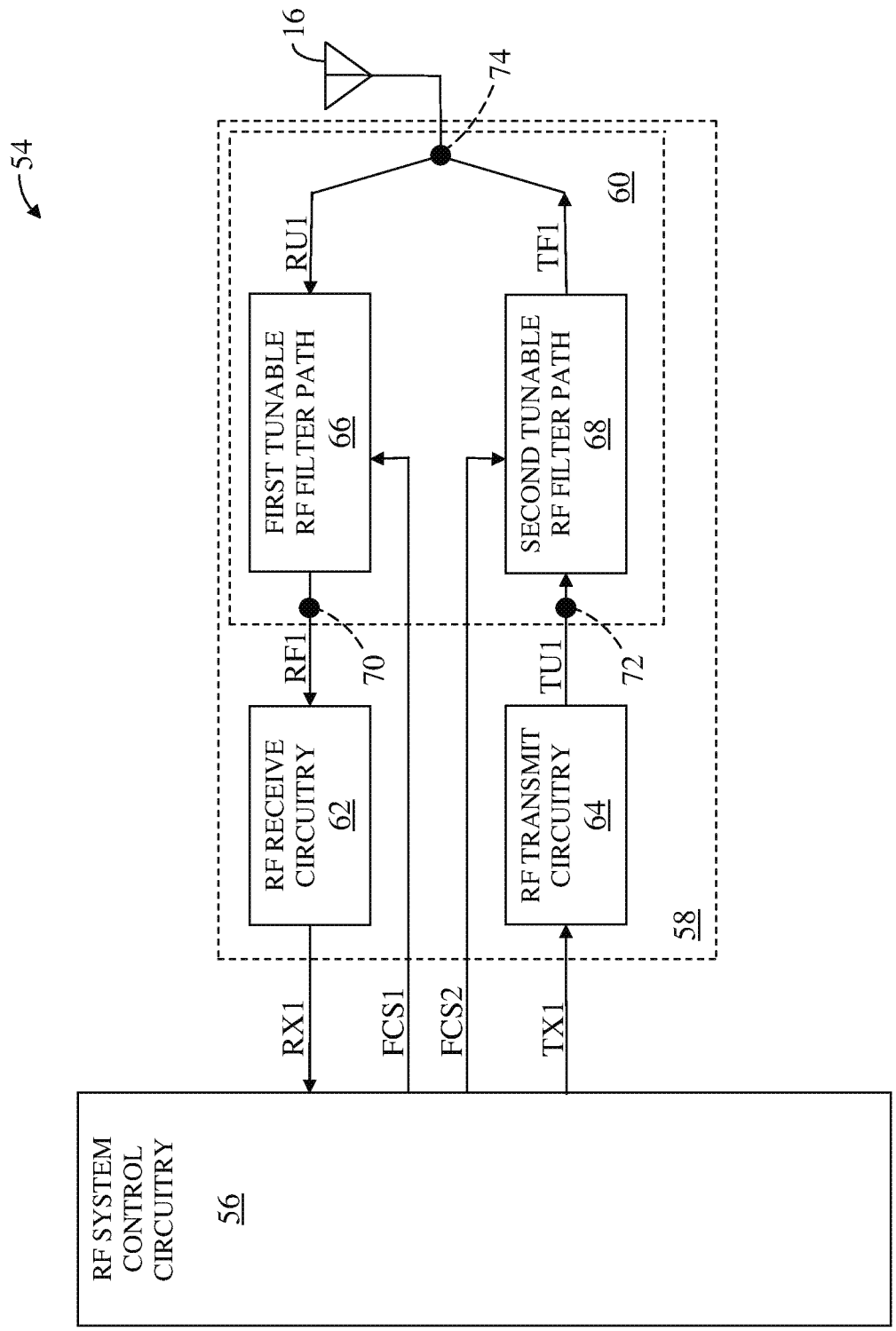
FIG. 4 shows RF communications circuitry according to one embodiment of the RF communications circuitry.
Figure 21:
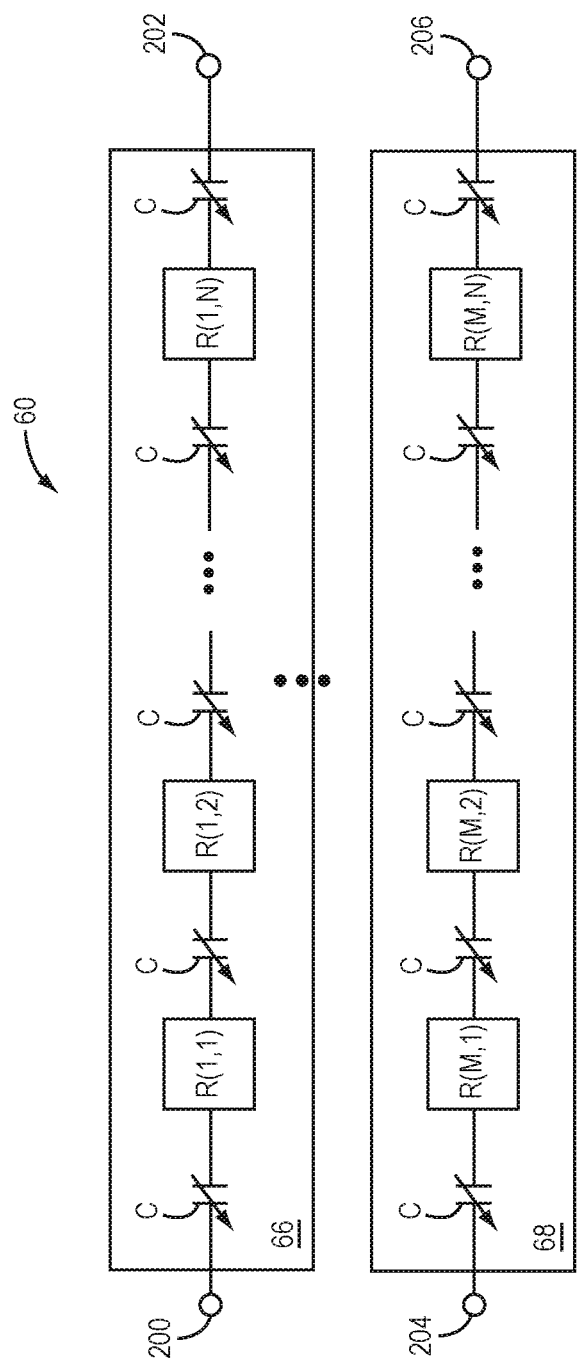
FIG. 21 illustrates one embodiment of a tunable radio frequency (RF) filter structure that defines multiple tunable RF filtering paths that are independent of each other.
Figure 22:
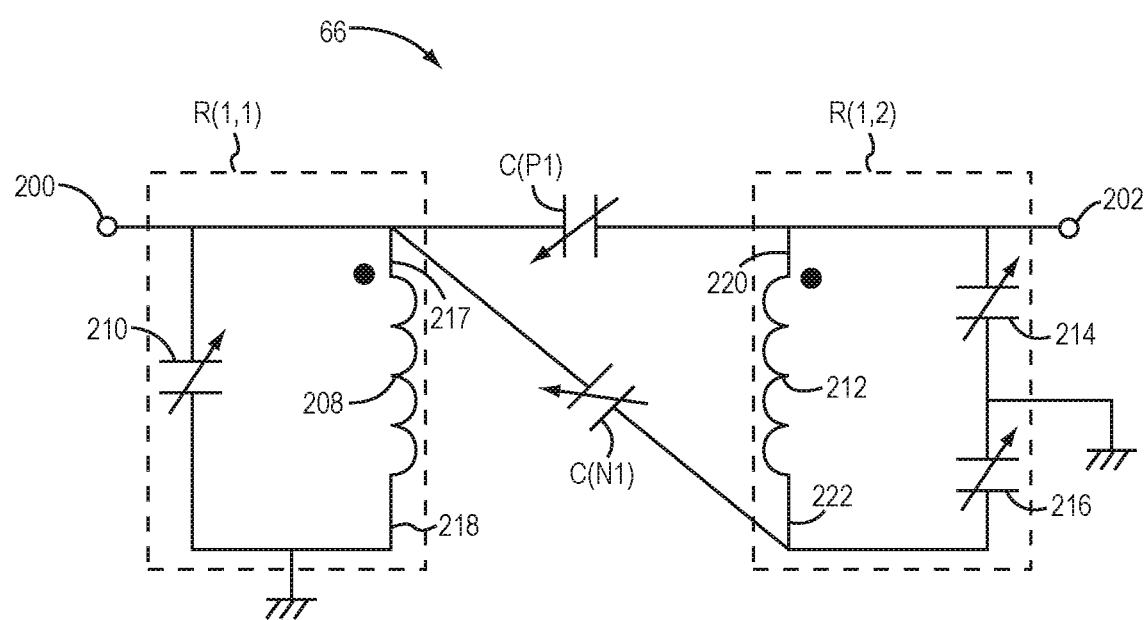
FIG. 22 illustrates one embodiment of a tunable RF filter path shown in FIG. 21 having cross-coupling capacitors arranged in a V-bridge structure.

FIG. 4 shows RF communications circuitry 54 according to one embodiment of the RF communications circuitry 54. The RF communications circuitry 54 includes RF system control circuitry 56, RF front-end circuitry 58, and the first RF antenna 16. The RF front-end circuitry 58 includes a first RF filter structure 60, RF receive circuitry 62, and RF transmit circuitry 64. The first RF filter structure 60 includes a first tunable RF filter path 66 and a second tunable RF filter path 68. Additionally, the first RF filter structure 60 has a first connection node 70, a second connection node 72, and a first common connection node 74. In one embodiment of the RF system control circuitry 56, the RF system control circuitry 56 is an RF transceiver. In one embodiment of the first tunable RF filter path 66, the first tunable RF filter path 66 includes a pair of weakly coupled resonators R(1,1), R(1,2) (FIG. 22). As such, in one embodiment of the first RF filter structure 60, the RF filter structure 60 includes the pair of weakly coupled resonators R(1,1), R(1,2) (FIG. 21).

In alternate embodiments of the first RF filter structure 60, any or all of the first connection node 70, the second connection node 72, and the first common connection node 74 are external to the first RF filter structure 60. In one embodiment of the first tunable RF filter path 66, the first tunable RF filter path 66 includes a first pair (not shown) of weakly coupled resonators. In one embodiment of the second tunable RF filter path 68, the second tunable RF filter path 68 includes a second pair (not shown) of weakly coupled resonators.

In one embodiment of the first RF filter structure 60, the first tunable RF filter path 66 is directly coupled between the first common connection node 74 and the first connection node 70, the second tunable RF filter path 68 is directly coupled between the second connection node 72 and the first common connection node 74, and the first RF antenna 16 is directly coupled to the first common connection node 74. In another embodiment of the RF communications circuitry 54, the first RF antenna 16 is omitted. Additionally, the RF receive circuitry 62 is coupled between the first connection node 70 and the RF system control circuitry 56, and the RF transmit circuitry 64 is coupled between the second connection node 72 and the RF system control circuitry 56.

In one embodiment of the RF communications circuitry 54, the first tunable RF filter path 66 is a first RF receive filter, such that the first RF antenna 16 forwards a received RF signal via the first common connection node 74 to provide a first upstream RF receive signal RU1 to the first tunable RF filter path 66, which receives and filters the first upstream RF receive signal RU1 to provide a first filtered RF receive signal RF1 to the RF receive circuitry 62. The RF receive circuitry 62 may include down-conversion circuitry, amplification circuitry, power supply circuitry, filtering circuitry, switching circuitry, combining circuitry, splitting circuitry, dividing circuitry, clocking circuitry, the like, or any combination thereof. The RF receive circuitry 62 processes the first filtered RF receive signal RF1 to provide a first receive signal RX1 to the RF system control circuitry 56.

In one embodiment of the RF communications circuitry 54, the second tunable RF filter path 68 is a first RF transmit filter, such that the RF system control circuitry 56 provides a first transmit signal TX1 to the RF transmit circuitry 64, which processes the first transmit signal TX1 to provide a first upstream RF transmit signal TU1 to the second tunable RF filter path 68. The RF transmit circuitry 64 may include up-conversion circuitry, amplification circuitry, power supply circuitry, filtering circuitry, switching circuitry, combining circuitry, splitting circuitry, dividing circuitry, clocking circuitry, the like, or any combination thereof. The second tunable RF filter path 68 receives and filters the first upstream RF transmit signal TU1 to provide a first filtered RF transmit signal TF1, which is transmitted via the first common connection node 74 by the first RF antenna 16.

The RF system control circuitry 56 provides a first filter control signal FCS1 to the first tunable RF filter path 66 and provides a second filter control signal FCS2 to the second tunable RF filter path 68. As such, in one embodiment of the RF communications circuitry 54, the RF system control circuitry 56 tunes a first filter parameter of the first tunable RF filter path 66 using the first filter control signal FCS1. Additionally, the RF system control circuitry 56 tunes a first filter parameter of the second tunable RF filter path 68 using the second filter control signal FCS2.

In one embodiment of the RF communications circuitry 54, the first tunable RF filter path 66 and the second tunable RF filter path 68 do not significantly load one another at frequencies of interest. As such, by directly coupling the first tunable RF filter path 66 and the second tunable RF filter path 68 to the first common connection node 74; front-end RF switching elements may be avoided, thereby reducing cost, size, and non-linearity; and increasing efficiency and flexibility of the RF communications circuitry 54. Since tunable RF filters can support multiple communications bands using a single signal path, they can simplify front-end architectures by eliminating switching and duplexing components.

In one embodiment of the RF communications circuitry 54, the RF communications circuitry 54 is used as an FDD communications system, such that the first upstream RF receive signal RU1 and the first filtered RF transmit signal TF1 are full-duplex signals. In an alternate embodiments of the RF communications circuitry 54, the RF communications circuitry 54 is used as a TDD communications system, such that the first upstream RF receive signal RU1 and the first filtered RF transmit signal TF1 are half-duplex signals. In additional embodiments of the RF communications circuitry 54, the RF communications circuitry 54 is used as a simplex communications system, such that the first upstream RF receive signal RU1 is a simplex signal and the first filtered RF transmit signal TF1 is not present. In other embodiments of the RF communications circuitry 54, the RF communications circuitry 54 is used as a simplex communications system, such that the first upstream RF receive signal RU1 is not present and the first filtered RF transmit signal TF1 is a simplex signal.

Figure 5:
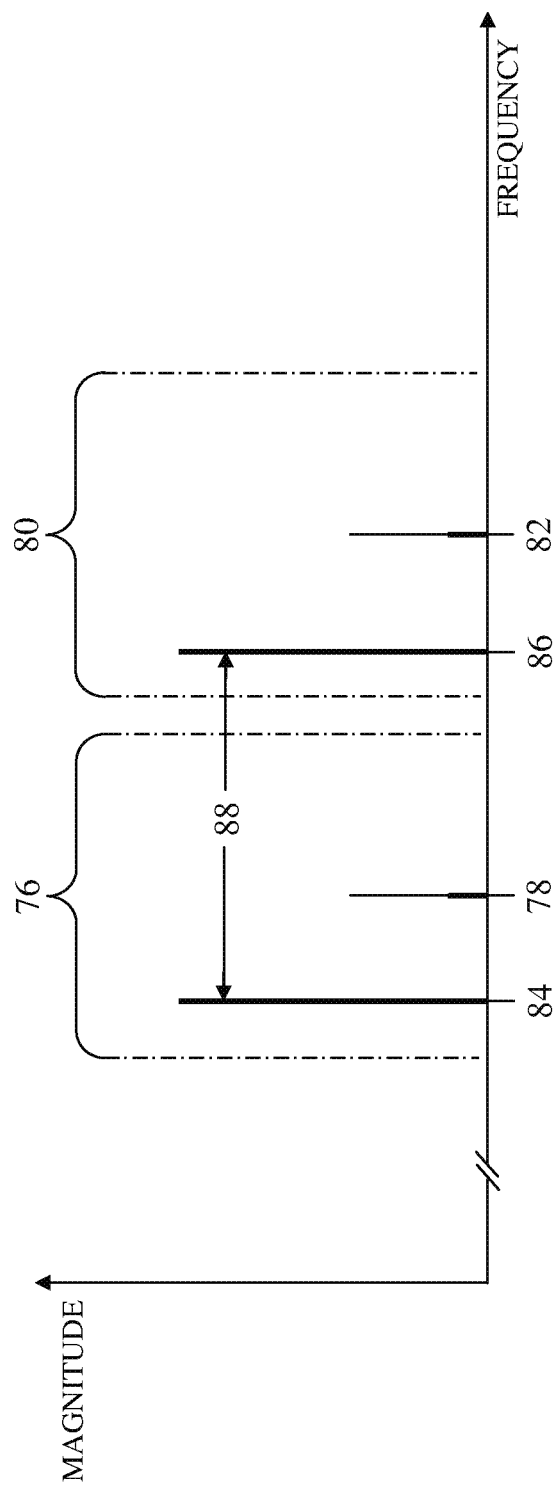
FIG. 5 is a graph illustrating filtering characteristics of a first tunable RF filter path and a second tunable RF filter path illustrated in FIG. 4 according to one embodiment of the first tunable RF filter path and the second tunable RF filter path.

FIG. 5 is a graph illustrating filtering characteristics of the first tunable RF filter path 66 and the second tunable RF filter path 68 illustrated in FIG. 4 according to one embodiment of the first tunable RF filter path 66 and the second tunable RF filter path 68. The first tunable RF filter path 66 is a first RF bandpass filter, which functions as the first RF receive filter, and the second tunable RF filter path 68 is a second RF bandpass filter, which functions as the first RF transmit filter. A bandwidth 76 of the first RF bandpass filter, a center frequency 78 of the first RF bandpass filter, a bandwidth 80 of the second RF bandpass filter, a center frequency 82 of the second RF bandpass filter, a frequency 84 of the first upstream RF receive signal RU1 (FIG. 4), and a frequency 86 of the first filtered RF transmit signal TF1 (FIG. 4) are shown. Operation of the first RF bandpass filter and the second RF bandpass filter is such that the first RF bandpass filter and the second RF bandpass filter do not significantly interfere with one another. In this regard, the bandwidth 76 of the first RF bandpass filter does not overlap the bandwidth 80 of the second RF bandpass filter.

In one embodiment of the first RF receive filter and the first RF transmit filter, the first RF receive filter and the first RF transmit filter in combination function as an RF duplexer. As such, a duplex frequency 88 of the RF duplexer is about equal to a difference between the frequency 84 of the first upstream RF receive signal RU1 (FIG. 4) and the frequency 86 of the first filtered RF transmit signal TF1 (FIG. 4).

In one embodiment of the first tunable RF filter path 66, the first filter parameter of the first tunable RF filter path 66 is tunable based on the first filter control signal FCS1. In an alternate embodiment of the first tunable RF filter path 66, both the first filter parameter of the first tunable RF filter path 66 and a second filter parameter of the first tunable RF filter path 66 are tunable based on the first filter control signal FCS1. Similarly, in one embodiment of the second tunable RF filter path 68, the first filter parameter of the second tunable RF filter path 68 is tunable based on the second filter control signal FCS2. In an alternate embodiment of the second tunable RF filter path 68, both the first filter parameter of the second tunable RF filter path 68 and a second filter parameter of the second tunable RF filter path 68 are tunable based on the second filter control signal FCS2.

The first filter parameter of the first tunable RF filter path 66 is the center frequency 78 of the first RF bandpass filter. The second filter parameter of the first tunable RF filter path 66 is the bandwidth 76 of the first RF bandpass filter. The first filter parameter of the second tunable RF filter path 68 is the center frequency 82 of the second RF bandpass filter. The second filter parameter of the second tunable RF filter path 68 is the bandwidth 80 of the second RF bandpass filter.

FIGS. 6A and 6B are graphs illustrating filtering characteristics of the first tunable RF filter path 66 and the second tunable RF filter path 68, respectively, illustrated in FIG. 4 according to an alternate embodiment of the first tunable RF filter path 66 and the second tunable RF filter path 68, respectively. The first tunable RF filter path 66 is an RF lowpass filter and the second tunable RF filter path 68 is an RF highpass filter. FIG. 6A shows a frequency response curve 90 of the RF lowpass filter and FIG. 6B shows a frequency response curve 92 of the RF highpass filter. Additionally FIG. 6A shows a break frequency 94 of the RF lowpass filter and FIG. 6B shows a break frequency 96 of the RF highpass filter. Both FIGS. 6A and 6B show the frequency 84 of the first upstream RF receive signal RU1 (FIG. 4), the frequency 86 of the first filtered RF transmit signal TF1 (FIG. 4), and the duplex frequency 88 of the RF duplexer for clarification. However, the RF lowpass filter and the RF highpass filter in combination function as an RF diplexer. The first filter parameter of the first tunable RF filter path 66 is the break frequency 94 of the RF lowpass filter. In one embodiment of the RF lowpass filter, the RF lowpass filter has bandpass filter characteristics. The first filter parameter of the second tunable RF filter path 68 is the break frequency 96 of the RF highpass filter. In one embodiment of the RF highpass filter, the RF highpass filter has bandpass filter characteristics. In one embodiment of the RF diplexer, the break frequency 96 of the RF highpass filter is about equal to the break frequency 94 of the RF lowpass filter.

Figure 7:
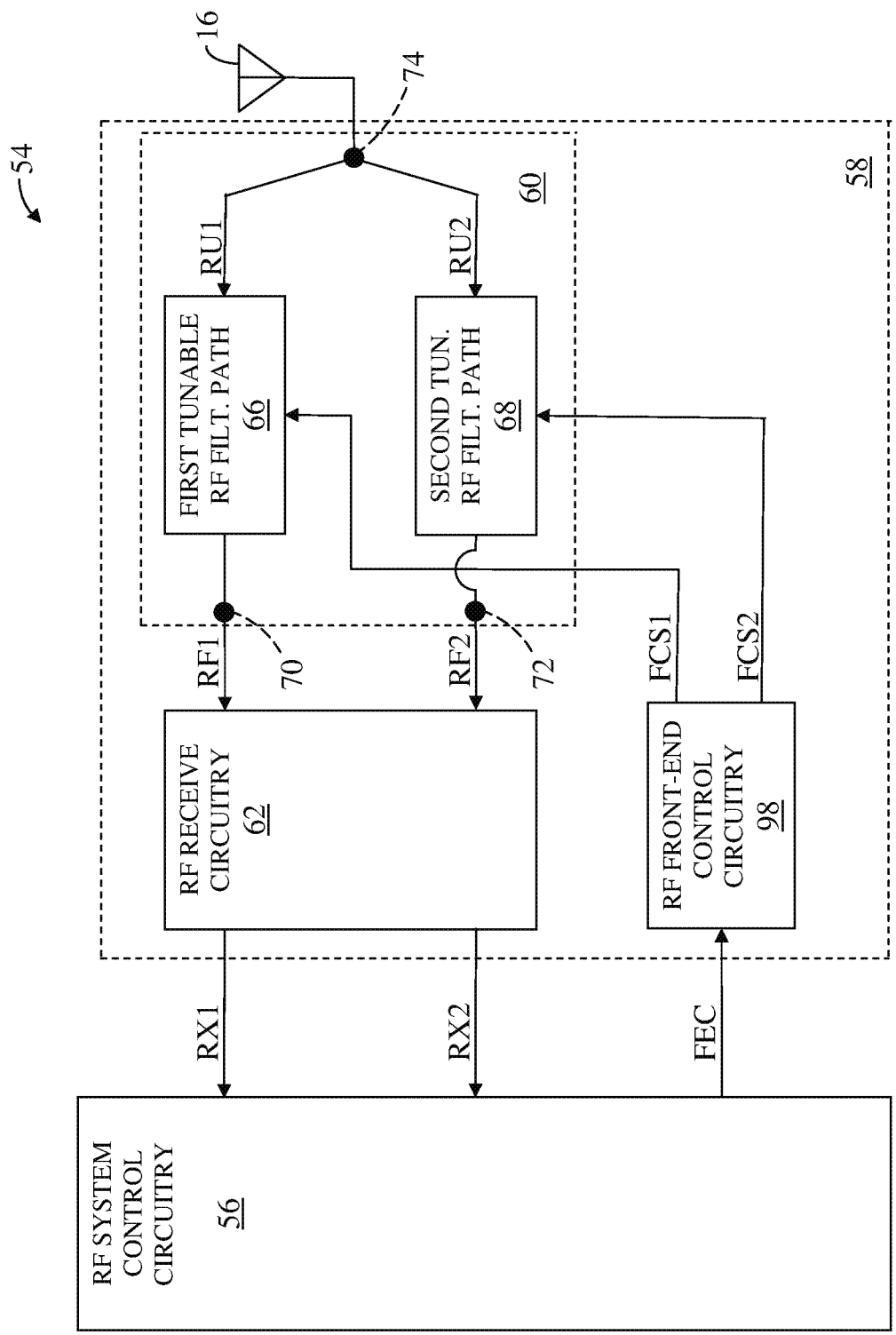
FIG. 7 shows the RF communications circuitry according to one embodiment of the RF communications circuitry.

FIG. 7 shows the RF communications circuitry 54 according to one embodiment of the RF communications circuitry 54. The RF communications circuitry 54 illustrated in FIG. 7 is similar to the RF communications circuitry 54 illustrated in FIG. 4, except in the RF front-end circuitry 58 illustrated in FIG. 7, the RF transmit circuitry 64 (FIG. 4) is omitted and the RF front-end circuitry 58 further includes RF front-end control circuitry 98.

The RF system control circuitry 56 provides a front-end control signal FEC to the RF front-end control circuitry 98. The RF front-end control circuitry 98 provides the first filter control signal FCS1 and the second filter control signal FCS2 based on the front-end control signal FEC. In the RF communications circuitry 54 illustrated in FIG. 4, the RF system control circuitry 56 provides the first filter control signal FCS1 and the second filter control signal FCS2 directly. In general, the RF communications circuitry 54 includes control circuitry, which may be either the RF system control circuitry 56 or the RF front-end control circuitry 98, that provides the first filter control signal FCS1 and the second filter control signal FCS2. As such, in one embodiment of the RF communications circuitry 54, the control circuitry tunes a first filter parameter of the first tunable RF filter path 66 using the first filter control signal FCS1. Additionally, the control circuitry tunes a first filter parameter of the second tunable RF filter path 68 using the second filter control signal FCS2. In an additional embodiment of the RF communications circuitry 54, the control circuitry further tunes a second filter parameter of the first tunable RF filter path 66 using the first filter control signal FCS1; and the control circuitry further tunes a second filter parameter of the second tunable RF filter path 68 using the second filter control signal FCS2.

In alternate embodiments of the first RF filter structure 60, any or all of the first connection node 70, the second connection node 72, and the first common connection node 74 are external to the first RF filter structure 60. In one embodiment of the first tunable RF filter path 66, the first tunable RF filter path 66 includes a first pair (not shown) of weakly coupled resonators. In one embodiment of the second tunable RF filter path 68, the second tunable RF filter path 68 includes a second pair (not shown) of weakly coupled resonators.

In one embodiment of the first RF filter structure 60, the first tunable RF filter path 66 is directly coupled between the first common connection node 74 and the first connection node 70, the second tunable RF filter path 68 is directly coupled between the second connection node 72 and the first common connection node 74, and the first RF antenna 16 is directly coupled to the first common connection node 74. In another embodiment of the RF communications circuitry 54, the first RF antenna 16 is omitted. Additionally, the RF receive circuitry 62 is coupled between the first connection node 70 and the RF system control circuitry 56, and the RF receive circuitry 62 is further coupled between the second connection node 72 and the RF system control circuitry 56.

In one embodiment of the RF communications circuitry 54, the first tunable RF filter path 66 is a first RF receive filter, such that the first RF antenna 16 forwards a first received RF signal via the first common connection node 74 to provide a first upstream RF receive signal RU1 to the first tunable RF filter path 66, which receives and filters the first upstream RF receive signal RU1 to provide a first filtered RF receive signal RF1 to the RF receive circuitry 62. Additionally, the second tunable RF filter path 68 is a second RF receive filter, such that the first RF antenna 16 forwards a second received RF signal via the first common connection node 74 to provide a second upstream RF receive signal RU2 to the second tunable RF filter path 68, which receives and filters the second upstream RF receive signal RU2 to provide a second filtered RF receive signal RF2 to the RF receive circuitry 62.

The RF receive circuitry 62 may include down-conversion circuitry, amplification circuitry, power supply circuitry, filtering circuitry, switching circuitry, combining circuitry, splitting circuitry, dividing circuitry, clocking circuitry, the like, or any combination thereof. The RF receive circuitry 62 processes the first filtered RF receive signal RF1 to provide a first receive signal RX1 to the RF system control circuitry 56. Additionally, the RF receive circuitry 62 processes the second filtered RF receive signal RF2 to provide a second receive signal RX2 to the RF system control circuitry 56.

In one embodiment of the RF communications circuitry 54, the first tunable RF filter path 66 and the second tunable RF filter path 68 do not significantly load one another at frequencies of interest. As such, by directly coupling the first tunable RF filter path 66 and the second tunable RF filter path 68 to the first common connection node 74; front-end RF switching elements may be avoided, thereby reducing cost, size, and non-linearity; and increasing efficiency and flexibility of the RF communications circuitry 54.

In this regard, in one embodiment of the first tunable RF filter path 66 and the second tunable RF filter path 68, each of the first tunable RF filter path 66 and the second tunable RF filter path 68 is a bandpass filter having a unique center frequency. As such, the first filter parameter of each of the first tunable RF filter path 66 and the second tunable RF filter path 68 is a unique center frequency.

In an alternate embodiment of the first tunable RF filter path 66 and the second tunable RF filter path 68, one of the first tunable RF filter path 66 and the second tunable RF filter path 68 is a lowpass filter, and another of the first tunable RF filter path 66 and the second tunable RF filter path 68 is a highpass filter. As such, the first filter parameter of each of the first tunable RF filter path 66 and the second tunable RF filter path 68 is a break frequency.

In an additional embodiment of the first tunable RF filter path 66 and the second tunable RF filter path 68, one of the first tunable RF filter path 66 and the second tunable RF filter path 68 is a lowpass filter, and another of the first tunable RF filter path 66 and the second tunable RF filter path 68 is a bandpass filter. As such, the first filter parameter of one of the first tunable RF filter path 66 and the second tunable RF filter path 68 is a center frequency, and the first filter parameter of another of the first tunable RF filter path 66 and the second tunable RF filter path 68 is a break frequency.

In an additional embodiment of the first tunable RF filter path 66 and the second tunable RF filter path 68, one of the first tunable RF filter path 66 and the second tunable RF filter path 68 is a highpass filter, and another of the first tunable RF filter path 66 and the second tunable RF filter path 68 is a bandpass filter. As such, the first filter parameter of one of the first tunable RF filter path 66 and the second tunable RF filter path 68 is a center frequency, and the first filter parameter of another of the first tunable RF filter path 66 and the second tunable RF filter path 68 is a break frequency.

In one embodiment of the RF communications circuitry 54, the RF communications circuitry 54 is a receive only CA system, such that the first tunable RF filter path 66, which is the first RF receive filter, and the second tunable RF filter path 68, which is the second RF receive filter, simultaneously receive and filter the first upstream RF receive signal RU1 and the second upstream RF receive signal RU2, respectively, via the first common connection node 74. As such, the first RF filter structure 60 functions as a de-multiplexer. In this regard, each of the first upstream RF receive signal RU1 and the second upstream RF receive signal RU2 has a unique carrier frequency. Using receive CA may increase an effective receive bandwidth of the RF communications circuitry 54.

In another embodiment of the RF communications circuitry 54, the RF communications circuitry 54 is a receive only communications system, such that the first tunable RF filter path 66, which is the first RF receive filter, and the second tunable RF filter path 68, which is the second RF receive filter, do not simultaneously receive and filter the first upstream RF receive signal RU1 and the second upstream RF receive signal RU2, respectively. As such, the first upstream RF receive signal RU1 and the second upstream RF receive signal RU2 are nonsimultaneous signals. Each of the first upstream RF receive signal RU1 and the second upstream RF receive signal RU2 may be associated with a unique RF communications band.

Figure 8:
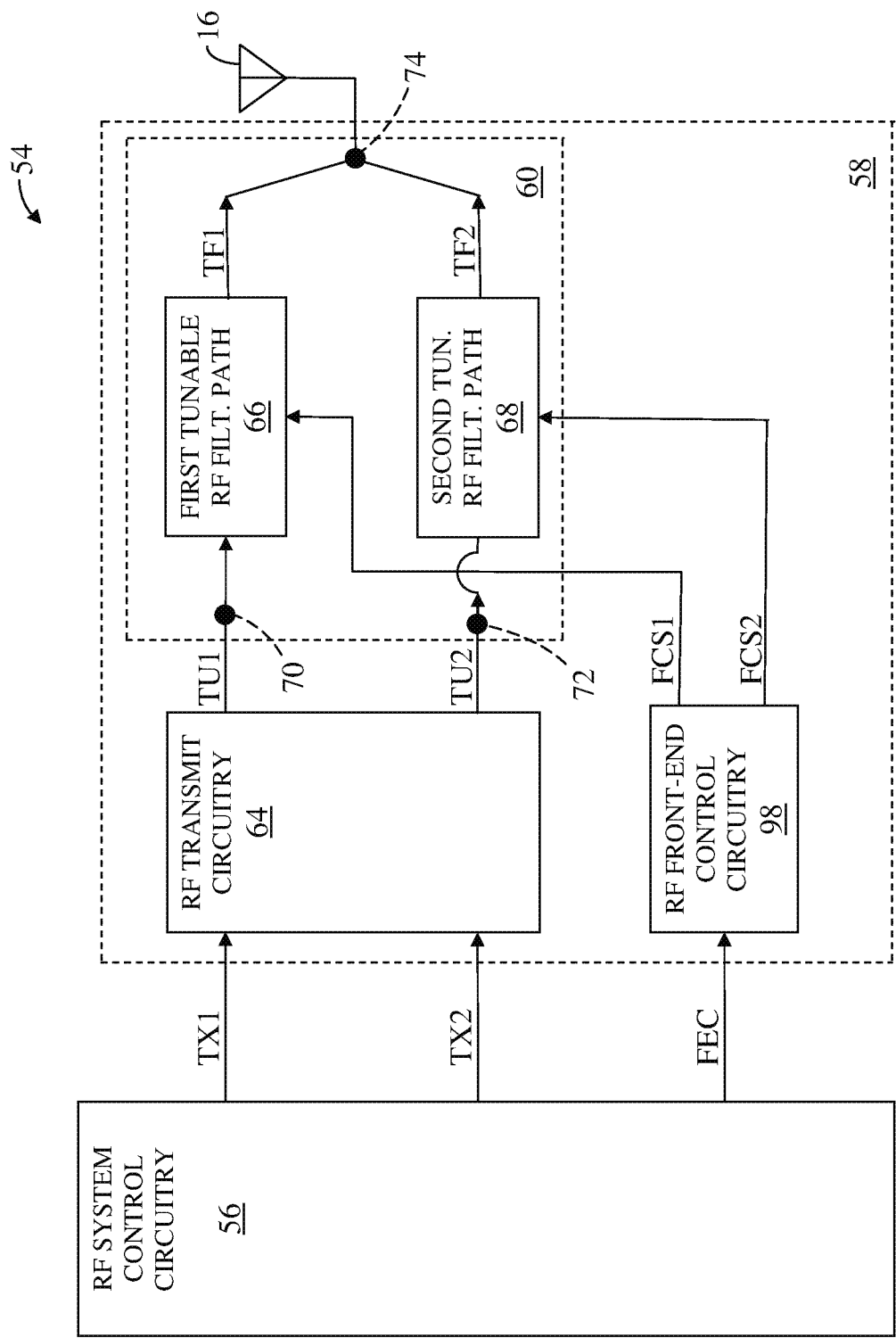
FIG. 8 shows the RF communications circuitry according to an alternate embodiment of the RF communications circuitry.

FIG. 8 shows the RF communications circuitry 54 according to an alternate embodiment of the RF communications circuitry 54. The RF communications circuitry 54 illustrated in FIG. 8 is similar to the RF communications circuitry 54 illustrated in FIG. 7, except in the RF front-end circuitry 58 illustrated in FIG. 8, the RF receive circuitry 62 is omitted and the RF transmit circuitry 64 is included.

The RF system control circuitry 56 provides the front-end control signal FEC to the RF front-end control circuitry 98. The RF front-end control circuitry 98 provides the first filter control signal FCS1 and the second filter control signal FCS2 based on the front-end control signal FEC. In the RF communications circuitry 54 illustrated in FIG. 4, the RF system control circuitry 56 provides the first filter control signal FCS1 and the second filter control signal FCS2 directly. In general, the RF communications circuitry 54 includes control circuitry, which may be either the RF system control circuitry 56 or the RF front-end control circuitry 98, that provides the first filter control signal FCS1 and the second filter control signal FCS2. As such, in one embodiment of the RF communications circuitry 54, the control circuitry tunes a first filter parameter of the first tunable RF filter path 66 using the first filter control signal FCS1. Additionally, the control circuitry tunes a first filter parameter of the second tunable RF filter path 68 using the second filter control signal FCS2. In an additional embodiment of the RF communications circuitry 54, the control circuitry further tunes a second filter parameter of the first tunable RF filter path 66 using the first filter control signal FCS1; and the control circuitry further tunes a second filter parameter of the second tunable RF filter path 68 using the second filter control signal FCS2.

In alternate embodiments of the first RF filter structure 60, any or all of the first connection node 70, the second connection node 72, and the first common connection node 74 are external to the first RF filter structure 60. In one embodiment of the first tunable RF filter path 66, the first tunable RF filter path 66 includes a first pair (not shown) of weakly coupled resonators. In one embodiment of the second tunable RF filter path 68, the second tunable RF filter path 68 includes a second pair (not shown) of weakly coupled resonators.

In one embodiment of the first RF filter structure 60, the first tunable RF filter path 66 is directly coupled between the first common connection node 74 and the first connection node 70, the second tunable RF filter path 68 is directly coupled between the second connection node 72 and the first common connection node 74, and the first RF antenna 16 is directly coupled to the first common connection node 74. In another embodiment of the RF communications circuitry 54, the first RF antenna 16 is omitted. Additionally, the RF transmit circuitry 64 is coupled between the first connection node 70 and the RF system control circuitry 56, and the RF transmit circuitry 64 is further coupled between the second connection node 72 and the RF system control circuitry 56.

In one embodiment of the RF communications circuitry 54, the first tunable RF filter path 66 is a first RF transmit filter, such that the RF system control circuitry 56 provides the first transmit signal TX1 to the RF transmit circuitry 64, which processes the first transmit signal TX1 to provide a first upstream RF transmit signal TU1 to the first tunable RF filter path 66. Similarly, the second tunable RF filter path 68 is a second RF transmit filter, such that the RF system control circuitry 56 provides a second transmit signal TX2 to the RF transmit circuitry 64, which processes the second transmit signal TX2 to provide a second upstream RF transmit signal TU2 to the second tunable RF filter path 68.

The RF transmit circuitry 64 may include up-conversion circuitry, amplification circuitry, power supply circuitry, filtering circuitry, switching circuitry, combining circuitry, splitting circuitry, dividing circuitry, clocking circuitry, the like, or any combination thereof. The first tunable RF filter path 66 receives and filters the first upstream RF transmit signal TU1 to provide the first filtered RF transmit signal TF1, which is transmitted via the first common connection node 74 by the first RF antenna 16. Similarly, the second tunable RF filter path 68 receives and filters the second upstream RF transmit signal TU2 to provide a second filtered RF transmit signal TF2, which is transmitted via the first common connection node 74 by the first RF antenna 16.

In one embodiment of the RF communications circuitry 54, the first tunable RF filter path 66 and the second tunable RF filter path 68 do not significantly load one another at frequencies of interest. As such, by directly coupling the first tunable RF filter path 66 and the second tunable RF filter path 68 to the first common connection node 74; front-end RF switching elements may be avoided, thereby reducing cost, size, and non-linearity; and increasing efficiency and flexibility of the RF communications circuitry 54.

In this regard, in one embodiment of the first tunable RF filter path 66 and the second tunable RF filter path 68, each of the first tunable RF filter path 66 and the second tunable RF filter path 68 is a bandpass filter having a unique center frequency. As such, the first filter parameter of each of the first tunable RF filter path 66 and the second tunable RF filter path 68 is a unique center frequency.

In an alternate embodiment of the first tunable RF filter path 66 and the second tunable RF filter path 68, one of the first tunable RF filter path 66 and the second tunable RF filter path 68 is a lowpass filter, and another of the first tunable RF filter path 66 and the second tunable RF filter path 68 is a highpass filter. As such, the first filter parameter of each of the first tunable RF filter path 66 and the second tunable RF filter path 68 is a break frequency.

In an additional embodiment of the first tunable RF filter path 66 and the second tunable RF filter path 68, one of the first tunable RF filter path 66 and the second tunable RF filter path 68 is a lowpass filter, and another of the first tunable RF filter path 66 and the second tunable RF filter path 68 is a bandpass filter. As such, the first filter parameter of one of the first tunable RF filter path 66 and the second tunable RF filter path 68 is a center frequency, and the first filter parameter of another of the first tunable RF filter path 66 and the second tunable RF filter path 68 is a break frequency.

In an additional embodiment of the first tunable RF filter path 66 and the second tunable RF filter path 68, one of the first tunable RF filter path 66 and the second tunable RF filter path 68 is a highpass filter, and another of the first tunable RF filter path 66 and the second tunable RF filter path 68 is a bandpass filter. As such, the first filter parameter of one of the first tunable RF filter path 66 and the second tunable RF filter path 68 is a center frequency, and the first filter parameter of another of the first tunable RF filter path 66 and the second tunable RF filter path 68 is a break frequency.

In one embodiment of the RF communications circuitry 54, the RF communications circuitry 54 is a transmit only CA system, such that the first tunable RF filter path 66, which is the first RF transmit filter, and the second tunable RF filter path 68, which is the second RF transmit filter, simultaneously receive and filter the first upstream RF transmit signal TU1 and the second upstream RF transmit signal TU2, respectively, to simultaneously provide the first filtered RF transmit signal TF1 and the second filtered RF transmit signal TF2, respectively, via the first common connection node 74. As such, the first RF filter structure 60 functions as a multiplexer. In this regard, each of the first filtered RF transmit signal TF1 and the second filtered RF transmit signal TF2 has a unique carrier frequency. Using transmit CA may increase an effective transmit bandwidth of the RF communications circuitry 54.

In another embodiment of the RF communications circuitry 54, the RF communications circuitry 54 is a transmit only communications system, such that the first tunable RF filter path 66, which is the first RF transmit filter, and the second tunable RF filter path 68, which is the second RF transmit filter, do not simultaneously receive and filter the first upstream RF transmit signal TU1 and the second upstream RF transmit signal TU2, respectively. As such, the first filtered RF transmit signal TF1 and the second filtered RF transmit signal TF2 are nonsimultaneous signals. Each of the first filtered RF transmit signal TF1 and the second filtered RF transmit signal TF2 may be associated with a unique RF communications band.

Figure 9A:
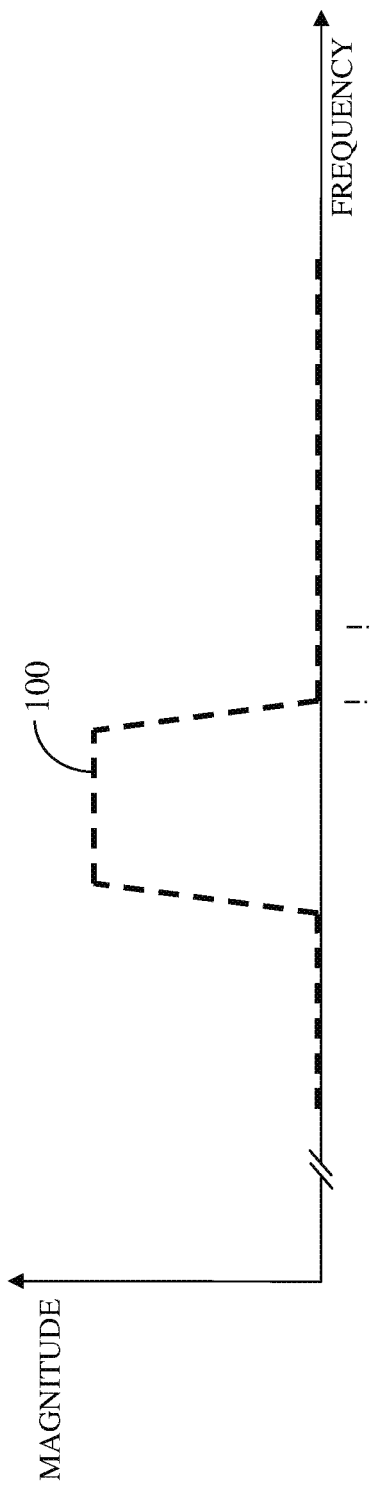
FIGS. 9A and 9B are graphs illustrating filtering characteristics of the first tunable RF filter path and the second tunable RF filter path, respectively, illustrated in FIG. 8 according to an additional embodiment of the first tunable RF filter path and the second tunable RF filter path.
Figure 9B:
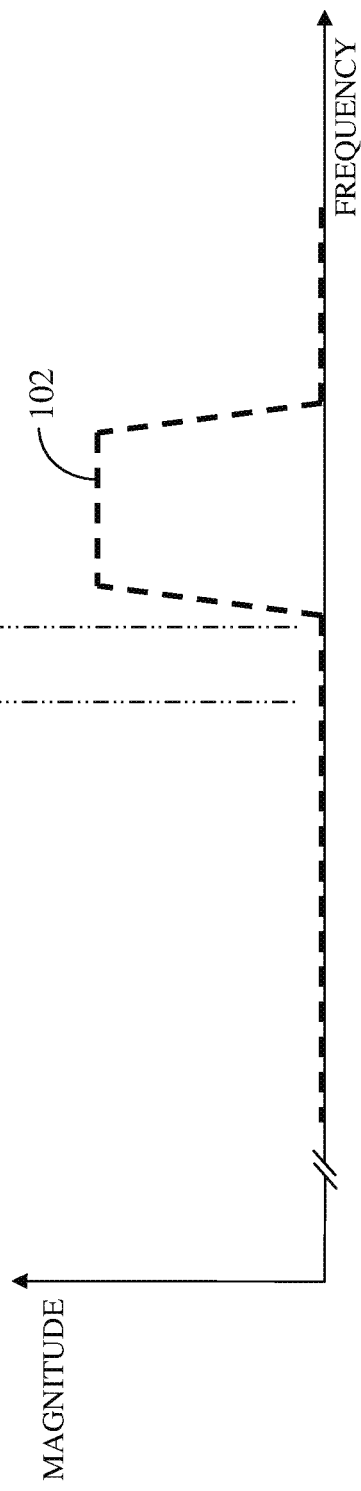

FIGS. 9A and 9B are graphs illustrating filtering characteristics of the first tunable RF filter path 66 and the second tunable RF filter path 68, respectively, illustrated in FIG. 8 according to an additional embodiment of the first tunable RF filter path 66 and the second tunable RF filter path 68, respectively. FIG. 9A shows a frequency response curve 100 of the first tunable RF filter path 66 and FIG. 9B shows a frequency response curve 102 of the second tunable RF filter path 68. The first tunable RF filter path 66 and the second tunable RF filter path 68 are both bandpass filters having the frequency response curves 100, 102 illustrated in FIGS. 9A and 9B, respectively. In this regard, the first tunable RF filter path 66 and the second tunable RF filter path 68 can be directly coupled to one another via the first common connection node 74 (FIG. 8) without interfering with one another.

FIGS. 10A and 10B are graphs illustrating filtering characteristics of the first traditional RF duplexer 30 and the second traditional RF duplexer 36, respectively, illustrated in FIG. 3 according to the prior art. FIG. 10A shows a frequency response curve 104 of the first traditional RF duplexer 30 and FIG. 10B shows a frequency response curve 106 of the second traditional RF duplexer 36. There is interference 108 between the frequency response curve 104 of the first traditional RF duplexer 30 and the frequency response curve 106 of the second traditional RF duplexer 36 as shown in FIGS. 10A and 10B. In this regard, the first traditional RF duplexer 30 and the second traditional RF duplexer 36 cannot be directly coupled to one another without interfering with one another. To avoid interference between different filters, traditional systems use RF switches to disconnect unused filters.

Figure 11:
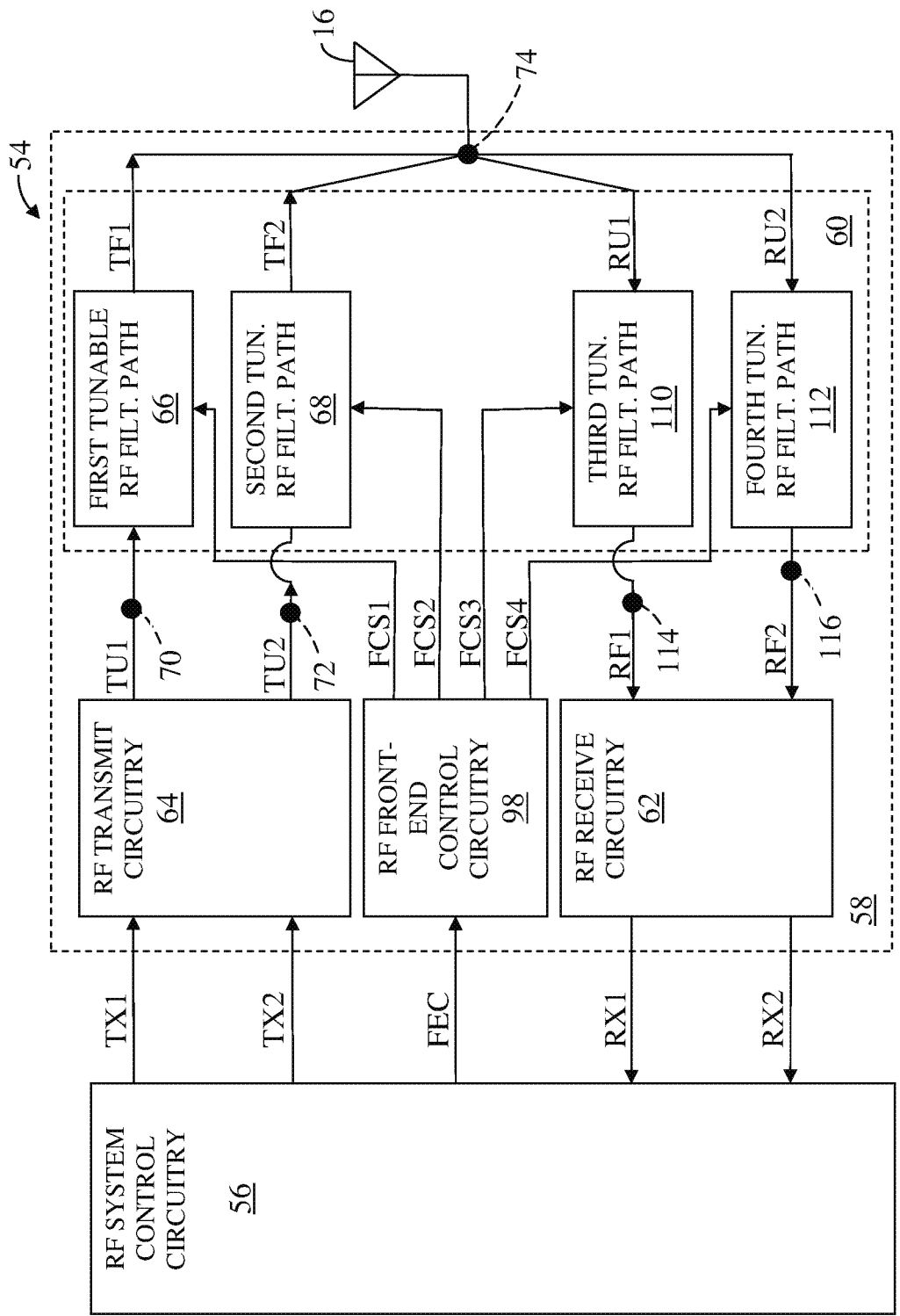
FIG. 11 shows the RF communications circuitry according to one embodiment of the RF communications circuitry.

FIG. 11 shows the RF communications circuitry 54 according to one embodiment of the RF communications circuitry 54. The RF communications circuitry 54 illustrated in FIG. 11 is similar to the RF communications circuitry 54 illustrated in FIG. 8, except in the RF communications circuitry 54 illustrated in FIG. 11, the RF front-end circuitry 58 further includes the RF receive circuitry 62 and the first RF filter structure 60 further includes a third tunable RF filter path 110 and a fourth tunable RF filter path 112. Additionally, the RF front-end circuitry 58 has the first connection node 70, the second connection node 72, the first common connection node 74, a third connection node 114 and a fourth connection node 116, such that all of the first connection node 70, the second connection node 72, the first common connection node 74, the third connection node 114 and the fourth connection node 116 are external to the first RF filter structure 60. In an alternate of the RF front-end circuitry 58, any or all of the first connection node 70, the second connection node 72, the first common connection node 74, a third connection node 114 and a fourth connection node 116 are internal to the first RF filter structure 60.

The RF front-end control circuitry 98 further provides a third filter control signal FCS3 to the third tunable RF filter path 110 and a fourth filter control signal FCS4 to the fourth tunable RF filter path 112 based on the front-end control signal FEC. In one embodiment of the RF communications circuitry 54, the control circuitry tunes a first filter parameter of the third tunable RF filter path 110 using the third filter control signal FCS3. Additionally, the control circuitry tunes a first filter parameter of the fourth tunable RF filter path 112 using the fourth filter control signal FCS4. In an additional embodiment of the RF communications circuitry 54, the control circuitry further tunes a second filter parameter of the third tunable RF filter path 110 using the third filter control signal FCS3; and the control circuitry further tunes a second filter parameter of the fourth tunable RF filter path 112 using the fourth filter control signal FCS4.

In one embodiment of the third tunable RF filter path 110, the third tunable RF filter path 110 includes a third pair (not shown) of weakly coupled resonators. In one embodiment of the fourth tunable RF filter path 112, the fourth tunable RF filter path 112 includes a fourth pair (not shown) of weakly coupled resonators.

In one embodiment of the third tunable RF filter path 110 and the fourth tunable RF filter path 112, the third tunable RF filter path 110 is directly coupled between the first common connection node 74 and the third connection node 114, and the fourth tunable RF filter path 112 is directly coupled between the fourth connection node 116 and the first common connection node 74. In another embodiment of the RF communications circuitry 54, the first RF antenna 16 is omitted. Additionally, the RF receive circuitry 62 is coupled between the third connection node 114 and the RF system control circuitry 56, and the RF receive circuitry 62 is further coupled between the fourth connection node 116 and the RF system control circuitry 56.

In one embodiment of the RF communications circuitry 54, the third tunable RF filter path 110 is the first RF receive filter, such that the first RF antenna 16 forwards a first received RF signal via the first common connection node 74 to provide the first upstream RF receive signal RU1 to the third tunable RF filter path 110, which receives and filters the first upstream RF receive signal RU1 to provide the first filtered RF receive signal RF1 to the RF receive circuitry 62. Additionally, the fourth tunable RF filter path 112 is a second RF receive filter, such that the first RF antenna 16 forwards a second received RF signal via the first common connection node 74 to provide the second upstream RF receive signal RU2 to the fourth tunable RF filter path 112, which receives and filters the second upstream RF receive signal RU2 to provide the second filtered RF receive signal RF2 to the RF receive circuitry 62.

The RF receive circuitry 62 may include down-conversion circuitry, amplification circuitry, power supply circuitry, filtering circuitry, switching circuitry, combining circuitry, splitting circuitry, dividing circuitry, clocking circuitry, the like, or any combination thereof. The RF receive circuitry 62 processes the first filtered RF receive signal RF1 to provide the first receive signal RX1 to the RF system control circuitry 56. Additionally, the RF receive circuitry 62 processes the second filtered RF receive signal RF2 to provide the second receive signal RX2 to the RF system control circuitry 56.

In one embodiment of the RF communications circuitry 54, the first tunable RF filter path 66, the second tunable RF filter path 68, the third tunable RF filter path 110, and the fourth tunable RF filter path 112 do not significantly load one another at frequencies of interest. As such, by directly coupling the first tunable RF filter path 66, the second tunable RF filter path 68, the third tunable RF filter path 110, and the fourth tunable RF filter path 112 to the first common connection node 74; front-end RF switching elements may be avoided, thereby reducing cost, size, and non-linearity; and increasing efficiency and flexibility of the RF communications circuitry 54.

In this regard, in one embodiment of the third tunable RF filter path 110 and the fourth tunable RF filter path 112, each of the third tunable RF filter path 110 and the fourth tunable RF filter path 112 is a bandpass filter having a unique center frequency. As such, the first filter parameter of each of the third tunable RF filter path 110 and the fourth tunable RF filter path 112 is a unique center frequency.

In an alternate embodiment of the third tunable RF filter path 110 and the fourth tunable RF filter path 112, one of the third tunable RF filter path 110 and the fourth tunable RF filter path 112 is a lowpass filter, and another of the third tunable RF filter path 110 and the fourth tunable RF filter path 112 is a highpass filter. As such, the first filter parameter of each of the third tunable RF filter path 110 and the fourth tunable RF filter path 112 is a break frequency.

In an additional embodiment of the third tunable RF filter path 110 and the fourth tunable RF filter path 112, one of the third tunable RF filter path 110 and the fourth tunable RF filter path 112 is a lowpass filter, and another of the third tunable RF filter path 110 and the fourth tunable RF filter path 112 is a bandpass filter. As such, the first filter parameter of one of the third tunable RF filter path 110 and the fourth tunable RF filter path 112 is a center frequency, and the first filter parameter of another of the third tunable RF filter path 110 and the fourth tunable RF filter path 112 is a break frequency.

In an additional embodiment of the third tunable RF filter path 110 and the fourth tunable RF filter path 112, one of the third tunable RF filter path 110 and the fourth tunable RF filter path 112 is a highpass filter, and another of the third tunable RF filter path 110 and the fourth tunable RF filter path 112 is a bandpass filter. As such, the first filter parameter of one of the third tunable RF filter path 110 and the fourth tunable RF filter path 112 is a center frequency, and the first filter parameter of another of the third tunable RF filter path 110 and the fourth tunable RF filter path 112 is a break frequency.

In one embodiment of the RF communications circuitry 54, the RF communications circuitry 54 is a CA system, such that the third tunable RF filter path 110, which is the first RF receive filter, and the fourth tunable RF filter path 112, which is the second RF receive filter, simultaneously receive and filter the first upstream RF receive signal RU1 and the second upstream RF receive signal RU2, respectively, via the first common connection node 74. As such, the first RF filter structure 60 functions as a de-multiplexer using the third tunable RF filter path 110 and the fourth tunable RF filter path 112. In one embodiment of the first RF filter structure 60, the first RF filter structure 60 further functions as a multiplexer using the first tunable RF filter path 66 and the second tunable RF filter path 68. In this regard, each of the first upstream RF receive signal RU1 and the second upstream RF receive signal RU2 has a unique carrier frequency.

In another embodiment of the RF communications circuitry 54, the RF communications circuitry 54 is a receive communications system, such that the third tunable RF filter path 110, which is the first RF receive filter, and the fourth tunable RF filter path 112, which is the second RF receive filter, do not simultaneously receive and filter the first upstream RF receive signal RU1 and the second upstream RF receive signal RU2, respectively. As such, the first upstream RF receive signal RU1 and the second upstream RF receive signal RU2 are nonsimultaneous signals. Each of the first upstream RF receive signal RU1 and the second upstream RF receive signal RU2 may be associated with a unique RF communications band.

Figure 12:
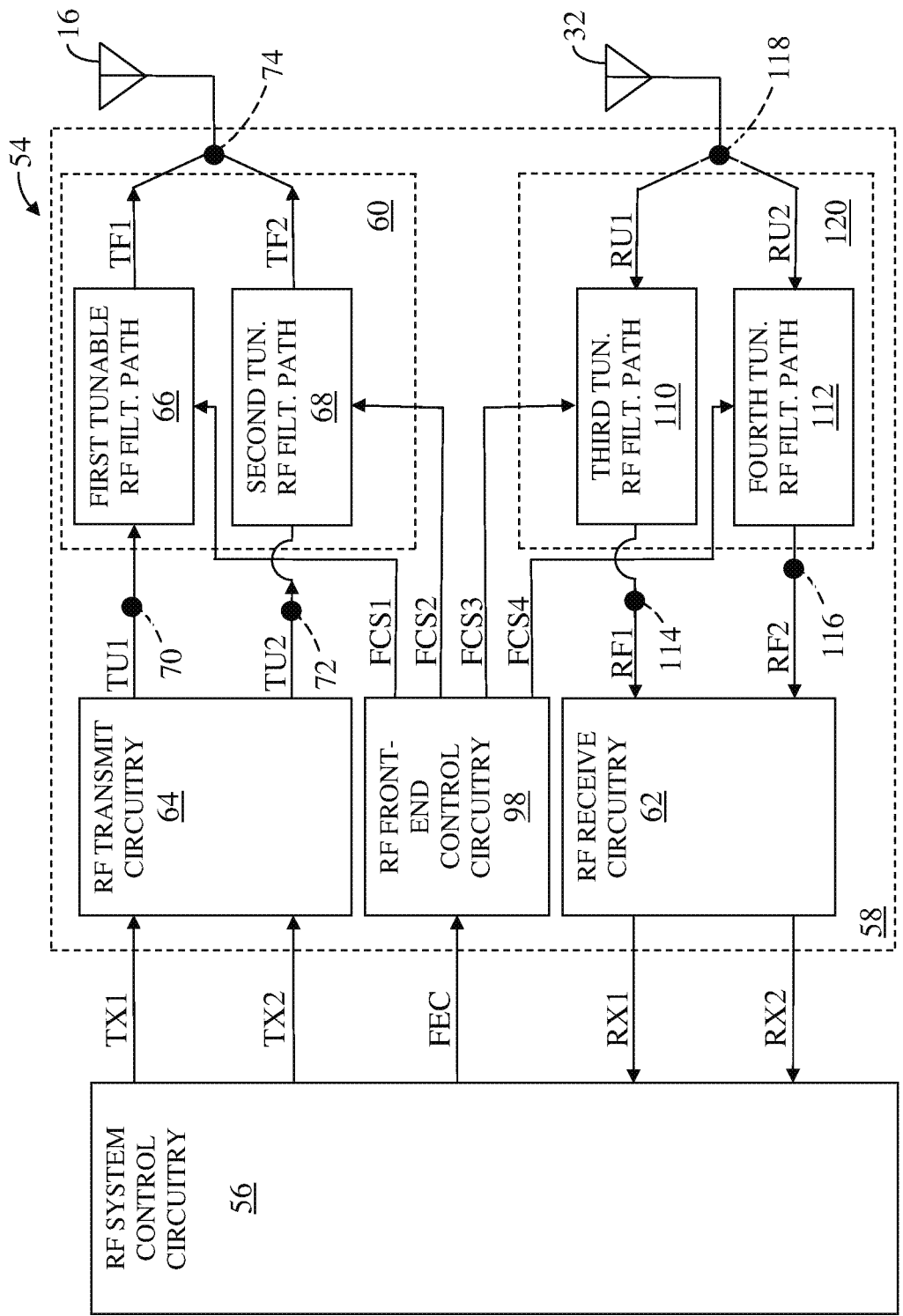
FIG. 12 shows the RF communications circuitry according to an alternate embodiment of the RF communications circuitry.

FIG. 12 shows the RF communications circuitry 54 according to an alternate embodiment of the RF communications circuitry 54. The RF communications circuitry 54 illustrated in FIG. 12 is similar to the RF communications circuitry 54 illustrated in FIG. 11, except the RF communications circuitry 54 illustrated in FIG. 12 further includes the second RF antenna 32. Additionally, the RF front-end circuitry 58 further includes a second common connection node 118 and a second RF filter structure 120. The third tunable RF filter path 110 and the fourth tunable RF filter path 112 are included in the second RF filter structure 120 instead of being included in the first RF filter structure 60. Instead of being coupled to the first common connection node 74, the third tunable RF filter path 110 and the fourth tunable RF filter path 112 are coupled to the second common connection node 118. In one embodiment of the third tunable RF filter path 110 and the fourth tunable RF filter path 112, the third tunable RF filter path 110 and the fourth tunable RF filter path 112 are directly coupled to the second common connection node 118. In one embodiment of the RF communications circuitry 54, the second RF antenna 32 is coupled to the second common connection node 118.

Figure 13:
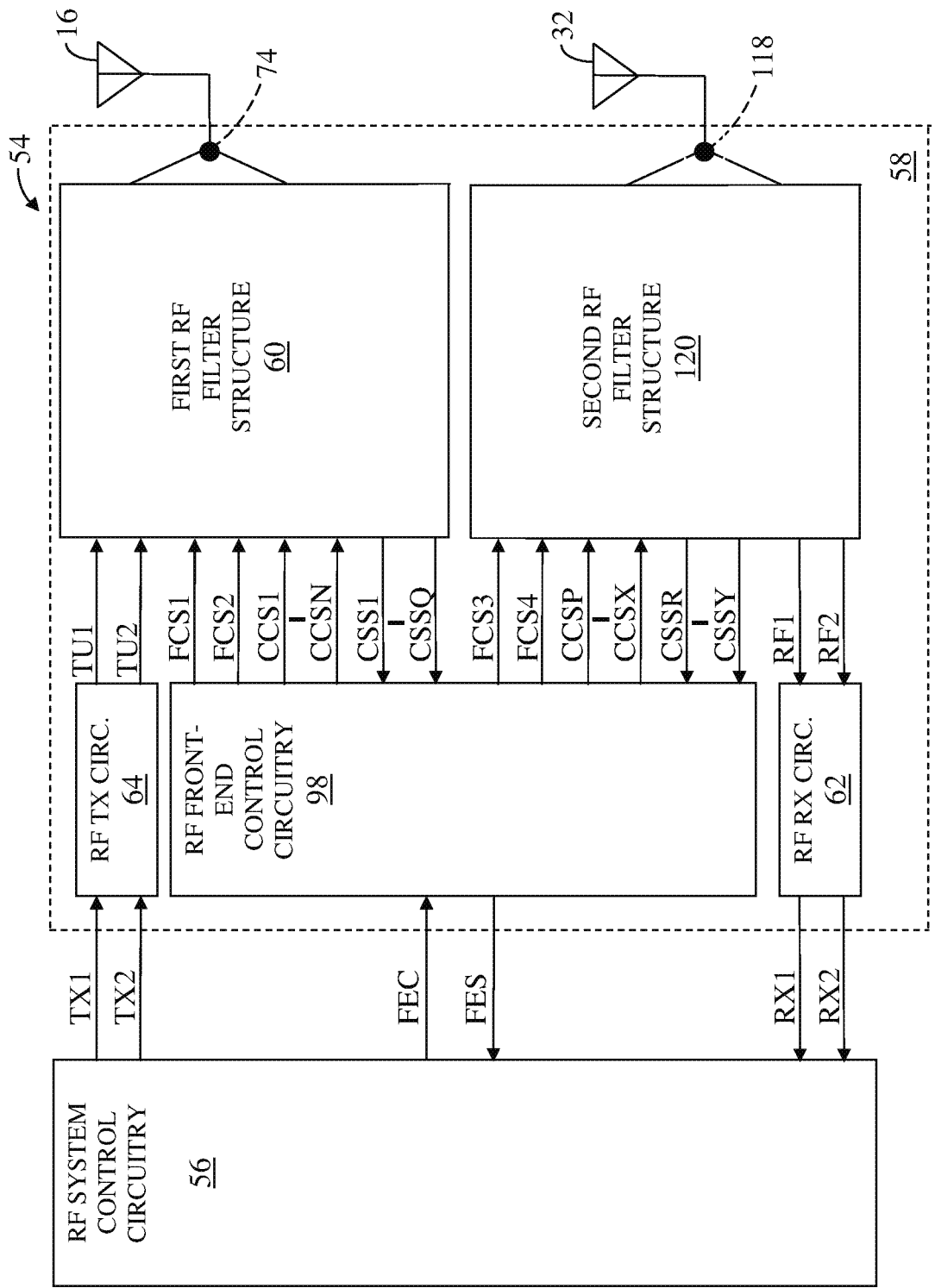
FIG. 13 shows the RF communications circuitry according to an additional embodiment of the RF communications circuitry.

FIG. 13 shows the RF communications circuitry 54 according to an additional embodiment of the RF communications circuitry 54. The RF communications circuitry 54 illustrated in FIG. 13 is similar to the RF communications circuitry 54 illustrated in FIG. 12, except in the RF communications circuitry 54 illustrated in FIG. 13, the RF front-end control circuitry 98 provides a front-end status signal FES to the RF system control circuitry 56. Additionally, the RF front-end control circuitry 98 provides a first calibration control signal CCS1 and up to and including an $N^{TH}$ calibration control signal CCSN to the first RF filter structure 60. The RF front-end control circuitry 98 provides a $P^{TH}$ calibration control signal CCSP and up to and including an $X^{TH}$ calibration control signal CCSX to the second RF filter structure 120. Details of the first RF filter structure 60 and the second RF filter structure 120 are not shown to simplify FIG. 13.

The first RF filter structure 60 provides a first calibration status signal CSS1 and up to and including a $Q^{TH}$ calibration status signal CSSQ to the RF front-end control circuitry 98. The second RF filter structure 120 provides an $R^{TH}$ calibration status signal CSSR and up to and including a $Y^{TH}$ calibration status signal CSSY to the RF front-end control circuitry 98. In an alternate embodiment of the RF front-end circuitry 58, any or all of the $N^{TH}$ calibration control signal CCSN, the $Q^{TH}$ calibration status signal CSSQ, the $X^{TH}$ calibration control signal CCSX, and the $Y^{TH}$ calibration status signal CSSY are omitted.

In one embodiment of the RF front-end circuitry 58, the RF front-end circuitry 58 operates in one of a normal operating mode and a calibration mode. During the calibration mode, the RF front-end control circuitry 98 performs a calibration of the first RF filter structure 60, the second RF filter structure 120, or both. As such, the RF front-end control circuitry 98 provides any or all of the filter control signals FCS1, FCS2, FCS3, FCS4 and any or all of the calibration control signals CCS1, CCSN, CCSP, CCSX needed for calibration. Further, the RF front-end control circuitry 98 receives any or all of the calibration status signals CSS1, CSSQ, CSSR, CSSY needed for calibration.

During the normal operating mode, the RF front-end control circuitry 98 provides any or all of the filter control signals FCS1, FCS2, FCS3, FCS4 and any or all of the calibration control signals CCS1, CCSN, CCSP, CCSX needed for normal operation. Further, the RF front-end control circuitry 98 receives any or all of the calibration status signals CSS1, CSSQ, CSSR, CSSY needed for normal operation. Any or all of the calibration control signals CCS1, CCSN, CCSP, CCSX may be based on the front-end control signal FEC. The front-end status signal FES may be based on any or all of the calibration status signals CSS1, CSSQ, CSSR, CSSY. Further, during the normal operating mode, the RF front-end circuitry 58 processes signals as needed for normal operation. Other embodiments described in the present disclosure may be associated with normal operation.

The RF communications circuitry 54 illustrated in FIG. 13 includes the first RF antenna 16 and the second RF antenna 32. In general, the RF communications circuitry 54 is a multiple antenna system. A single-input single-output (SISO) antenna system is a system in which RF transmit signals may be transmitted from the first RF antenna 16 and RF receive signals may be received via the second RF antenna 32. In one embodiment of the RF communications circuitry 54, the antenna system in the RF communications circuitry 54 is a SISO antenna system, as illustrated in FIG. 13.

A single-input multiple-output (SIMO) antenna system is a system in which RF transmit signals may be simultaneously transmitted from the first RF antenna 16 and the second RF antenna 32, and RF receive signals may be received via the second RF antenna 32. In an alternate embodiment of the RF communications circuitry 54, the second RF filter structure 120 is coupled to the RF transmit circuitry 64, such that the antenna system in the RF communications circuitry 54 is a SIMO antenna system.

A multiple-input single-output (MISO) antenna system is a system in which RF transmit signals may be transmitted from the first RF antenna 16, and RF receive signals may be simultaneously received via the first RF antenna 16 and the second RF antenna 32. In an additional embodiment of the RF communications circuitry 54, the first RF filter structure 60 is coupled to the RF receive circuitry 62, such that the antenna system in the RF communications circuitry 54 is a MISO antenna system.

A multiple-input multiple-output (MIMO) antenna system is a system in which RF transmit signals may be simultaneously transmitted from the first RF antenna 16 and the second RF antenna 32, and RF receive signals may be simultaneously received via the first RF antenna 16 and the second RF antenna 32. In another embodiment of the RF communications circuitry 54, the second RF filter structure 120 is coupled to the RF transmit circuitry 64 and the first RF filter structure 60 is coupled to the RF receive circuitry 62, such that the antenna system in the RF communications circuitry 54 is a MIMO antenna system.

Figure 14:
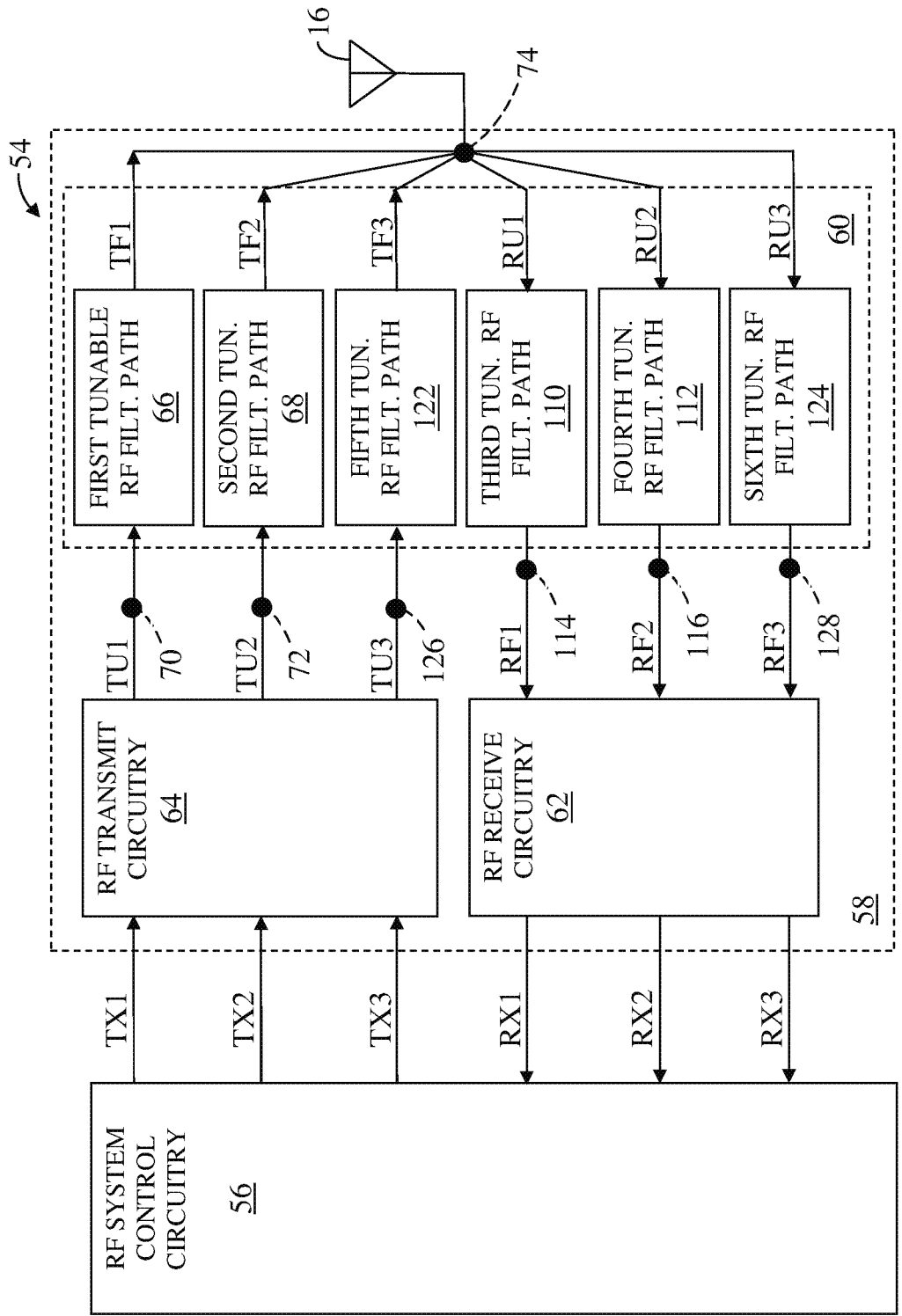
FIG. 14 shows the RF communications circuitry according to another embodiment of the RF communications circuitry.

FIG. 14 shows the RF communications circuitry 54 according to another embodiment of the RF communications circuitry 54. The RF communications circuitry 54 illustrated in FIG. 14 is similar to the RF communications circuitry 54 illustrated in FIG. 11, except in the RF communications circuitry 54 illustrated in FIG. 14, the first RF filter structure 60 further includes a fifth tunable RF filter path 122 and a sixth tunable RF filter path 124, and the RF front-end circuitry 58 further includes a fifth connection node 126 and a sixth connection node 128. Additionally, the RF front-end control circuitry 98 shown in FIG. 11 is not shown in FIG. 14 to simplify FIG. 14.

In one embodiment of the fifth tunable RF filter path 122, the fifth tunable RF filter path 122 includes a fifth pair (not shown) of weakly coupled resonators. In one embodiment of the sixth tunable RF filter path 124, the sixth tunable RF filter path 124 includes a sixth pair (not shown) of weakly coupled resonators.

In one embodiment of the fifth tunable RF filter path 122 and the sixth tunable RF filter path 124, the fifth tunable RF filter path 122 is directly coupled between the first common connection node 74 and the fifth connection node 126, and the sixth tunable RF filter path 124 is directly coupled between the sixth connection node 128 and the first common connection node 74. In another embodiment of the RF communications circuitry 54, the first RF antenna 16 is omitted. Additionally, the RF receive circuitry 62 is further coupled between the sixth connection node 128 and the RF system control circuitry 56, and the RF transmit circuitry 64 is further coupled between the fifth connection node 126 and the RF system control circuitry 56.

In one embodiment of the RF communications circuitry 54, the sixth tunable RF filter path 124 is a third RF receive filter, such that the first RF antenna 16 forwards a third received RF signal via the first common connection node 74 to provide a third upstream RF receive signal RU3 to the sixth tunable RF filter path 124, which receives and filters the third upstream RF receive signal RU3 to provide a third filtered RF receive signal RF3 to the RF receive circuitry 62, which processes the third filtered RF receive signal RF3 to provide the third receive signal RX3 to the RF system control circuitry 56.

In one embodiment of the RF communications circuitry 54, the fifth tunable RF filter path 122 is a third RF transmit filter, such that the RF system control circuitry 56 provides a third transmit signal TX3 to the RF transmit circuitry 64, which processes the third transmit signal TX3 to provide a third upstream RF transmit signal TU3 to the fifth tunable RF filter path 122. The fifth tunable RF filter path 122 receives and filters the third upstream RF transmit signal TU3 to provide a third filtered RF transmit signal TF3, which is transmitted via the first common connection node 74 by the first RF antenna 16.

In one embodiment of the RF communications circuitry 54, the first tunable RF filter path 66, the second tunable RF filter path 68, the third tunable RF filter path 110, the fourth tunable RF filter path 112, the fifth tunable RF filter path 122, and the sixth tunable RF filter path 124 do not significantly load one another at frequencies of interest. Therefore, antenna switching circuitry 34, 42 (FIG. 3) may be avoided. As such, by directly coupling the first tunable RF filter path 66, the second tunable RF filter path 68, the third tunable RF filter path 110, the fourth tunable RF filter path 112, the fifth tunable RF filter path 122 and the sixth tunable RF filter path 124 to the first common connection node 74; front-end RF switching elements may be avoided, thereby reducing cost, size, and non-linearity; and increasing efficiency and flexibility of the RF communications circuitry 54.

In one embodiment of the RF communications circuitry 54, the RF communications circuitry 54 is an FDD communications system, such that each of the first tunable RF filter path 66, the second tunable RF filter path 68, the third tunable RF filter path 110, the fourth tunable RF filter path 112, the fifth tunable RF filter path 122, and the sixth tunable RF filter path 124 is a bandpass filter having a unique center frequency. As such, in one embodiment of the RF system control circuitry 56, the first filter parameter of each of the first tunable RF filter path 66, the second tunable RF filter path 68, the third tunable RF filter path 110, the fourth tunable RF filter path 112, the fifth tunable RF filter path 122, and the sixth tunable RF filter path 124 is a unique center frequency.

Figure 15:
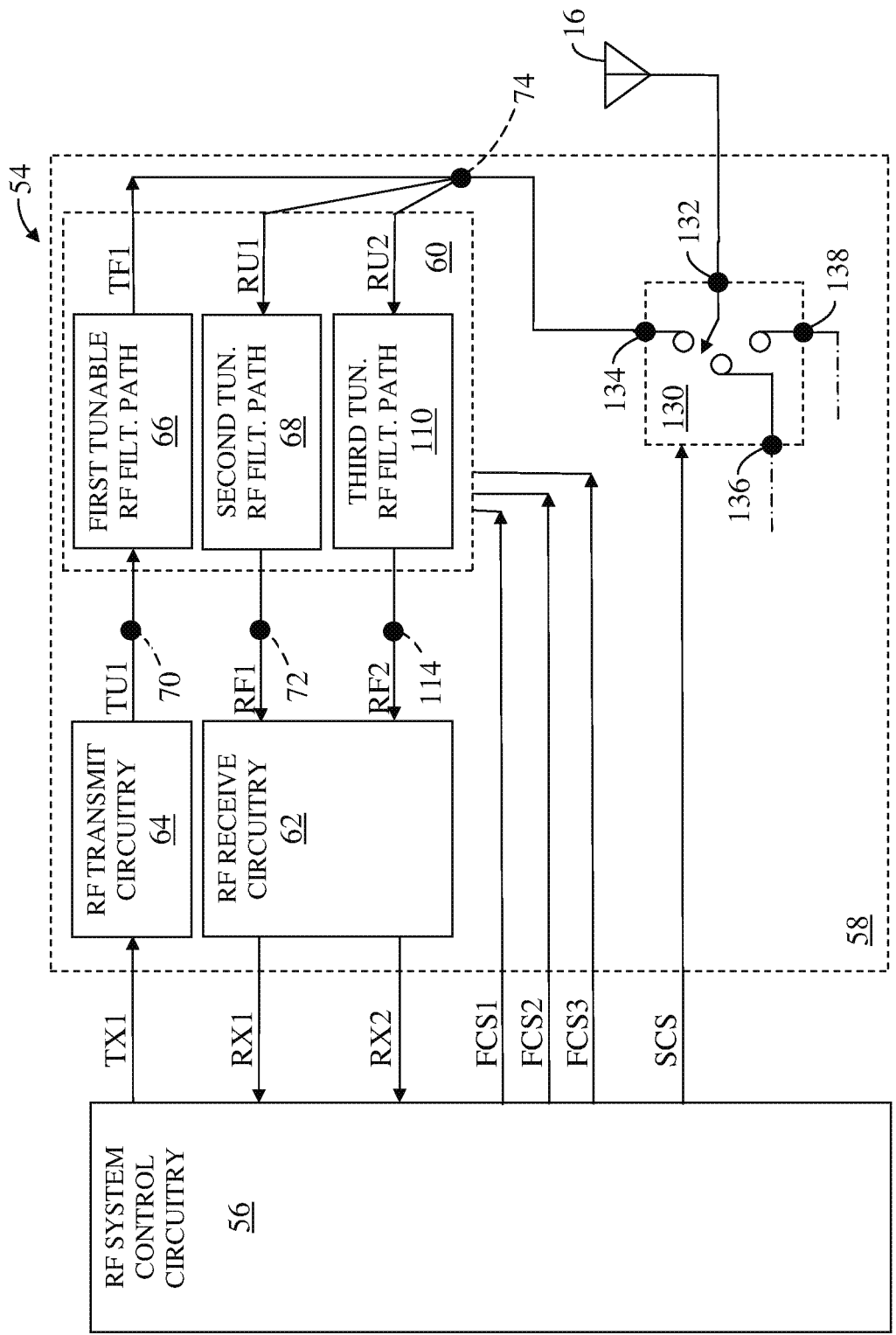
FIG. 15 shows the RF communications circuitry according to a further embodiment of the RF communications circuitry.

FIG. 15 shows the RF communications circuitry 54 according to a further embodiment of the RF communications circuitry 54. The RF communications circuitry 54 illustrated in FIG. 15 is similar to the RF communications circuitry 54 illustrated in FIG. 4, except in the RF communications circuitry 54 illustrated in FIG. 15, the RF front-end circuitry 58 further includes an RF antenna switch 130 and the third connection node 114. Additionally, the first RF filter structure 60 further includes the third tunable RF filter path 110. Instead of the first RF antenna 16 being directly coupled to the first common connection node 74, as illustrated in FIG. 4, the RF antenna switch 130 is coupled between the first RF antenna 16 and the first common connection node 74. As such, the first common connection node 74 is coupled to the first RF antenna 16 via the RF antenna switch 130. In this regard, the RF communications circuitry 54 is a hybrid RF communications system.

The RF antenna switch 130 has an antenna switch common connection node 132, an antenna switch first connection node 134, an antenna switch second connection node 136, and an antenna switch third connection node 138. The antenna switch common connection node 132 is coupled to the first RF antenna 16. In one embodiment of the RF antenna switch 130, the antenna switch common connection node 132 is directly coupled to the first RF antenna 16. The antenna switch first connection node 134 is coupled to the first common connection node 74. In one embodiment of the RF antenna switch 130, the antenna switch first connection node 134 is directly coupled to the first common connection node 74. The antenna switch second connection node 136 may be coupled to other circuitry (not shown). The antenna switch third connection node 138 may be coupled to other circuitry (not shown). In another embodiment of the RF antenna switch 130, the antenna switch third connection node 138 is omitted. In a further embodiment of the RF antenna switch 130, the RF antenna switch 130 has at least one additional connection node.

The RF system control circuitry 56 provides a switch control signal SCS to the RF antenna switch 130. As such, the RF system control circuitry 56 selects one of the antenna switch first connection node 134, the antenna switch second connection node 136, and the antenna switch third connection node 138 to be coupled to the antenna switch common connection node 132 using the switch control signal SCS.

The third tunable RF filter path 110 is directly coupled between the first common connection node 74 and the third connection node 114. In one embodiment of the RF communications circuitry 54, the third tunable RF filter path 110 is a second RF receive filter, such that the first RF antenna 16 forwards a received RF signal via the RF antenna switch 130 and the first common connection node 74 to provide the second upstream RF receive signal RU2 to the third tunable RF filter path 110, which receives and filters the second upstream RF receive signal RU2 to provide the second filtered RF receive signal RF2 to the RF receive circuitry 62. The RF receive circuitry 62 processes the second filtered RF receive signal RF2 to provide a second receive signal RX2 to the RF system control circuitry 56.

The RF system control circuitry 56 further provides the third filter control signal FCS3. As such, in one embodiment of the RF communications circuitry 54, the RF system control circuitry 56 tunes a first filter parameter of the third tunable RF filter path 110 using the third filter control signal FCS3. In one embodiment of the RF communications circuitry 54, the RF communications circuitry 54 uses the second tunable RF filter path 68 and the third tunable RF filter path 110 to provide receive CA. In an alternate embodiment of the RF communications circuitry 54, tunable RF filters allow for sharing a signal path to provide both an FDD signal path and a TDD signal path, thereby lowering front-end complexity.

Figure 16:
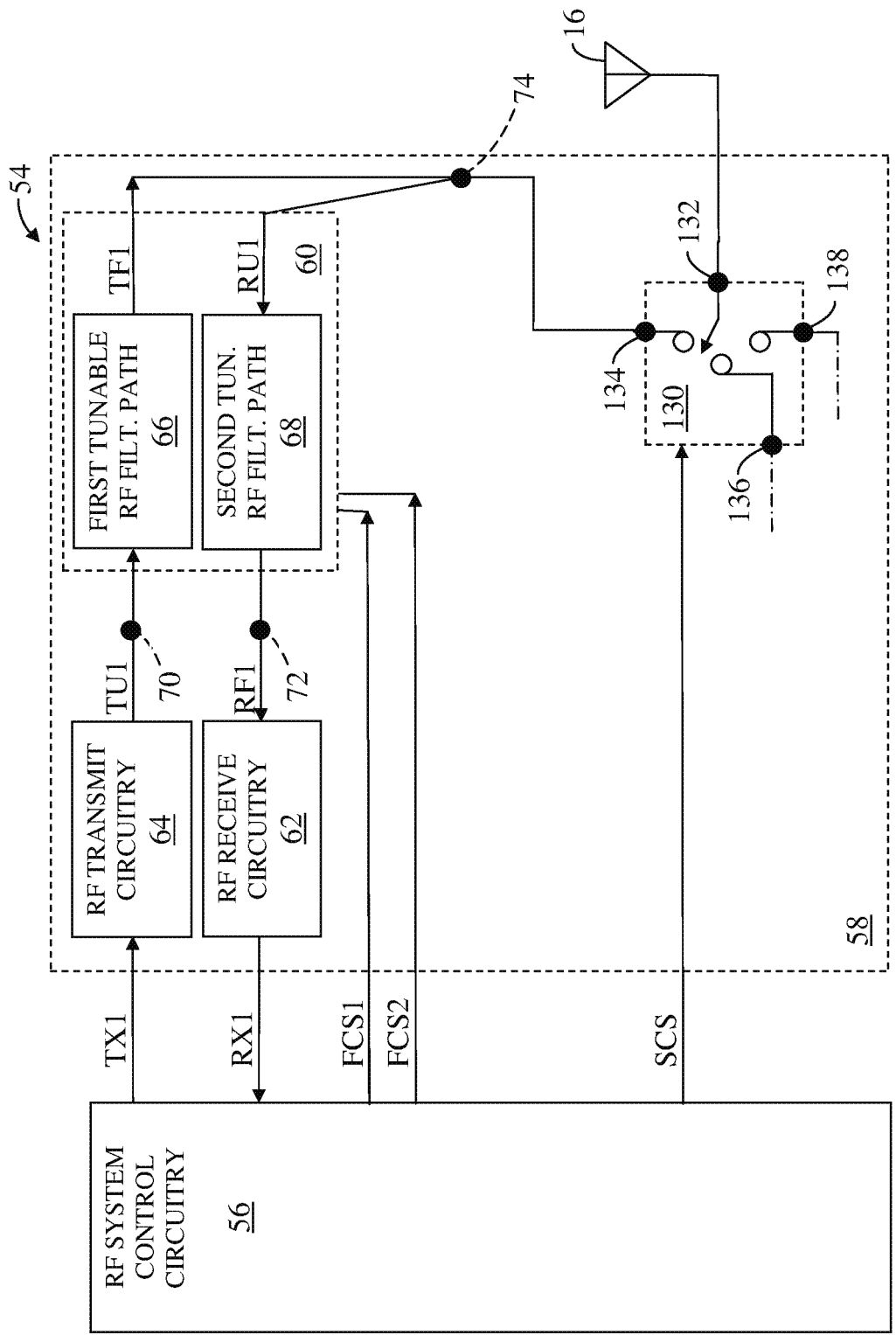
FIG. 16 shows the RF communications circuitry according to one embodiment of the RF communications circuitry.

FIG. 16 shows the RF communications circuitry 54 according to one embodiment of the RF communications circuitry 54. The RF communications circuitry 54 illustrated in FIG. 16 is similar to the RF communications circuitry 54 illustrated in FIG. 15, except in the RF communications circuitry 54 illustrated in FIG. 16, the third tunable RF filter path 110 is omitted. Additionally, in one embodiment of the RF communications circuitry 54, the RF receive circuitry 62, the RF transmit circuitry 64, and the first RF filter structure 60 are all broadband devices. As such, the RF communications circuitry 54 is broadband circuitry capable of processing RF signals having wide frequency ranges.

Figure 17:
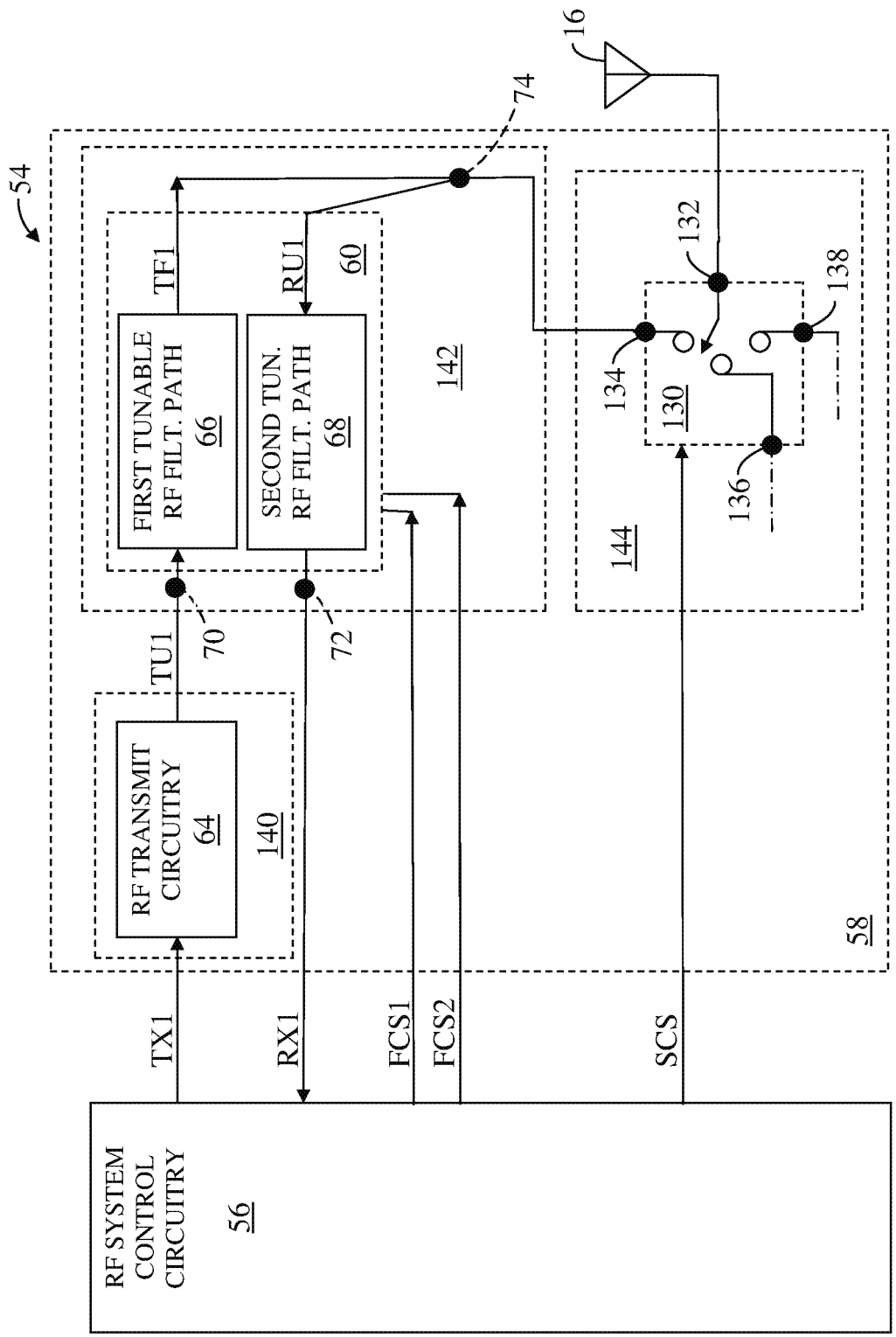
FIG. 17 shows the RF communications circuitry according to an alternate embodiment of the RF communications circuitry.

FIG. 17 shows the RF communications circuitry 54 according to an alternate embodiment of the RF communications circuitry 54. The RF communications circuitry 54 illustrated in FIG. 17 is similar to the RF communications circuitry 54 illustrated in FIG. 16, except in the RF communications circuitry 54 illustrated in FIG. 17, the RF receive circuitry 62 is omitted and the RF front-end circuitry 58 further includes a first RF front-end circuit 140, a second RF front-end circuit 142, and a third RF front-end circuit 144.

The first RF front-end circuit 140 includes the RF transmit circuitry 64. The second RF front-end circuit 142 includes the first RF filter structure 60, the first connection node 70, the second connection node 72, and the first common connection node 74. The third RF front-end circuit 144 includes the RF antenna switch 130. In one embodiment of the first RF front-end circuit 140, the first RF front-end circuit 140 is a first RF front-end integrated circuit (IC). In one embodiment of the second RF front-end circuit 142, the second RF front-end circuit 142 is a second RF front-end IC. In one embodiment of the third RF front-end circuit 144, the third RF front-end circuit 144 is a third RF front-end IC.

Figure 18:
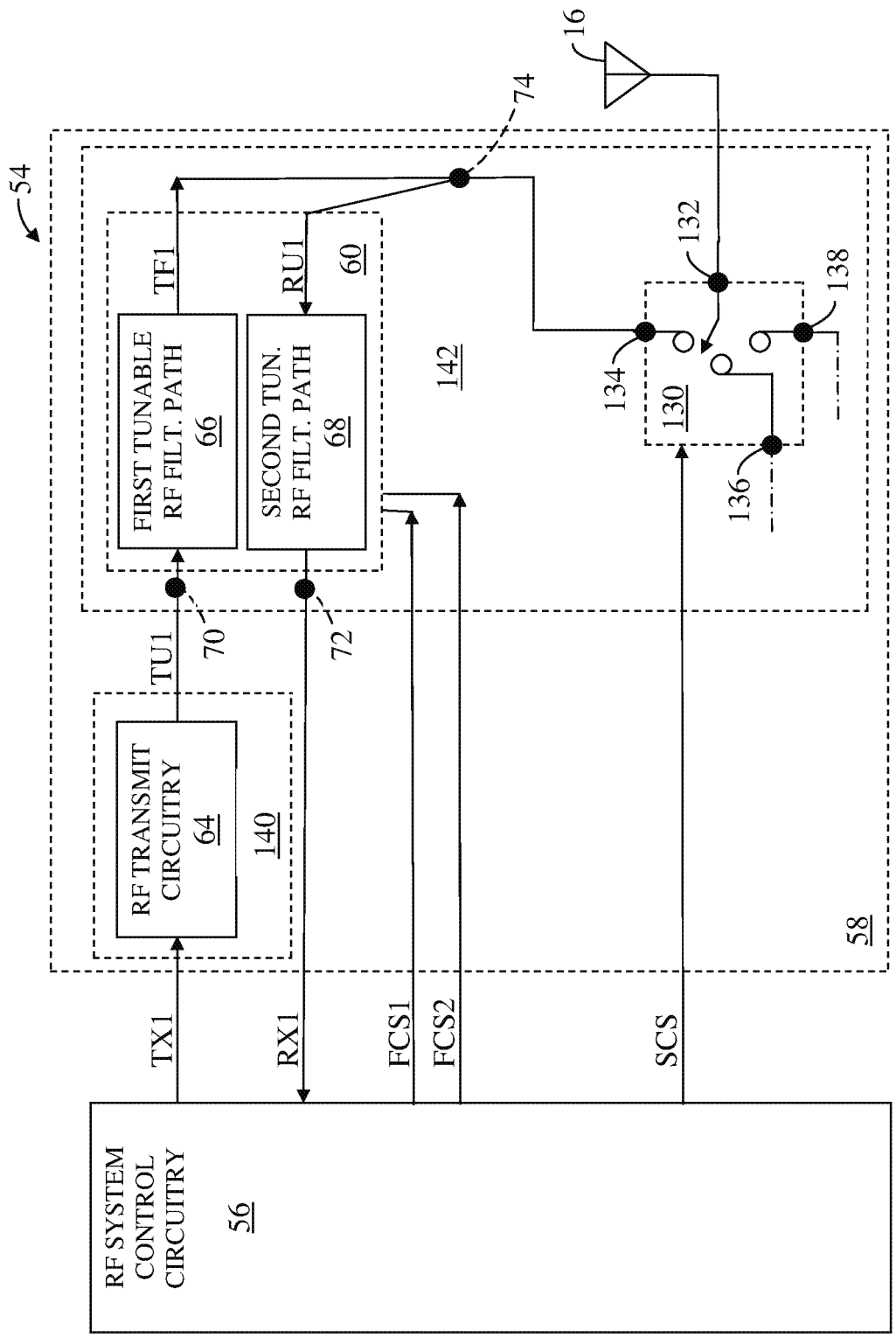
FIG. 18 shows the RF communications circuitry according to an additional embodiment of the RF communications circuitry.

FIG. 18 shows the RF communications circuitry 54 according to an additional embodiment of the RF communications circuitry 54. The RF communications circuitry 54 illustrated in FIG. 18 is similar to the RF communications circuitry 54 illustrated in FIG. 16, except in the RF communications circuitry 54 illustrated in FIG. 18, the RF receive circuitry 62 is omitted and the RF front-end circuitry 58 further includes the first RF front-end circuit 140 and the second RF front-end circuit 142.

The first RF front-end circuit 140 includes the RF transmit circuitry 64. The second RF front-end circuit 142 includes the first RF filter structure 60, the RF antenna switch 130, the first connection node 70, the second connection node 72, and the first common connection node 74. In one embodiment of the first RF front-end circuit 140, the first RF front-end circuit 140 is the first RF front-end IC. In one embodiment of the second RF front-end circuit 142, the second RF front-end circuit 142 is the second RF front-end IC.

Figure 19:
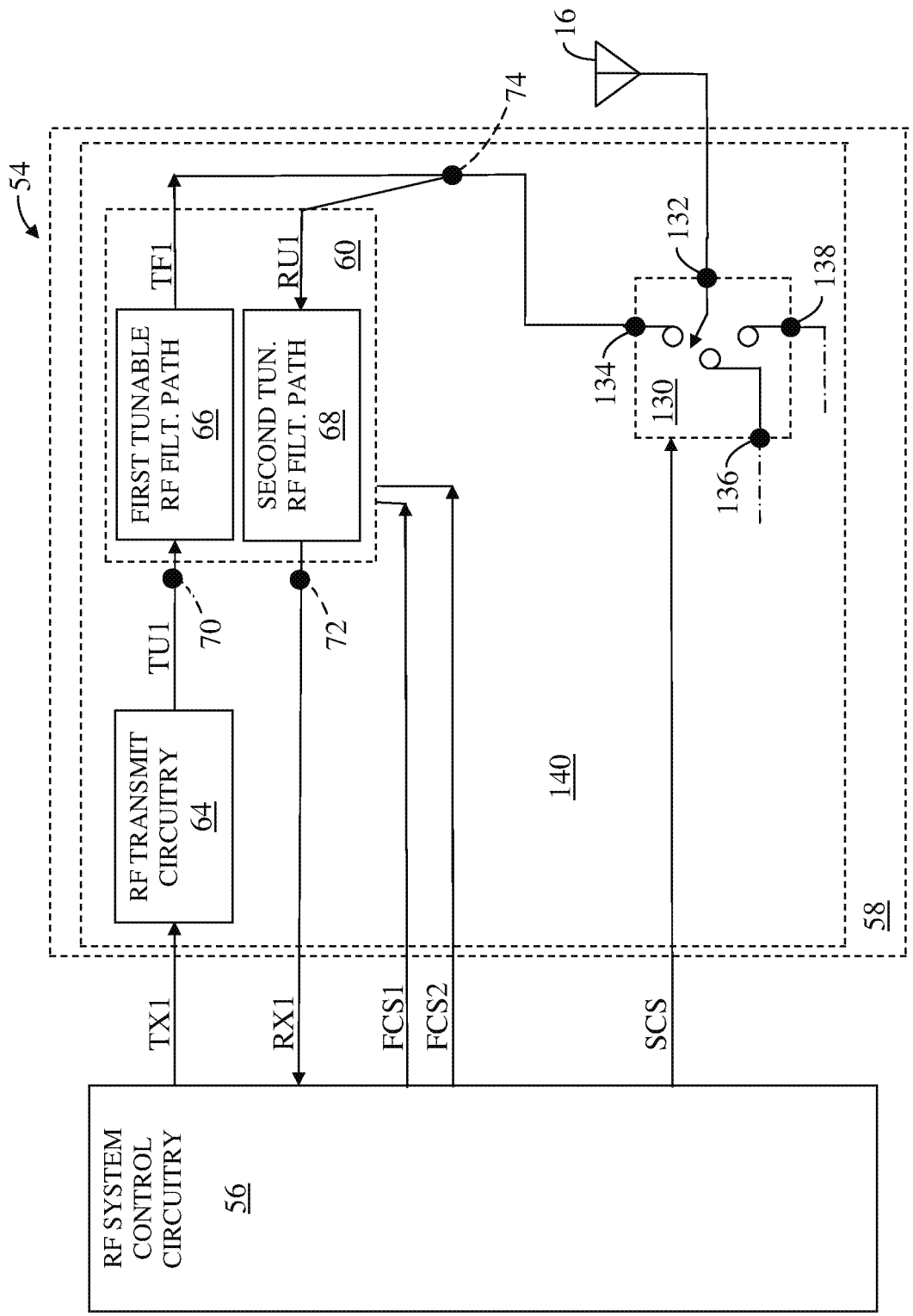
FIG. 19 shows the RF communications circuitry according to another embodiment of the RF communications circuitry.

FIG. 19 shows the RF communications circuitry 54 according to another embodiment of the RF communications circuitry 54. The RF communications circuitry 54 illustrated in FIG. 19 is similar to the RF communications circuitry 54 illustrated in FIG. 16, except in the RF communications circuitry 54 illustrated in FIG. 19, the RF receive circuitry 62 is omitted and the RF front-end circuitry 58 further includes the first RF front-end circuit 140.

The first RF front-end circuit 140 includes the RF transmit circuitry 64, the first RF filter structure 60, the RF antenna switch 130, the first connection node 70, the second connection node 72, and the first common connection node 74. In one embodiment of the first RF front-end circuit 140, the first RF front-end circuit 140 is the first RF front-end IC.

Figure 20:
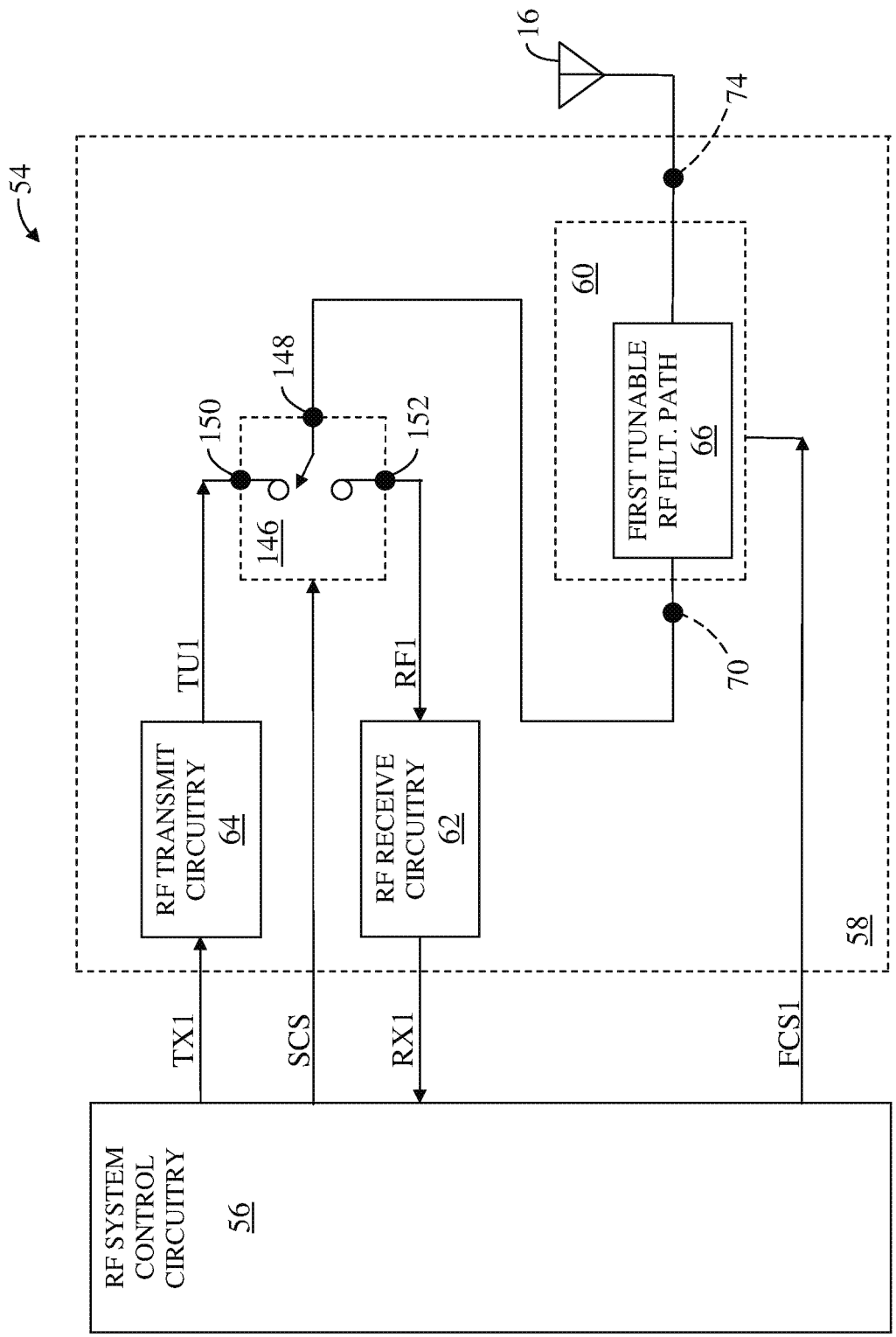
FIG. 20 shows the RF communications circuitry according to a further embodiment of the RF communications circuitry.

FIG. 20 shows the RF communications circuitry 54 according to a further embodiment of the RF communications circuitry 54. The RF communications circuitry 54 illustrated in FIG. 20 is a TDD system, which is capable of transmitting and receiving RF signals, but not simultaneously. As such, the RF communications circuitry 54 illustrated in FIG. 20 is similar to the RF communications circuitry 54 illustrated in FIG. 4, except in the RF communications circuitry 54 illustrated in FIG. 20, the second tunable RF filter path 68 and the second connection node 72 are omitted, and the RF front-end circuitry 58 further includes an RF transmit/receive switch 146 coupled between the first tunable RF filter path 66 and the RF receive circuitry 62, and further coupled between the first tunable RF filter path 66 and the RF transmit circuitry 64.

Since the RF communications circuitry 54 does not simultaneously transmit and receive RF signals, the first tunable RF filter path 66 provides front-end transmit filtering when the RF communications circuitry 54 is transmitting RF signals and the first tunable RF filter path 66 provides front-end receive filtering when the RF communications circuitry 54 is receiving RF signals. In this regard, the first tunable RF filter path 66 processes half-duplex signals.

The RF transmit/receive switch 146 has a transmit/receive switch common connection node 148, a transmit/receive switch first connection node 150, and a transmit/receive switch second connection node 152. The RF receive circuitry 62 is coupled between the RF system control circuitry 56 and the transmit/receive switch second connection node 152. The RF transmit circuitry 64 is coupled between the RF system control circuitry 56 and the transmit/receive switch first connection node 150. The first connection node 70 is coupled to the transmit/receive switch common connection node 148.

The RF system control circuitry 56 provides a switch control signal SCS to the RF transmit/receive switch 146. As such, the RF system control circuitry 56 selects either the transmit/receive switch first connection node 150 or the transmit/receive switch second connection node 152 to be coupled to the transmit/receive switch common connection node 148 using the switch control signal SCS. Therefore, when the RF communications circuitry 54 is transmitting RF signals, the RF transmit circuitry 64 is coupled to the first tunable RF filter path 66 and the RF receive circuitry 62 is not coupled to the first tunable RF filter path 66. Conversely, when the RF communications circuitry 54 is receiving RF signals, the RF receive circuitry 62 is coupled to the first tunable RF filter path 66 and the RF transmit circuitry 64 is not coupled to the first tunable RF filter path 66.

FIG. 21 illustrates an exemplary embodiment of the first RF filter structure 60. The first RF filter structure 60 includes a plurality of resonators (referred to generically as elements R and specifically as elements R(i,j), where an integer i indicates a row position and an integer j indicates a column position, where $1 \leq i \leq M$, $1 \leq j \leq N$ and M is any integer greater than 1 and N is any integer greater than to 1. It should be noted that in alternative embodiments the number of resonators R in each row and column may be the same or different). The first tunable RF filter path 66 includes row 1 of weakly coupled resonators R(1,1), R(1,2) through (R(1,N). All of the weakly coupled resonators R(1,1), R(1,2) through (R(1,N) are weakly coupled to one another. Furthermore, the first tunable RF filter path 66 is electrically connected between terminal 200 and terminal 202. In this manner, the first tunable RF filter path 66 is configured to receive RF signals and output filtered RF signals. The second tunable RF filter path 68 includes row M of weakly coupled resonators R(M,1), R(M,2) through R(M,N). All of the weakly coupled resonators R(M,1), R(M,2) through R(M,N) are weakly coupled to one another. Furthermore, the second tunable RF filter path 68 is electrically connected between terminal 204 and terminal 206. In this manner, the second tunable RF filter path 68 is configured to receive RF signals and output filtered RF signals. It should be noted that the first RF filter structure 60 may include any number of tunable RF filter paths, such as, for example, the third tunable RF filter path 110, the fourth tunable RF filter path 112, the fifth tunable RF filter path 122, and the sixth tunable RF filter path 124, described above with respect to FIGS. 11-14. Each of the resonators R may be a tunable resonator, which allows for a resonant frequency of each of the resonators R to be varied to along a frequency range. In some embodiments, not all of the couplings between the resonators R are weak. A hybrid architecture having at least one pair of weakly coupled resonators R and strongly or moderately coupled resonators R is also possible.

Cross-coupling capacitive structures C are electrically connected to and between the resonators R. In this embodiment, each of the cross-coupling capacitive structures C is a variable cross-coupling capacitive structure, such as a varactor or an array of capacitors. To be independent, the magnetic couplings may be negligible. Alternatively, the cross-coupling capacitive structures C may simply be provided by a capacitor with a fixed capacitance. With regard to the exemplary embodiment shown in FIG. 21, the tunable RF filter paths of the first RF filter structure 60 are independent of one another. As such, the first tunable RF filter path 66 and the second tunable RF filter path 68 are independent of one another and thus do not have cross-coupling capacitive structures C between their resonators. Thus, in this embodiment, the cross-coupling capacitive structures C do not connect any of the weakly coupled resonators R(1,1), R(1,2) through (R(1,N) to any of the weakly coupled resonators R(M,1), R(M,2) through (R(M,N). This provides increased isolation between the first tunable RF filter path 66 and the second tunable RF filter path 68. In general, energy transfer between two weakly coupled resonators R in the first tunable RF filter path 66 and the second tunable RF filter path 68 may be provided by multiple energy transfer components. For example, energy may be transferred between the resonators R only through mutual magnetic coupling, only through mutual electric coupling, or through both mutual electric coupling and mutual magnetic coupling. Ideally, all of the mutual coupling coefficients are provided as designed, but in practice, the mutual coupling coefficients also be the result of parasitics. The inductors of the resonators R may also have magnetic coupling between them. A total coupling between the resonators R is given by the sum of magnetic and electric coupling.

In order to provide the transfer functions of the tunable RF filter paths 66, 68 with high out-of-band attenuation and a relatively low filter order, the tunable RF filter paths 66, 68 are configured to adjust notches in the transfer function, which are provided by the resonators R within the tunable RF filter paths 66, 68. The notches can be provided using parallel tanks connected in series or in shunt along a signal path of the first tunable RF filter path 66. To provide the notches, the parallel tanks operate approximately as an open circuit or as short circuits at certain frequencies. The notches can also be provided using multi-signal path cancellation. In this case, the tunable RF filter paths 66, 68 may be smaller and/or have fewer inductors. To tune the total mutual coupling coefficients between the resonators R towards a desired value, the tunable RF filter paths 66, 68 are configured to vary variable electric coupling coefficients so that parasitic couplings between the resonators R in the tunable RF filter paths 66, 68 are absorbed into a desired frequency transfer function.

FIG. 22 illustrates an exemplary embodiment of the first tunable RF filter path 66 in the first RF filter structure 60 shown in FIG. 21. While the exemplary embodiment shown in FIG. 22 is of the first tunable RF filter path 66, any of the tunable RF filter paths shown in the first RF filter structure 60 of FIG. 21 may be arranged in accordance with the exemplary embodiment shown in FIG. 22. The first tunable RF filter path 66 shown in FIG. 22 includes an embodiment of the resonator R(1,1) and an embodiment of the resonator R(1,2). The resonator R(1,1) and the resonator R(1,2) are weakly coupled to one another. More specifically, the resonator R(1,1) includes an inductor 208 and a capacitive structure 210. The resonator R(1,2) includes an inductor 212, a capacitive structure 214, and a capacitive structure 216.

The resonator R(1,1) and the resonator R(1,2) are a pair of weakly coupled resonators. The resonator R(1,1) and the resonator R(1,2) are weakly coupled by providing the inductor 208 and the inductor 212 such that the inductor 208 and the inductor 212 are weakly magnetically coupled. Although the resonator R(1,1) and the resonator R(1,2) are weakly coupled, the inductor 212 has a maximum lateral width and a displacement between the inductor 208 and the inductor 212 is less than or equal to half the maximum lateral width of the inductor 212. As such, the inductor 208 and the inductor 212 are relatively close to one another. The displacement between the inductor 208 and the inductor 212 may be measured from a geometric centroid of the inductor 208 to a geometric centroid of the inductor 212. The maximum lateral width may be a maximum dimension of the inductor 212 along a plane defined by its largest winding. The weak coupling between the inductor 208 and the inductor 212 is obtained through topological techniques. For example, the inductor 208 and the inductor 212 may be fully or partially aligned, where winding(s) of the inductor 208 and winding(s) of the inductor 212 are configured to provide weak coupling through cancellation. Alternatively or additionally, a plane defining an orientation of the winding(s) of the inductor 208 and a plane defining an orientation of the winding(s) of the inductor 212 may be fully or partially orthogonal to one another. Some of the magnetic couplings between the resonators R can be unidirectional (passive or active). This can significantly improve isolation (e.g., transmit and receive isolation in duplexers).

To maximize the quality (Q) factor of the tunable RF filter paths 66 through 68, most of the total mutual coupling should be realized magnetically, and only fine-tuning is provided electrically. This also helps to reduce common-mode signal transfer in the differential resonators and thus keeps the Q factor high. While the magnetic coupling can be adjusted only statically, with a new layout design, the electric coupling can be tuned on the fly (after fabrication). The filter characteristics (e.g., bias network structure, resonator capacitance) can be adjusted based on given coupling coefficients to maximize filter performance.

To provide a tuning range to tune a transfer function of the first tunable RF filter path 66 and provide a fast roll-off from a low-frequency side to a high-frequency side of the transfer function, the first tunable RF filter path 66 is configured to change a sign of a total mutual coupling coefficient between the resonator R(1,1) and the resonator R(1,2). Accordingly, the first tunable RF filter path 66 includes a cross-coupling capacitive structure C(P1) and a cross-coupling capacitive structure C(N1). The cross-coupling capacitive structure C(P1) and the cross-coupling capacitive structure C(N1) are embodiments of the cross-coupling capacitive structures C described above with regard to FIG. 21. As shown in FIG. 22, the cross-coupling capacitive structure C(P1) is electrically connected between the resonator R(1,1) and the resonator R(1,2) so as to provide a positive coupling coefficient between the resonator R(1,1) and the resonator R(1,2). The cross-coupling capacitive structure C(P1) is a variable cross-coupling capacitive structure configured to vary the positive coupling coefficient provided between the resonator R(1,1) and the resonator R(1,2). The cross-coupling capacitive structure C(N1) is electrically connected between the resonator R(1,1) and the resonator R(1,2) so as to provide a negative coupling coefficient between the resonator R(1,1) and the resonator R(1,2). The cross-coupling capacitive structure C(N1) is a variable cross-coupling capacitive structure configured to vary the negative coupling coefficient provided between the resonator R(1,1) and the resonator R(1,2). The arrangement of the cross-coupling capacitive structure C(P1) and the cross-coupling capacitive structure C(N1) shown in FIG. 22 is a V-bridge structure. In alternative embodiments, some or all of the cross-coupling capacitive structures is fixed (not variable).

In the resonator R(1,1), the inductor 208 and the capacitive structure 210 are electrically connected in parallel. More specifically, the inductor 208 has an end 217 and an end 218, which are disposed opposite to one another. The ends 217, 218 are each electrically connected to the capacitive structure 210, which is grounded. Thus, the resonator R(1,1) is a single-ended resonator. On the other hand, the inductor 212 is electrically connected between the capacitive structure 214 and the capacitive structure 216. More specifically, the inductor 212 has an end 220 and an end 222, which are disposed opposite to one another. The end 220 is electrically connected to the capacitive structure 214 and the end 222 is electrically connected to the capacitive structure 216. Both the capacitive structure 214 and the capacitive structure 216 are grounded. Thus, the resonator R(1,2) is a differential resonator. In an alternative, an inductor with a center tap can be used. The tap can be connected to ground and only a single capacitive structure can be used. In yet another embodiment, both an inductor and a capacitive structure may have a center tap that is grounded. In still another embodiment, neither the inductor nor the capacitive structure may have a grounded center tap.

The inductor 208 is magnetically coupled to the inductor 212 such that an RF signal received at the end 217 of the inductor 208 with a voltage polarity (i.e., either a positive voltage polarity or a negative voltage polarity) results in a filtered RF signal being transmitted out the end 220 of the inductor 212 with the same voltage polarity. Also, the inductor 212 is magnetically coupled to the inductor 208 such that an RF signal received at the end 220 of the inductor 212 with a voltage polarity (i.e., either a positive voltage polarity or a negative voltage polarity) results in a filtered RF signal being transmitted out the end 217 of the inductor 208 with the same voltage polarity. This is indicated in FIG. 22 by the dot convention where a dot is placed at the end 217 of the inductor 208 and a dot is placed at the end 220 of the inductor 212. By using two independent and adjustable coupling coefficients (i.e., the positive coupling coefficient and the negative coupling coefficient) with the resonator R(1,2) (i.e., the differential resonator), the transfer function of the first tunable RF filter path 66 is provided so as to be fully adjustable. More specifically, the inductors 208, 212 may be magnetically coupled so as to have a low magnetic coupling coefficient through field cancellation, with the variable positive coupling coefficient and the variable negative coupling coefficient. In this case, the inductor 208 and the inductor 212 are arranged such that a mutual magnetic coupling between the inductor 208 and the inductor 212 cancel. Alternatively, the inductor 208 and the inductor 212 are arranged such that the inductor 212 reduces a mutual magnetic coupling coefficient of the inductor 208. With respect to the magnetic coupling coefficient, the variable positive coupling coefficient is a variable positive electric coupling coefficient and the variable negative coupling coefficient is a variable negative electric coupling coefficient. The variable positive electric coupling coefficient and the variable negative electric coupling coefficient oppose each other to create a tunable filter characteristic.

The resonator R(1,2) is operably associated with the resonator R(1,1) such that an energy transfer factor between the resonator R(1,1) and the resonator R(1,2) is less than 10%. A total mutual coupling between the resonator R(1,1) and the resonator R(1,2) is provided by a sum total of the mutual magnetic factor between the resonator R(1,1) and the resonator R(1,2) and the mutual electric coupling coefficients between the resonator R(1,1) and the resonator R(1, 2). In this embodiment, the mutual magnetic coupling coefficient between the inductor 208 and the inductor 212 is a fixed mutual magnetic coupling coefficient. Although embodiments of the resonators R(1,1), R(1,2) may be provided so as to provide a variable magnetic coupling coefficient between the resonators R(1,1), R(1,2), embodiments of the resonators R(1,1), R(1,2) that provide variable magnetic couplings can be costly and difficult to realize. However, providing variable electric coupling coefficients (i.e., the variable positive electric coupling coefficient and the variable electric negative coupling coefficient) is easier and more economical. Thus, using the cross-coupling capacitive structure C(P1) and the cross-coupling capacitive structure C(N1) to provide the variable positive electric coupling coefficient and the variable electric negative coupling coefficient is an economical technique for providing a tunable filter characteristic between the resonators R(1,1), R(1,2). Furthermore, since the mutual magnetic coupling coefficient between the inductor 208 and the inductor 212 is fixed, the first tunable RF filter path 66 has lower insertion losses.

In the embodiment shown in FIG. 22, the inductor 208 and the 212 inductor are the same size. Alternatively, the inductor 208 and the inductor 212 may be different sizes. For example, the inductor 212 may be smaller than the inductor 208. By determining a distance between the inductor 208 and the inductor 212, the magnetic coupling coefficient between the inductor 208 and the inductor 212 can be set. With regard to the inductors 208, 212 shown in FIG. 22, the inductor 208 may be a folded inductor configured to generate a first confined magnetic field, while the inductor 212 may be a folded inductor configured to generate a second confined magnetic field. Magnetic field lines of the first confined magnetic field and of the second confined magnetic field that are external to the inductor 208 and inductor 212 are cancelled by opposing magnetic field lines in all directions. When the inductor 208 and the inductor 212 are folded inductors, the folded inductors can be stacked. This allows building the first tunable RF filter path 66 such that several inductors 208, 212 are stacked. Furthermore, this arrangement allows for a specially sized interconnect structure that electrically connects the inductors 208, 212 to the capacitive structure 210, the capacitive structure 214, the capacitive structure 216, the cross-coupling capacitive structure C(P1), and the cross-coupling capacitive structure C(N1). The specially sized interconnect increases the Q factor of the capacitive structure 210, the capacitive structure 214, the capacitive structure 216, the cross-coupling capacitive structure C(P1), and the cross-coupling capacitive structure C(N1), and allows for precise control of their variable capacitances. Weakly coupled filters can also be realized with planar field cancellation structures.

Figure 23:
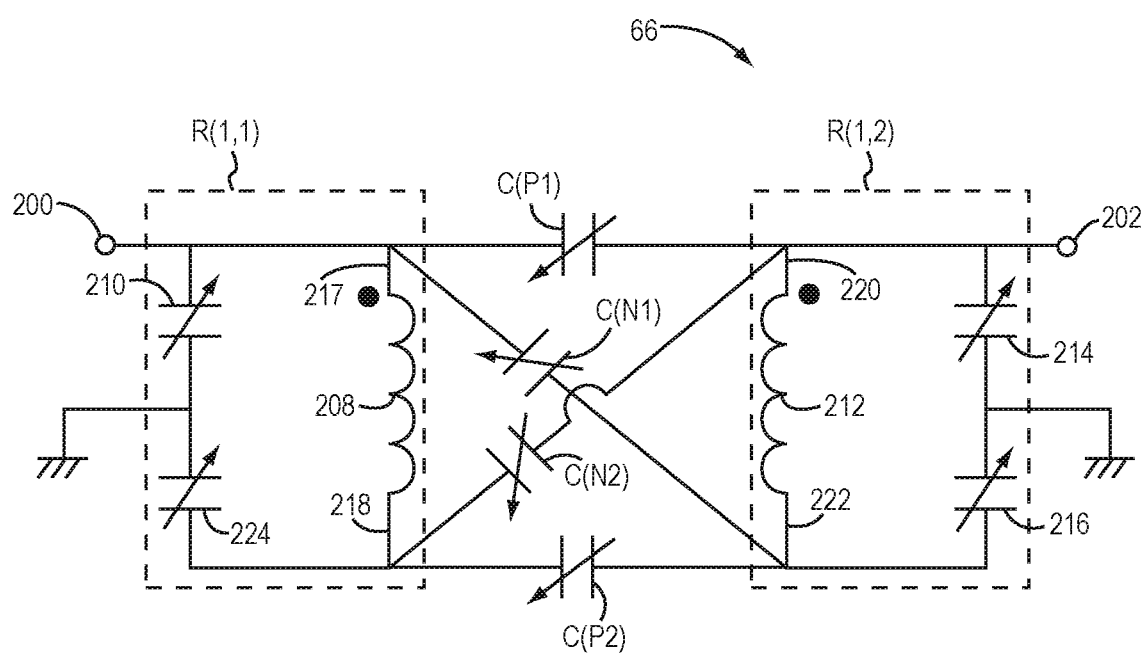
FIG. 23 illustrates another embodiment of the tunable RF filter path shown in FIG. 21 having cross-coupling capacitors arranged in an X-bridge structure.

FIG. 23 illustrates an exemplary embodiment of the first tunable RF filter path 66 in the first RF filter structure 60 shown in FIG. 21. While the exemplary embodiment shown in FIG. 23 is of the first tunable RF filter path 66, any of the tunable RF filter paths shown in the first RF filter structure 60 of FIG. 21 may be arranged in accordance with the exemplary embodiment shown in FIG. 23. The first tunable RF filter path 66 shown in FIG. 23 includes an embodiment of the resonator R(1,1) and an embodiment of the resonator R(1,2). The resonator R(1,1) and the resonator R(1,2) are weakly coupled to one another. The embodiment of the resonator R(1,2) is the same as the embodiment of the resonator R(1,2) shown in FIG. 22. Thus, the resonator R(1,2) shown in FIG. 23 is a differential resonator that includes the inductor 212, the capacitive structure 214, and the capacitive structure 216. Additionally, like the embodiment of the resonator R(1,1) shown in FIG. 22, the embodiment of the resonator R(1,1) shown in FIG. 23 includes the inductor 208 and the capacitive structure 210. However, in this embodiment, the resonator R(1,1) shown in FIG. 23 is a differential resonator and further includes a capacitive structure 224. More specifically, the end 217 of the inductor 208 is electrically connected to the capacitive structure 210 and the end 218 of the inductor 208 is electrically connected to the capacitive structure 224. Both the capacitive structure 210 and the capacitive structure 224 are grounded. Like the capacitive structure 210, the capacitive structure 224 is also a variable capacitive structure, such as a programmable array of capacitors or a varactor. Alternatively, a center tap of an inductor may be grounded. In yet another embodiment, the inductor and a capacitive structure may be RF floating (a low-resistance connection to ground).

The resonator R(1,1) and the resonator R(1,2) are a pair of weakly coupled resonators. Like the first tunable RF filter path 66 shown in FIG. 22, the resonator R(1,1) and the resonator R(1,2) are weakly coupled by providing the inductor 208 and the inductor 212 such that the inductor 208 and the inductor 212 are weakly coupled. Thus, the inductor 208 and the inductor 212 may have a magnetic coupling coefficient that is less than or equal to approximately 0.3. Although the resonator R(1,1) and the resonator R(1,2) are weakly coupled, a displacement between the inductor 208 and the inductor 212 is less than or equal to half the maximum lateral width of the inductor 212. As such, the inductor 208 and the inductor 212 are relatively close to one another. The displacement between the inductor 208 and the inductor 212 may be measured from a geometric centroid of the inductor 208 to a geometric centroid of the inductor 212. The maximum lateral width may be a maximum dimension of the inductor 212 along a plane defined by its largest winding.

The weak coupling between the inductor 208 and the inductor 212 is obtained through topological techniques. For example, the inductor 208 and the inductor 212 may be fully or partially aligned, where winding(s) of the inductor 208 and winding(s) of the inductor 212 are configured to provide weak coupling through cancellation. Alternatively or additionally, a plane defining an orientation of the windings of the inductor 208 and a plane defining an orientation of the windings of the inductor 212 may be fully or partially orthogonal to one another.

The resonator R(1,2) is operably associated with the resonator R(1,1) such that an energy transfer factor between the resonator R(1,1) and the resonator R(1,2) is less than 10%. To provide a tuning range to tune a transfer function of the first tunable RF filter path 66 such to provide a fast roll-off from a low-frequency side to a high-frequency side requires changing a sign of the total mutual coupling coefficient between the resonator R(1,1) and the resonator R(1, 2). Like the embodiment of the first tunable RF filter path 66 shown in FIG. 22, the first tunable RF filter path 66 shown in FIG. 23 includes the cross-coupling capacitive structure C(P1) and the cross-coupling capacitive structure C(N1). The cross-coupling capacitive structure C(P1) and the cross-coupling capacitive structure C(N1) are arranged in the same manner described above with respect to FIG. 22. However, in this embodiment, the first tunable RF filter path 66 shown in FIG. 23 also includes a cross-coupling capacitive structure C(P2) and a cross-coupling capacitive structure C(N2). The cross-coupling capacitive structure C(P2) and the cross-coupling capacitive structure C(N2) are also embodiments of the cross-coupling capacitive structures C described above with regard to FIG. 21.

As described above with respect to FIG. 22, the cross-coupling capacitive structure C(P1) is electrically connected between the resonator R(1,1) and the resonator R(1,2) so as to provide the positive coupling coefficient (i.e., the variable positive electric coupling coefficient) between the resonator R(1,1) and the resonator R(1,2). Also as described above with respect to FIG. 22, the cross-coupling capacitive structure C(N1) is electrically connected between the resonator R(1,1) and the resonator R(1,2) so as to provide the negative coupling coefficient (i.e., the variable negative electric coupling coefficient) between the resonator R(1,1) and the resonator R(1,2). With regard to the cross-coupling capacitive structure C(P2), the cross-coupling capacitive structure C(P2) is electrically connected between the resonator R(1,1) and the resonator R(1,2) so as to provide another positive coupling coefficient (i.e., another variable positive electric coupling coefficient) between the resonator R(1,1) and the resonator R(1,2). In this embodiment, the cross-coupling capacitive structure C(P2) is electrically connected between the end 218 of the inductor 208 and the end 222 of the inductor 212. The cross-coupling capacitive structure C(P2) is a variable cross-coupling capacitive structure configured to vary the other positive coupling coefficient (i.e., the other variable positive electric coupling coefficient) provided between the resonator R(1,1) and the resonator R(1,2). With regard to the cross-coupling capacitive structure C(N2), the cross-coupling capacitive structure C(N2) is electrically connected between the resonator R(1,1) and the resonator R(1,2) so as to provide another negative coupling coefficient (i.e., another variable negative electric coupling coefficient) between the resonator R(1,1) and the resonator R(1,2). In this embodiment, the cross-coupling capacitive structure C(N2) is electrically connected between the end 218 of the inductor 208 and the end 220 of the inductor 212. The cross-coupling capacitive structure C(N2) is a variable cross-coupling capacitive structure configured to vary the negative coupling coefficient (i.e., the other variable negative electric coupling coefficient) provided between the resonator R(1,1) and the resonator R(1,2). The arrangement of the cross-coupling capacitive structure C(P1), the cross-coupling capacitive structure C(N1), the cross-coupling capacitive structure C(P2), and the cross-coupling capacitive structure C(N2) shown in FIG. 23 is an X-bridge structure.

As shown in FIG. 23, the resonator R(1,2) is operably associated with the resonator R(1,1) such that an energy transfer factor between the resonator R(1,1) and the resonator R(1,2) is less than 10%. The total mutual coupling between the resonator R(1,1) and the resonator R(1,2) is provided by a sum total of the mutual magnetic factor between the resonator R(1,1) and the resonator R(1,2) and the mutual electric coupling coefficients between the resonator R(1,1) and the resonator R(1,2). Thus, in this embodiment, the total mutual coupling between the resonator R(1,1) and the resonator R(1,2) is provided by the sum total of the mutual magnetic coupling coefficient, the variable positive electric coupling coefficient provided by the cross-coupling capacitive structure C(P1), the variable negative electric coupling coefficient provided by the cross-coupling capacitive structure C(N1), the other variable positive electric coupling coefficient provided by the cross-coupling capacitive structure C(P2), and the other variable negative electric coupling coefficient provided by the cross-coupling capacitive structure C(N2).

Figure 24:
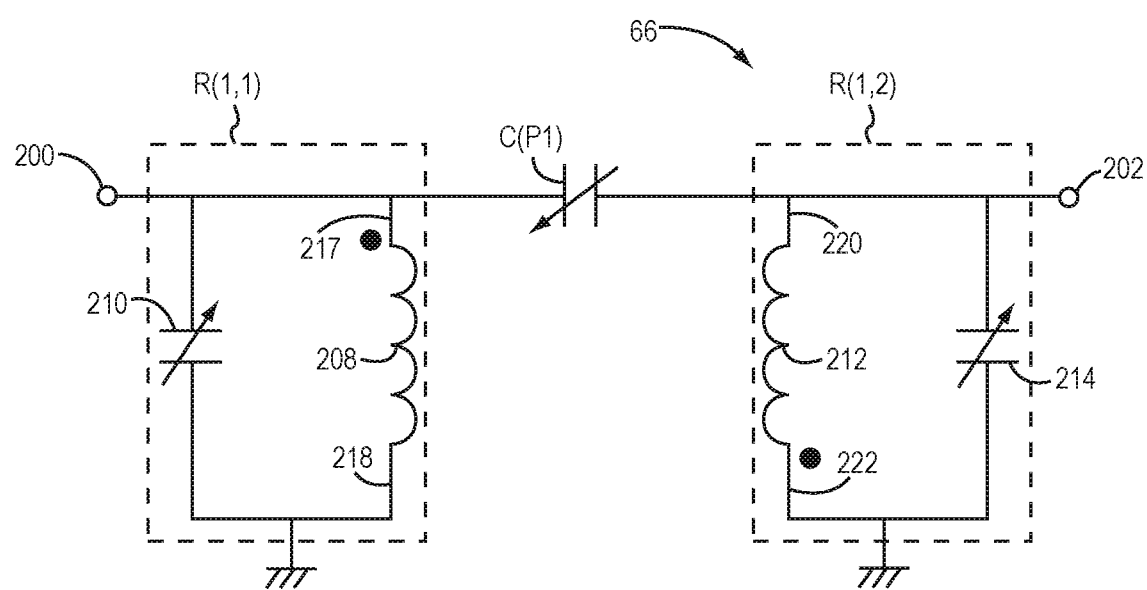
FIG. 24 illustrates another embodiment of the tunable RF filter path shown in FIG. 21 having a cross-coupling capacitor arranged in a single positive bridge structure.

FIG. 24 illustrates an exemplary embodiment of the first tunable RF filter path 66 in the first RF filter structure 60 shown in FIG. 21. While the exemplary embodiment shown in FIG. 24 is of the first tunable RF filter path 66, any of the tunable RF filter paths shown in the first RF filter structure 60 of FIG. 21 may be arranged in accordance with the exemplary embodiment shown in FIG. 24. The first tunable RF filter path 66 shown in FIG. 24 includes an embodiment of the resonator R(1,1) and an embodiment of the resonator R(1,2). The resonator R(1,1) and the resonator R(1,2) are weakly coupled to one another. The embodiment of the resonator R(1,1) is the same as the embodiment of the resonator R(1,1) shown in FIG. 22. Thus, the resonator R(1,1) shown in FIG. 24 is a single-ended resonator that includes the inductor 208 and the capacitive structure 210. Additionally, like the embodiment of the resonator R(1,2) shown in FIG. 22, the embodiment of the resonator R(1,2) shown in FIG. 24 includes the inductor 212 and the capacitive structure 214. However, in this embodiment, the resonator R(1,2) shown in FIG. 24 is a single-ended resonator. More specifically, the end 220 and the end 222 of the inductor 212 are each electrically connected to the capacitive structure 214, which is grounded.

The resonator R(1,1) and the resonator R(1,2) are a pair of weakly coupled resonators. Like the first tunable RF filter path 66 shown in FIG. 22, the resonator R(1,1) and the resonator R(1,2) are weakly coupled by providing the inductor 208 and the inductor 212 such that the inductor 208 and the inductor 212 are weakly coupled. Thus, the inductor 208 and the inductor 212 may have a magnetic coupling coefficient that is less than or equal to approximately 0.3. Although the resonator R(1,1) and the resonator R(1,2) are weakly coupled, the displacement between the inductor 208 and the inductor 212 is less than or equal to half the maximum lateral width of the inductor 212. As such, the inductor 208 and the inductor 212 are relatively close to one another. The displacement between the inductor 208 and the inductor 212 may be measured from the geometric centroid of the inductor 208 to the geometric centroid of the inductor 212. The maximum lateral width may be a maximum dimension of the inductor 212 along a plane defined by its largest winding. The weak coupling between the inductor 208 and the inductor 212 is obtained through topological techniques. For example, the inductor 208 and the inductor 212 may be fully or partially aligned, where winding(s) of the inductor 208 and winding(s) of the inductor 212 are configured to provide weak coupling through cancellation. Alternatively or additionally, a plane defining an orientation of the windings of the inductor 208 and a plane defining an orientation of the windings of the inductor 212 may be fully or partially orthogonal to one another.

The resonator R(1,2) is operably associated with the resonator R(1,1) such that an energy transfer factor between the resonator R(1,1) and the resonator R(1,2) is less than 10%. To provide a tuning range to tune a transfer function of the first tunable RF filter path 66 and provide a fast roll-off from a low-frequency side to a high-frequency side of the transfer function, the first tunable RF filter path 66 is configured to change a sign of a total mutual coupling coefficient between the resonator R(1,1) and the resonator R(1,2). However, in this embodiment, the first tunable RF filter path 66 shown in FIG. 24 only includes the cross-coupling capacitive structure C(P1), which is electrically connected between the end 217 of the inductor 208 and the end 220 of the inductor 212. As discussed above with respect to FIGS. 22 and 23, the cross-coupling capacitive structure C(P1) is a variable cross-coupling capacitive structure configured to vary the positive coupling coefficient (i.e., the variable positive electric coupling coefficient) provided between the resonator R(1,1) and the resonator R(1,2). Thus, in order to allow for the sign of the total mutual coupling coefficient between the resonator R(1,1) and the resonator R(1,2) to be changed, the inductor 208 and the inductor 212 are arranged so as to provide a fixed negative mutual magnetic coupling coefficient between the inductor 208 of the resonator R(1,1) and the inductor 212 of the resonator R(1,2). As such, varying the variable positive electric coupling coefficient allows for the sign of the total mutual coupling coefficient between the resonator R(1,1) and the resonator R(1,2) to be changed using only the cross-coupling capacitive structure C(P1).

As such, in this embodiment, the inductor 208 is magnetically coupled to the inductor 212 such that an RF signal received at the end 217 of the inductor 208 with a voltage polarity (i.e., either a positive voltage polarity or a negative voltage polarity) results in a filtered RF signal with the same voltage polarity being transmitted out the end 222 of the inductor 212. In addition, the inductor 212 is magnetically coupled to the inductor 208 such that an RF signal received at the end 222 of the inductor 212 with a voltage polarity (i.e., either a positive voltage polarity or a negative voltage polarity) results in a filtered RF signal with the same voltage polarity being transmitted out the end 217 of the inductor 208. This is indicated in FIG. 24 by the dot convention where a dot is placed at the end 217 of the inductor 208 and a dot is placed at the end 222 of the inductor 212. By using the fixed negative mutual magnetic coupling coefficient and the variable positive electric coupling coefficient, the transfer function of the first tunable RF filter path 66 is provided so to be fully adjustable. The arrangement of the cross-coupling capacitive structure C(P1) shown in FIG. 24 is a single positive bridge structure.

Figure 25:
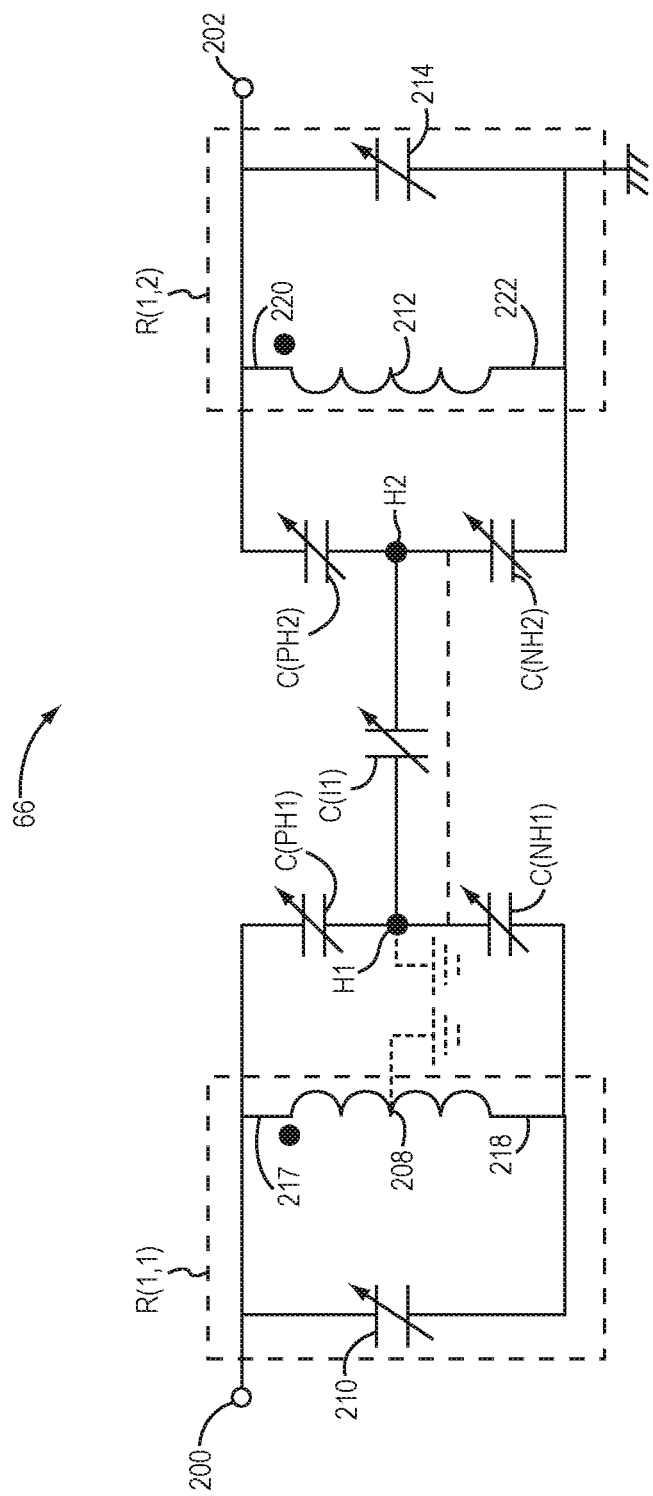
FIG. 25 illustrates another embodiment of the tunable RF filter path shown in FIG. 21 having cross-coupling capacitors arranged in an H-bridge structure.

FIG. 25 illustrates another exemplary embodiment of the first tunable RF filter path 66 in the first RF filter structure 60 shown in FIG. 21. While the exemplary embodiment shown in FIG. 25 is of the first tunable RF filter path 66, any of the tunable RF filter paths shown in the first RF filter structure 60 of FIG. 21 may be arranged in accordance with the exemplary embodiment shown in FIG. 25. The first tunable RF filter path 66 shown in FIG. 25 includes an embodiment of the resonator R(1,1) and an embodiment of the resonator R(1,2). The resonator R(1,1) and the resonator R(1,2) are weakly coupled to one another. The embodiment of the resonator R(1,1) is the same as the embodiment of the resonator R(1,1) shown in FIG. 22. Thus, the resonator R(1,1) shown in FIG. 25 is a single-ended resonator that includes the inductor 208 and the capacitive structure 210, which are arranged in the same manner described above with respect to FIG. 22. Like the resonator R(1,2) shown in FIG. 24, the resonator R(1,2) shown in FIG. 25 is a single-ended resonator that includes the inductor 212 and the capacitive structure 214. However, the inductor 208 shown in FIG. 25 is magnetically coupled to the inductor 212 such that an RF signal received at the end 217 of the inductor 208 with a voltage polarity (i.e., either a positive voltage polarity or a negative voltage polarity) results in a filtered RF signal with the same voltage polarity being transmitted out the end 220 of the inductor 212. Also, the inductor 212 shown in FIG. 25 is magnetically coupled to the inductor 208 such that an RF signal received at the end 220 of the inductor 212 with a voltage polarity (i.e., either a positive voltage polarity or a negative voltage polarity) results in a filtered RF signal with the same voltage polarity being transmitted out the end 217 of the inductor 208. This is indicated in FIG. 25 by the dot convention where a dot is placed at the end 217 of the inductor 208 and a dot is placed at the end 220 of the inductor 212. In alternative embodiments, the resonator R(1,2) is a differential resonator. In yet another alternative embodiment, the resonator R(1,1) is a single-ended resonator while the resonator R(1,2) is a differential resonator.

The resonator R(1,1) and the resonator R(1,2) are a pair of weakly coupled resonators. Like the first tunable RF filter path 66 shown in FIG. 22, the resonator R(1,1) and the resonator R(1,2) are weakly coupled by providing the inductor 208 and the inductor 212 such that the inductor 208 and the inductor 212 are weakly coupled. Thus, the inductor 208 and the inductor 212 may have a fixed magnetic coupling coefficient that is less than or equal to approximately 0.3. Although the resonator R(1,1) and the resonator R(1,2) are weakly coupled, a displacement between the inductor 208 and the inductor 212 is less than or equal to half the maximum lateral width of the inductor 212. As such, the inductor 208 and the inductor 212 are relatively close to one another. The displacement between the inductor 208 and the inductor 212 may be measured from a geometric centroid of the inductor 208 to a geometric centroid of the inductor 212. The maximum lateral width may be a maximum dimension of the inductor 212 along a plane defined by its largest winding.

The weak coupling between the inductor 208 and the inductor 212 is obtained through topological techniques. For example, the inductor 208 and the inductor 212 may be fully or partially aligned, where winding(s) of the inductor 208 and winding(s) of the inductor 212 are configured to provide weak coupling through cancellation. Alternatively or additionally, a plane defining an orientation of the windings of the inductor 208 and a plane defining an orientation of the windings of the inductor 212 may be fully or partially orthogonal to one another.

The resonator R(1,2) is operably associated with the resonator R(1,1) such that an energy transfer factor between the resonator R(1,1) and the resonator R(1,2) is less than 10%. To provide a tuning range to tune the transfer function of the first tunable RF filter path 66 and to provide a fast roll-off from the low-frequency side to the high-frequency side of the transfer function, the first tunable RF filter path 66 is configured to change the sign of the total mutual coupling coefficient between the resonator R(1,1) and the resonator R(1,2). In this embodiment, the first tunable RF filter path 66 shown in FIG. 25 includes a cross-coupling capacitive structure C(PH1), a cross-coupling capacitive structure (CNH1), a cross-coupling capacitive structure C(I1), a cross-coupling capacitive structure C(PH2), and a cross-coupling capacitive structure C(NH2). The cross-coupling capacitive structure C(PH1), the cross-coupling capacitive structure (CNH1), the cross-coupling capacitive structure C(I1), the cross-coupling capacitive structure C(PH2), and the cross-coupling capacitive structure C(NH2) are also embodiments of the cross-coupling capacitive structures C described above with regard to FIG. 21.

The cross-coupling capacitive structure C(PH1) and the cross-coupling capacitive structure C(NH1) are arranged to form a first capacitive voltage divider. The first capacitive voltage divider is electrically connected to the resonator R(1,1). More specifically, the cross-coupling capacitive structure C(PH1) is electrically connected between the end 217 of the inductor 208 and a common connection node H1. The cross-coupling capacitive structure C(NH1) is electrically connected between the end 218 of the inductor 208 and the common connection node H1. Additionally, the cross-coupling capacitive structure C(PH2) and the cross-coupling capacitive structure C(NH2) are arranged to form a second capacitive voltage divider. The second capacitive voltage divider is electrically connected to the resonator R(1,2). More specifically, the cross-coupling capacitive structure C(PH2) is electrically connected between the end 220 of the inductor 212 and a common connection node H2. The cross-coupling capacitive structure C(NH2) is electrically connected between the end 222 of the inductor 212 and the common connection node H2. As shown in FIG. 25, the cross-coupling capacitive structure C(I1) is electrically connected between the first capacitive voltage divider and the second capacitive voltage divider. More specifically, the cross-coupling capacitive structure C(I1) is electrically connected between the common connection node H1 and the common connection node H2. The arrangement of the cross-coupling capacitive structure C(PH1), the cross-coupling capacitive structure C(NH1), the cross-coupling capacitive structure C(PH2), the cross-coupling capacitive structure C(NH2), and the cross-coupling capacitive structure C(I1) shown in FIG. 25 is an H-bridge structure. In an alternative H-bridge structure, the cross-coupling capacitive structure C(I1) is not provided and instead there is a short between the common connection node H1 and the common connection node H2. In addition, a center tap of the inductor 208 may be grounded and/or the common connection node H1 may be grounded. Finally, a high impedance to ground may be provided at the common connection node H1.

With regard to the first capacitive voltage divider, the cross-coupling capacitive structure C(PH1) is a variable cross-coupling capacitive structure configured to vary a first variable positive electric coupling coefficient provided between the resonator R(1,1) and the common connection node H1. The cross-coupling capacitive structure C(NH1) is a variable cross-coupling capacitive structure configured to vary a first variable negative electric coupling coefficient provided between the resonator R(1,1) and the common connection node H1. Thus, a mutual electric coupling coefficient of the resonator R(1,1) is approximately equal to the first variable positive electric coupling coefficient and the first variable negative electric coupling coefficient.

With regard to the second capacitive voltage divider, the cross-coupling capacitive structure C(PH2) is a variable cross-coupling capacitive structure configured to vary a second variable positive electric coupling coefficient provided between the resonator R(1,2) and the common connection node H2. The cross-coupling capacitive structure C(NH2) is a variable cross-coupling capacitive structure configured to vary a second variable negative electric coupling coefficient provided between the resonator R(1,2) and the common connection node H2. Thus, a mutual electric coupling coefficient of the resonator R(1,2) is approximately equal to the second variable positive electric coupling coefficient and the second variable negative electric coupling coefficient. Furthermore, the cross-coupling capacitive structure C(I1) is a variable cross-coupling capacitive structure configured to vary a first variable intermediate electric coupling coefficient provided between the common connection node H1 and the common connection node H2. The first tunable RF filter path 66 shown in FIG. 25 thus has a total mutual coupling coefficient between the resonator R(1,1) and the resonator R(1,2) equal to the sum total of the mutual magnetic coupling coefficient between the inductor 208 and the inductor 212, the mutual electric coupling coefficient of the resonator R(1,1), the mutual electric coupling coefficient of the resonator R(1,2), and the first variable intermediate electric coupling coefficient provided between the common connection node H1 and the common connection node H2. In alternative embodiments, cross-coupling capacitive structures with fixed capacitances are provided.

In one embodiment, the cross-coupling capacitive structure C(PH1), the cross-coupling capacitive structure C(NH1), the cross-coupling capacitive structure C(PH2), the cross-coupling capacitive structure C(NH2), and the cross-coupling capacitive structure C(I1) may each be provided as a varactor. However, the cross-coupling capacitive structure C(PH1), the cross-coupling capacitive structure C(NH1), the cross-coupling capacitive structure C(PH2), the cross-coupling capacitive structure C(NH2), and the cross-coupling capacitive structure C(I1) may each be provided as a programmable array of capacitors in order to reduce insertion losses and improve linearity. The cross-coupling capacitive structure C(PH1), the cross-coupling capacitive structure C(NH1), the cross-coupling capacitive structure C(PH2), the cross-coupling capacitive structure C(NH2), and the cross-coupling capacitive structure C(I1) can also be any combination of suitable variable cross-coupling capacitive structures, such as combinations of varactors and programmable arrays of capacitors. Although the H-bridge structure can provide good linearity and low insertion losses, the H-bridge structure can also suffer from common-mode signal transfer.

Figure 26:
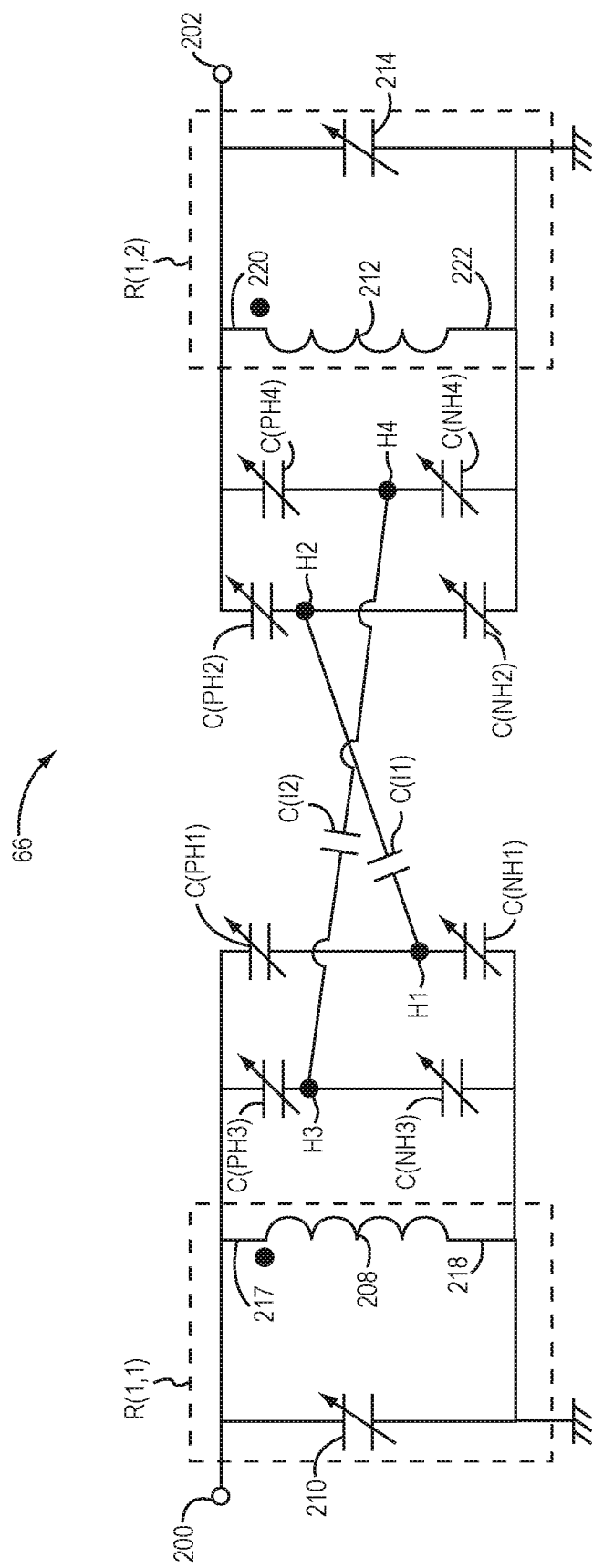
FIG. 26 illustrates another embodiment of the tunable RF filter path shown in FIG. 21 having cross-coupling capacitors arranged in a double H-bridge structure.

FIG. 26 illustrates yet another exemplary embodiment of the first tunable RF filter path 66 in the first RF filter structure 60 shown in FIG. 21. While the exemplary embodiment shown in FIG. 26 is of the first tunable RF filter path 66, any of the tunable RF filter paths shown in the first RF filter structure 60 of FIG. 21 may be arranged in accordance with the exemplary embodiment shown in FIG. 26. The first tunable RF filter path 66 shown in FIG. 26 can be used to ameliorate the common-mode signal transfer of the H-bridge structure shown in FIG. 25. More specifically, the first tunable RF filter path 66 shown in FIG. 26 includes the same embodiment of the resonator R(1,1) and the same embodiment of the resonator R(1,2) described above with respect to FIG. 25. Furthermore, the first tunable RF filter path 66 shown in FIG. 26 includes the first capacitive voltage divider with the cross-coupling capacitive structure C(PH1) and the cross-coupling capacitive structure C(NH1) described above with respect to FIG. 25, the second capacitive voltage divider with the cross-coupling capacitive structure C(PH2) and the cross-coupling capacitive structure (CNH2) described above with respect to FIG. 25, and the cross-coupling capacitive structure C(I1) described above with respect to FIG. 25. However, in this embodiment, the first tunable RF filter path 66 shown in FIG. 26 also includes a cross-coupling capacitive structure C(PH3), a cross-coupling capacitive structure (CNH3), a cross-coupling capacitive structure C(I2), a cross-coupling capacitive structure C(PH4), and a cross-coupling capacitive structure C(NH4). The cross-coupling capacitive structure C(PH3), the cross-coupling capacitive structure (CNH3), the cross-coupling capacitive structure C(I2), the cross-coupling capacitive structure C(PH4), and the cross-coupling capacitive structure C(NH4) are also embodiments of the cross-coupling capacitive structures C described above with regard to FIG. 21.

As shown in FIG. 26, the cross-coupling capacitive structure C(PH3) and the cross-coupling capacitive structure C(NH3) are arranged to form a third capacitive voltage divider. The third capacitive voltage divider is electrically connected to the resonator R(1,1). More specifically, the cross-coupling capacitive structure C(PH3) is electrically connected between the end 217 of the inductor 208 and a common connection node H3. The cross-coupling capacitive structure C(NH3) is electrically connected between the end 218 of the inductor 208 and the common connection node H3. Additionally, the cross-coupling capacitive structure C(PH4) and the cross-coupling capacitive structure C(NH4) are arranged to form a fourth capacitive voltage divider. The fourth capacitive voltage divider is electrically connected to the resonator R(1,2). More specifically, the cross-coupling capacitive structure C(PH4) is electrically connected between the end 220 of the inductor 212 and a common connection node H4. The cross-coupling capacitive structure C(NH4) is electrically connected between the end 222 of the inductor 212 and the common connection node H4. As shown in FIG. 26, the cross-coupling capacitive structure C(I2) is electrically connected between first capacitive voltage divider and the second capacitive voltage divider. More specifically, the cross-coupling capacitive structure C(I2) is electrically connected between the common connection node H3 and the common connection node H4. Alternatively, the cross-coupling capacitive structure C(I1) and the cross-coupling capacitive structure C(I2) can be replaced with shorts. The arrangement of the cross-coupling capacitive structure C(PH1), the cross-coupling capacitive structure C(NH1), the cross-coupling capacitive structure C(PH2), the cross-coupling capacitive structure C(NH2), the cross-coupling capacitive structure C(I1), the cross-coupling capacitive structure C(PH3), the cross-coupling capacitive structure C(NH3), the cross-coupling capacitive structure C(PH4), the cross-coupling capacitive structure C(NH4), and the cross-coupling capacitive structure C(I2) shown in FIG. 26 is a double H-bridge structure.

With regard to the third capacitive voltage divider, the cross-coupling capacitive structure C(PH3) is a variable cross-coupling capacitive structure configured to vary a third variable positive electric coupling coefficient provided between the resonator R(1,1) and the common connection node H3. The cross-coupling capacitive structure C(NH3) is a variable cross-coupling capacitive structure configured to vary a third variable negative electric coupling coefficient provided between the resonator R(1,1) and the common connection node H3. Thus, a mutual electric coupling coefficient of the resonator R(1,1) is approximately equal to the first variable positive electric coupling coefficient, the third variable positive electric coupling coefficient, the first variable negative electric coupling coefficient and the third variable negative electric coupling coefficient.

With regard to the fourth capacitive voltage divider, the cross-coupling capacitive structure C(PH4) is a variable cross-coupling capacitive structure configured to vary a fourth variable positive electric coupling coefficient provided between the resonator R(1,2) and the common connection node H4. The cross-coupling capacitive structure C(NH4) is a variable cross-coupling capacitive structure configured to vary a fourth variable negative electric coupling coefficient provided between the resonator R(1,2) and the common connection node H4. Thus, a mutual electric coupling coefficient of the resonator R(1,2) is approximately equal to the second variable positive electric coupling coefficient, the fourth variable positive coupling coefficient, the second variable negative coupling coefficient, and the fourth variable negative electric coupling coefficient. Furthermore, the cross-coupling capacitive structure C(I2) is a variable cross-coupling capacitive structure configured to vary a second variable intermediate electric coupling coefficient provided between the common connection node H3 and the common connection node H4. The first tunable RF filter path 66 shown in FIG. 26 thus has a total mutual coupling coefficient between the resonator R(1,1) and the resonator R(1,2) equal to the sum total of the mutual magnetic coupling coefficient between the inductor 208 and the inductor 212, the mutual electric coupling coefficient of the resonator R(1,1), the mutual electric coupling coefficient of the resonator R(1,2), the first variable intermediate electric coupling coefficient provided between the common connection node H1 and the common connection node H2 and the second variable intermediate electric coupling coefficient provided between the common connection node H3 and the common connection node H4. The double H-bridge structure thus includes two H-bridge structures. The two H-bridge structures allow for common-mode signal transfers of the two H-bridge structures to oppose one another and thereby be reduced and even cancelled.

Figure 27:
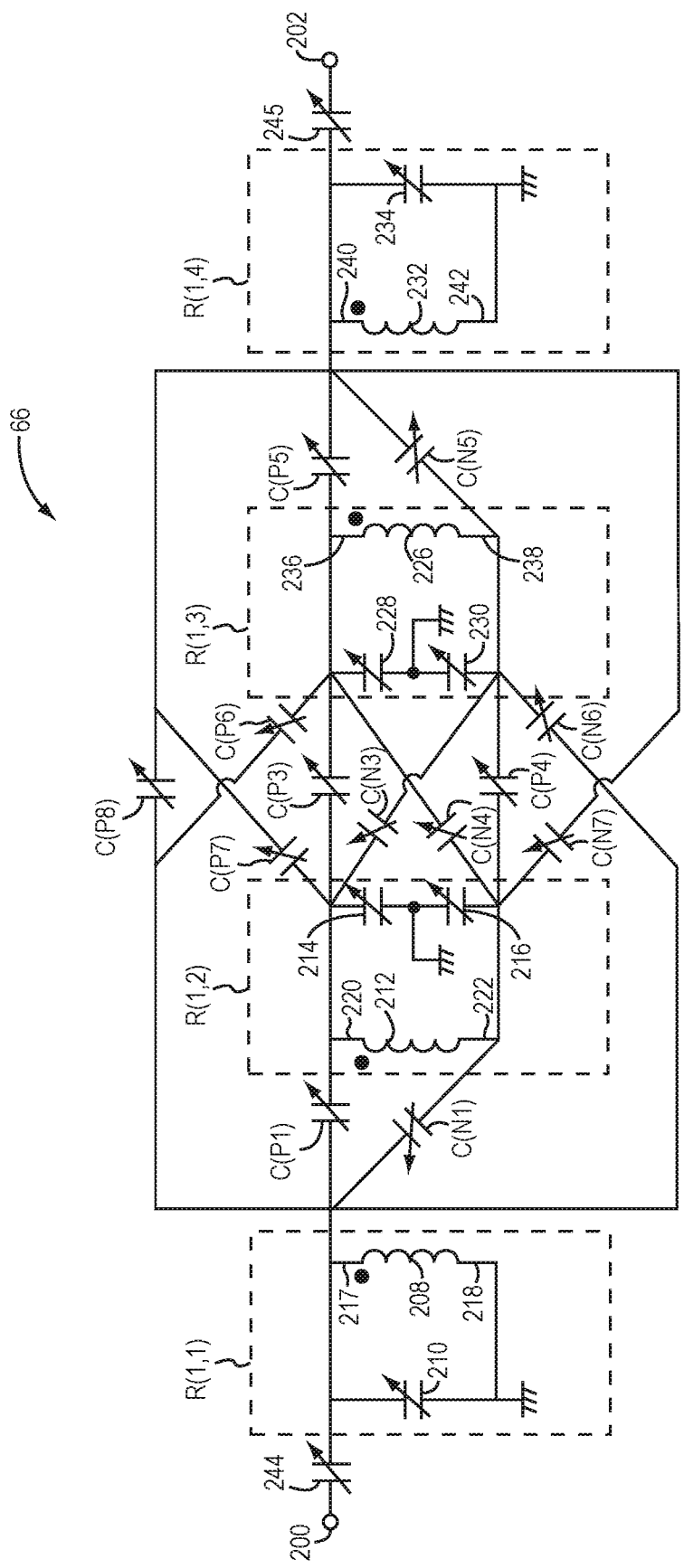
FIG. 27 illustrates another embodiment of the tunable RF filter path shown in FIG. 21 having four weakly coupled resonators with magnetic and electric couplings between them.

FIG. 27 illustrates still another exemplary embodiment of the first tunable RF filter path 66 in the first RF filter structure 60 shown in FIG. 21. While the exemplary embodiment shown in FIG. 27 is of the first tunable RF filter path 66, any of the tunable RF filter paths shown in the first RF filter structure 60 of FIG. 21 may be arranged in accordance with the exemplary embodiment shown in FIG. 27. The first tunable RF filter path 66 shown in FIG. 27 includes the same embodiment of the resonator R(1,1) and the same embodiment of the resonator R(1,2) described above with respect to FIG. 22. In addition, the first tunable RF filter path 66 shown in FIG. 27 includes the cross-coupling capacitive structure C(P1) and the cross-coupling capacitive structure (CN1) that form the V-bridge structure described above with respect to FIG. 22. However, the first tunable RF filter path 66 shown in FIG. 27 further includes a resonator R(1,3) and a resonator R(1,4). More specifically, the resonator R(1,3) includes an inductor 226, a capacitive structure 228, and a capacitive structure 230. The resonator R(1,4) includes an inductor 232 and a capacitive structure 234.

With regard to the resonator R(1,3), the inductor 226 is electrically connected between the capacitive structure 228 and the capacitive structure 230. More specifically, the inductor 226 has an end 236 and an end 238, which are disposed opposite to one another. The end 236 is electrically connected to the capacitive structure 228 and the end 238 is electrically connected to the capacitive structure 230. Both the capacitive structure 228 and the capacitive structure 230 are grounded. Thus, the resonator R(1,3) is a differential resonator. In this embodiment, each of the capacitive structure 228 and the capacitive structure 230 is a variable capacitive structure.

With regard to the resonator R(1,4), the inductor 232 and the capacitive structure 234 are electrically connected in parallel. More specifically, the inductor 232 has an end 240 and an end 242, which are disposed opposite to one another. The ends 240, 242 are each electrically connected to the capacitive structure 234, which is grounded. Thus, the resonator R(1,4) is a single-ended resonator.

In this embodiment, the resonator R(1,1), the resonator R(1,2), the resonator R(1,3), and the resonator R(1,4) are all weakly coupled to one another. The resonator R(1,3) and the resonator R(1,4) are weakly coupled by providing the inductor 226 and the inductor 232 such that the inductor 226 and the inductor 232 are weakly coupled. The resonators R(1,1), R(1,2), R(1,3), and R(1,4) are each operably associated with one another such that energy transfer factors between the resonators R(1,1), R(1,2), R(1,3), and R(1,4) are less than 10%. Although the resonator R(1,3) and the resonator R(1,4) are weakly coupled, the inductor 232 has a maximum lateral width and a displacement between the inductor 226 and the inductor 232 is less than or equal to half the maximum lateral width of the inductor 232. As such, the inductor 226 and the inductor 232 are relatively close to one another. The displacement between the inductor 226 and the inductor 232 may be measured from a geometric centroid of the inductor 226 to a geometric centroid of the inductor 232. The maximum lateral width may be a maximum dimension of the inductor 232 along a plane defined by its largest winding. The weak coupling between the inductor 226 and the inductor 232 is obtained through topological techniques. For example, the inductor 226 and the inductor 232 may be fully or partially aligned, where winding(s) of the inductor 226 and winding(s) of the inductor 232 are configured to provide weak coupling through cancellation. Alternatively or additionally, a plane defining an orientation of the windings of the inductor 226 and a plane defining an orientation of the windings of the inductor 232 may be fully or partially orthogonal to one another.

In some embodiments, all of the inductors 208, 212, 226, 232 are provided such that displacements between each of the inductors 208, 212, 226, 232 are less than or equal to half the maximum lateral width of the inductor 212. Alternatively, in other embodiments, only a proper subset of the inductors 208, 212, 226, 232 has displacements that are less than or equal to half the maximum lateral width of the inductor 212. For example, while the displacement between the inductor 208 and the inductor 212 may be less than or equal to half the maximum lateral width of the inductor 212 and the displacement between the inductor 226 and the inductor 232 may be less than or equal to half the maximum lateral width of the inductor 232, the displacements from the inductor 208 and the inductor 212 to the inductor 226 and the inductor 232 may each be greater than half the maximum lateral width of the inductor 212 and half the maximum lateral width of the inductor 232.

The inductors 208, 212, 226, and 232 are magnetically coupled to the each other such that an RF signal received at the end 217 of the inductor 208 with a voltage polarity (i.e., either a positive voltage polarity or a negative voltage polarity) results in filtered RF signals with the same voltage polarity being transmitted out the end 220 of the inductor 212, the end 236 of the inductor 226, and the end 240 of the inductor 232. Also, the inductors 208, 212, 226, and 232 are magnetically coupled to the each other such that an RF signal received at the end 240 of the inductor 232 with a voltage polarity (i.e., either a positive voltage polarity or a negative voltage polarity) results in filtered RF signals with the same voltage polarity being transmitted out the end 217 of the inductor 208, the end 220 of the inductor 212, and the end 236 of the inductor 226. This is indicated in FIG. 27 by the dot convention where a dot is placed at the end 217 of the inductor 208, a dot is placed at the end 220 of the inductor 212, a dot is placed at the end 236 of the inductor 226, and a dot is placed at the end 240 of the inductor 232.

The first tunable RF filter path 66 shown in FIG. 27 includes a cross-coupling capacitive structure C(P3), a cross-coupling capacitive structure C(N3), a cross-coupling capacitive structure C(P4), and a cross-coupling capacitive structure C(N4) electrically connected between the resonator R(1,2) and the resonator R(1,3). With respect to the resonator R(1,2) and the resonator R(1,3), the cross-coupling capacitive structure C(P3), the cross-coupling capacitive structure C(N3), the cross-coupling capacitive structure C(P4) and the cross-coupling capacitive structure C(N4) are arranged to have the X-bridge structure described above with respect to FIG. 23. Thus, the cross-coupling capacitive structure C(P3) is electrically connected between the end 220 and the end 236 so as to provide a variable positive electric coupling coefficient between the resonator R(1,2) and the resonator R(1,3). The cross-coupling capacitive structure C(P3) is a variable cross-coupling capacitive structure configured to vary the variable positive electric coupling coefficient provided between the resonator R(1,2) and the resonator R(1,3). Also, the cross-coupling capacitive structure C(N3) is electrically connected between the end 220 and the end 238 so as to provide a variable negative electric coupling coefficient between the resonator R(1,2) and the resonator R(1,3). The cross-coupling capacitive structure C(N3) is a variable cross-coupling capacitive structure configured to vary the variable negative electric coupling coefficient provided between the resonator R(1,2) and the resonator R(1,3).

Additionally, the cross-coupling capacitive structure C(P4) is electrically connected between the end 222 and the end 238 so as to provide another variable positive electric coupling coefficient between the resonator R(1,2) and the resonator R(1,3). The cross-coupling capacitive structure C(P4) is a variable cross-coupling capacitive structure configured to vary the other variable positive electric coupling coefficient provided between the resonator R(1,2) and the resonator R(1,3). Finally, the cross-coupling capacitive structure C(N4) is electrically connected between the end 222 and the end 236 so as to provide another variable negative electric coupling coefficient between the resonator R(1,2) and the resonator R(1,3). The cross-coupling capacitive structure C(N4) is a variable cross-coupling capacitive structure configured to vary the other variable negative electric coupling coefficient provided between the resonator R(1,2) and the resonator R(1,3).

With respect to the resonator R(1,3) and the resonator R(1,4), the first tunable RF filter path 66 shown in FIG. 27 includes a cross-coupling capacitive structure C(P5) and a cross-coupling capacitive structure C(N5) electrically connected between the resonator R(1,3) and the resonator R(1,4). With respect to the resonator R(1,3) and the resonator R(1,4), the cross-coupling capacitive structure C(P5) and the cross-coupling capacitive structure C(N5) are arranged to have the V-bridge structure described above with respect to FIG. 22. Thus, the cross-coupling capacitive structure C(P5) is electrically connected between the end 236 and the end 240 so as to provide a variable positive electric coupling coefficient between the resonator R(1,3) and the resonator R(1,4). The cross-coupling capacitive structure C(P5) is a variable cross-coupling capacitive structure configured to vary the variable positive electric coupling coefficient provided between the resonator R(1,3) and the resonator R(1,4). Also, the cross-coupling capacitive structure C(N5) is electrically connected between the end 238 and the end 240 so as to provide a variable negative electric coupling coefficient between the resonator R(1,3) and the resonator R(1,4). The cross-coupling capacitive structure C(N5) is a variable cross-coupling capacitive structure configured to vary the variable negative electric coupling coefficient provided between the resonator R(1,3) and the resonator R(1,4).

The embodiment of first RF filter structure 60 shown in FIG. 27 also includes a cross-coupling capacitive structure C(P6), a cross-coupling capacitive structure C(N6), a cross-coupling capacitive structure C(P7), a cross-coupling capacitive structure C(N7), and a cross-coupling capacitive structure C(P8). With respect to the resonator R(1,1) and the resonator R(1,3), the cross-coupling capacitive structure C(P6) and the cross-coupling capacitive structure C(N6) are each electrically connected between the resonator R(1,1) and the resonator R(1,3). The cross-coupling capacitive structure C(P6) is electrically connected between the end 217 and the end 236 so as to provide a variable positive electric coupling coefficient between the resonator R(1,1) and the resonator R(1,3). The cross-coupling capacitive structure C(P6) is a variable cross-coupling capacitive structure configured to vary the variable positive electric coupling coefficient provided between the resonator R(1,1) and the resonator R(1,3). Also, the cross-coupling capacitive structure C(N6) is electrically connected between the end 217 and the end 238 so as to provide a variable negative electric coupling coefficient between the resonator R(1,1)

and the resonator R(1,3). The cross-coupling capacitive structure C(N6) is a variable cross-coupling capacitive structure configured to vary the variable negative electric coupling coefficient provided between the resonator R(1,1) and the resonator R(1,3).

With respect to the resonator R(1,2) and the resonator R(1,4), the cross-coupling capacitive structure C(P7) and the cross-coupling capacitive structure C(N7) are each electrically connected between the resonator R(1,2) and the resonator R(1,4). The cross-coupling capacitive structure C(P7) is electrically connected between the end 220 and the end 240 so as to provide a variable positive electric coupling coefficient between the resonator R(1,2) and the resonator R(1,4). The cross-coupling capacitive structure C(P7) is a variable cross-coupling capacitive structure configured to vary the variable positive electric coupling coefficient provided between the resonator R(1,2) and the resonator R(1,4). Also, the cross-coupling capacitive structure C(N7) is electrically connected between the end 222 and the end 240 so as to provide a variable negative electric coupling coefficient between the resonator R(1,2) and the resonator R(1,4). The cross-coupling capacitive structure C(N7) is a variable cross-coupling capacitive structure configured to vary the variable negative electric coupling coefficient provided between the resonator R(1,2) and the resonator R(1,4).

With respect to the resonator R(1,1) and the resonator R(1,4), the cross-coupling capacitive structure C(P8) is electrically connected between the resonator R(1,1) and the resonator R(1,4). The cross-coupling capacitive structure C(P8) is electrically connected between the end 217 and the end 240 so as to provide a variable positive electric coupling coefficient between the resonator R(1,1) and the resonator R(1,4). The cross-coupling capacitive structure C(P8) is a variable cross-coupling capacitive structure configured to vary the variable positive electric coupling coefficient provided between the resonator R(1,1) and the resonator R(1,4).

Furthermore, in this embodiment, a variable capacitive structure 244 is electrically connected in series between the terminal 200 and the resonator R(1,1). The variable capacitive structure 244 is configured to vary a variable impedance of the first tunable RF filter path 66 as measured into the terminal 200 in order to match a source or a load impedance at the terminal 200. In addition, a variable capacitive structure 245 is electrically connected in series between the resonator R(1,4) and the terminal 202. The variable capacitive structure 245 is configured to vary a variable impedance of the first tunable RF filter path 66 as seen into the terminal 202 in order to match a source or a load impedance at the terminal 202.

FIGS. 28A through 28D illustrate different embodiments of the first RF filter structure 60, wherein each of the embodiments has different combinations of input terminals and output terminals. The first RF filter structure 60 can have various topologies. For example, the embodiment of the first RF filter structure 60 shown in FIG. 28A has a single input terminal IN and an integer number i of output terminals OUT$_1$-OUT$_i$. As will be discussed below, the first RF filter structure 60 may define various tunable RF filter paths (e.g., the first tunable RF filter path 66, the second tunable RF filter path 68, the third tunable RF filter path 110, the fourth tunable RF filter path 112, the fifth tunable RF filter path 122, and the sixth tunable RF filter path 124 shown in FIGS. 4, 8, 11, 12, and 14-20) that may be used to receive different RF signals at the input terminal IN and transmit a different filtered RF signal from each of the output terminals OUT$_1$-OUT$_i$. As such, the first RF filter structure 60 shown in FIG. 28A may be specifically configured to provide Single Input Multiple Output (SIMO) operations.

Figure 28A:
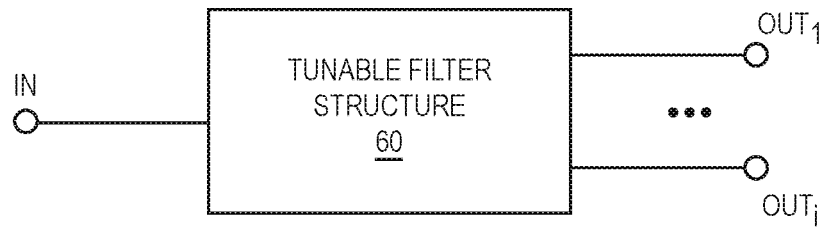
FIGS. 28A-28D disclose different embodiments of a tunable RF filter structure, each with a different number of input terminals and output terminals.
Figure 28B:
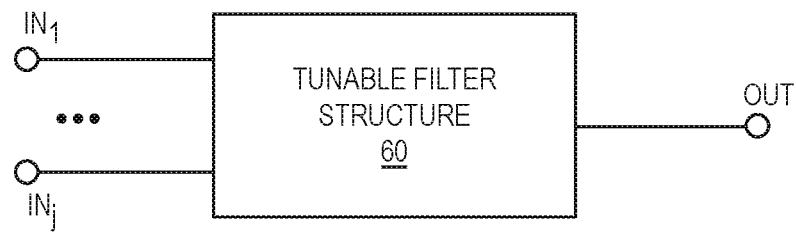

With regard to the embodiment of the first RF filter structure 60 shown in FIG. 28B, the first RF filter structure 60 has an integer number j of input terminals IN$_1$-IN$_j$ and a single output terminal OUT. As will be discussed below, the first RF filter structure 60 may define various tunable RF filter paths (e.g., the first tunable RF filter path 66, the second tunable RF filter path 68, the third tunable RF filter path 110, the fourth tunable RF filter path 112, the fifth tunable RF filter path 122, and the sixth tunable RF filter path 124 shown in FIGS. 4, 8, 11, 12, and 14-20) that may be used to receive a different RF signal at each of the input terminals IN$_1$-IN$_j$ and transmit different filtered RF signals from the single output terminal OUT. As such, the first RF filter structure 60 shown in FIG. 28B may be specifically configured to provide Multiple Input Single Output (MISO) operations.

Figure 28C:
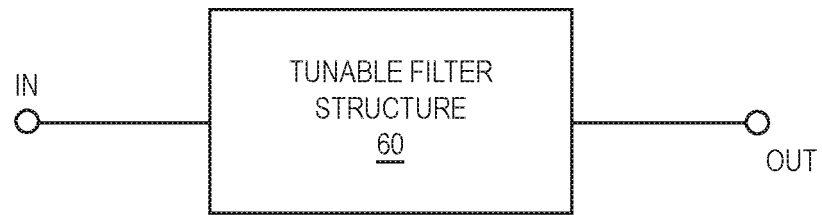

With regard to the embodiment of the first RF filter structure 60 shown in FIG. 28C, the first RF filter structure 60 has a single input terminal IN and a single output terminal OUT. As will be discussed below, the first RF filter structure 60 may define various tunable RF filter paths (e.g., the first tunable RF filter path 66, the second tunable RF filter path 68, the third tunable RF filter path 110, the fourth tunable RF filter path 112, the fifth tunable RF filter path 122, and the sixth tunable RF filter path 124 shown in FIGS. 4, 8, 11, 12, and 14-20) that may be used to receive different RF signals at the single input terminal IN and transmit different filtered RF signals from the output terminal OUT. As such, the first RF filter structure 60 shown in FIG. 28A may be specifically configured to provide Single Input Single Output (SISO) operations.

Figure 28D:
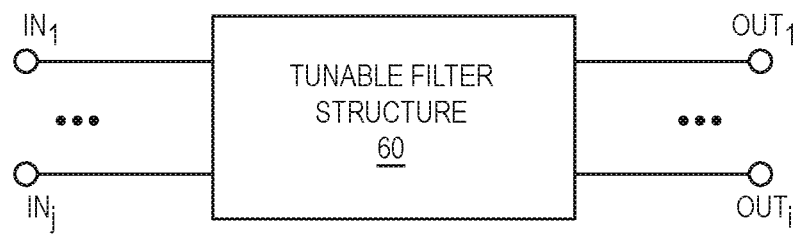

With regard to the embodiment of the first RF filter structure 60 shown in FIG. 28D, the first RF filter structure 60 has the input terminals IN$_1$-IN$_j$ and the output terminals OUT$_1$-OUT$_i$. As will be discussed below, the first RF filter structure 60 may define various tunable RF filter paths (e.g., the first tunable RF filter path 66, the second tunable RF filter path 68, the third tunable RF filter path 110, the fourth tunable RF filter path 112, the fifth tunable RF filter path 122, and the sixth tunable RF filter path 124 shown in FIGS. 4, 8, 11, 12, and 14-20) that may be used to receive a different RF signal at each of the input terminal IN$_1$-IN$_j$ and transmit a different filtered RF signal from each of the output terminals OUT$_1$-OUT$_i$.

Figure 29:
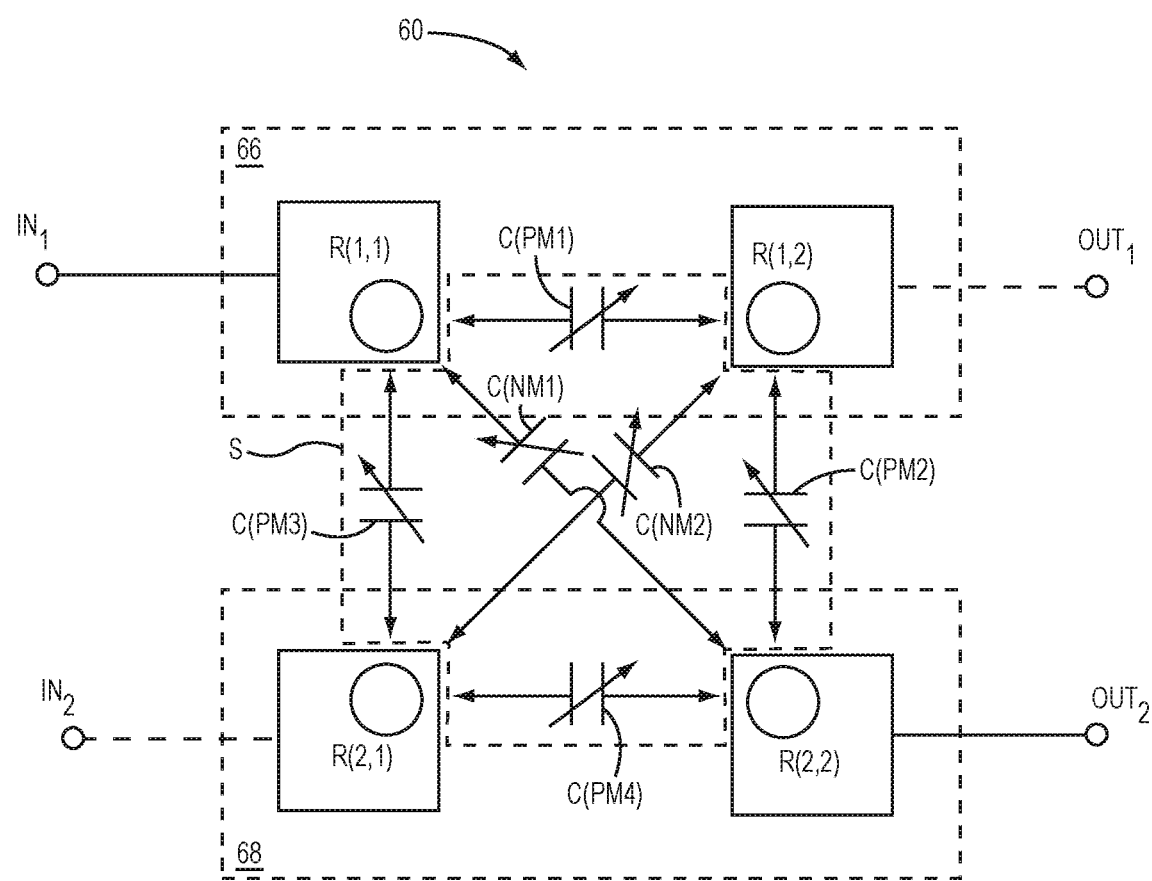
FIG. 29 illustrates one embodiment of a tunable radio frequency (RF) filter structure having four resonators and cross-coupling capacitive structures electrically connected between the four resonators so as to form a 2×2 matrix with the four resonators. In alternative embodiments, fewer (e.g., three) resonators or more (e.g., five or more) resonators may be provided.

FIG. 29 illustrates another embodiment of the first RF filter structure 60. The first RF filter structure 60 shown in FIG. 29 includes one embodiment of the first tunable RF filter path 66 and one embodiment of the second tunable RF filter path 68. The first tunable RF filter path 66 includes the resonator R(1,1) and the resonator R(1,2). The resonator R(1,1) and the resonator R(1,2) are thus a first pair of weakly coupled resonators in the first tunable RF filter path 66. The second tunable RF filter path 68 includes the resonator R(2,1) and the resonator R(2,2). The resonator R(2,1) and the resonator R(2,2) are thus a second pair of weakly coupled resonators in the second tunable RF filter path 68.

As explained in further detail below, a set S of cross-coupling capacitive structures is electrically connected between the resonator R(1,1), the resonator R(1,2), the resonator R(2,1), and the resonator R(2,2) in the first tunable RF filter path 66 and the second tunable RF filter path 68. More specifically, the set S includes a cross-coupling capacitive structure C(PM1), a cross-coupling capacitive structure C(PM2), a cross-coupling capacitive structure C(PM3), a cross-coupling capacitive structure C(PM4), a cross-coupling capacitive structure C(NM1), and a cross-coupling capacitive structure C(NM2). The set S of cross-coupling capacitive structures interconnects the resonator R(1,1), the resonator R(1,2), the resonator R(2,1), and the resonator R(2,2) so that the first RF filter structure 60 shown in FIG. 29 is a matrix (in this embodiment, a 2×2 matrix) of the resonators R. In alternative embodiments, some of the cross-coupling capacitive structures C(PM1), C(PM2), C(PM3), C(PM4), C(NM1), and C(NM2) may be omitted depending on the filter transfer function to be provided.

Unlike in the embodiment of the first RF filter structure 60 shown in FIG. 21, in this embodiment, the first tunable RF filter path 66 and the second tunable RF filter path 68 are not independent of one another. The set S of cross-coupling capacitive structures thus provides for additional tunable RF filter paths to be formed from the resonator R(1,1), the resonator R(1,2), the resonator R(2,1), and the resonator R(2,2). As discussed in further detail below, the arrangement of the first RF filter structure 60 shown in FIG. 29 can be used to realize examples of each of the embodiments of the first RF filter structure 60 shown in FIGS. 28A-28D.

The cross-coupling capacitive structure C(PM1) is electrically connected within the first tunable RF filter path 66, while the cross-coupling capacitive structure C(PM4) is electrically connected within the second tunable RF filter path 68. More specifically, the cross-coupling capacitive structure C(PM1) is electrically connected between the resonator R(1,1) and the resonator R(1,2) in the first tunable RF filter path 66. The cross-coupling capacitive structure C(PM1) is a variable cross-coupling capacitive structure configured to provide and vary a (e.g., positive or negative) electric coupling coefficient between the resonator R(1,1) and the resonator R(1,2). The cross-coupling capacitive structure C(PM4) is a variable cross-coupling capacitive structure configured to provide and vary a (e.g., positive or negative) electric coupling coefficient between the resonator R(2,1) and the resonator R(2,2) in the second tunable RF filter path 68.

To provide additional tunable RF filter paths, the cross-coupling capacitive structure C(PM2), the cross-coupling capacitive structure C(PM3), the cross-coupling capacitive structure C(NM1), and the cross-coupling capacitive structure C(NM2) are each electrically connected between the first tunable RF filter path 66 and the second tunable RF filter path 68. The cross-coupling capacitive structure C(PM2) is a variable cross-coupling capacitive structure configured to provide and vary a (e.g., positive or negative) electric coupling coefficient between the resonator R(1,2) and the resonator R(2,2). The cross-coupling capacitive structure C(PM3) is a variable cross-coupling capacitive structure configured to provide and vary a (e.g., positive or negative) electric coupling coefficient between the resonator R(1,1) and the resonator R(2,1). The cross-coupling capacitive structure C(NM1) is a variable cross-coupling capacitive structure configured to provide and vary a (e.g., positive or negative) electric coupling coefficient between the resonator R(1,1) and the resonator R(2,2). The cross-coupling capacitive structure C(NM2) is a variable cross-coupling capacitive structure configured to provide and vary a (e.g., positive or negative) electric coupling coefficient between the resonator R(1,2) and the resonator R(2,1).

The first tunable RF filter path 66 is electrically connected between the input terminal IN₁ and the output terminal OUT₁. In addition, the second tunable RF filter path 68 is electrically connected between an input terminal IN₂ and an output terminal OUT₂. Accordingly, the first RF filter structure 60 shown in FIG. 29 is an embodiment of the first RF filter structure 60 shown in FIG. 28D. However, the input terminal IN₂ and the output terminal OUT₁ are optional and may be excluded in other embodiments. For example, if the input terminal IN₂ were not provided, but the output terminal OUT₁ and the output terminal OUT₂ were provided, the first RF filter structure 60 shown in FIG. 29 would be provided as an embodiment of the first RF filter structure 60 shown in FIG. 28A. It might, for example, provide a diplexing or a duplexing function. Furthermore, more than two input terminals or output terminals can be provided. Some examples include embodiments of the first RF filter structure 60 used for triplexing, quadplexing, herplexing, and providing FDD and carrier aggregation.

The first tunable RF filter path 66 still provides a path between the input terminal IN₁ and the output terminal OUT₁. However, assuming that the input terminal IN₂ is not provided for SIMO operation, the cross-coupling capacitive structure C(NM1) is electrically connected between the first tunable RF filter path 66 and the second tunable RF filter path 68 to define a first additional tunable RF filter path between the input terminal IN₁ and the output terminal OUT₂. The first additional tunable RF filter path is thus provided by a portion of the first tunable RF filter path 66 and a portion of the second tunable RF filter path 68. More specifically, the first additional tunable RF filter path includes the resonator R(1,1) and the resonator R(2,2). The first additional tunable RF filter path also includes the cross-coupling capacitive structure C(NM1) that is electrically connected between the resonator R(1,1) and the resonator R(1,2). A second additional tunable RF filter path, a third additional tunable RF filter path, a fourth additional tunable RF filter path, and a fifth additional tunable RF filter path are also defined from the input terminal IN₁ to the output terminal OUT₂. The second additional tunable RF filter path includes the resonator R(1,1), the cross-coupling capacitive structure C(PM1), the resonator R(1,2), the cross-coupling capacitive C(PM2), and the resonator R(2,2). Additionally, the third additional tunable RF filter path includes the resonator R(1,1), the cross-coupling capacitive structure C(PM3), the resonator R(2,1), the cross-coupling capacitive C(PM4), and the resonator R(2,2). The fourth additional tunable RF filter path includes the resonator R(1,1), the cross-coupling capacitive structure C(PM1), the resonator R(1,2), the cross-coupling capacitive C(NM2), the resonator R(2,1), the cross-coupling capacitive structure C(PM4), and the resonator R(2,2). Finally, the fifth additional tunable RF filter path includes the resonator R(1,1), the cross-coupling capacitive structure C(PM3), the resonator R(2,1), the cross-coupling capacitive C(NM2), the resonator R(1,2), the cross-coupling capacitive structure C(PM2), and the resonator R(2,2).

If the output terminal OUT₁ were not provided, but the input terminal IN₁ and the input terminal IN₂ were provided, the first RF filter structure 60 shown in FIG. 29 would be provided as an embodiment of the first RF filter structure 60 shown in FIG. 28B. In this case, the second tunable RF filter path 68 still provides a path between the input terminal IN₂ and the output terminal OUT₂. However, assuming that the output terminal OUT₁ is not provided for MISO operation, the first additional tunable RF filter path, the second additional tunable RF filter path, the third additional tunable RF filter path, the fourth additional tunable RF filter path, and the fifth additional tunable RF filter path would provide the paths from the input terminal IN₁ to the output terminal OUT₂.

Finally, if the input terminal IN₂ and the output terminal OUT₂ were not provided, the first RF filter structure 60 shown in FIG. 29 would be provided as an embodiment of the first RF filter structure 60 shown in FIG. 28C. In this case, the second tunable RF filter path 68 still provides a path between the input terminal $IN_2$ and the output terminal $OUT_2$. However, assuming that the output terminal $IN_1$ is not provided for MISO operation, the first additional tunable RF filter path, the second additional tunable RF filter path, the third additional tunable RF filter path, the fourth additional tunable RF filter path, and the fifth additional tunable RF filter path would provide the paths from the input terminal $IN_1$ to the output terminal $OUT_2$. This may constitute a SISO filter implemented with an array to allow for a large number of signal paths and thus create one or more notches in the transfer function.

With regard to the resonators R(1,1), R(1,2), R(2,1), R(2,2) shown in FIG. 29, the resonators R(1,1), R(1,2), R(2,1), R(2,2) may each be single-ended resonators, differential resonators, or different combinations of single-ended resonators and differential resonators. The resonator R(1,1) and the resonator R(1,2) in the first tunable RF filter path 66 may each be provided in accordance with any of the embodiments of the resonator R(1,1) and the resonator R(1,2) described above with respect to FIGS. 22-27. For example, the resonator R(1,1) may include the inductor 208 (see FIG. 24) and the capacitive structure 210 (see FIG. 24). The resonator R(1,2) may include the inductor 212 and the capacitive structure 214 (see FIG. 24). The resonator R(2,1) may include an inductor (like the inductor 208 in FIG. 24) and a capacitive structure (like the capacitive structure 210 shown in FIG. 24). The resonator R(2,2) may include an inductor (like the inductor 212 in FIG. 24) and a capacitive structure (like the capacitive structure 214 shown in FIG. 24).

Additionally, one or more of the resonators R(1,1), R(1,2) in the first tunable RF filter path 66 and one or more of the resonators R(2,1), R(2,2) in the second tunable RF filter path 68 may be weakly coupled. Thus, the resonators R(1,1), R(1,2), R(2,1), R(2,2) may be operably associated with one another such that an energy transfer factor between each of the resonators R(1,1), R(1,2), R(2,1), R(2,2) is less than 10%. Alternatively, the energy transfer factor between only a subset of the resonators R(1,1), R(1,2), R(2,1), R(2,2) is less than 10%. In addition, in at least some embodiments, not all of the resonators R(1,1), R(1,2), R(2,1), R(2,2) are weakly coupled to one another.

In this embodiment, the inductor 208 (see FIG. 24) of the resonator R(1,1), the inductor 212 (see FIG. 24) of the resonator R(1,2), the inductor of the resonator R(2,1), and the inductor of the resonator R(2,2) may all be weakly coupled to one another. In some embodiments, displacements between the inductor 208 (see FIG. 24) of the resonator R(1,1), the inductor 212 (see FIG. 24) of the resonator R(1,2), the inductor of the resonator R(2,1), and the inductor of the resonator R(2,2) may all be less than or equal to half the maximum lateral width of the inductor 212. Alternatively, in other embodiments, only a proper subset of the inductor 208 (see FIG. 24) of the resonator R(1,1), the inductor 212 (see FIG. 24) of the resonator R(1,2), the inductor of the resonator R(2,1), and the inductor of the resonator R(2,2) may have displacements that are less than or equal to half the maximum lateral width of the inductor 212.

Figure 30:
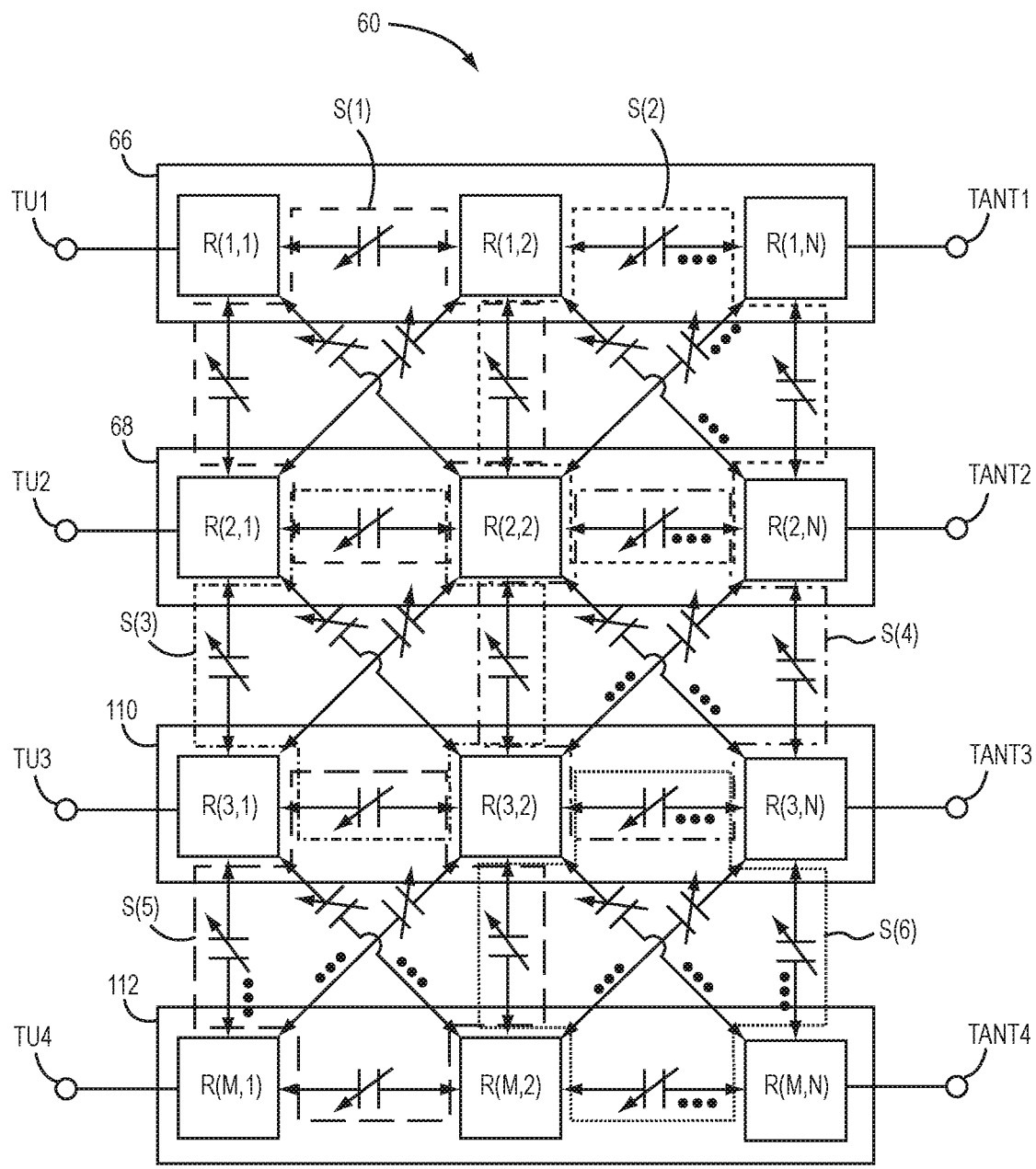
FIG. 30 illustrates another embodiment of a tunable RF filter structure having M number of rows and N number of columns of resonators that are electrically connected by cross-coupling capacitive structures so that the tunable RF filter structure is arranged so as to form an M×N two-dimensional matrix of the resonators.

FIG. 30 illustrates yet another embodiment of the first RF filter structure 60. The first RF filter structure 60 includes the resonators R described above with respect to FIG. 21. The resonators R of the first RF filter structure 60 shown in FIG. 30 are arranged as a two-dimensional matrix of the resonators R. In this embodiment, the first RF filter structure 60 includes an embodiment of the first tunable RF filter path 66, an embodiment of the second tunable RF filter path 68, an embodiment of the third tunable RF filter path 110, and an embodiment of the fourth tunable RF filter path 112. Thus, the integer M for the first RF filter structure 60 shown in FIG. 30 is four (4) or greater. Additionally, the integer N for the first RF filter structure 60 shown in FIG. 30 is 3 or greater. Note that in alternative embodiments, the integer M may be two (2) or greater and the integer N may be two (2) or greater. It should be noted that in alternative embodiments the number of resonators R in each row and column may be the same or different.

In the embodiment of the first RF filter structure 60 shown in FIG. 30, the first tunable RF filter path 66 includes the resonator R(1,1), the resonator R(1,2), and one or more additional resonators R, such as the resonator R(1,N), since the integer N is 3 or greater. All of the weakly coupled resonators R(1,1) through R(1,N) are weakly coupled to one another. Furthermore, the first tunable RF filter path 66 is electrically connected between a terminal TU1 and a terminal TANT1. With regard to the second tunable RF filter path 68, the second tunable RF filter path 68 includes the resonator R(2,1), the resonator R(2,2), and one or more additional resonators R, such as the resonator R(2,N), since the integer N is 3 or greater. All of the weakly coupled resonators R(2,1) through R(2,N) are weakly coupled to one another. Furthermore, the second tunable RF filter path 68 is electrically connected between a terminal TU2 and a terminal TANT2.

With regard to the third tunable RF filter path 110, the third tunable RF filter path 110 includes a resonator R(3,1), a resonator R(3,2), and one or more additional resonators R, such as a resonator R(3,N), since the integer N is 3 or greater. All of the weakly coupled resonators R(3,1) through R(3,N) are weakly coupled to one another. Alternatively, only a proper subset of them may be weakly coupled to one another. Furthermore, the third tunable RF filter path 110 is electrically connected between a terminal TU3 and a terminal TANT3. With regard to the fourth tunable RF filter path 112, the fourth tunable RF filter path 112 includes the resonator R(M,1), the resonator R(M,2), and one or more additional resonators R, such as the resonator R(M,N), since the integer N is 3 or greater. All of the weakly coupled resonators R(M,1) through R(M,N) are weakly coupled to one another. Alternatively, only a proper subset of them may be weakly coupled to one another. Furthermore, the fourth tunable RF filter path 112 is electrically connected between a terminal TU4 and a terminal TANT4.

The first tunable RF filter path 66 is configured to receive RF signals and output filtered RF signals. It should be noted that the first RF filter structure 60 may include any number of tunable RF filter paths, such as, for example, the third tunable RF filter path 110, the fourth tunable RF filter path 112, the fifth tunable RF filter path 122, and the sixth tunable RF filter path 124, described above with respect to FIGS. 11-14. Each of the resonators R may be a tunable resonator, which allows for a resonant frequency of each of the resonators to be varied to along a frequency range. In alternative embodiments, only a proper subset of the resonators R may be tunable. In still another embodiment, all of the resonators R are not tunable, but rather have a fixed transfer function.

In some embodiments, all of the resonators R in the first RF filter structure 60 shown in FIG. 30 are weakly coupled to one another. Thus, the resonators R may all be operably associated with one another such that energy transfer factors between the resonators R are less than 10%. Alternatively, the energy transfer factor is less than 10% only among a proper subset of the resonators R. In other embodiments, only the resonators R in adjacent tunable RF filter paths 66, 68, 110, 112 are weakly coupled to one another. For example, all the resonators R(1,1) through R(1,N) may be weakly coupled to all the resonators R(2,1) through R(2,N). In still other embodiments, only subsets of adjacent resonators R may be weakly coupled to each other. For example, the resonators R(1,1), R(1,2) may be weakly coupled to the resonators R(2,1), R(2,2), while the resonators R(3,1), R(3,2) may be weakly coupled to the resonators R(M,1), R(M,2). These and other combinations would be apparent to one of ordinary skill in the art in light of this disclosure.

Sets S(1), S(2), S(3), S(4), S(5), and S(6) of cross-coupled capacitive structures are electrically connected between the resonators R. Each of the sets S(1), S(2), S(3), S(4), S(5), and S(6) is arranged like the set S of cross-coupled capacitive structures described above with respect to FIG. 29. For example, in one particular exemplary embodiment (e.g., when M=4 and N=3), the set S(1) of cross-coupled capacitive structures is electrically connected between the resonators R(1,1), R(1,2) in the first tunable RF filter path 66 and the resonators R(2,1), R(2,2) in the second tunable RF filter path 68. The set S(2) of cross-coupled capacitive structures is electrically connected between the resonators R(1,2), R(1,N) in the first tunable RF filter path 66 and the resonators R(2,2), R(2,N) in the second tunable RF filter path 68. The set S(3) of cross-coupled capacitive structures is electrically connected between the resonators R(2,1), R(2,2) in the second tunable RF filter path 68 and the resonators R(3,1), R(3,2) in the third tunable RF filter path 110. The set S(4) of cross-coupled capacitive structures is electrically connected between the resonators R(2,2), R(2,N) in the second tunable RF filter path 68 and the resonators R(3,2), R(3,N) in the third tunable RF filter path 110. The set S(5) of cross-coupled capacitive structures is electrically connected between the resonators R(3,1), R(3,2) in the third tunable RF filter path 110 and the resonators R(M,1), R(M,2) in the fourth tunable RF filter path 112. Finally, the set S(6) of cross-coupled capacitive structures is electrically connected between the resonators R(3,2), R(3,N) in the third tunable RF filter path 110 and the resonators R(M,2), R(M,N) in the fourth tunable RF filter path 112. Note that some cross-coupled capacitive structures in the sets S(1), S(2), S(3), S(4), S(5), and S(6) of cross-coupled capacitive structures for the resonators R in adjacent columns or in adjacent ones of the tunable RF filter paths 66, 68, 110, 112 overlap. This is because in the matrix of the resonators R, each of the resonators R is adjacent to multiple other ones of the resonators R. In another embodiment, the sets S(1), S(2), S(3), S(4), S(5), and S(6) of cross-coupled capacitive structures may be connected between non-adjacent resonators R. For example, there may be cross-coupled capacitive structures between resonators R that are more than one column or row apart.

Figure 31:
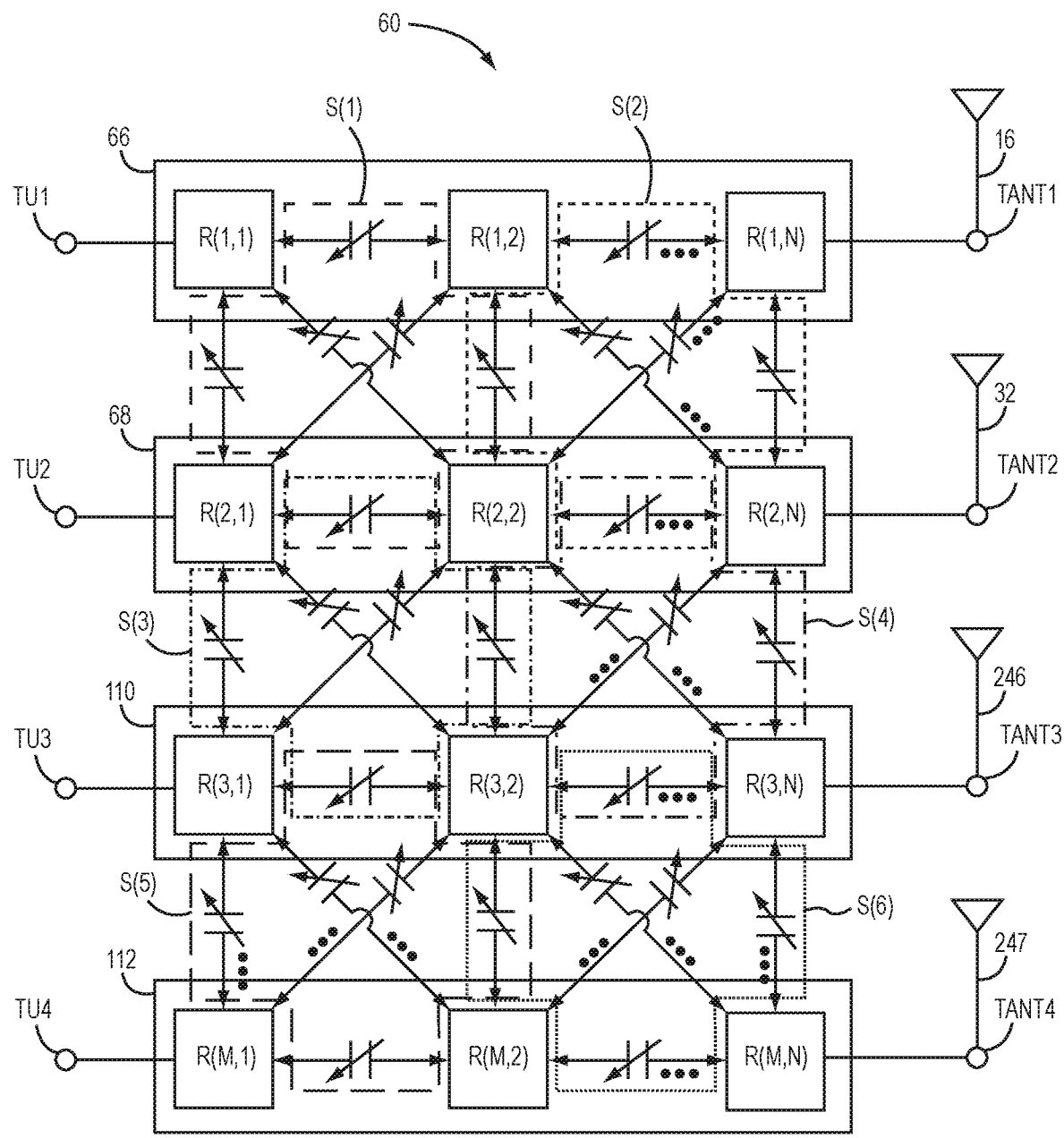
FIG. 31 illustrates the tunable RF filter structure shown in FIG. 30 electrically connected to various RF antennas.

FIG. 31 illustrates the embodiment of the first RF filter structure 60 shown in FIG. 30 electrically connected to the first RF antenna 16, the second RF antenna 32, a third RF antenna 246, and a fourth RF antenna 247. More specifically, the first tunable RF filter path 66 is electrically connected to the first RF antenna 16 at the terminal TANT1. The second tunable RF filter path 68 is electrically connected to the second RF antenna 32 at the terminal TANT2. The third tunable RF filter path 110 is electrically connected to the third RF antenna 246 at the terminal TANT3. The fourth tunable RF filter path 112 is electrically connected to the fourth RF antenna 247 at the terminal TANT4. With the sets S(1), S(2), S(3), S(4), S(5), and S(6) of cross-coupled capacitive structures, the first RF filter structure 60 shown in FIG. 31 forms an interconnected two-dimensional matrix of the resonators R. Thus, in addition to the first tunable RF filter path 66, the second tunable RF filter path 68, the third tunable RF filter path 110, and the fourth tunable RF filter path 112, the sets S(1), S(2), S(3), S(4), S(5), and S(6) of cross-coupled capacitive structures provide a multitude of additional tunable RF filter paths between the terminals TU1, TU2, TU3, TU4 and the terminals TANT1, TANT2, TANT3, TANT4. It should be noted that in alternative embodiments, the terminals TANT1, TANT2, TANT3, TANT4 may not be connected to antennas. Some antennas may be omitted depending on the functionality being realized.

By tuning the sets S(1), S(2), S(3), S(4), S(5), and S(6), the first RF filter structure 60 shown in FIG. 31 can be tuned so that any combination of the resonators R is selectable for the propagation of RF signals. More specifically, the first RF filter structure 60 shown in FIG. 31 is tunable to route RF receive signals from any combination of the terminals TANT1, TANT2, TANT3, TANT4 to any combination of the terminals TU1, TU2, TU3, TU4. Additionally, the first RF filter structure 60 shown in FIG. 31 is tunable to route RF transmission signals from any combination of the terminals TU1, TU2, TU3, TU4 to the terminals TANT1, TANT2, TANT3, TANT4. Accordingly, the first RF filter structure 60 can be configured to implement various MIMO, SIMO, MISO, and SISO operations.

Figure 32:
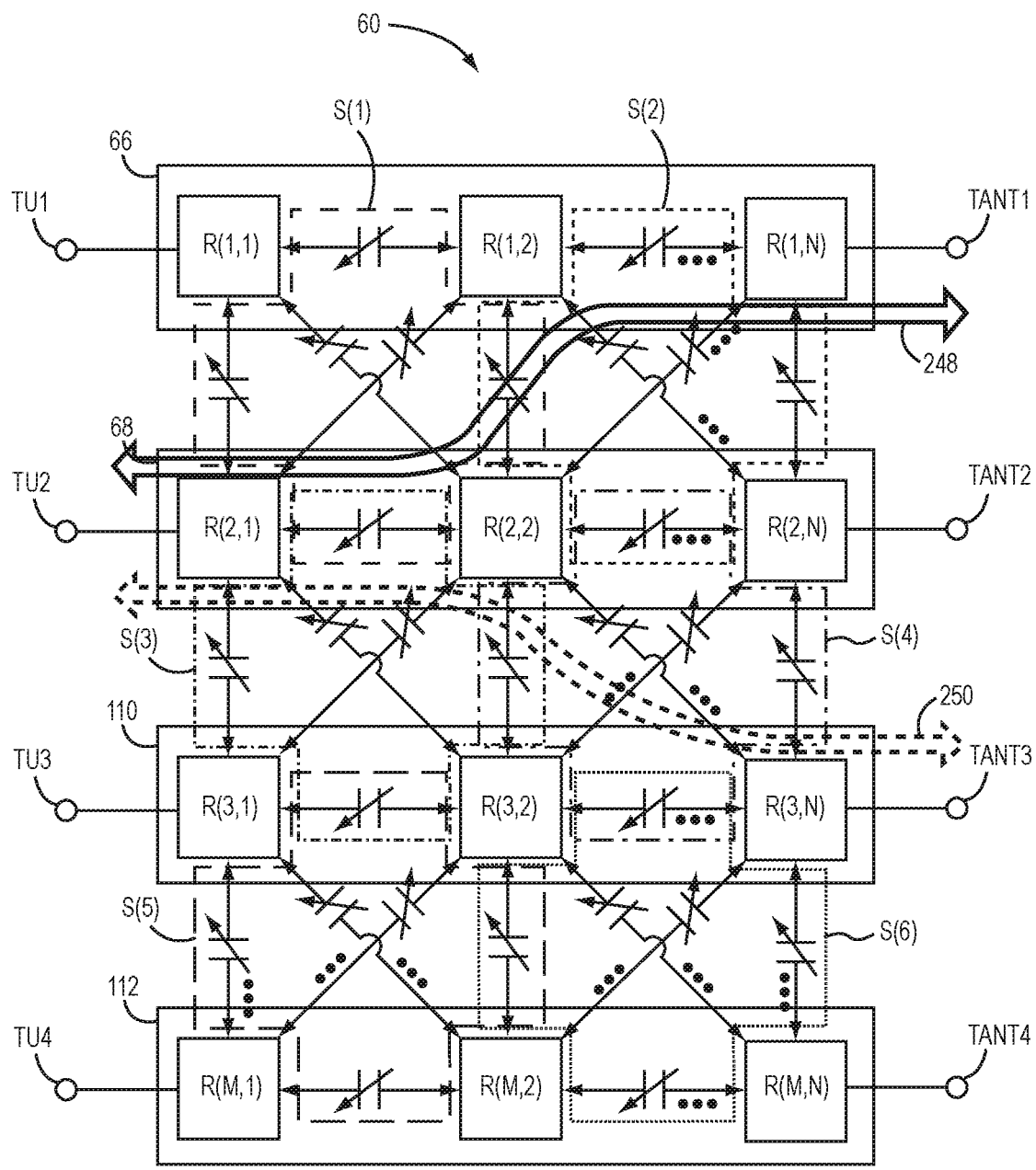
FIG. 32 illustrates the tunable RF filter structure shown in FIG. 30 with two tunable RF filter paths highlighted for performing Multiple Input Multiple Output (MIMO), Single Input Multiple Output (SIMO), Multiple Input Single Output (MISO), and Single Input Single Output (SISO) operations.

FIG. 32 illustrates the first RF filter structure 60 shown in FIGS. 30 and 31 with examples of additional tunable RF filter paths 248, 250 highlighted. It should be noted, however, that there are a vast number of additional combinations of the resonators R that may be selected to provide tunable RF filter paths (e.g., the first tunable RF filter path 66, the second tunable RF filter path 68, the third tunable RF filter path 110, the fourth tunable RF filter path 112, the additional tunable RF filter path 248, and the additional tunable RF filter path 250) between the terminals TU1, TU2, TU3, TU4 and the terminals TANT1, TANT2, TANT3, TANT4. An explicit description of all of the various combinations of the resonators R that may be implemented with the first RF filter structure 60 shown in FIGS. 30-32 is simply impractical given the high number of possible combinations. Along with the previous descriptions, the additional tunable RF filter paths 248, 250 are highlighted in FIG. 32 simply to give examples of the basic concepts. However, the combinations provided for the additional tunable RF filter paths 248, 250 are in no way limiting, as any combination of the resonators R may be selected to route RF signals between the terminals TU1, TU2, TU3, TU4 and the terminals TANT1, TANT2, TANT3, TANT4. Any number of functions, such as signal combining, splitting, multiplexing, and demultiplexing, with various filtering profiles for each, may be realized.

With regard to the additional tunable RF filter paths 248, 250 highlighted in FIG. 32, the additional tunable RF filter paths 248, 250 may be used during MIMO, SIMO, MISO, and SISO operations. More specifically, the additional tunable RF filter path 248 connects the terminal TANT1 to the terminal TU2. The additional tunable RF filter path 250 connects the terminal TANT3 to the terminal TU2. As such, the first RF filter structure 60 may be tuned so that the additional tunable RF filter path 248 and the additional tunable RF filter path 250 are selected in a MISO operation from the terminal TANT1 and the terminal TANT3 to the terminal TU2. The additional tunable RF filter paths 248, 250 may also be used in SIMO operations. For example, the first RF filter structure 60 may be tuned so that the first tunable RF filter path 66 and the additional tunable RF filter path 248 are selected in a SIMO operation from the terminal TU2 to the terminal TANT1. The additional tunable RF filter paths 248, 250 can also be used in SISO operations from the terminal TANT1 to the terminal TU2 or from the terminal TANT3 to the terminal TU2. Finally, the additional tunable RF filter paths 248, 250 may also be used in SIMO operations. For instance, the first RF filter structure 60 may be tuned so that the first tunable RF filter path 66 and the additional tunable RF filter path 250 are selected in a SIMO operation from the terminal TANT1 to the terminal TU1 and from the terminal TANT3 to the terminal TU2.

In some applications involving the first RF filter structure 60 in FIGS. 30-32, MISO and SIMO operations can be used in conjunction with wideband antenna cables or fiber for transmitting RF signals in multiple RF communication frequency bands. Specific communication frequency bands can be processed by certain dedicated RF filtering paths in the first RF filter structure 60. For example, different RF signals may be injected from a wideband antenna and then propagated along different dedicated tunable RF filter paths in the first RF filter structure 60 to the terminals TU1, TU2, TU3, TU4. These dedicated tunable RF filter paths can be configured to have a transfer function that is specifically designed to handle these RF signals. Furthermore, the first RF filter structure 60 shown in FIGS. 30-32 is configured to tune a transfer function of any of the specific tunable RF filter paths (e.g., the first tunable RF filter path 66, the second tunable RF filter path 68, the third tunable RF filter path 110, the fourth tunable RF filter path 112, the additional tunable RF filter path 248, and the additional tunable RF filter path 250) in the first RF filter structure 60 by tuning resonators R that are not in the specific tunable RF filter path being used to route RF signals. This can help reduce out-of-band noise and reduce insertion losses. It can also improve isolation and out-of-band attenuation.

Figure 33:
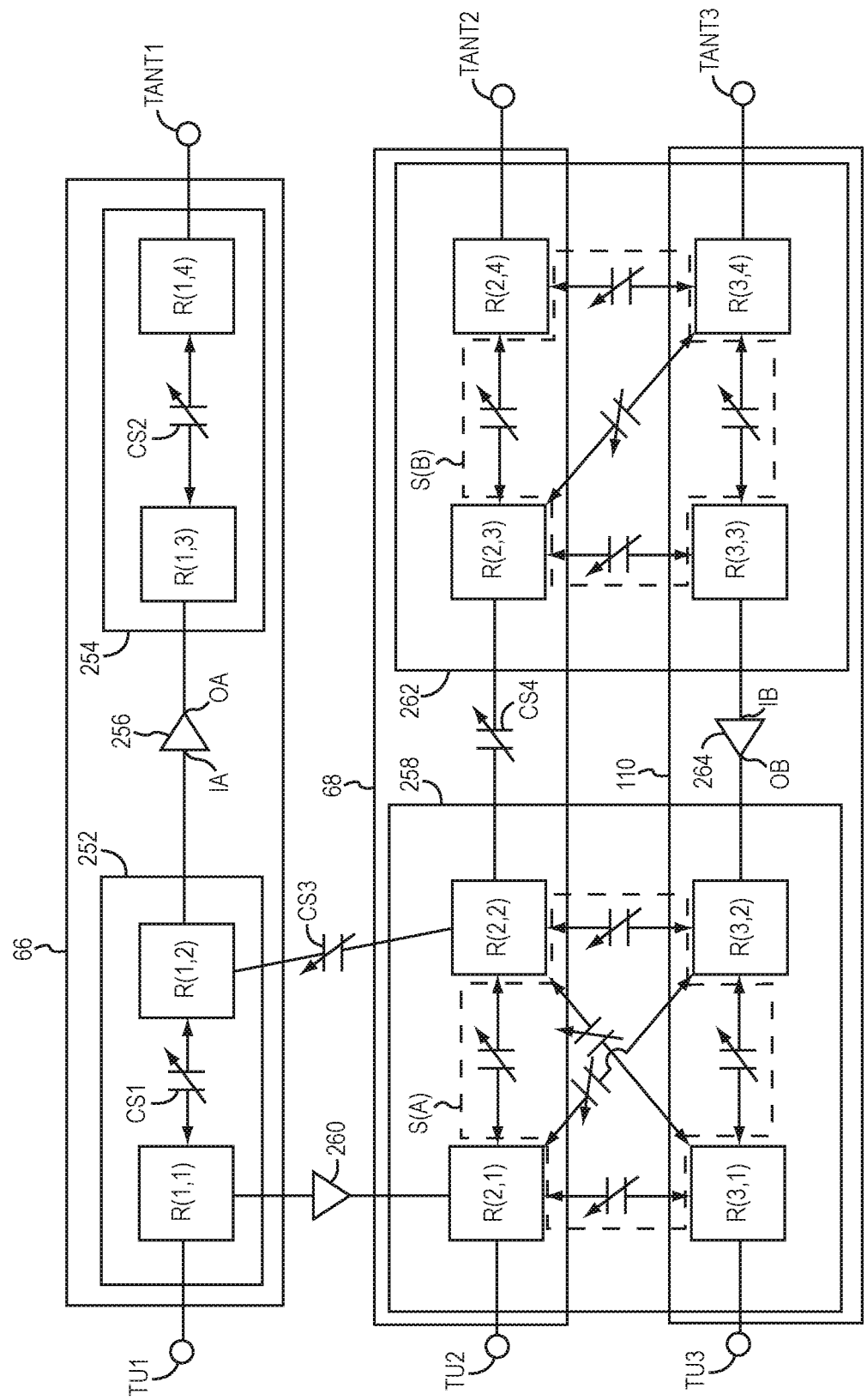
FIG. 33 illustrates another embodiment of a tunable RF filter structure with amplifier stages electrically connected within and between tunable RF filter paths.

FIG. 33 illustrates yet another embodiment of the first RF filter structure 60. The first RF filter structure 60 includes the resonators R and is arranged as a two-dimensional matrix of the resonators R, where N is equal to four (4) and M is equal to three (3). In this embodiment, the first RF filter structure 60 includes an embodiment of the first tunable RF filter path 66, an embodiment of the second tunable RF filter path 68, and an embodiment of the third tunable RF filter path 110. It should be noted that in alternative embodiments, the number of resonators R in each row and column may be the same or different.

In the embodiment of the first RF filter structure 60 shown in FIG. 33, the first tunable RF filter path 66 includes the resonator R(1,1), the resonator R(1,2), the resonator R(1,3), and the resonator R(1,4). Furthermore, the first tunable RF filter path 66 is electrically connected between the terminal TU1 and the terminal TANT1. With regard to the second tunable RF filter path 68, the second tunable RF filter path 68 includes the resonator R(2,1), the resonator R(2,2), a resonator R(2,3), and a resonator R(2,4). Furthermore, the second tunable RF filter path 68 is electrically connected between the terminal TU2 and the terminal TANT2. With regard to the third tunable RF filter path 110, the third tunable RF filter path 110 includes the resonator R(3,1), the resonator R(3,2), a resonator R(3,3), and a resonator R(3,4). Furthermore, the third tunable RF filter path 110 is electrically connected between the terminal TU3 and the terminal TANT3.

In this embodiment, the resonators R in a subset 252 of the resonators R(1,1), R(1,2) in the first tunable RF filter path 66 are weakly coupled to one another. A cross-coupling capacitive structure CS1 is electrically connected between the resonators R(1,1), R(1,2). The cross-coupling capacitive structure CS1 is a variable cross-coupling capacitive structure configured to vary a variable electric coupling coefficient between the resonators R(1,1), R(1,2). A subset 254 of the resonators R(1,3), and R(1,4) in the second tunable RF filter path 68 is also weakly coupled to each other. A cross-coupling capacitive structure CS2 is electrically connected between the resonators R(1,3), R(1,4). The cross-coupling capacitive structure CS2 is a variable cross-coupling capacitive structure configured to vary a variable electric coupling coefficient between the resonators R(1,3), R(1,4).

As shown in FIG. 33, a unidirectional coupling stage 256 is electrically connected within the first tunable RF filter path 66. The unidirectional coupling stage 256 defines an amplifier gain and is configured to provide amplification within the first tunable RF filter path 66 in accordance with the amplifier gain. In some embodiments, the amplifier gain of the unidirectional coupling stage 256 is a variable amplifier gain. In this embodiment, the unidirectional coupling stage 256 is electrically connected between the resonator R(1,2) and the resonator R(1,3). The variable amplifier gain can thus control a variable electric coupling coefficient between the resonator R(1,2) in the subset 252 and the resonator R(1,3) in the subset 254. Since the unidirectional coupling stage 256 is an active semiconductor component, the unidirectional coupling stage 256 is unidirectional and thus only allows signal propagations from an input terminal IA of the unidirectional coupling stage 256 to an output terminal OA of the unidirectional coupling stage 256. Thus, the resonator R(1,2) in the subset 252 is unidirectionally mutual electrically coupled to the resonator R(1,3) in the subset 254.

Note that the resonators R(1,3), R(1,4) in the subset 254 are not electrically connected to the second tunable RF filter path 68 and the third tunable RF filter path 110. As such, the unidirectional coupling stage 256 thus results in a portion of the first tunable RF filter path 66 with the subset 254 of the resonators R(1,3), R(1,4) to be unidirectional. Consequently, signal flow can be to the terminal TANT1 but not from the terminal TANT1. Since the unidirectional coupling stage 256 is unidirectional, the variable amplifier gain (and thus the variable electric coupling coefficient between the resonator R(1,2) and the resonator R(1,3)) may be controlled using feed-forward control techniques and/or feedback control techniques.

Next, the resonators R in a subset 258 of the resonators R(2,1), R(2,2), R(3,1), and R(3,2) in the second tunable RF filter path 68 and in the third tunable RF filter path 110 are weakly coupled to one another. An unidirectional coupling stage 260 is electrically connected between the first tunable RF filter path 66 and the second tunable RF filter path 68. More specifically, the unidirectional coupling stage 260 is electrically connected between the resonator R(1,1) and the resonator R(2,1). The unidirectional coupling stage 260 defines an amplifier gain and is configured to provide amplification in accordance with the amplifier gain. In some embodiments, the amplifier gain of the unidirectional coupling stage 260 is a variable amplifier gain. The variable amplifier gain thus can control a variable electric coupling coefficient between the resonator R(1,1) in the subset 252 and the resonator R(2,1) in the subset 258. A cross-coupling capacitive structure CS3 is electrically connected between the resonator R(1,2) and the resonator R(2,2). The cross-coupling capacitive structure CS3 is a variable cross-coupling capacitive structure configured to vary a variable electric coupling coefficient between the resonators R(1,2), R(2,2).

To interconnect the resonators R(2,1), R(2,2), R(3,1), and R(3,2), a set S(A) of cross-coupling capacitive structures is electrically connected between the resonators R(2,1), R(2,2), R(3,1), and R(3,2) in the subset 258. The set S(A) of cross-coupling capacitive structures is arranged like the set S of cross-coupling capacitive structures described above with respect to FIG. 29. Additionally, the resonators R in a subset 262 of the resonators R(2,3), R(2,4), R(3,3), and R(3,4) in the second tunable RF filter path 68 and in the third tunable RF filter path 110 are weakly coupled to one another. A set S(B) of cross-coupling capacitive structures is electrically connected between the resonators R(2,3), R(2,4), R(3,3), and R(3,4) in the subset 262. The set S(B) of cross-coupling capacitive structures is arranged like the set S of cross-coupling capacitive structures described above with respect to FIG. 29.

To interconnect the subset 258 and the subset 262, the first RF filter structure 60 shown in FIG. 33 includes a cross-coupling capacitive structure CS4 and a unidirectional coupling stage 264. The cross-coupling capacitive structure CS4 is electrically connected between the resonators R(2,2), R(2,3). The cross-coupling capacitive structure CS4 is a variable cross-coupling capacitive structure configured to vary a variable electric coupling coefficient between the resonators R(2,2), R(2,3). The unidirectional coupling stage 264 is electrically connected within the third tunable RF filter path 110. In this embodiment, the unidirectional coupling stage 264 is electrically connected between the resonator R(3,3) and the resonator R(3,2). The unidirectional coupling stage 264 defines an amplifier gain and is configured to provide amplification within the third tunable RF filter path 110 in accordance with the amplifier gain. In some embodiments, the amplifier gain of the unidirectional coupling stage 264 is a variable amplifier gain. The variable amplifier gain can thus control a variable electric coupling coefficient between the resonator R(3,3) in the subset 262 and the resonator R(3,2) in the subset 258. Since the unidirectional coupling stage 264 is an active semiconductor component, the unidirectional coupling stage 264 is unidirectional and thus only allows signal propagations from an input terminal IB of the unidirectional coupling stage 264 to an output terminal OB of the unidirectional coupling stage 264. Thus, the resonator R(3,3) in the subset 262 is unidirectionally mutual electrically coupled to the resonator R(3,2) in the subset 258. Consequently, the third tunable RF filter path 110 shown in FIG. 33 is unidirectional if the signal flow is between the terminal TANT3 and the terminal TU3 though the third tunable RF filter path 110. As such signal flow between the terminal TANT3 and the terminal TU3 is provided only through the third tunable RF filter path 110, signal flow can only be from the terminal TANT3 to the terminal TU3, and not vice versa. In other cases, an additional tunable RF signal path (e.g., the additional RF terminal tunable RF signal path that includes the resonators R(3,1), R(2,2), R(2,3) and R(3,4)) can be tuned to provide bidirectional signal flow between the terminal TU3 and the terminal TANT3 through the cross-coupling capacitive structure CS4. The unidirectional coupling stages 256, 260, 264 may be active devices, such as amplifiers, diodes, transistors, networks of transistors, buffer stages, attenuation stages, and the like. The unidirectional coupling stages 256, 260, 264 can have gains higher than one (1), lower than one (1), or equal to one (1). Additionally, the unidirectional coupling stages 256, 260, 264 may be passive devices. The unidirectional coupling stages 256, 260, 264 may not be entirely or ideally unilateral, but may have some finite reverse coupling. In this case, the unidirectional coupling stages 256, 260, 264 may be predominately unilateral. One example in which the unidirectional coupling stages 256, 260, 264 may be used for multi-resonator applications and may improve isolation between certain parts, such as transmission ports and receive ports of a duplexer.

Figure 34:
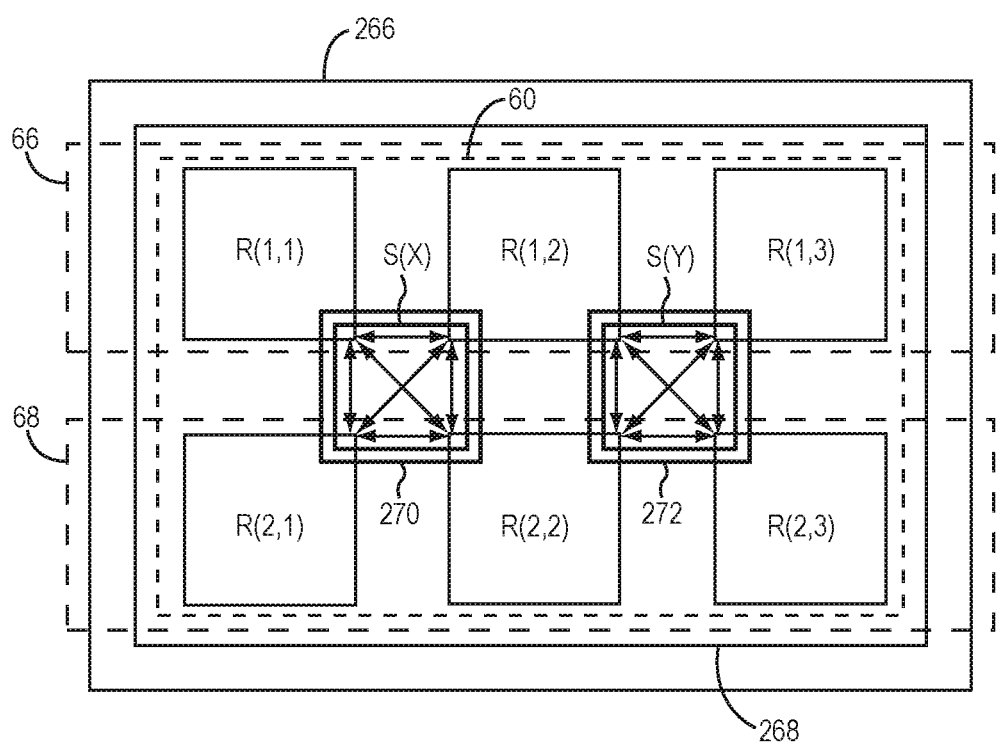
FIG. 34 illustrates an embodiment of a tunable RF filter structure integrated into an integrated circuit (IC) package with multiple and separate semiconductor dies.

FIG. 34 illustrates yet another embodiment of the first RF filter structure 60. The first RF filter structure 60 shown in FIG. 34 is integrated into an IC package 266. The first RF filter structure 60 shown in FIG. 34 includes the resonators R and is arranged as a two-dimensional matrix of the resonators R, where N is equal to three (3) and M is equal to two (2). It should be noted that in alternative embodiments the number of resonators R in each row and column may be the same or different.

In this embodiment, the first RF filter structure 60 includes an embodiment of the first tunable RF filter path 66 and an embodiment of the second tunable RF filter path 68. The first tunable RF filter path 66 includes the resonator R(1,1), the resonator R(1,2), and the resonator R(1,3). The second tunable RF filter path 68 includes the resonator R(2,1), the resonator R(2,2), and the resonator R(2,3). A set S(X) of cross-coupling capacitive structures is electrically connected between the resonators R(1,1), R(1,2), R(2,1), and R(2,2). The set S(X) of cross-coupling capacitive structures is arranged like the set S of cross-coupling capacitive structures described above with respect to FIG. 29. A set S(Y) of cross-coupling capacitive structures is electrically connected between the resonators R(1,2), R(1,3), R(2,2), and R(2,3). The set S(Y) of cross-coupling capacitive structures is also arranged like the set S of cross-coupling capacitive structures described above with respect to FIG. 29.

As shown in FIG. 34, the IC package 266 houses a package substrate 268, a semiconductor die 270, and a semiconductor die 272. The semiconductor die 270 and the semiconductor die 272 are mounted on the package substrate 268. In this embodiment, the resonators R of the first RF filter structure 60 are formed by the package substrate 268. The set S(X) of cross-coupling capacitive structures is formed by the semiconductor die 270. On the other hand, the set S(Y) of cross-coupling capacitive structures is formed by the semiconductor die 272. Thus, the set S(X) of cross-coupling capacitive structures and the set S(Y) of cross-coupling capacitive structures are formed on multiple and separate semiconductor dies 270, 272. Using the multiple and separate semiconductor dies 270, 272 may be helpful in order to increase isolation. The multiple and separate semiconductor dies 270, 272 may have less area than the semiconductor die 270 shown in FIG. 34. As such, the embodiment shown in FIG. 35 may consume less die area.

Figure 35:
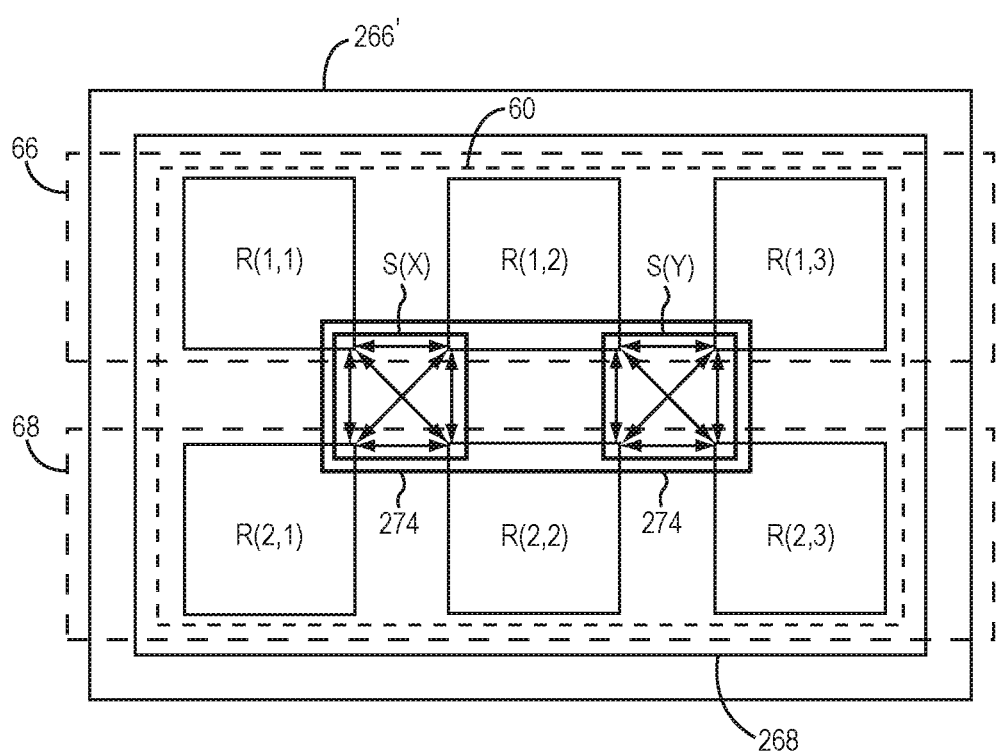
FIG. 35 illustrates an embodiment of the same tunable RF filter structure shown in FIG. 34, but now integrated into an IC package with a single semiconductor die.

FIG. 35 illustrates another embodiment of an IC package 266' that houses the same embodiment of the first RF filter structure 60 described above with regard to FIG. 34. The IC package 266' is the same as the IC package 266 shown in FIG. 34, except that the IC package 266' only has a single semiconductor die 274. In this embodiment, both the set S(X) of cross-coupling capacitive structures and the set S(Y) of cross-coupling capacitive structures are formed by the semiconductor die 272. Thus, the IC package 266' allows for a more compact arrangement than the IC package 266.

Figure 36:
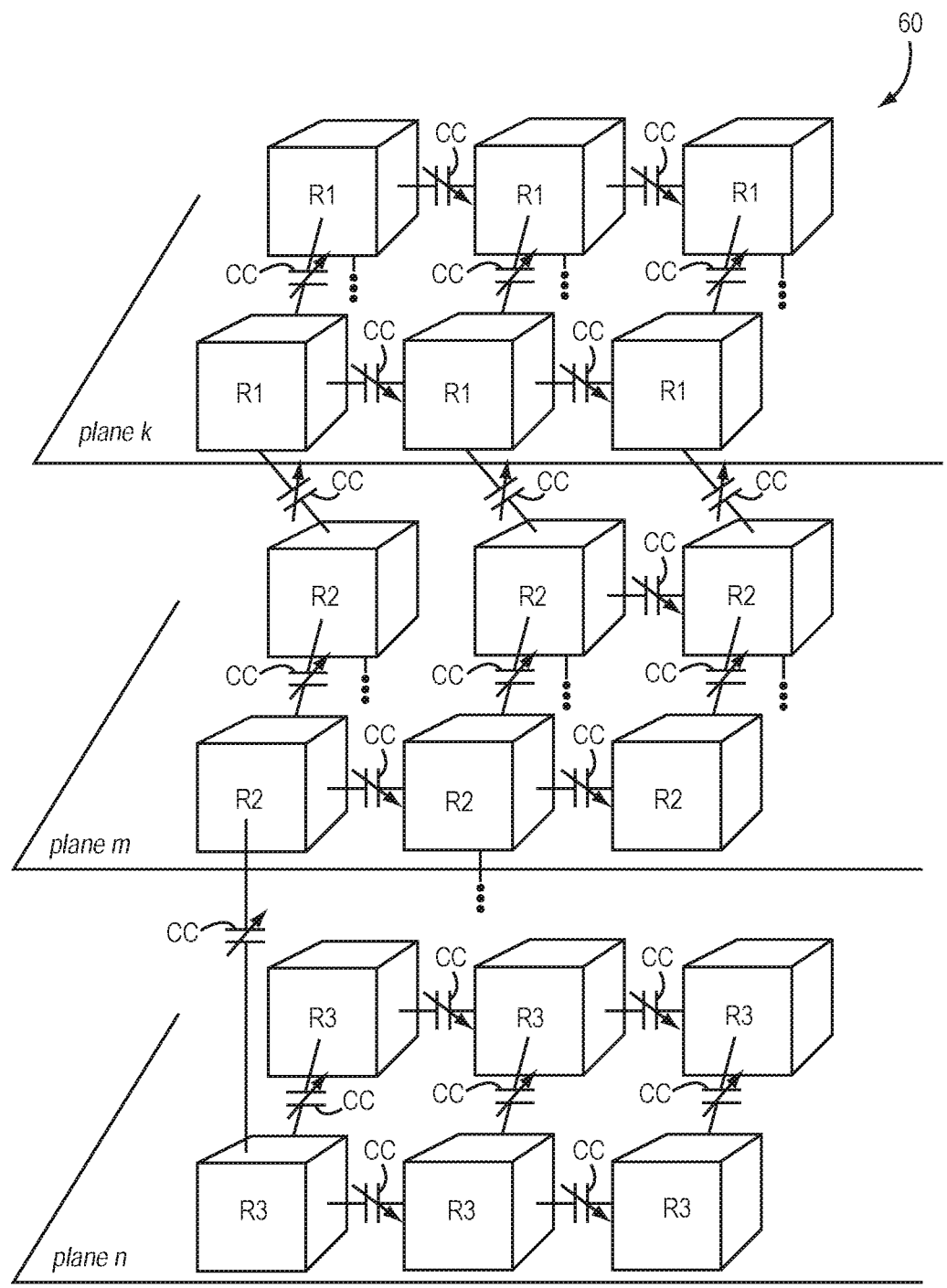
FIG. 36 illustrates one embodiment of a tunable RF filter structure having resonators and cross-coupling capacitive structures electrically connected between the resonators so as to form a three-dimensional matrix of the resonators.

FIG. 36 illustrates yet another embodiment of the first RF filter structure 60. In this embodiment, the first RF filter structure 60 is arranged as a three-dimensional matrix of resonators R1, R2, R3. More specifically, a two-dimensional matrix of the resonators R1 is provided on a plane k, a two-dimensional array of the resonators R2 is provided on a plane m, and a two-dimensional array of the resonators R3 is provided on a plane n. Cross-coupling capacitive structures CC are electrically connected between the resonators R1, R2, R3 that are adjacent to one another in the same plane k,m,n and in the different planes k,m,n. The three-dimensional matrix of resonators R1, R2, R3 thus allows for more resonators to be cross-coupled to one another. This allows for the first RF filter structure 60 to provide greater numbers of tunable RF filter paths and allows for the first RF filter structure 60 to be tuned more accurately.

In general, having more tunable RF filter paths allows for the synthesis of a more complex transfer function with multiple notches for better blocker rejection. The number of resonators R1, R2, R3 in each of the planes k, n, m may be different or the same. The three-dimensional matrix of resonators can be used in MIMO, SIMO, MISO, and SISO applications.

Figure 37:
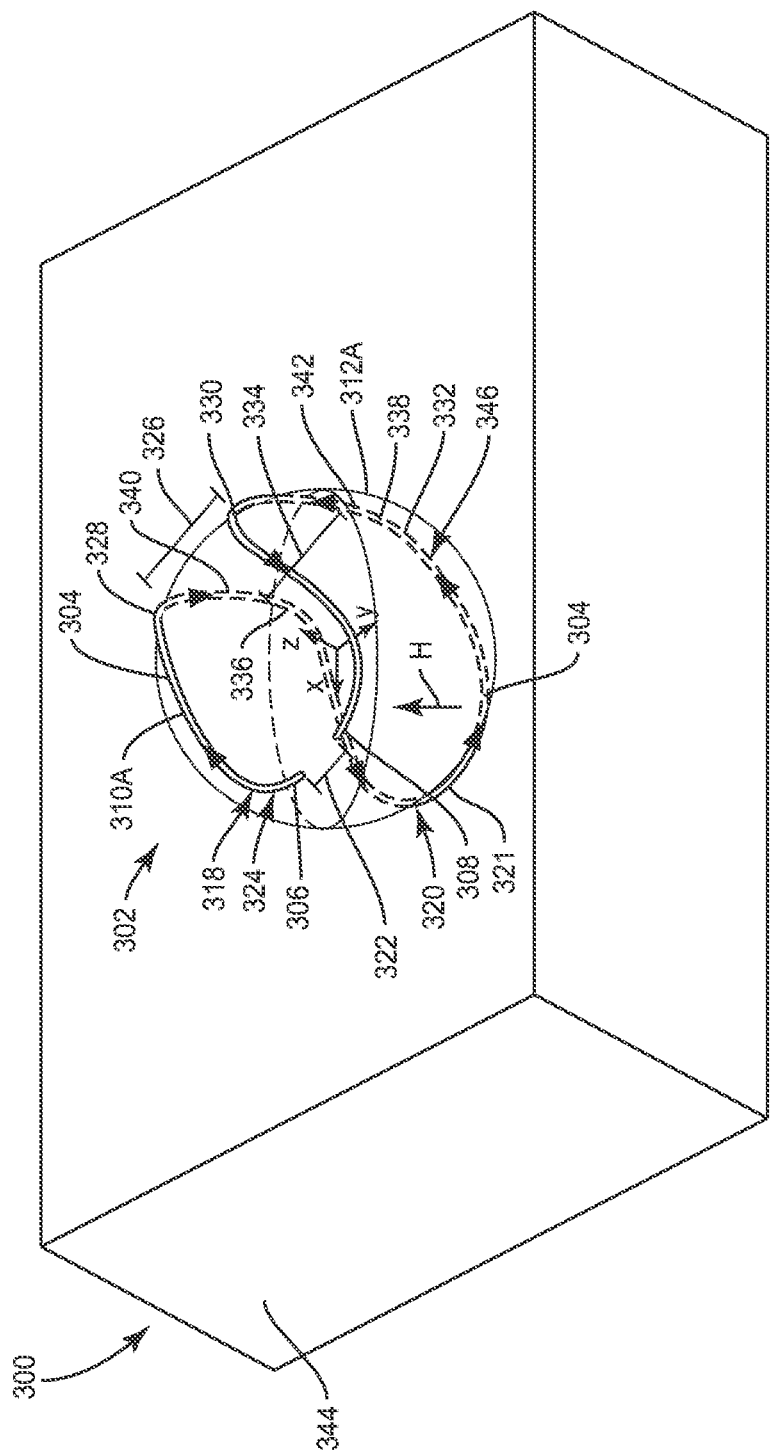
FIG. 37 illustrates one embodiment of an inductor having a conductive path corresponding to a shape of a 2D lobe laid over a 3D volume, where the 2D lobe is shaped as a continuous and rounded double humped resonant curve and the 3D volume is a sphere.

FIG. 37 illustrates an exemplary apparatus that includes a substrate 300 and an exemplary inductor 302 residing in the substrate 300. Embodiments of the inductor 302 may be provided in any of the resonators R, R1, R2, R3 described with regard to FIGS. 21-27 (e.g., the inductors 208, 212, 226, 232) and FIGS. 29-36 above. As explained in further detail below, the inductor 302 is configured to generate a magnetic field H that allows the inductor 302 to be placed close to other inductors, while still allowing for weak coupling. In this embodiment, the inductor 302 resides in the substrate 300, which may be any type of suitable substrate, such as a Back-End-of-Line (BEOL) or a semiconductor substrate of a semiconductor die, a package substrate (e.g., the package substrate 268 described above with regard to FIGS. 34 and 35), a printed circuit board (PCB), and/or the like. While the inductor 302 is described as being used in the resonators R, R1, R2, R3 described with regard to FIGS. 21-27 and FIGS. 29-36 of the first RF filter structure 60 described above, the inductor 302 has a wide range of RF applications. For example, the inductor 302 may be used in baluns, transformers, antenna tuners, and/or any other type of RF device or component that could benefit from inductors with an improved Q factor.

As shown in FIG. 37, the inductor 302 comprises a conductive path 304 that extends from a first terminal 306 to a second terminal 308. For example, the first terminal 306 and the second terminal 308 may each be an end (e.g., the ends 217, 218, 220, 222, 236, 238, 240, 242 in FIGS. 22-27), nodes, conductive features, and/or the like, for inputting/outputting an RF signal into and/or out of the of the inductor 302. The conductive path 304 has a shape corresponding to a two-dimensional (2D) lobe 310A laid over a three-dimensional (3D) volume 312A. In this embodiment, the 2D lobe 310A is approximately shaped as a double humped resonant curve having a first open circle 318 (a special case of an open ellipse) and a second open circle 320 (also a special case of another open ellipse). Also, the 3D volume 312A is approximately shaped as a sphere (which is a special case of an ellipsoid). However, as explained in further detail below, the conductive path 304 may have the 2D lobe 310A be in any 2D shape and the 3D volume 312A may have any 3D shape.

Note that the 2D lobe 310A is not a 2D structure but is rather a 3D structure, since the 2D lobe 310A is laid over the 3D volume 312A. In other words, the 2D lobe 310A would be a 2D structure if the 2D lobe 310A where laid over a 2D plane. However, the 2D lobe 310A is a 3D structure because the 3D volume 312A provides a 3D manifold and the 2D lobe 310A is folded onto the 3D volume 312A. The 2D lobe 310A may be any conductive structure that is at least partially bounded so as to form a loop. In this manner, the inductor 302 is configured to generate the magnetic field H having magnetic field lines outside the inductor 302 that are predominately destructive and magnetic field lines inside the inductor 302 that are predominately constructive.

With regard to the embodiment of the inductor 302 shown in FIG. 37, the first open circle 318 is open so that the 2D lobe 310A extends from the first terminal 306 to the second terminal 308. The 2D lobe 310 is open so as to define a gap 322 in the 2D lobe 310A between the first terminal 306 and the second terminal 308. The 2D lobe 310A is formed such that the 2D lobe 310A extends out of the first terminal 306 away from the first terminal 306 and loops back to the second terminal 308 back towards the gap 322. In this embodiment, the first open circle 318 forms a first turn 324 of the inductor 302 having the gap 322 and another gap 326 between a connecting end 328 and a connecting end 330 of the first turn 324. The 2D lobe 310A thus forms a bend 321 that bounds the 2D lobe 310A. More specifically, the second open circle 320 forms a second turn 332 of the inductor 302 that loops the 2D lobe 310A back toward the gap 322 and the second terminal 308 of the first turn 324. The second turn 332 forms a gap 334 between a connecting end 336 and a connecting end 338 of the second turn 332. The connecting end 336 of the second turn 332 is connected to the connecting end 328 of the first turn 324, and the connecting end 338 of the second turn 332 is connected to the connecting end 330 of the first turn 324. Note however, that the connection between the first turn 324 and the second turn 332 also forms a third turn 340 and a fourth turn 342 that face one another but are oriented orthogonally with respect to the first turn 324 and the second turn 332.

The magnetic field H is generated by the inductor 302 in response to an RF signal. By laying the 2D lobe 310A of the conductive path 304 of the inductor 302 over the 3D volume 312A, the magnetic field lines of the magnetic field H are predominately constructive inside the inductor 302 and within the 3D volume 312A. The magnetic field lines of the magnetic field H are predominately constructive inside the inductor 302 and within the 3D volume 312A because magnetic field line summation dominates inside the inductor 302 and within the 3D volume 312A so that a majority of magnetic energy of the magnetic field H is stored inside the inductor 302 and within the 3D volume 312A. Also, the magnetic field lines of the magnetic field H are predominately destructive outside the inductor 302 and the 3D volume 312A of the inductor 302. The magnetic field lines of the magnetic field H are predominately destructive outside the inductor 302 and the 3D volume 312A because magnetic field line subtraction dominates outside the inductor 302 and the 3D volume 312A so that a minority of the magnetic energy of the magnetic field H is stored outside of the inductor 302 and the 3D volume 312A. Nevertheless, the inductor 302 may be designed to have some magnetic coupling with another inductor, and thus the magnetic field lines outside of the inductor 302 and the 3D volume 312A may not completely cancel, and in some regions outside of the inductor 302 and the 3D volume 312A may actually be constructive. The magnetic field H is non-zero in magnitude around the opening in the inductor 302, thereby allowing weak coupling between inductors in different resonators R (shown in FIG. 30). Similarly, while the magnetic field lines of the magnetic field H are predominately constructive inside the inductor 302 and within the 3D volume 312A, there may be regions inside the inductor 302 and within the 3D volume 312A where the magnetic field lines are destructive inside the inductor 302 and within the 3D volume 312A. For example, the inductor 302 is configured to generate the magnetic field H so that the magnetic field lines inside the inductor are predominately constructive but also substantially cancel near a geometric centroid of the inductor 302. If a second inductor (not shown) is placed inside the inductor 302 in areas where the magnetic field H is strong, a large coupling can be achieved as needed for transformer applications. Thus, a magnetic field null may be provided near the geometric centroid inside the inductor 302 and within the 3D volume 312A. Additionally, lack of complete symmetry in the inductor 302, either by design or through error, may result in regions outside the inductor 302 where magnetic field lines are primarily constructive so that magnetic coupling to adjacent inductors may be provided.

The 2D lobe 310A is laid over the 3D volume 312A such that the 2D lobe 310A extends in three orthogonal spatial dimensions. Thus, an RF signal propagates through the 2D lobe in three orthogonal spatial dimensions, and the conductive path 304 is a 3D conductive path. As such, all three spatial dimensions are required to describe signal propagation throughout the 2D lobe 310. Arrows are drawn throughout the inductor 302 to indicate directions of current propagation throughout the inductor 302. The spreading of the magnetic field H in all three dimensions helps achieve weak coupling, since little energy is concentrated in any given direction.

An x-axis, a y-axis, and a z-axis are shown in FIG. 37 with an origin at a geometric centroid of the inductor 302 and the 3D volume 312A. As shown in FIG. 37, the first turn 324 and the second turn 332 face one another and are substantially symmetrical with respect to an x-y plane. The third turn 340 and the fourth turn 342 face one another and are substantially symmetrical with respect to x-z plane, which is orthogonal to the x-y plane. The inductor 302 does not have symmetry with respect to the y-z plane, which is orthogonal to both the x-y plane and the x-z plane. However, on one side of the y-z plane the inductor 302 is bounded, while on another side of the y-z plane, the inductor 302 is unbounded.

Due to the symmetry of the inductor 302 shown in FIG. 37, the 2D lobe 310A of the inductor 302 is laid over the 3D volume 312A such that most inductor segments have a corresponding inductor segment in the inductor 302 such that current propagation in the inductor segments is antipodal. For instance, except for the gap 322, inductor segments in the first turn 324 located on one side of the x-y plane have a corresponding inductor segment in the second turn 332 located on the other side of the x-y plane where current propagation is antipodal. Similarly, except for the gap 322, inductor segments in the third turn 340 located on one side of the x-z plane have a corresponding inductor segment in the fourth turn 342 located on the other side of the x-z plane where current propagation is antipodal. Accordingly, the magnetic field lines of the magnetic field H are predominately additive within the inductor 302 (reinforce each other) inside the inductor 302, while the magnetic field lines of the magnetic field H are predominately subtractive (canceling partially or completely) outside the inductor 302. However, lack of symmetry with respect to the y-z plane ensures that this is not entirely the case throughout.

In this embodiment, the inductor 302 shown in FIG. 37 is formed by the substrate 300. More specifically, the substrate 300 includes a substrate body 344 and a metallic structure 346 integrated into the substrate body 344. For example, the substrate body 344 may be formed from multiple layers of a non-conductive material. The metallic structure 346 may be integrated into the substrate body 344 and formed by conductive layers and vias within and/or on a surface of the substrate body 344. The inductor 302 may be formed by the metallic structure and thus may be partially or completely formed from the conductive layers and vias provided by the metallic structure integrated into the substrate body 344.

Figure 38:
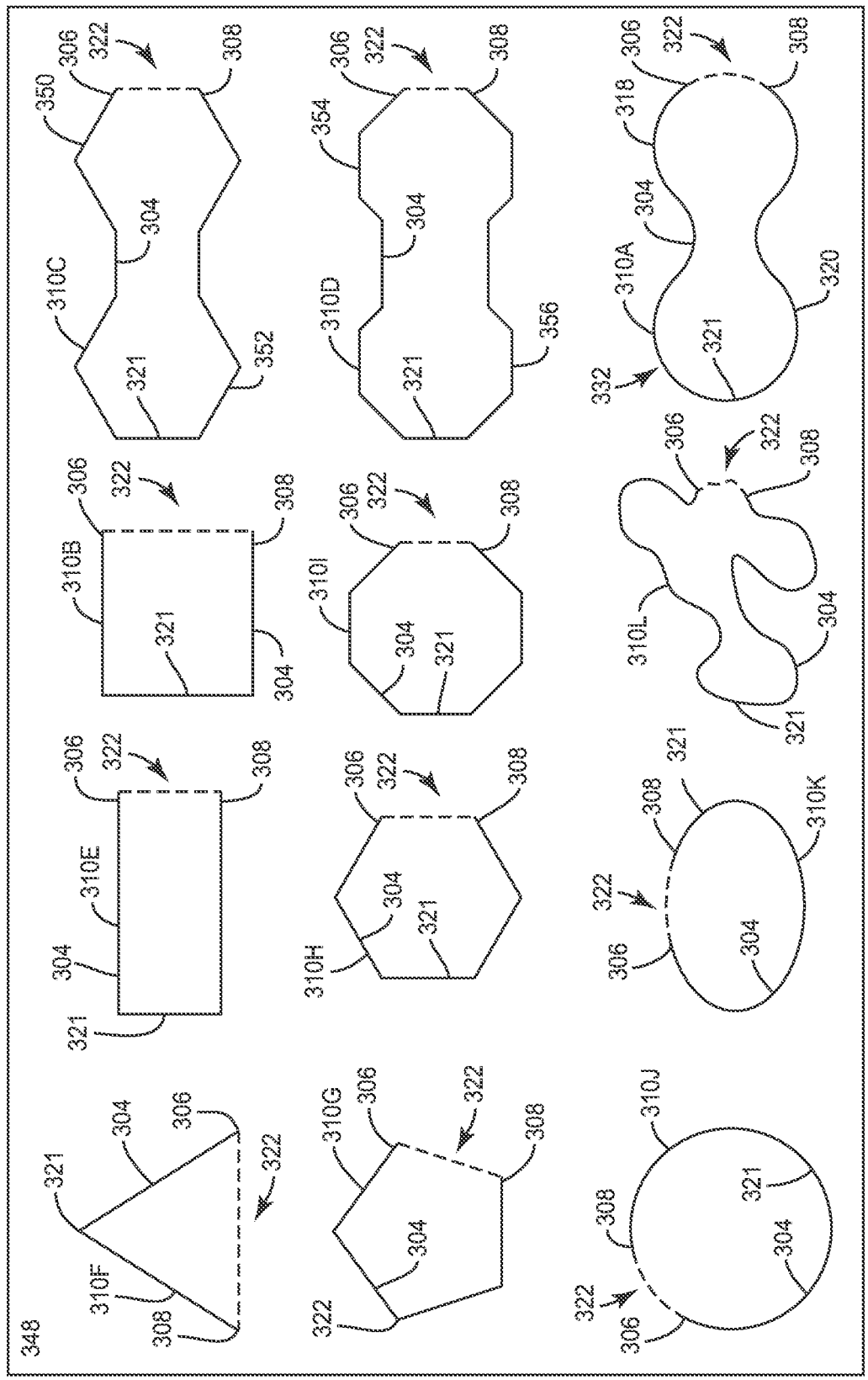
FIG. 38 illustrates various embodiments of 2D lobes, any one of which may be utilized to form embodiments of the inductor shown in FIG. 37.

FIG. 38 illustrates various different exemplary types of 2D lobes (referred to generically as elements 310 and specifically as elements 310A-310L) mapped onto a 2D plane 348. As mentioned above, the inductor 302 shown in FIG. 37 was formed with the 2D lobe 310A. The 2D lobe 310A is approximately shaped as a double humped resonant curve having the first open circle 318 (a special case of an open ellipse) and the second open circle 320 (also a special case of another open ellipse). However, the 2D lobe 310 of the conductive path 304 may have any suitable 2D shape that forms a lobe. As such, the 2D lobes 310A-310L are simply exemplary and should not be considered exhaustive. As would be apparent to one of ordinary skill in the art in light of this disclosure, embodiments of the conductive path 304 of the inductor 302 may be have a shape in accordance to any one of the 2D lobes 310 shown in FIG. 38 or any other suitable 2D shape that forms a lobe. The 2D lobe 310 of the conductive path 304 may be open or closed.

With regard to the 2D lobes 310 specifically shown in FIG. 38, each of the 2D lobes 310 shown in FIG. 38 is open to define the gap 322 (between the first terminal 306 and the second terminal 308) and the bend 321. The conductive path 304 may be shaped approximately as a polygon, such as a 2D lobe 310B shaped approximately as a square, the 2D lobe 310E shaped approximately as a rectangle, the 2D lobe 310F is shaped approximately as a triangle, the 2D lobe 310G shaped approximately as a pentagon, the 2D lobe 310H shaped approximately as a hexagon, the 2D lobe 310I shaped approximately as a octagon, and/or any other 2D lobe shaped as any polygon have three or more sides. Each of the 2D lobes 310B, 310E-310I is open either by having a side that is fully or partially open to define the gap 322. The 2D lobe 310B is a special case of a rectangle where each of side of the 310B is about equal. Thus, the 2D lobe 310B is shaped approximately as a square. The 2D lobe 310E is a rectangle having sides that define a length of the rectangle with a different distance than sides that define a width of the rectangle. Note also that, while the 310E-310I each have sides that are approximately equal, the sides of 310E-310I may or may not be approximately equal in other alternative embodiments.

The 2D lobes 310J and 310K are shaped as continuous and rounded resonant curves. More specifically, the 2D lobe 310J is shaped approximately as a circle while the 2D lobe 310K is shaped approximately as an ellipse. The 2D lobe 310J is a special case of a ellipse. Thus, on the plane 348, each portion of the 2D lobe 310J is about equidistant from a geometric centroid of the 2D lobe 310J. As such, the 2D lobe 310J is shaped approximately as a circle. The 2D lobe 310K is an ellipse where a distance to a geometric centroid is defined by a minor and major axis of different distances. Each of the 2D lobes 310J, 310K is open since each of the 2D lobes 310J, 310K defines the gap 322 so that the circle and ellipse are only partially bounded.

The 2D lobes 310A, 310C, and 310D are each shaped approximately as a double humped resonant curve. As discussed above, the 2D lobe 310A has the first open circle 318 (a special case of an open ellipse) and the second open circle 320 (also a special case of another open ellipse) and, thus, the 2D lobe 310A is a continuous double humped resonant curve. However, the 2D lobes 310C and 310D are discrete double humped resonant curves. The 2D lobes 310C, 310D each are approximately shaped as a first open polygon and a second open polygon connected to one another. For example, the 2D lobe 310C is approximately shaped as a first open hexagon 350 and a second open hexagon 352 connected to one another. The 2D lobe 310D is approximately shaped as a first open octagon 354 and a second open octagon 356 connected to one another.

Accordingly, FIG. 38 illustrates various different exemplary types of the 2D lobes 310, which may be used to provide the conductive path 304 of the inductor 302 shown in FIG. 37. In FIG. 38 however the 2D lobes 310 are not shown laid over a 3D volume but rather are shown mapped onto the 2D plane 348. As mentioned above, the inductor 302 shown in FIG. 37 was formed with the 2D lobe 310A. The 2D lobe 310A is approximately shaped as a double humped resonant curve having the first open circle 318 (a special case of an open ellipse) and the second open circle 320 (also a special case of another open ellipse). However, the 2D lobe 310 of the conductive path 304 may have any suitable 2D shape that forms a lobe. As such, the 2D lobes 310A-310L are simply exemplary and should not be considered exhaustive. As would be apparent to one of ordinary skill in the art in light of this disclosure, embodiments of the conductive path 304 of the inductor 302 may be have a shape in accordance to any one of the 2D lobes 310 shown in FIG. 38 or any other suitable 2D shape that forms a lobe. The 2D lobe 310 of the conductive path 304 may be open or closed.

With regard to the 2D lobes 310 specifically shown in FIG. 38, each of the 2D lobes 310 shown in FIG. 38 is open to define the gap 322 (between the first terminal 306 and the second terminal 308) and the bend 321. The conductive path 304 may be shaped approximately as a polygon, such as a 2D lobe 310B shaped approximately as a square, the 2D lobe 310E shaped approximately as a rectangle, the 2D lobe 310F is shaped approximately as a triangle, the 2D lobe 310G shaped approximately as a pentagon, the 2D lobe 310H shaped approximately as a hexagon, the 2D lobe 310I shaped approximately as a octagon, and/or any other 2D lobe shaped as any polygon have three or more sides. Each of the 2D lobes 310B, 310E-310I is open either by having a side that is fully or partially open to define the gap 322. The 2D lobe 310B is a special case of a rectangle where each of side of the 310B is about equal. Thus, the 2D lobe 310B is shaped approximately as a square. The 2D lobe 310E is a rectangle with sides that define a length of the rectangle being different distance than sides that define a width of the rectangle. Note that while the 310E-310I each have sides that are approximately equal, this may or may not be the case in other alternative embodiments.

Again, the 2D lobes 310J and 310K are each shaped as continuos and resonant curves. More specifically, the 2D lobe 310J is shaped approximately as a circle while the 2D lobe 310K is shaped approximately as an ellipse. The 2D lobe 310J is a special case of a ellipse, where each portion of the 2D lobe 310J is about equidistant from a geometric centroid. Thus, the 2D lobe 310J is shaped approximately as a circle. The 2D lobe 310K is an ellipse where a distance to a geometric centroid is defined by a minor and major axis of different distances. Each of the 2D lobes 310J, 310K is open since the gap 322 means that the circle and ellipse are only partially bounded.

Again, the 2D lobes 310A, 310C, and 310D are each shaped approximately as a double humped resonant curve. As discussed above, the 2D lobe 310A has the first open circle 318 (a special case of an open ellipse) and the second open circle 320 (also a special case of another open ellipse), and thus the 2D lobe 310A is a continuous double humped resonant curve. However, the 2D lobes 310C and 310D are discrete double humped resonant curves. The 2D lobes 310C, 310D each are approximately shaped as a first open polygon and a second open polygon connected to one another. For example, the 2D lobe 310C is approximately shaped as a first open hexagon 350 and a second open hexagon 352 connected to one another. The 2D lobe 310D is approximately shaped as a first open octagon 354 and a second open octagon 356 connected to one another. Finally, the 2D lobe 310L has an irregular 2D shape but also defines the gap 322 and the bend 321.

It should be noted that a resistance of the 2D lobe 310 increases the sharper the directional changes are in the 2D lobe 310. More rounded 2D lobes are thus preferable as there is less resistance (lower losses give a higher Q factor). While polygons are discrete shapes and can be considered discrete resonant curves, polygons approximate rounded 2D lobes as a number of sides are increased. In other words, as a number of sides of the polygon increases, the sharpness of directional changes decreases. However, the inductor 302 may be more difficult to construct as a rounded 2D lobe or as a polygonial 2D lobe as a number of sides of the polygon increases. Thus, some accommodation between resistance and manufacturability should be made when selecting a shape for the 2D lobe 310 for the inductor 302.

Figure 39:
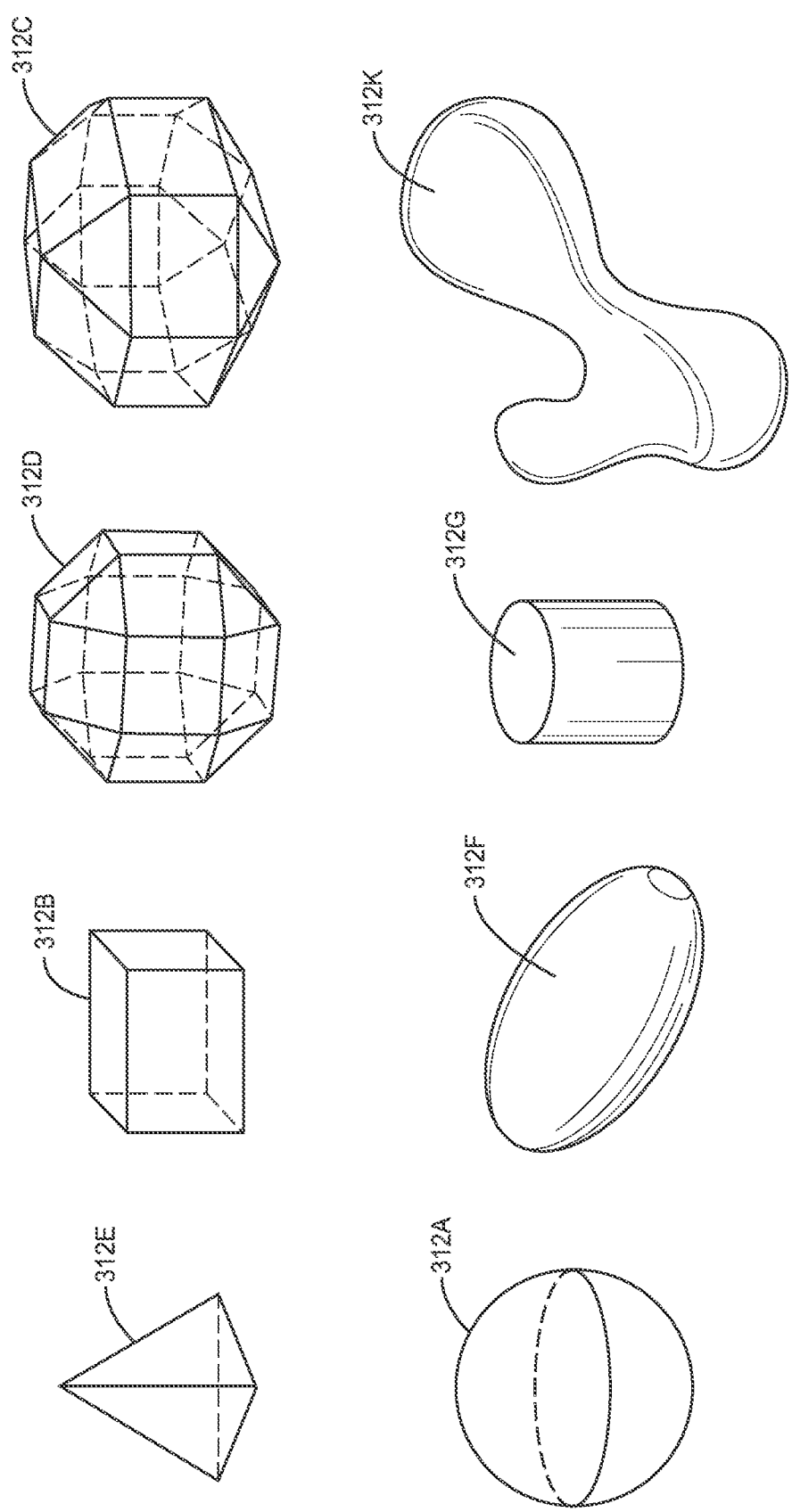
FIG. 39 illustrates various embodiments of 3D volumes, any one of which may be provided to form embodiments of the inductor shown in FIG. 39.

FIG. 39 illustrates various different exemplary types of 3D volumes (referred to generically as elements 312 and specifically as elements 312A-312K) having a variety of 3D shapes. As mentioned above, the inductor 302 shown in FIG. 37 was formed with the 3D volume 312A, which is a sphere (and a special case of an ellipsoid). However, the inductor 302 may be formed with the conductive path 304 (shown in FIGS. 37 and 38) shaped as any suitable 2D lobe laid over a 3D volume of any suitable 3D shape. For example, embodiments of the conductive path 304 can be provided as any combination of any one of the 2D lobes 310 shown in FIG. 38 laid over any one of the 3D volumes 312 shown in FIG. 39. As such, the 3D volumes 312A-312K are simply exemplary and should not be considered exhaustive. As would be apparent to one of ordinary skill in the art in light of this disclosure, embodiments of the conductive path 304 of the inductor 302 may be laid over any one of the 3D volumes 312 shown in FIG. 39 or any other 3D volume having a suitable 3D shape. With regard to the 2D lobes 310, in general, 2D shapes with higher level symmetry are preferred. Rounded shapes result in fewer losses and will also be favored.

With regard to the 3D volumes 312 specifically shown in FIG. 39, the 3D volume 312B-312E is shaped approximately as a polyhedron. The 3D volume 312B is shaped approximately as a cuboid. A boundary of the 3D volume 312B thus has six faces and eight sides. In this embodiment, the eight sides of the 3D volume 312 at the boundary have lengths that are approximately equal and the six faces at the boundary have areas that are approximately equal. Thus, the cuboid is approximately shaped as a cube. In alternative embodiments, the boundary of the 3D volume 312B may have sides of different length and faces of different areas (forming a rectangular prism). Next, the 3D volume 312C is approximately shaped as an icosahedron. As such, a boundary of the 3D volume 312C shown in FIG. 39 has 32 sides that form 20 faces. With regard to the 3D volume 312D, a boundary of the 3D volume 312D is shaped approximately as a rhombicuboctahedron. Thus, a boundary of the 3D volume 312D has 24 faces and 54 sides. Finally, the 3D volume 312E is shaped approximately as a tetrahedron. Accordingly, a boundary of the 3D volume 312E thus has three faces and six sides. Other alternative embodiments of the 3D volume 312 may be shaped approximately as any other type of polyhedral, which may or may not have sides of equal lengths and faces of equal areas.

The 3D volumes 312A and 312F are each approximately shaped as an ellipsoid and are rounded volumes. More specifically, the 3D volume 312A is shaped approximately as a sphere, which is a special case of an ellipsoid. Since the 3D volume 312A is shaped approximately as a sphere, every point along a boundary of the 3D volume 312A is approximately equidistant to a geometric centroid. The 3D volume 312F is shaped approximately as an ellipsoid that is not spherical. Thus, every point along a boundary of the 3D volume 312F has a distance to a geometric centroid approximately defined by a two minor axis and a major axis. The 3D volume 312G is approximately shaped as a cylinder and is thus also a rounded volume. For example, the 3D volume 312G may be approximately shaped as a circular cylinder, an elliptical cylinder, a parabolic cylinder, or a hyberbolic cylinder. Finally, the 3D volume 312K has an irregular 3D shape. In general, the 3D volumes 312 that have a high degree of symmetry are preferred. Also, the Q factor of the inductor 302 is dependent on the 3D volume 312 encircled by a given lateral surface. This is a second region for rounded shapes having higher Q factors.

Referring now to FIGS. 37-39, the shape of the conductive path 304 is conceptualized by wrapping the plane 348 (which is 2D) with one of the 2D lobes 310, over one of the 3D volumes 312. Which embodiment of the 2D lobes 310 and 3D volume 312 is used to form the conductive path 304 of the inductor 302 may depend on budgetary constraints along with required performance parameters for a particular RF application.

For example, embodiments of the inductor 302 may be used in RF applications with operating frequencies between 100 MHz to 10 GHz. Due to the unique topology of the inductor 302, a Q factor of the inductor 302 may be between 100 and 500 at these operating frequencies. The inductor 302 is also generally integrated into an IC. As such, a largest dimension of the inductor 302 is generally less than or equal to 10 millimeters. Additionally, the sharper directional changes are in the conductive path 304, the higher a resistance is of the conductive path 304. Accordingly, embodiments of the conductive path 304 where the 2D lobe 310 and the 3D volume 312 are rounded decreases the resistance of the conductive path 304. Embodiments of the conductive path 304 where the 2D lobe 310 and the 3D volume 312 are polygonial thus provide for increased resistance. Still, the sharpness of directional changes in the conductive path 304 decreases as a number of sides of the 2D lobe 310 and the 3D volume 312 increase. However, it may be more difficult to construct embodiments of the conductive path 304 with the 2D lobe 310 and the 3D volume 312 either being rounded or with a large number of sides. Thus, some accommodation between resistance and manufacturability should be made when selecting the shape of the conductive path 304 for the inductor 302.

Figure 40:
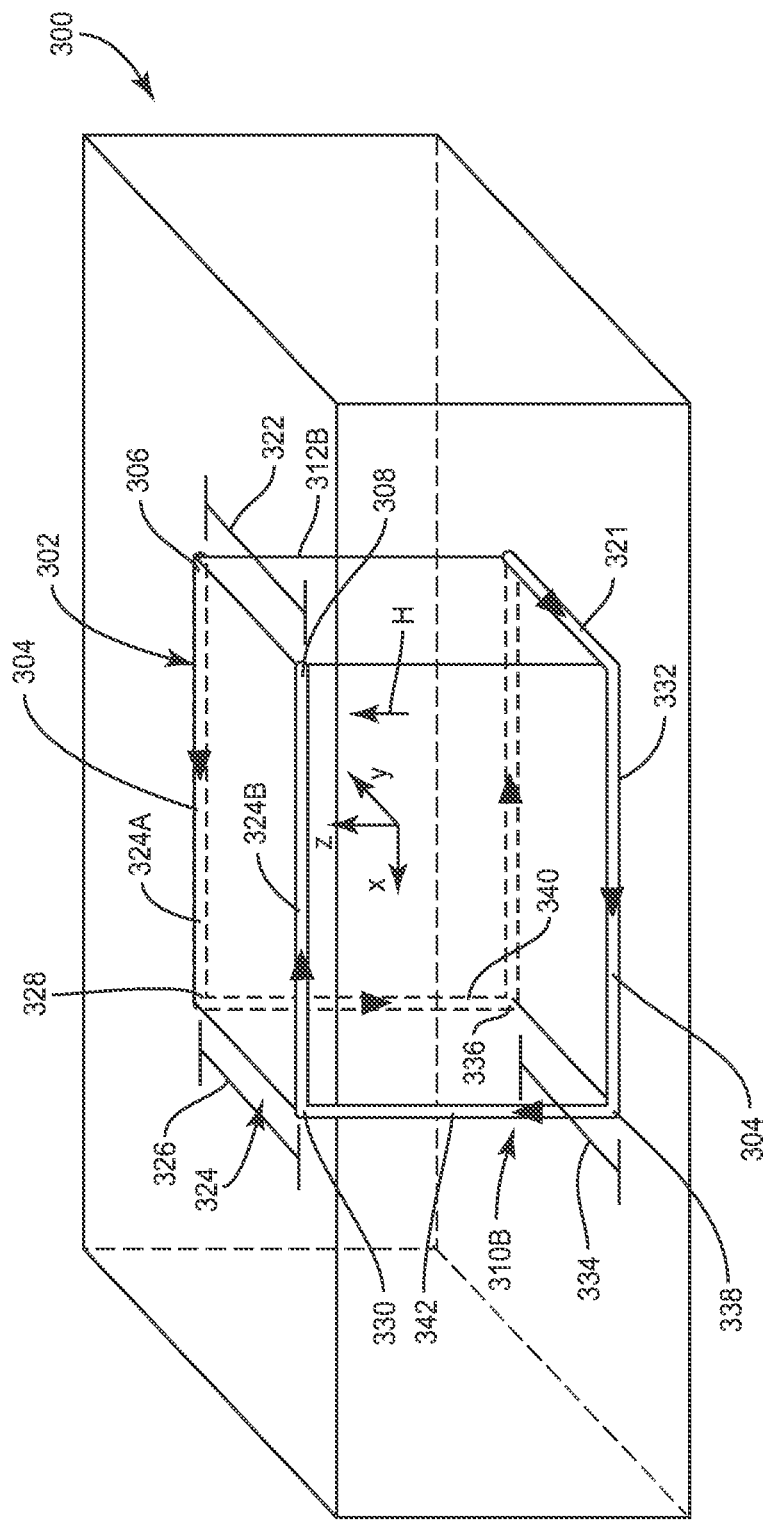
FIG. 40 illustrates another embodiment of the inductor shown in FIG. 37, where the 2D lobe is shaped as a square and the 3D volume is a cube.
Figure 41:
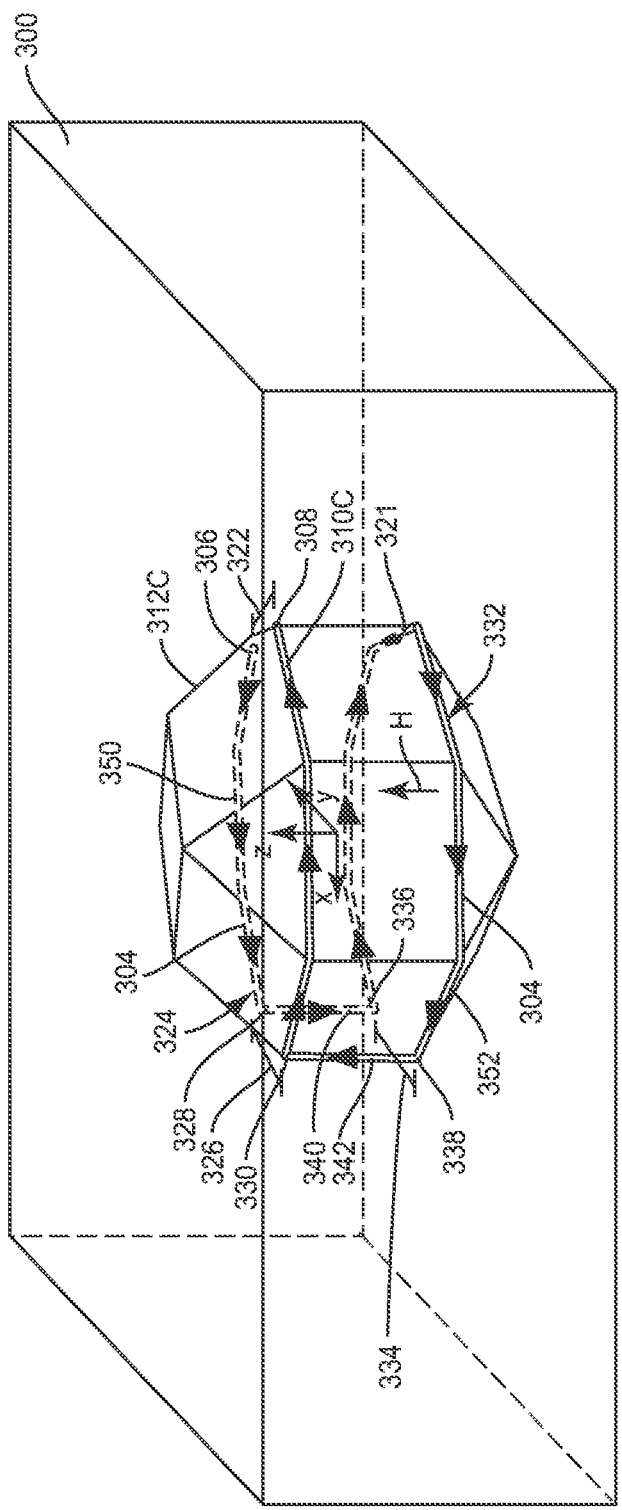
FIG. 41 illustrates another embodiment of the inductor shown in FIG. 37, where the 2D lobe is shaped as a discrete double humped resonant curve and the 3D volume is a icosahedron.
Figure 42:
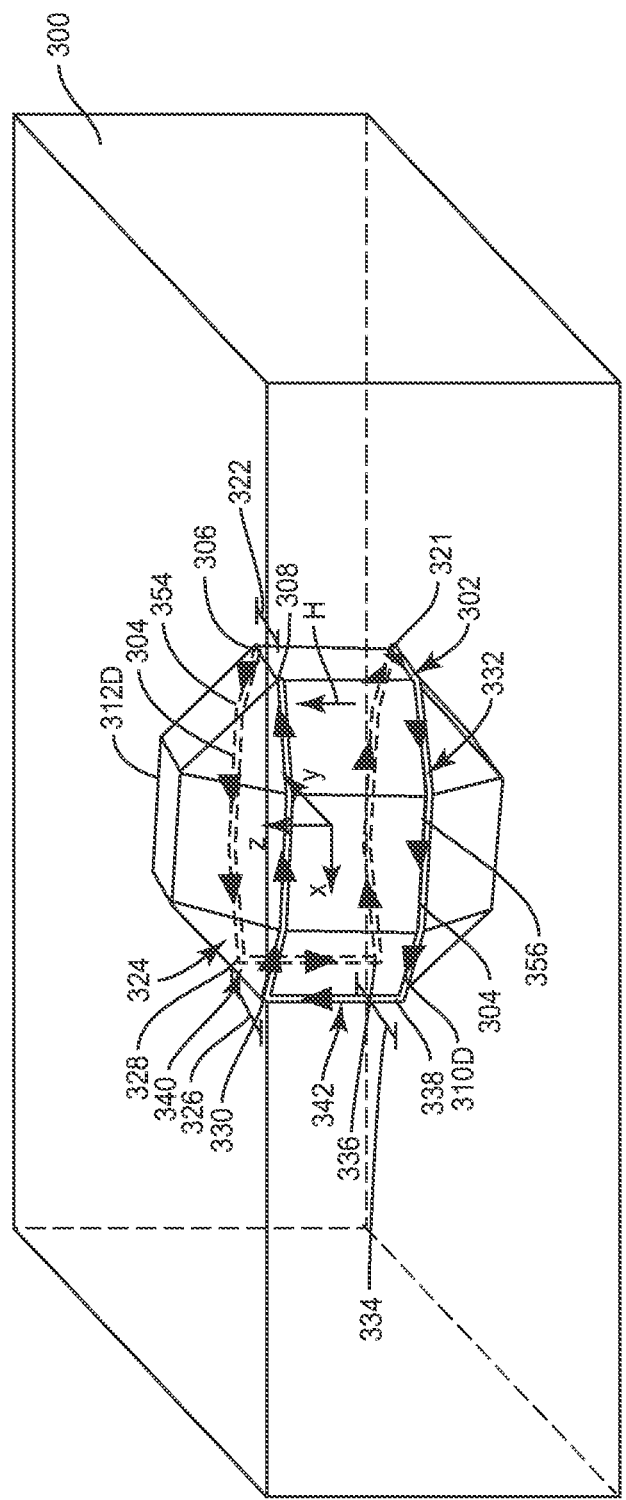
FIG. 42 illustrates another embodiment of the inductor shown in FIG. 37, where the 2D lobe is shaped as another discrete double humped resonant curve and the 3D volume is a rhombicuboctahedron.

FIGS. 40-42 each show a different combination of the 2D lobes 310 shown in FIG. 38 and the 3D volumes 312 shown in FIG. 39. Again, embodiments of the inductor 302 may be formed having the conductive path 304 shaped as any suitable 2D lobe, such as any one of the 2D lobes 310 shown in FIG. 38 laid over a 3D volume of any suitable 3D shape or such as any one of the 3D volumes 312 shown in FIG. 39. Thus, as would be apparent to one of ordinary skill in the art, the embodiments of the inductor 302 shown in FIGS. 40-42 are merely exemplary and not exhaustive.

Referring now specifically to FIG. 40, FIG. 40 illustrates another embodiment of the inductor 302 residing in the substrate 300. In this embodiment, the conductive path 304 of the inductor 302 corresponds to the shape of the 2D lobe 310B laid over the 3D volume 312B. As mentioned above with regard to FIGS. 38 and 39, the 2D lobe 310B is shaped approximately as a square and the 3D volume 312B is shaped approximately as a cube. The magnetic field H is generated by the inductor 302 in response to an RF signal. By laying the 2D lobe 310B of the conductive path 304 over the 3D volume 312B, the magnetic field lines of the magnetic field H are predominately constructive inside the inductor 302 and within the 3D volume 312B, and they are predominately destructive outside the inductor 302 and the 3D volume 312B. Arrows in FIG. 40 indicate directions of current propagation through the conductive path 304 of the inductor 302.

In this embodiment, the gap 322 between the first terminal 306 and the second terminal 308 is formed by an open side of the 2D lobe 310B. Since the 2D lobe 310B is shaped approximately as a square, the 2D lobe 310B only forms segments 324A, 324B of the first turn 324. The segment 324A is substantially parallel with the x-axis such that current propagation within the segment 324A is in a negative x direction. The segment 324B is substantially parallel with the x-axis such that current propagation within the segment 324B is in a positive x-direction. The gap 326 is formed between the segments 324A, 324B of the first turn 324. The segment 324A includes the connecting end 328, and the segment 324B includes the connecting end 330.

However, in this embodiment, segment(s) having y-directional components are not connected to either of the segments 324A, 324B, and thus the first turn 324 is not formed. In alternative embodiments, the 2D lobe 310B may be approximately square with only a partially open side to form the gap 322 so that one or more segments are formed with y-directional components and thereby form the first turn 324. In this case, the first turn 324 would be provided and shaped approximately as an open square.

Referring again to the embodiment shown in FIG. 40, the second turn 332 is formed by the 2D lobe 310B. In this embodiment, the second turn 332 defines the gap 334 and is approximately shaped as an open square. The second turn 332 thus includes the connecting end 336 that is connected to the connecting end 328 of the segment 324A. Furthermore, the second turn 332 includes the connecting end 338 connected to the connecting end of the segment 324B. Since the 2D lobe 310B only forms the segments 324A, 324B of the first turn 324, the inductor 302 shown in FIG. 40 does not have mirror symmetry relative to the x-y plane. In alternative embodiments, the 2D lobe 310B may be approximately square with only a partially open side to form the gap 322 so that one or more segments are formed with y-directional components and thereby form the first turn 324. In this case, the first turn 324 and the second turn 332 would be provided as open squares facing one another. Thus, the first turn 324 and the second turn 332 would be substantially symmetric relative to the x-y plane.

Note that in the embodiment shown in FIG. 40, the conductive path 304 does form the third turn 340 and the fourth turn 342. The third turn 340 and the fourth turn 342 are each provided as open squares that face one another. The third turn 340 is formed by the segment 324A and the second turn 332, while the fourth turn 342 is formed by the segment 324B and the second turn 332. In this embodiment, the third turn 340 and the fourth turn 342 are substantially symmetric relative to the y-z plane. Furthermore note that the 2D lobe 310B laid over the 3D volume 312B shown in FIG. 40 may have greater resistance than the 2D lobe 310A laid over the 3D volume 312B, since direction changes in the 2D lobe 310 are very sharp and approximately 90 degrees. However, the 2D lobe 310B laid over the 3D volume 312B shown in FIG. 40 can be constructed easily with vias and metallic layers within the substrate 300.

Referring now specifically to FIG. 41, FIG. 41 illustrates another embodiment of the inductor 302 residing in the substrate 300. In this embodiment, the conductive path 304 of the inductor 302 corresponds to the shape of the 2D lobe 310C laid over the 3D volume 312C. As mentioned above with regard to FIG. 38, the 2D lobe 310C is shaped approximately as a double humped resonant curve having the first open hexagon 350 and the second open hexagon. The 3D volume 312C is shaped approximately as a icosahedron. The magnetic field H is generated by the inductor 302 in response to an RF signal. By laying the 2D lobe 310C of the conductive path 304 over the 3D volume 312C, the magnetic field lines of the magnetic field H are predominately constructive inside the inductor 302 and within the 3D volume 312C and predominately destructive outside the inductor 302 and the 3D volume 312C. Arrows in FIG. 41 indicate directions of current propagation through the conductive path 304 of the inductor 302.

In this embodiment, the gap 322 between the first terminal 306 and the second terminal 308 is formed by an open side of the 2D lobe 310B. More specifically, the gap 322 is formed by an open side of the first open hexagon 350. The first open hexagon 350 also has an open side that forms the gap 326 and the first turn 324. The first turn 324 is thus provided by the first open hexagon 350. The first turn 324 includes the connecting end 328 and the connecting end 330.

As shown in FIG. 41, the second open hexagon 352 provides the second turn 332. An open side of the second open hexagon 352 defines the gap 334. The second turn 332 thus includes the connecting end 336 that is connected to the connecting end 328 of the first turn 324. Furthermore, the second turn 332 includes the connecting end 338 that connects to the connecting end 330 of the first turn 324. The first open hexagon 350 and the second open hexagon 352 face one another and are substantially symmetrical relative to the x-y plane.

Note that in the embodiment shown in FIG. 41, the conductive path 304 does form the third turn 340 and the fourth turn 342, which face one another. The third turn 340 and the fourth turn 342 are each formed by the first open hexagon 350 and the second open hexagon 352. In this embodiment, the third turn 340 and the fourth turn 342 are substantially symmetric relative to the y-z plane. Furthermore note that the 2D lobe 310C laid over the 3D volume 312C shown in FIG. 41 may have greater resistance than the 2D lobe 310A laid over the 3D volume 312A but less resistance than the 2D lobe 310B laid over the 3D volume 312B, since direction changes in first turn 324 and the second turn 332 are approximately 60 degrees.

Referring now specifically to FIG. 42, FIG. 42 illustrates another embodiment of the inductor 302 residing in the substrate 300. In this embodiment, the conductive path 304 of the inductor 302 corresponds to the shape of the 2D lobe 310D laid over the 3D volume 312D. As mentioned above with regard to FIG. 38, the 2D lobe 310D is shaped approximately as a double humped resonant curve having the first open octagon 354 and the second open octagon 356. The 3D volume 312D is shaped approximately as a rhombbicuboctahedron. The magnetic field H is generated by the inductor 302 in response to an RF signal. By laying the 2D lobe 310D of the conductive path 304 over the 3D volume 312D, the magnetic field lines of the magnetic field H are predominately constructive inside the inductor 302 and within the 3D volume 312D and predominately destructive outside the inductor 302 and the 3D volume 312D. Arrows in FIG. 42 indicate directions of current propagation through the conductive path 304 of the inductor 302.

In this embodiment, the gap 322 between the first terminal 306 and the second terminal 308 is formed by an open side of the 2D lobe 310B. More specifically, the gap 322 is formed by an open side of the first open octagon 354. The first open octagon 354 also has an open side that forms the gap 326 and the first turn 324. The first turn 324 is thus provided by the first open octagon 354. The first turn 324 includes the connecting end 328 and the connecting end 330.

As shown in FIG. 41, the second open octagon 356 provides the second turn 332. An open side of the second open octagon 356 defines the gap 334. The second turn 332 thus includes the connecting end 336 that is connected to the connecting end 328 of the first turn 324. Furthermore, the second turn 332 includes the connecting end 338 that connects to the connecting end 330 of the first turn 324. The first open octagon 354 and the second open octagon 356 face one another and are substantially symmetrical relative to the x-y plane.

Note that in the embodiment shown in FIG. 42, the conductive path 304 does form the third turn 340 and the fourth turn 342, which face one another. The third turn 340 and the fourth turn 342 are each formed by the first open octagon 354 and the second open octagon 356. In this embodiment, the third turn 340 and the fourth turn 342 are substantially symmetric relative to the y-z plane. Furthermore, note that the 2D lobe 310D laid over the 3D volume 312D shown in FIG. 42 may have greater resistance than the 2D lobe 310A laid over the 3D volume 312A but less resistance than the 2D lobe 310B laid over the 3D volume 312B, since direction changes in first turn 324 and the second turn 332 are approximately 45 degrees.

Figure 43:
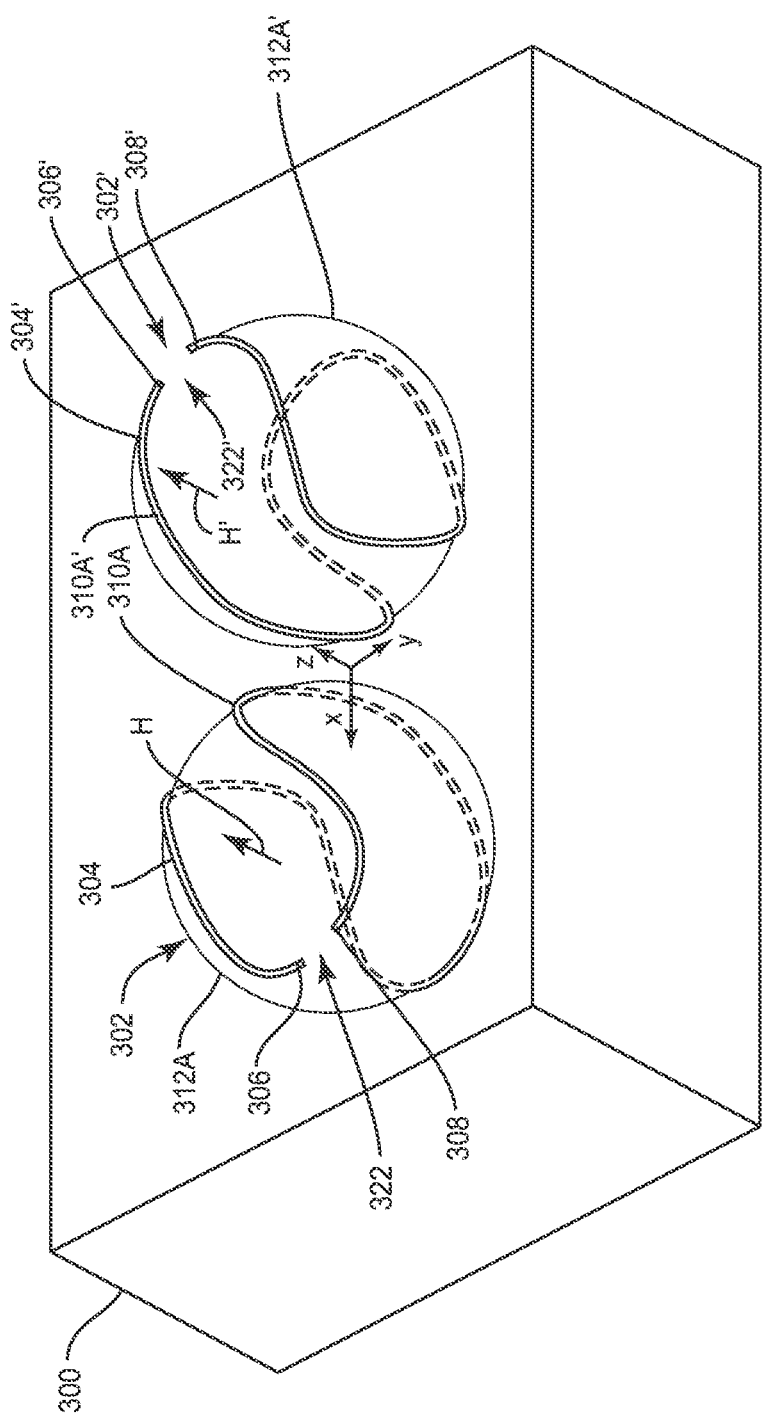
FIG. 43 illustrates an embodiment of the inductor shown in FIG. 37 close to another inductor, where the inductors are weakly coupled to one another.

FIG. 43 illustrates an embodiment of the inductor 302 shown in FIG. 37 positioned near another inductor 302'. The inductor 302 and the inductor 302' are formed in the substrate 300. In this embodiment, the inductor 302' is identical to the inductor 302. Thus, the inductor 302' includes another conductive path 304' that extends from a third terminal 306' to a fourth terminal 308'. The conductive path 304' has a shape corresponding to a second 2D lobe 310A' laid over a second 3D volume 312A'. Accordingly, the inductor 302' is configured to generate a second magnetic field H' having magnetic field lines outside the inductor 302' that are predominately constructive and magnetic field lines inside the inductor 302' that are predominately destructive. While the inductor 302 and the inductor 302' are placed close to one another (i.e. less than 10 mm apart), the inductor 302 and the inductor 302 may be weakly coupled to each other.

Any combination of a suitable 2D lobe and 3D volume may be provided to form the inductor 302 and any combination of suitable 2D lobe and 3D volume may be provided to form the inductor 302'. In this embodiment, the inductor 302' and the inductor 302 are identical. Thus, the 2D lobe 310A of the inductor 302 and the 2D lobe 310A' of the inductor 302' are both shaped as double humped resonant curves that are continuous and rounded. Also, the 3D volume 312A of the inductor 302 and the 3D volume 312A' of the inductor 302' are both spheres. In alternative embodiments, the inductor 302 and the inductor 302' may be identical but have the 2D lobes 310A, 310A' and the 3D volumes 312A, 312A' provided with a different shape, such as any of the shapes described in FIGS. 38 and 39 above. In other alternative embodiments, the inductor 302 and the inductor 302' may not be identical but rather have different shaped 2D lobes laid over different 3D volumes. For example, in an alternative embodiment, the conductive path 304 is shaped like the 2D lobe 310A laid over the 3D volume 312A while the conductive path 304' is shaped like the 3D lobe 310B laid over the 3D volume 31B shown in FIGS. 38 and 39. Any other combination of the 2D lobes 310 shown in FIG. 38 and the 3D volumes 312 shown in FIG. 39 may be provided to form the inductor 302 and any other combination of the 2D lobes 310 shown in FIG. 38 and the 3D volumes 312 shown in FIG. 39 may be provided to form the inductor 302'. Most existing manufacturing processes use planar multi-layered structures to provide the substrate. To have a physical implementation of an inductor that is 3D, a current path realized with 2D lobes laid over a 3D volume needs to be provided with such multi-layered substrate configurations.

Figure 44A:
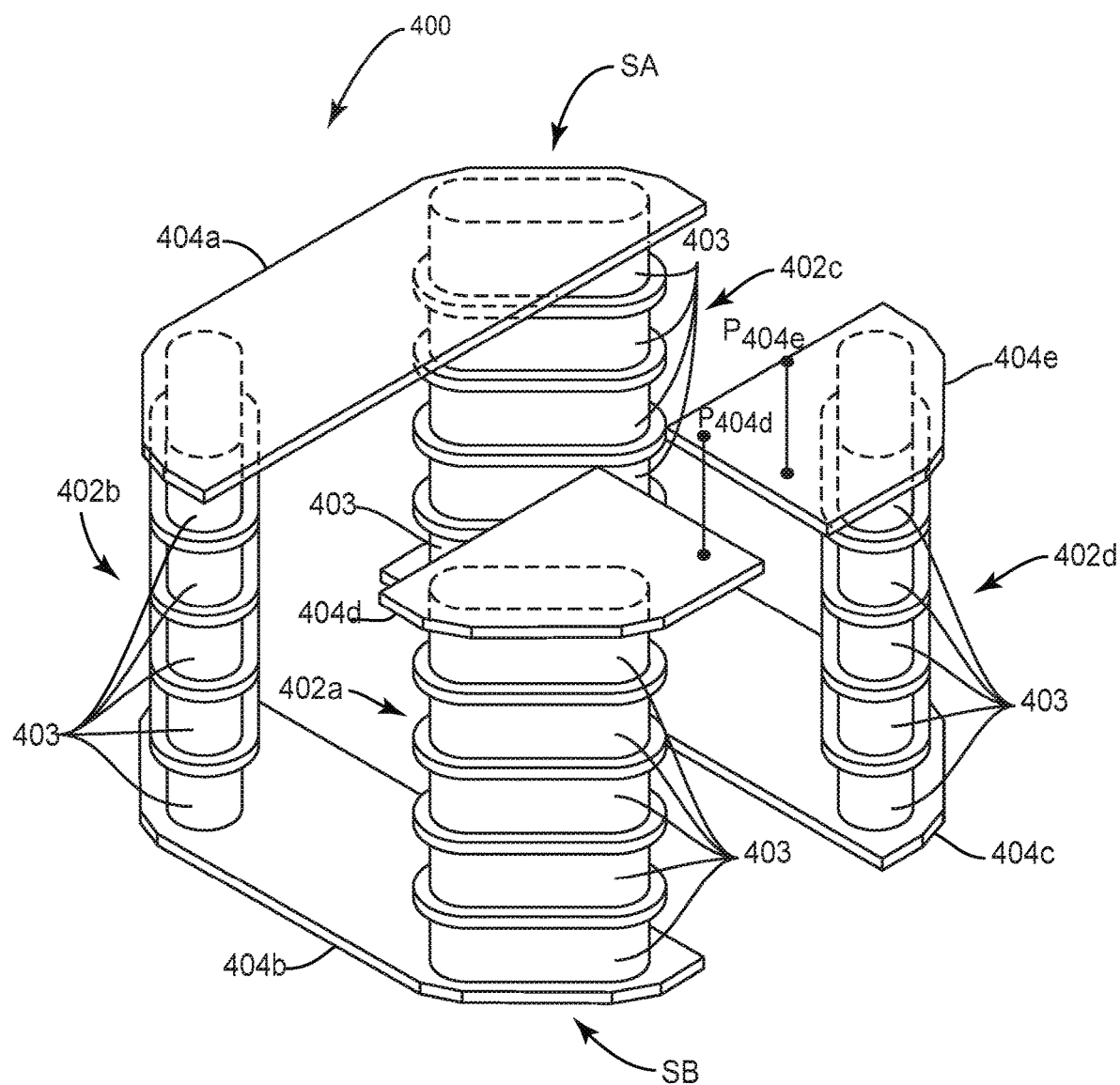

FIG. 44A illustrates an embodiment of an inductor 400 similar to the inductor 302 shown in FIG. 40. The inductor 400 includes four vias (referred to generically as element 402 and specifically as via 402a, 402b, 402c, and 402d). Each of the vias 402 includes metallic bars 403. The inductor 400 also includes five metallic plates (referred to generically as element 404 and specifically as metallic plates 404a, 404b, 404c, 404d, and 404e). The metallic plate 404a connects the via 402b to the via 402c on a first side SA of the inductor 400. On a second side SB of the inductor 400 that is antipodal to the first side SA, the metallic plate 404b connects the via 402a to the via 402b, and the metallic plate 404c connects the via 402c to the via 402d. The metallic plates 404d and 404e provide terminal connections for the inductor 400 and are connected to the vias 402a and 402d, respectively, at the first side SA. The metallic plates 404d and 404e can be connected to ports $P_{404d}$ and $P_{404e}$, respectively, for connection to an external component, such as, but not limited to, a tunable capacitor. Note that the inductor 400 in FIG. 44A is also a three-dimensional inductor structure. Furthermore, while the inductor 400 in FIG. 44A is cubic, other embodiments of the inductor 400 may be any shape. For example, an alternative embodiment of the vertical inductor structure may be spherical.

Current from the port $P_{404d}$ flows to and across the metallic plate 404d down the via 402a to the metallic plate 404b. The current flow continues across the metallic plate 404b up through the via 402b to the metallic plate 404a. The current flow then continues across the metallic plate 404a down through the via 402c to the metallic plate 404c. The current flow continues up through the via 402d to the terminal plate 404e and up through the port $P_{404e}$. Since the current direction of one via 402 is parallel to an adjacent via 402 (for example, the adjacent vias 402a and 402b), the magnetic fields generated from each individual via 402 cancel each other, confining the magnetic field to the interior of the inductor 400 of FIG. 44A. Thus, the inductor 400 of FIG. 44A contains a small, or substantially zero, coupling factor. As such, the vias 402a-402d and the metallic plates 404a-404e are arranged such that the magnetic field generated by the inductor 400 is substantially confined to the interior of the inductor 400.

FIGS. 44B-44D provide cross-section views of the inductor 400 of FIG. 44A in a multi-layered substrate 406. Note that the inductor 400 shown in FIGS. 44B-44D is also a three-dimensional inductor structure. In particular, FIG. 44B provides a cross-section view of the terminal side of the inductor 400 of FIG. 44A. In FIG. 44B, the ports $P_{404d}$ and $P_{404e}$ extend from the surface of the multi-layered substrate 406 down to the respective terminal plates 404d and 404e. Placing the inductor 400 of FIG. 44A in the substrate 406 enables an active device, such as, but not limited to, a tunable capacitor, to be attached right above the inductor 400 on the surface of the multi-layered substrate 406 to maintain a low series resistance between the inductor 400 and the active device, and to ensure a homogenous injection of current between the inductor 400 and the active device. This arrangement also greatly reduces the amount of space resonant circuitry comprising the vertical inductor structure of the present disclosure takes up in the multi-layered substrate 406.

FIG. 44B also provides a cross-section view of a gap 405 between the terminal metallic plates 404d and 404e. The gap 405 between the terminal metallic plates 404d and 404e must be a minimum of approximately 50 microns to keep electrical separation between the terminal metallic plates 404d and 404e. It is also advantageous that the ports $P_{404d}$ and $P_{404e}$ are respectively connected substantially to the edge of the terminal metallic plates 404d and 404e for proper current flow throughout the inductor 400 of the present disclosure.

The cross-section view shown in FIG. 44B also demonstrates how a height $h_1$ of the metallic bars 403 correspond to a depth $d_1$ of the substrate layers, which may range between approximately 50 microns and 80 microns. As shown, the height $h_1$ of the vias 402 is dependent upon the depth $d_1$ and the number of the metallic bars 403 available to create each via 402. For example, the height $h_1$ of the vias 402a-402d shown in FIGS. 44B-44D would be approximately 250 microns to 400 microns if the depth $d_1$ ranges from approximately 50 microns to 80 microns. However, the height $h_1$ of the vias 402 of the present disclosure may be taller or shorter depending upon the number of metallic bars 403 used to construct the inductor 400 and the depth $d_1$ of each of those metallic bars 403.

The high Q factor and the small coupling factor of the inductor 400 of FIG. 44A can be adjusted by either increasing or decreasing widths $w_1$ of the vias 402a and 402b shown in FIG. 44C. The width $w_1$ of the vias 402a and 402b can be increased to improve a metal density of the inductor 400 and to achieve a high Q factor without increasing an inductive resistance of the inductor 400 of FIG. 44A. However, the width $w_1$ cannot be increased such that a spacing 407 between the vias 402a and 402b is smaller than approximately 150 microns, which is the amount of space need to provide an electrical separation between the vias 402a and 402b.

A length $L_1$ of the metallic plate 404b shown in FIG. 44C is dependent upon the width $w_1$ of the vias 402a and 402b and the size of the spacing 407 to achieve a specific high Q value. Typically, a high Q value would be equal or higher than a value of 100. For example, if the desired widths $w_1$ of the vias 402a and 402b is approximately 400 microns, and the spacing 407 is approximately 400 microns, then the length $L_1$ of the metallic plate 404b would be approximately 1200 microns. However, the width $w_1$, the spacing 407, and the length $L_1$ of the metallic plate 404b may be larger or smaller, depending upon the desired Q factor and coupling factor of the inductor 400 of the present disclosure.

In accordance with the inductor 400 of FIG. 44A of the present disclosure, although not shown, the vias 402c and 402d possess the same width $w_1$ of the vias shown in FIG.

44C. A spacing between the vias 402c and 402d would also be the same as the spacing 407 shown in FIG. 44C.

FIG. 44D shows the opposite terminal view of the inductor 400 of FIG. 44A within the substrate 406. A length $L_2$ of the metallic plate 404a is also substantially long enough to connect the tops of the vias 402b and 402c. In order to ensure that the path length the current travels is equal in each turn of the inductor 400 of FIG. 44A, the length $L_2$ of the metallic plate 404a is substantially equal to the length $L_1$ of the metallic plate 404b shown in FIG. 44C. For example, if the length $L_1$ of the metallic plate 404b of FIG. 44C is approximately 1200 microns, the length $L_2$ of the metallic plate 404a will also be approximately 1200 microns. In one embodiment, the metallic plates 404a, 404b, 404c, 404d, and 404e are each approximately 20 microns wide.

Figure 44E:
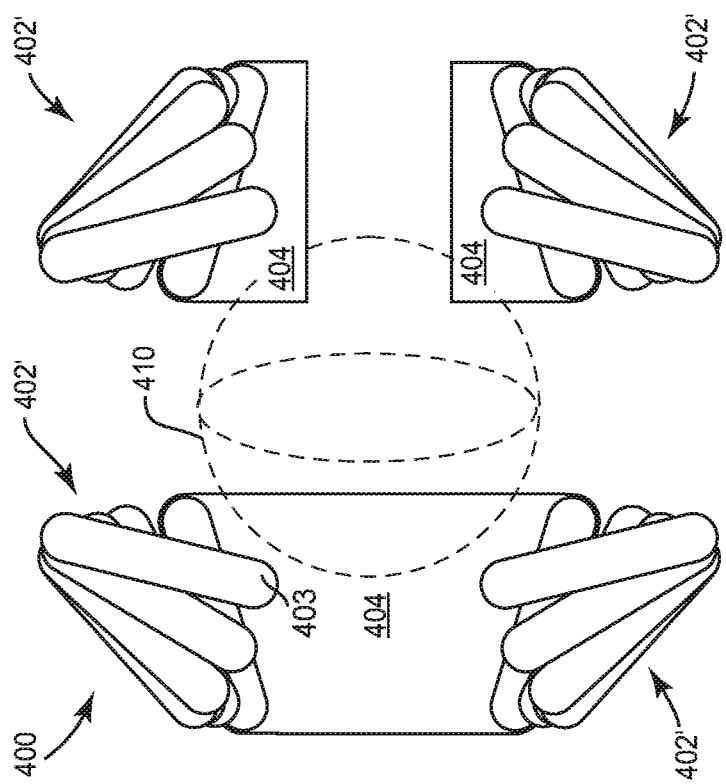
Figure 44F:
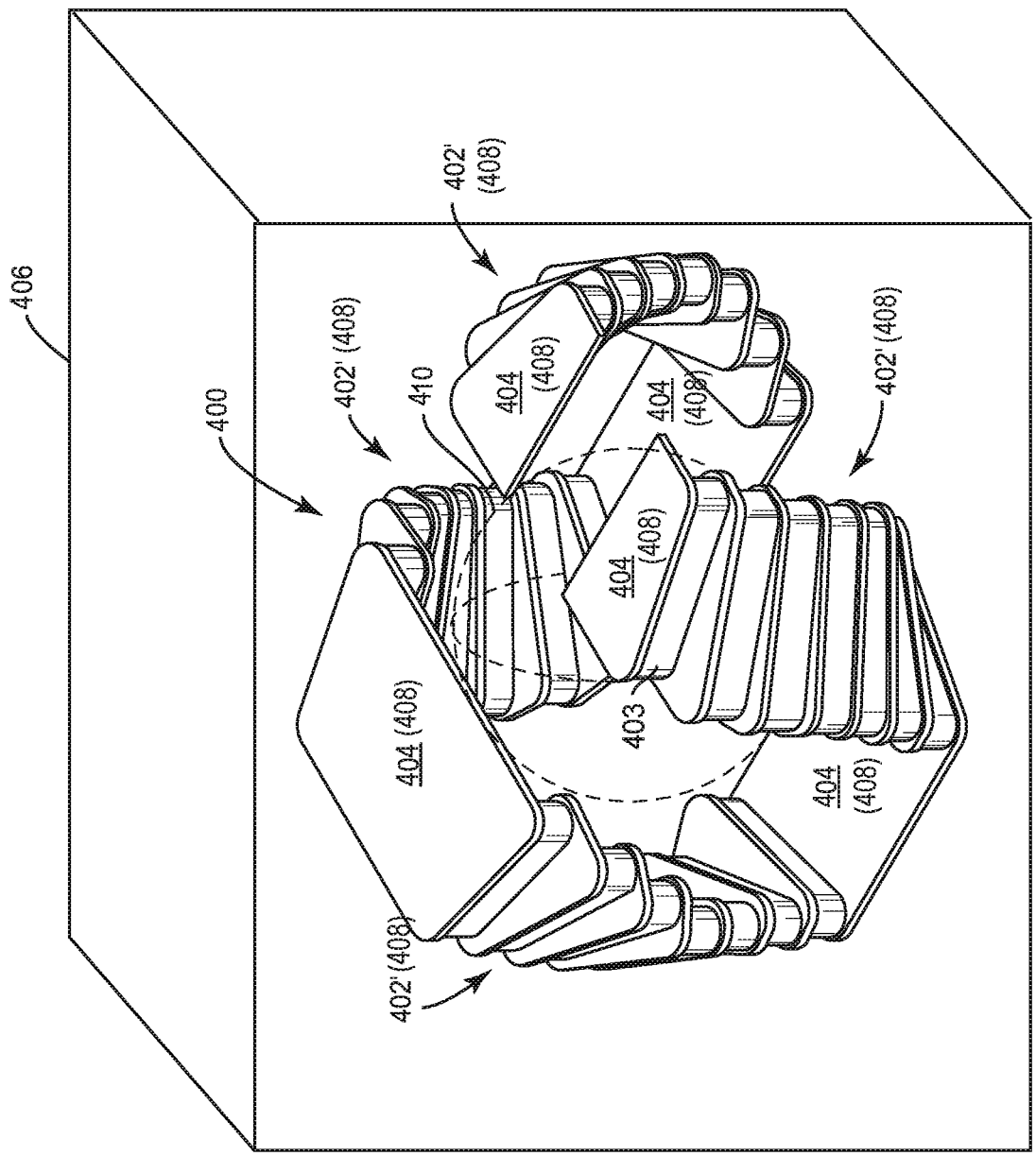

FIGS. 44E and 44F illustrate another embodiment of the inductor 400. In this embodiment, the inductor 400 is implemented using vias 402' and the metallic plates 404. The vias 402' and the metallic plates 404 are provided by a metallic structure integrated into the substrate 406. In this embodiment however, the inductor 400 has a rounded current path 408 laid over a sphere 410. The inductor 400 thus has a high level of symmetry, while minimizing the losses in the rounded current path 408. A Q factor of the inductor 400 is boosted by enclosing a large volume (approximately a sphere) with a minimal current path length due to the piece-wise linear approximation provided by the vias 402' and the metallic plates 404. The vias 402' are realized with shifted and rotated metallic bars 403. The metallic plates 404 are provided by metallic layers. The greater the number of the (planar) metallic layers used, the better the approximation of the rounded current path 408, which thus give a high Q factor.

At RF frequencies, current does not circulate in the entire volume of the metal but only in at the surface. This significantly reduces the Q factor. Therefore, the Q factor of the inductor 400 can be improved by maximizing the surface area on which RF current travels. In FIGS. 44E and 44F, the bars 403 used to implement the vias 402' have surface areas dominated by their length. Increasing the length may result in a higher Q factor, but also in larger sited and thus in her cost and footprint.

Figures 45A, 45B:
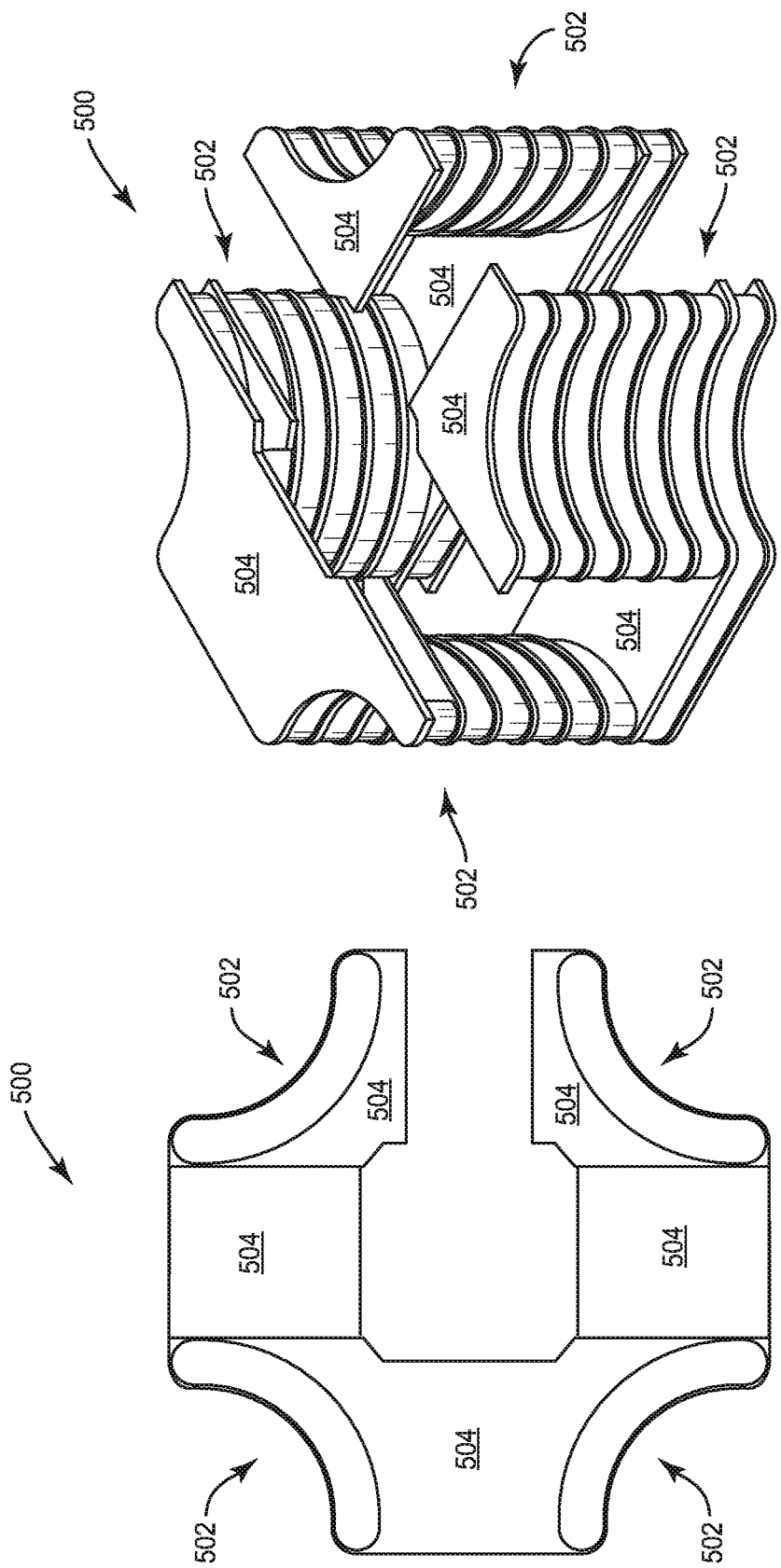
FIGS. 45A and 45B illustrate an embodiment of an inductor similar to the inductor shown in FIGS. 44E and 44F, except that in this embodiment the vias have a concave shape.

FIGS. 45A and 45B illustrate an embodiment of an inductor 500 similar to the inductor 302 shown in FIGS. 44E and 44F. The inductor 500 is also formed from vias 502 and metallic plates 504. In this embodiment, the vias 502 are formed by concave via bars that, for a given linear length, provide a larger lateral area and thus smaller losses (the vias 502 have a concave shape). Clearly, this may lead to higher Q factors. The curved side walls' via bars were applied to a standard hexagonal prism as the 3D volume. In an alternative embodiment, the rounded current path 408 and the vias 402' in FIGS. 44E and 44F may also have the concave via bars. This may lead to a higher Q factor.

Figure 46A:
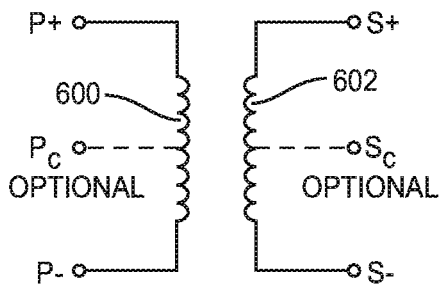
FIG. 46A illustrates two inductors that are weakly coupled are each implemented 3D multi-turn inductors.

FIG. 46A illustrates two inductors 600, 602 that are weakly coupled, where the inductors 600, 602 are 3D multi-turn inductors. In this embodiment, two or more lobed structures are provided. The lobed structures have current going in the same direction on each facet. Lobed structures are also provided so that current goes in opposite directions with current circulating in opposite directions and placed symmetrically such that a magnetic field reinforces in the interior and is destructive in the exterior. Larger value inductors can be achieved in a given volume with such structures.

Figure 46B:
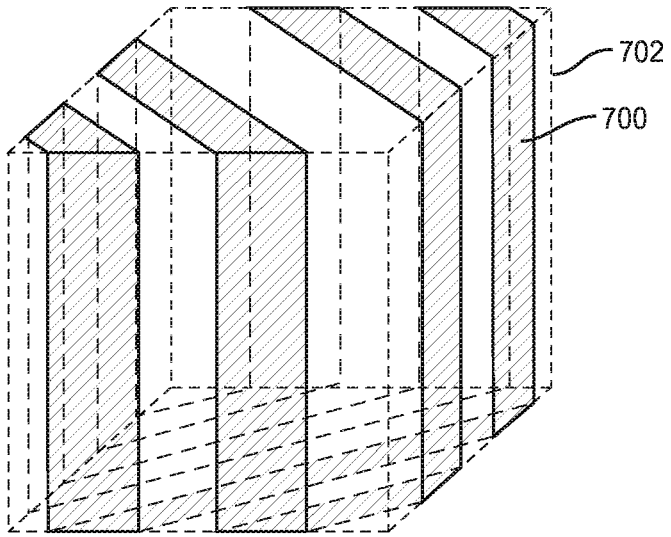
FIG. 46B illustrates an embodiment of a multi-turn inductor wrapped and folded around a cube.

FIG. 46B illustrates an embodiment of a multi-turn inductor 700 wrapped and folded around a cube 702. In this case, similar concepts of wrapping and folding can be used to create the multi-turn inductor 700 with a 3D shape. In this case, a transformer with two windings is created. A number of windings greater than two is also possible.

Figure 46C:
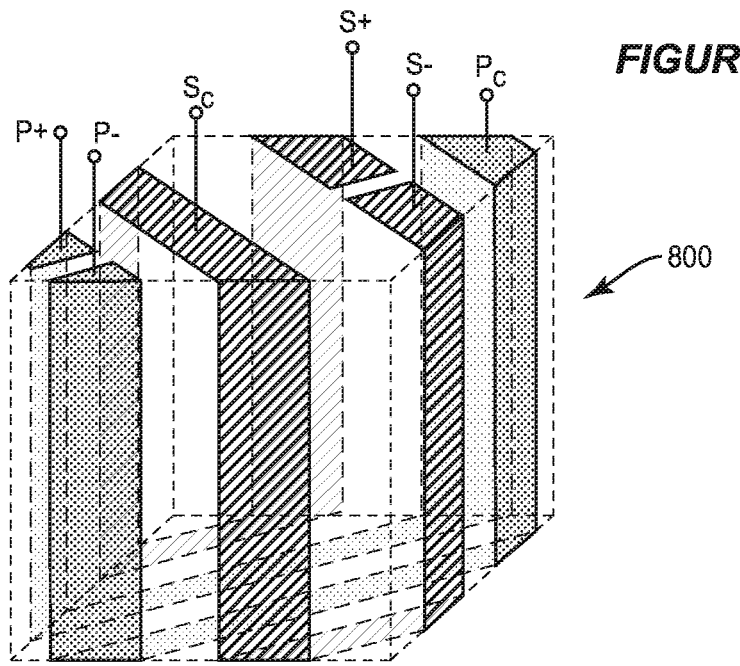
FIG. 46C illustrates an exemplary embodiment multi-turn inductor.

FIG. 46C illustrates an exemplary embodiment multi-turn inductor 800, which is also a 3D inductor. Taps are created in the inductor by placing additional terminals at certain points of a conductive path 802. These and other embodiment would be apparent to one of ordinary skill in the art.

Those skilled in the art will recognize improvements and modifications to the preferred embodiments of the present disclosure. All such improvements and modifications are considered within the scope of the concepts disclosed herein and the claims that follow.

What is claimed is:

1. An apparatus, comprising:
    a substrate;
    a first inductor residing in the substrate and comprising a first conductive path that extends from a first terminal to a second terminal, wherein:
        the first conductive path has a shape corresponding to a first two-dimensional (2D) lobe laid over a first three-dimensional (3D) volume such that the first inductor forms a first turn and a second turn that face one another and are substantially symmetrical with respect to a first plane, and forms a third turn and a fourth turn that are substantially symmetrical and face one another with respect to a second plane;
        the first plane and the second plane are substantially orthogonal to one another; and
        the first 2D lobe is open so as to define a first gap in the first 2D lobe between the first terminal and the second terminal and the first 2D lobe is formed such that the first 2D lobe extends out of the first terminal away from the first gap and loops back to the second terminal towards the first gap; and
    a second inductor residing in the substrate and near the first inductor, and comprising a second conductive path that extends from a third terminal to a fourth terminal, wherein:
        the second conductive path has a shape corresponding to a second 2D lobe laid over a second 3D volume such that the second inductor forms a fifth turn and a sixth turn that face one another and are substantially symmetrical with respect to a third plane, and forms a seventh turn and an eighth turn that are substantially symmetrical and face one another with respect to a fourth plane; and
        the third plane and the fourth plane are substantially orthogonal to one another.

2. The apparatus of claim 1 wherein the first inductor and the second inductor are identical.

3. The apparatus of claim 1 wherein the first inductor and the second inductor provide at least one of the following:
    the first 2D lobe of the first inductor and the second 2D lobe of the second inductor have different shapes; and
    the first 3D volume of the first inductor and the second 3D volume of the second inductor have different 3D volumes.

4. The apparatus of claim 1 wherein the first plane and the third plane are a same plane, and the second plane and the fourth plane are a same plane.

5. The apparatus of claim 1 wherein the substrate comprises:
    a substrate body; and
    a metallic structure, which is formed by conductive layers and vias, integrated into the substrate body, wherein the first inductor and the second inductor are at least partially formed from the conductive layers and the vias.

6. The apparatus of claim 5 wherein the conductive layers are within the substrate body and on a surface of the substrate body.

7. The apparatus of claim 5 wherein the conductive layers are within the substrate body and not on a surface of the substrate body.

8. The apparatus of claim 1 wherein:
the first inductor is configured to generate a magnetic field so that magnetic field lines inside the first inductor are predominately constructive but also substantially cancel near a geometric centroid of the first inductor; and
the second inductor is configured to generate a magnetic field so that magnetic field lines inside the second inductor are predominately constructive but also substantially cancel near a geometric centroid of the second inductor.

9. The apparatus of claim 8 wherein a largest dimension of the first inductor is less than or equal to 10 millimeters, and a largest dimension of the second inductor is less than or equal to 10 millimeters.

10. The apparatus of claim 9 wherein the first inductor is configured to have a quality factor of between 100 and 500 at operating frequencies of between 100 MHz and 10 GHz, and the second inductor is configured to have a quality factor of between 100 and 500 at operating frequencies of between 100 MHz and 10 GHz.

11. The apparatus of claim 1 wherein the second 2D lobe is open so as to define a second gap in the second 2D lobe between the third terminal and the fourth terminal, and the second 2D lobe is formed such that the second 2D lobe extends out of the third terminal away from the second gap and loops back to the fourth terminal towards the second gap.

12. The apparatus of claim 1 wherein:
the first 2D lobe is shaped approximately as one of a group consisting of a polygon, a rectangle, a square, an ellipse, and a circle; and
the first 3D volume is shaped approximately as one of a group consisting of a polyhedron, a rectangular cuboid, a cube, an ellipsoid, and a sphere.

13. The apparatus of claim 1 wherein:
the first 2D lobe is shaped approximately as a first open polygon and a second open polygon connected to one another, or approximately as a first open ellipse and a second open ellipse connected to one another; and
the first 3D volume is shaped approximately as a polyhedron or an ellipsoid.

14. The apparatus of claim 13 wherein:
the first open polygon is shaped approximately as a first hexagon or a first octagon; and
the second open polygon is shaped approximately as a second hexagon or a second octagon.

15. The apparatus of claim 1 wherein:
the second 2D lobe is shaped approximately as one of a group consisting of a polygon, a rectangle, a square, an ellipse, and a circle; and
the second 3D volume is shaped approximately as one of a group consisting of a polyhedron, a rectangular cuboid, a cube, an ellipsoid, and a sphere.

16. The apparatus of claim 1 wherein:
the second 2D lobe is shaped approximately as a first open polygon and a second open polygon connected to one another, or approximately as a first open ellipse and a second open ellipse connected to one another; and
the second 3D volume is shaped approximately as a polyhedron or an ellipsoid.

17. The apparatus of claim 16 wherein:
the first open polygon is shaped approximately as a first hexagon or a first octagon; and
the second open polygon is shaped approximately as a second hexagon or a second octagon.

* * * * *